United States Patent
Juengling

(10) Patent No.: US 7,915,692 B2
(45) Date of Patent: Mar. 29, 2011

(54) SEMICONDUCTOR STRUCTURE INCLUDING GATELINE SURROUNDING SOURCE AND DRAIN PILLARS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 12/116,748

(22) Filed: May 7, 2008

(65) Prior Publication Data

US 2008/0203453 A1    Aug. 28, 2008

Related U.S. Application Data

(62) Division of application No. 11/201,824, filed on Aug. 10, 2005, now Pat. No. 7,391,070, which is a division of application No. 10/855,429, filed on May 26, 2004, now Pat. No. 7,098,105.

(51) Int. Cl.
*H01L 27/108* (2006.01)

(52) U.S. Cl. ........ 257/401; 257/206; 257/296; 257/908; 257/E21.655

(58) Field of Classification Search .................. 257/202, 257/401
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,648,937 A | 3/1987 | Ogura et al. | |
| 4,776,922 A | 10/1988 | Bhattacharyya et al. | |
| 4,838,991 A | 6/1989 | Cote et al. | |
| 4,972,244 A | 11/1990 | Buffet et al. | |
| 4,984,039 A | 1/1991 | Douglas | |
| 4,992,838 A | 2/1991 | Mori | |
| 5,013,680 A | 5/1991 | Lowrey et al. | |

(Continued)

FOREIGN PATENT DOCUMENTS

DE    44 08 764 A1    9/1994

(Continued)

OTHER PUBLICATIONS

Notice of Allowance dated Apr. 6, 2010 in U.S. Appl. No. 12/339,610.

(Continued)

*Primary Examiner* — Wael M Fahmy
*Assistant Examiner* — Abul Kalam
(74) *Attorney, Agent, or Firm* — Knobbe, Martens, Olson & Bear, LLP

(57) ABSTRACT

The invention includes a semiconductor structure having a gateline lattice surrounding vertical source/drain regions. In some aspects, the source/drain regions can be provided in pairs, with one of the sourcedrain regions of each pair extending to a digit line and the other extending to a memory storage device, such as a capacitor. The source/drain regions extending to the digit line can have the same composition as the source/drain regions extending to the memory storage devices, or can have different compositions from the source-drain regions extending to the memory storage devices. The invention also includes methods of forming semiconductor structures. In exemplary methods, a lattice comprising a first material is provided to surround repeating regions of a second material. At least some of the first material is then replaced with a gateline structure, and at least some of the second material is replaced with vertical source/drain regions.

17 Claims, 128 Drawing Sheets

U.S. PATENT DOCUMENTS

| | | |
|---|---|---|
| 5,315,142 A | 5/1994 | Acovic et al. |
| 5,319,753 A | 6/1994 | MacKenna et al. |
| 5,328,810 A | 7/1994 | Lowrey et al. |
| 5,398,205 A | 3/1995 | Yamaguchi |
| 5,405,794 A | 4/1995 | Kim |
| 5,408,116 A | 4/1995 | Tanaka et al. |
| 5,502,320 A | 3/1996 | Yamada |
| 5,514,885 A | 5/1996 | Myrick |
| 5,578,850 A | 11/1996 | Fitch et al. |
| 5,677,210 A | 10/1997 | Park et al. |
| 5,679,591 A | 10/1997 | Lin et al. |
| 5,905,285 A | 5/1999 | Gardner et al. |
| 5,981,333 A | 11/1999 | Parekh et al. |
| 6,004,862 A | 12/1999 | Kim et al. |
| 6,071,789 A | 6/2000 | Yang et al. |
| 6,140,172 A | 10/2000 | Parekh |
| 6,229,169 B1 | 5/2001 | Hofmann et al. |
| 6,291,334 B1 | 9/2001 | Somekh |
| 6,297,554 B1 | 10/2001 | Lin |
| 6,319,782 B1 | 11/2001 | Nakabayashi |
| 6,340,614 B1 | 1/2002 | Tseng |
| 6,548,396 B2 | 4/2003 | Naik et al. |
| 6,551,878 B2 | 4/2003 | Clampitt et al. |
| 6,573,030 B1 | 6/2003 | Fairbairn et al. |
| 6,627,933 B2 | 9/2003 | Juengling |
| 6,707,092 B2 | 3/2004 | Sasaki |
| 6,709,807 B2 | 3/2004 | Hallock et al. |
| 6,713,392 B1 | 3/2004 | Ngo et al. |
| 6,734,063 B2 | 5/2004 | Willer et al. |
| 6,734,107 B2 | 5/2004 | Lai et al. |
| 6,737,333 B2 | 5/2004 | Chen et al. |
| 6,777,725 B2 | 8/2004 | Willer et al. |
| 6,900,521 B2 | 5/2005 | Forbes et al. |
| 6,936,507 B2 | 8/2005 | Tang et al. |
| 7,109,544 B2 | 9/2006 | Schloesser et al. |
| 7,176,109 B2 | 2/2007 | Ping et al. |
| 7,241,658 B2 | 7/2007 | Forbes |
| 7,391,070 B2 | 6/2008 | Juengling |
| 2001/0040273 A1* | 11/2001 | Hueting et al. ............. 257/623 |
| 2002/0001960 A1 | 1/2002 | Wu et al. |
| 2002/0004298 A1 | 1/2002 | Sugahara et al. |
| 2002/0094622 A1 | 7/2002 | Sneelal et al. |
| 2002/0125536 A1 | 9/2002 | Iwasa et al. |
| 2002/0130686 A1 | 9/2002 | Forbes |
| 2002/0135029 A1 | 9/2002 | Ping et al. |
| 2003/0008461 A1 | 1/2003 | Forbes et al. |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0109102 A1 | 6/2003 | Kujirai et al. |
| 2003/0129001 A1 | 7/2003 | Kisu et al. |
| 2003/0164513 A1 | 9/2003 | Ping et al. |
| 2003/0203564 A1 | 10/2003 | McQueen et al. |
| 2003/0207207 A1 | 11/2003 | Li |
| 2003/0218199 A1 | 11/2003 | Forbes et al. |
| 2003/0230234 A1 | 12/2003 | Nam et al. |
| 2003/0235076 A1 | 12/2003 | Forbes |
| 2004/0000534 A1 | 1/2004 | Lipinski |
| 2004/0033646 A1* | 2/2004 | Tang et al. ............. 438/142 |
| 2004/0036095 A1 | 2/2004 | Brown et al. |
| 2005/0079662 A1 | 4/2005 | Miki |
| 2005/0151206 A1 | 7/2005 | Schwerin |
| 2005/0207264 A1 | 9/2005 | Hsieh et al. |
| 2006/0022248 A1 | 2/2006 | Fischer et al. |
| 2006/0028859 A1 | 2/2006 | Forbes |
| 2006/0046407 A1 | 3/2006 | Juengling |
| 2006/0278911 A1 | 12/2006 | Eppich |

FOREIGN PATENT DOCUMENTS

| | | |
|---|---|---|
| DE | 199 28 781 C1 | 7/2000 |
| WO | WO 01/01489 A1 | 1/2001 |
| WO | WO 2002/099864 A1 | 12/2002 |
| WO | WO 2004/073044 A2 | 8/2004 |
| WO | WO 2005/119741 A3 | 12/2005 |
| WO | WO 2006/028777 A1 | 3/2006 |

OTHER PUBLICATIONS

Yan R-H et al., "Scaling the Si MOSFET: From Bulk to SOI to Bulk", IEEE Transactions on Electron Devices USA; vol. 39, No. 7, Jul. 1992, pp. 1704-1710.

Sakao M. et al., "A Straight-Line-Trench Isolation and Trench-Gate Transistor (SLIT) Cell for Giga-bit DRAMs", Proceedings of IEEE VLSI Technology Symposium May 17-19, 1993 Kyoto, Japan, May 17, 1993, pp. 19-20.

U.S. Appl. No. 10/933,062, filed Sep. 1, 2004.

U.S. Appl. No. 10/934,778, filed Sep. 2, 2004.

Bergeron, et al., "Resolution Enhancement Techniques for the 90nm Technology Node and Beyond", Future Fab International, Issue 15,4 pages, Jul. 11, 2003.

Bhave et al., "Developer-soluble Gap fill materials for patterning metal trenches in Via-first Dual Damascene process", preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines", J. Vac.Sci. Technol. B21(4), Jul./Aug. 2003, pp. 1491-1495.

Chung et al., "Nanoscale Multi-Line Patterning Using Sidewall Structure", Jpn., J.App.. Phys. vol. 41 (2002) Pt. 1, No. 6B,pp. 4410-4414.

Joubert et al., "Nanometer scale linewidth control during etching of polysilicon gates in high-density plasmas", Microelectronic Engineering 69 (2003), pp. 350-357.

Oehrlein et al., "Pattern transfer into low dielectric materials by high-density plasma etching", Solid State Tech., May 2000, 8 pages.

Schloesser et al., "Highly Scalable Sub-50nm Vertical Double Gate Trench DRAM Cell", Memory Development Center, Infineon Tech., 2004, 4 pages.

* cited by examiner

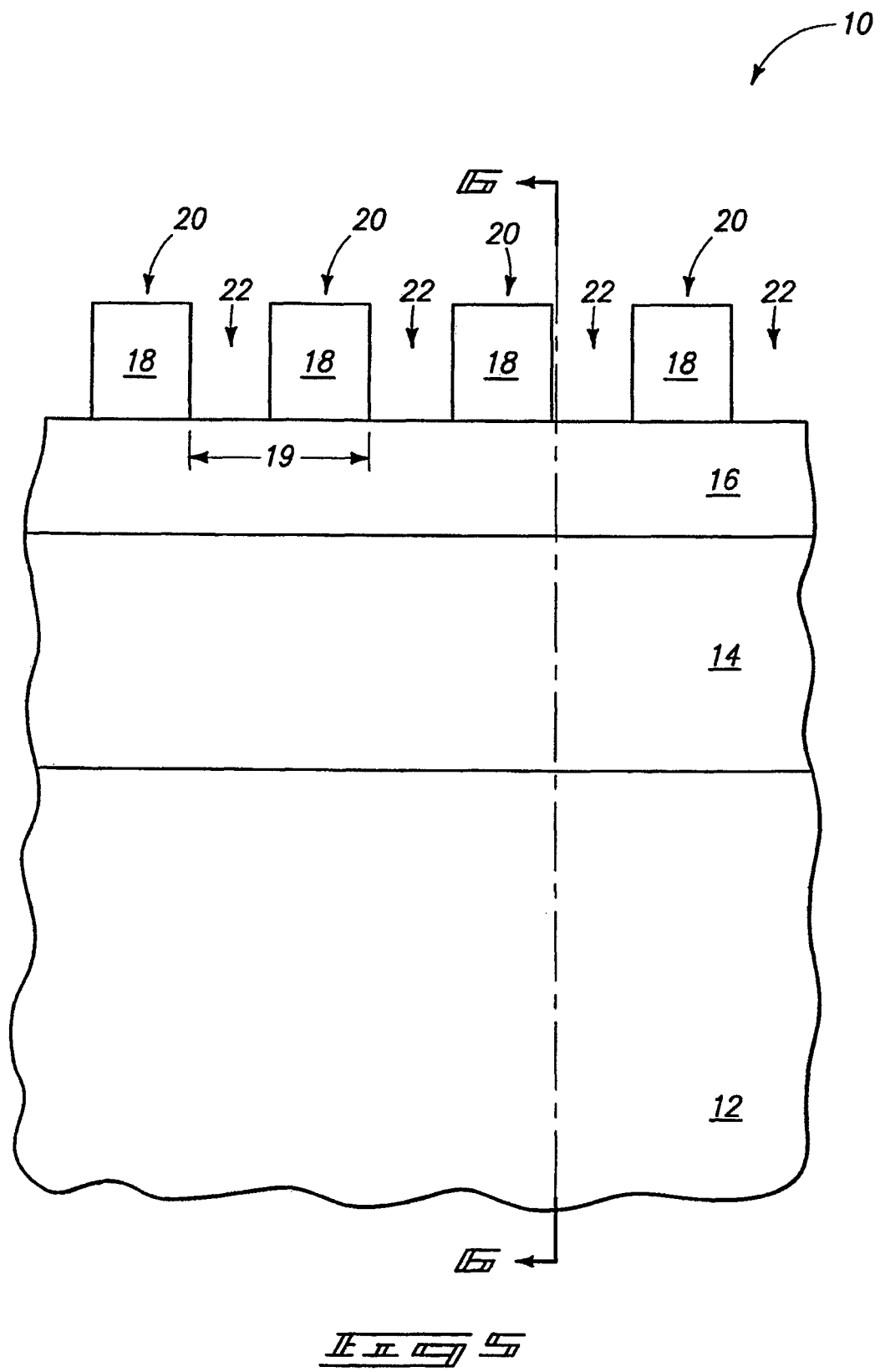

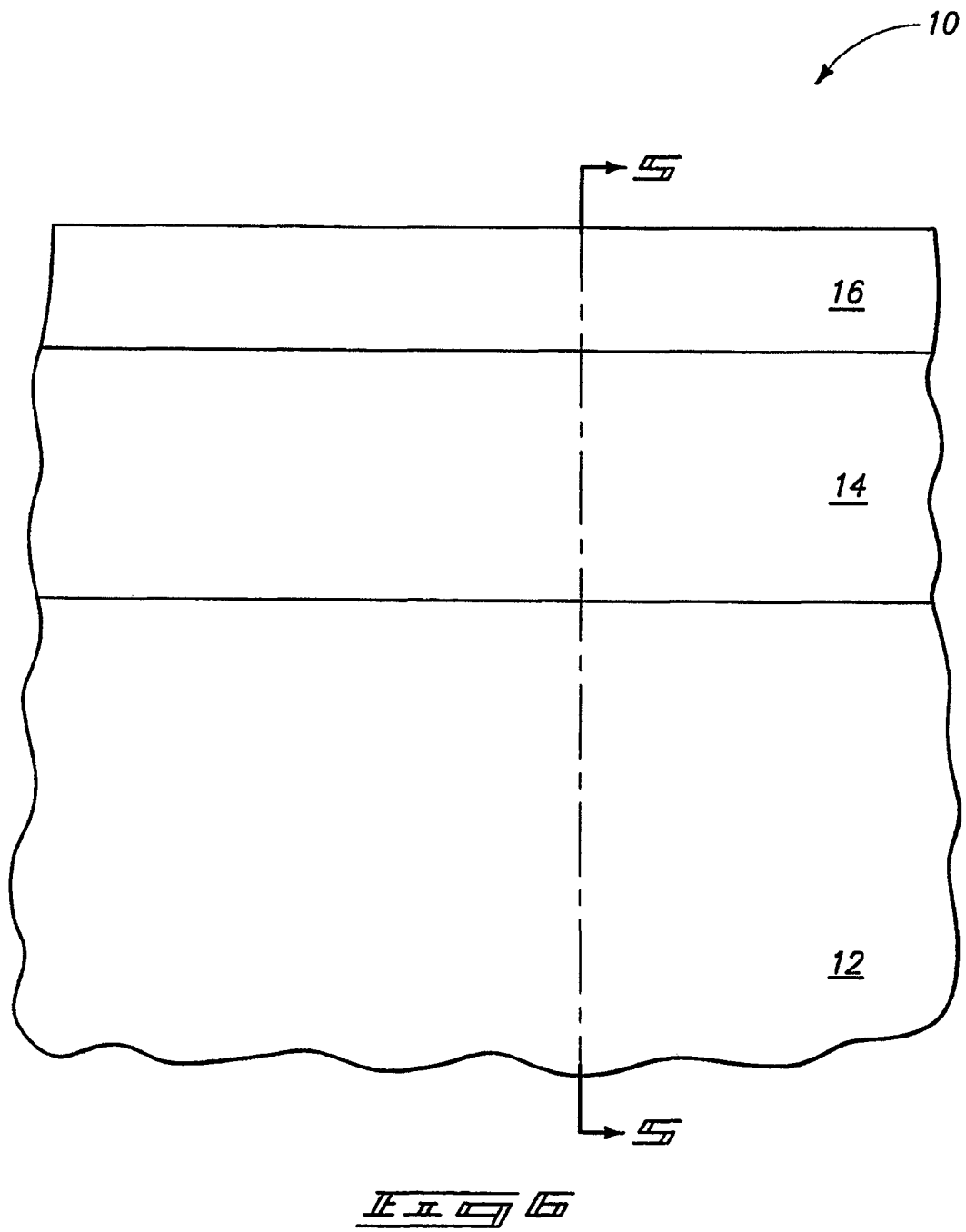

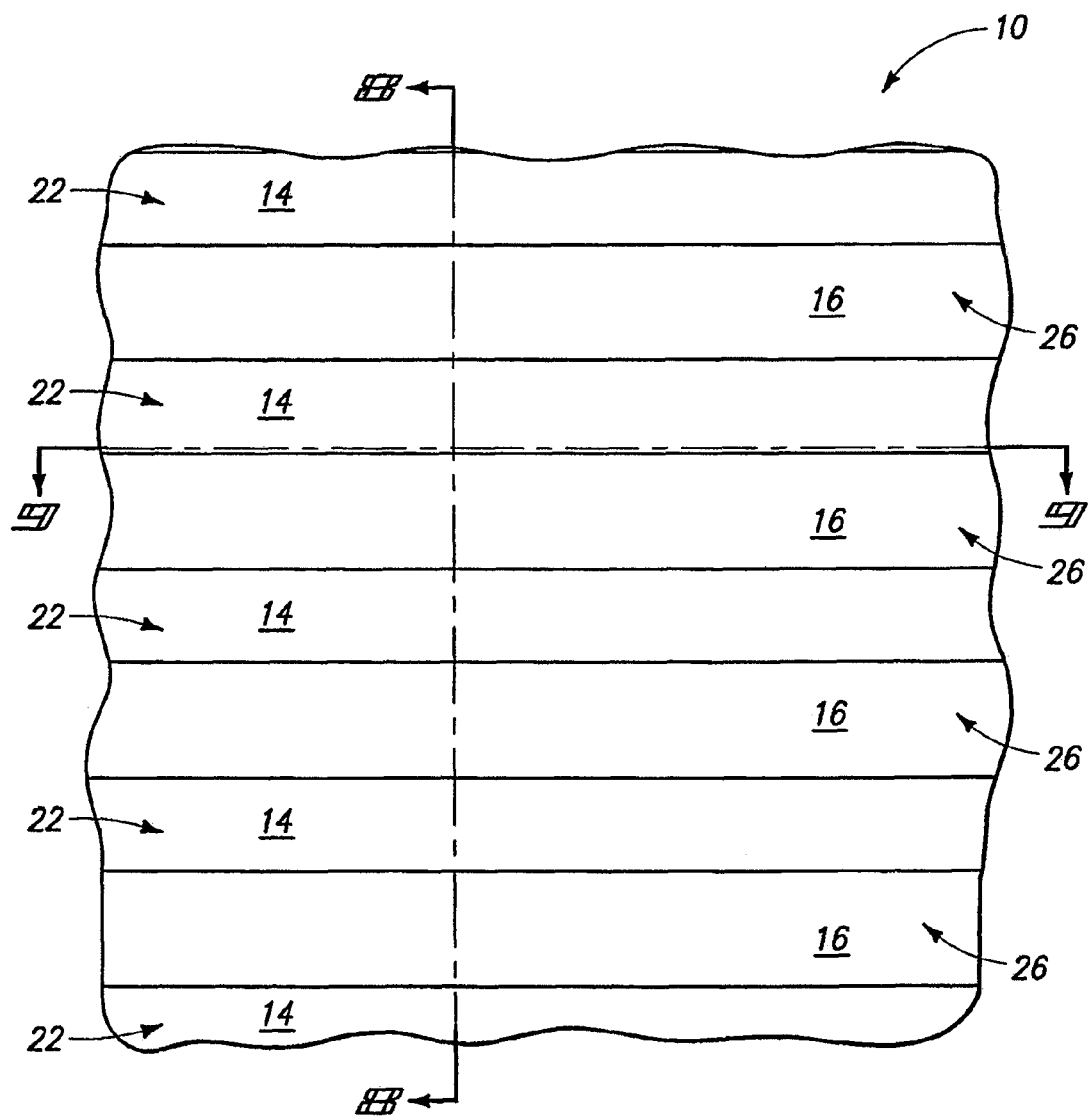
$F_{I\!I\!I\!J}$ 7

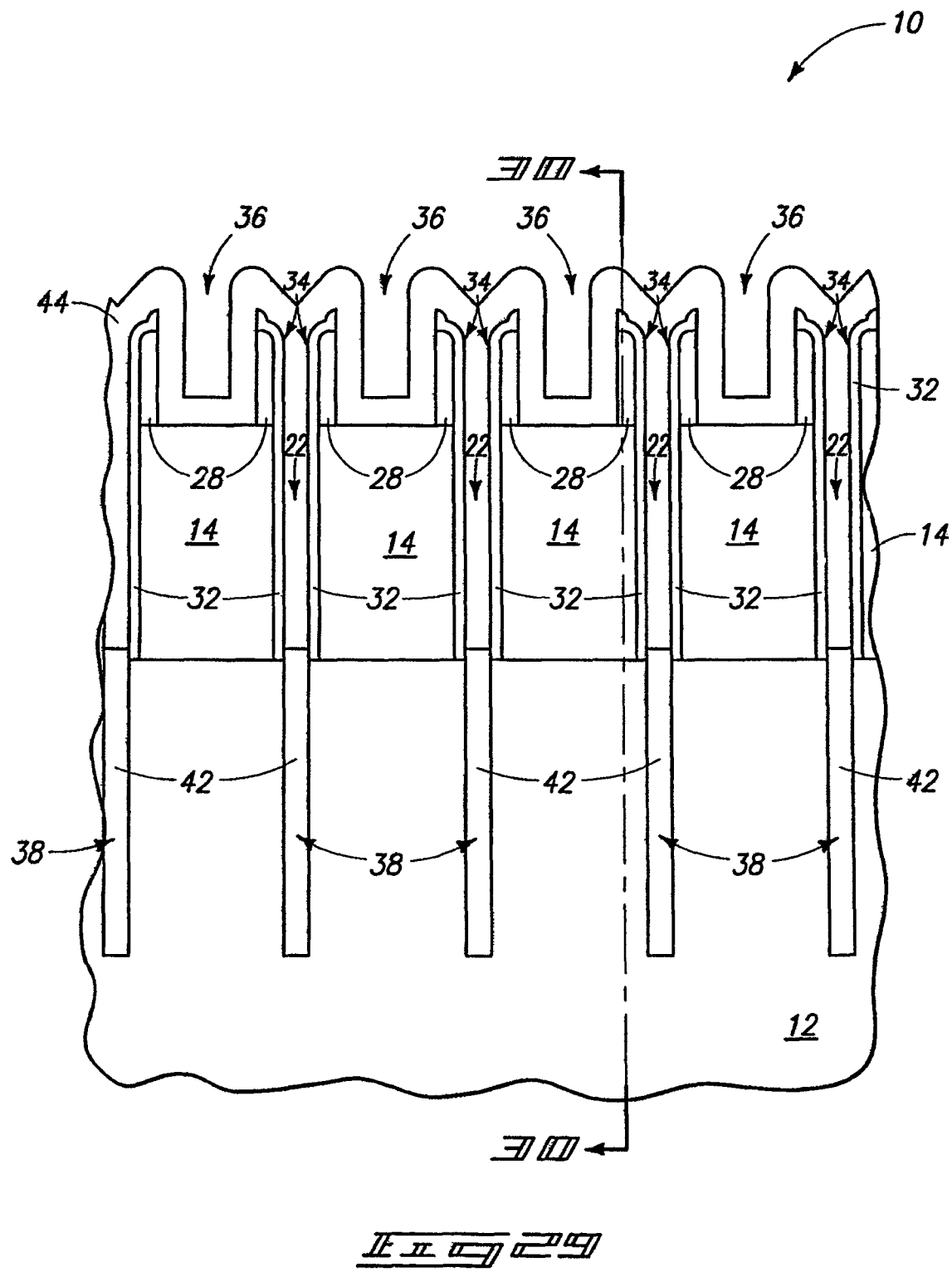
F I G 29

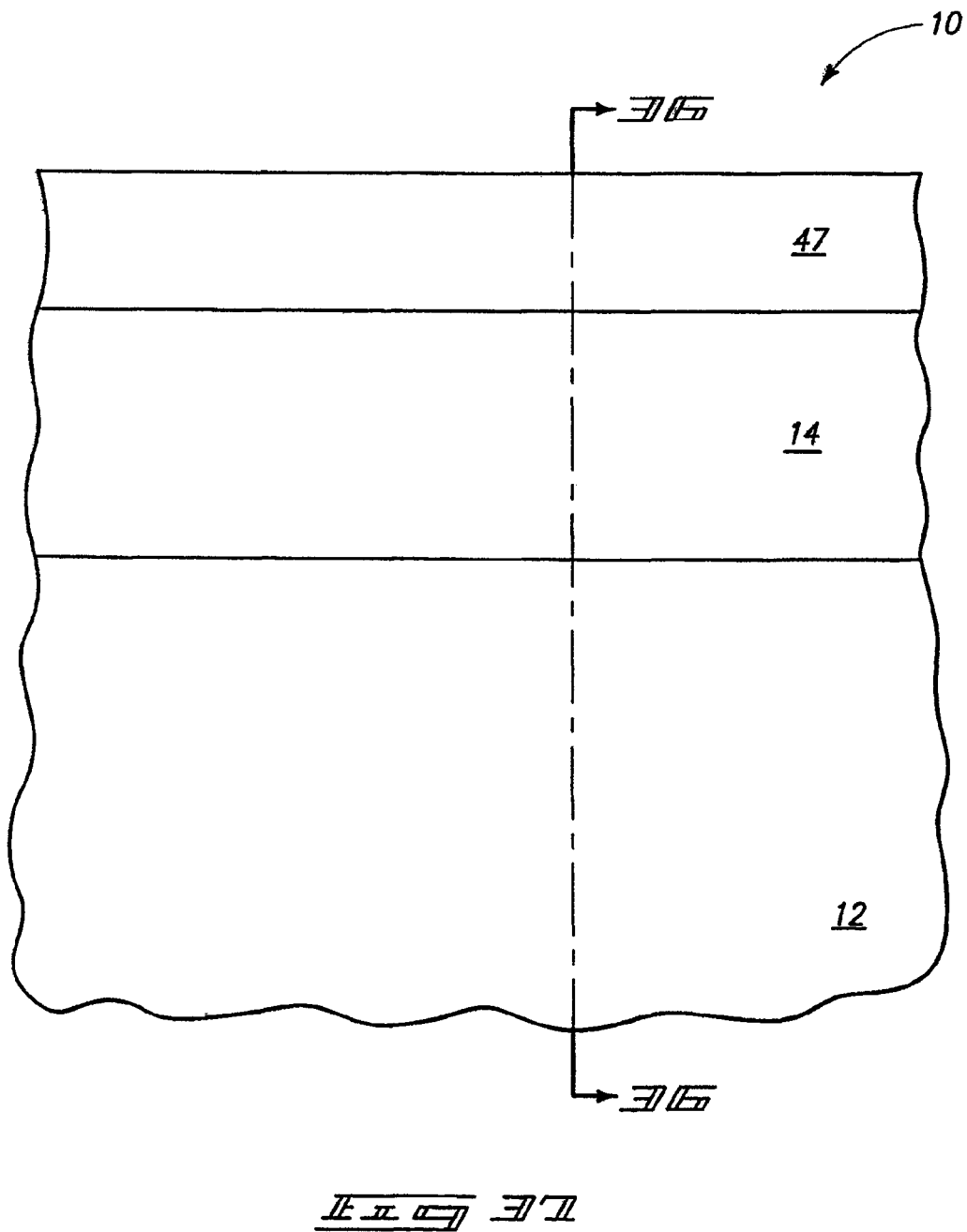
_FIG 37_

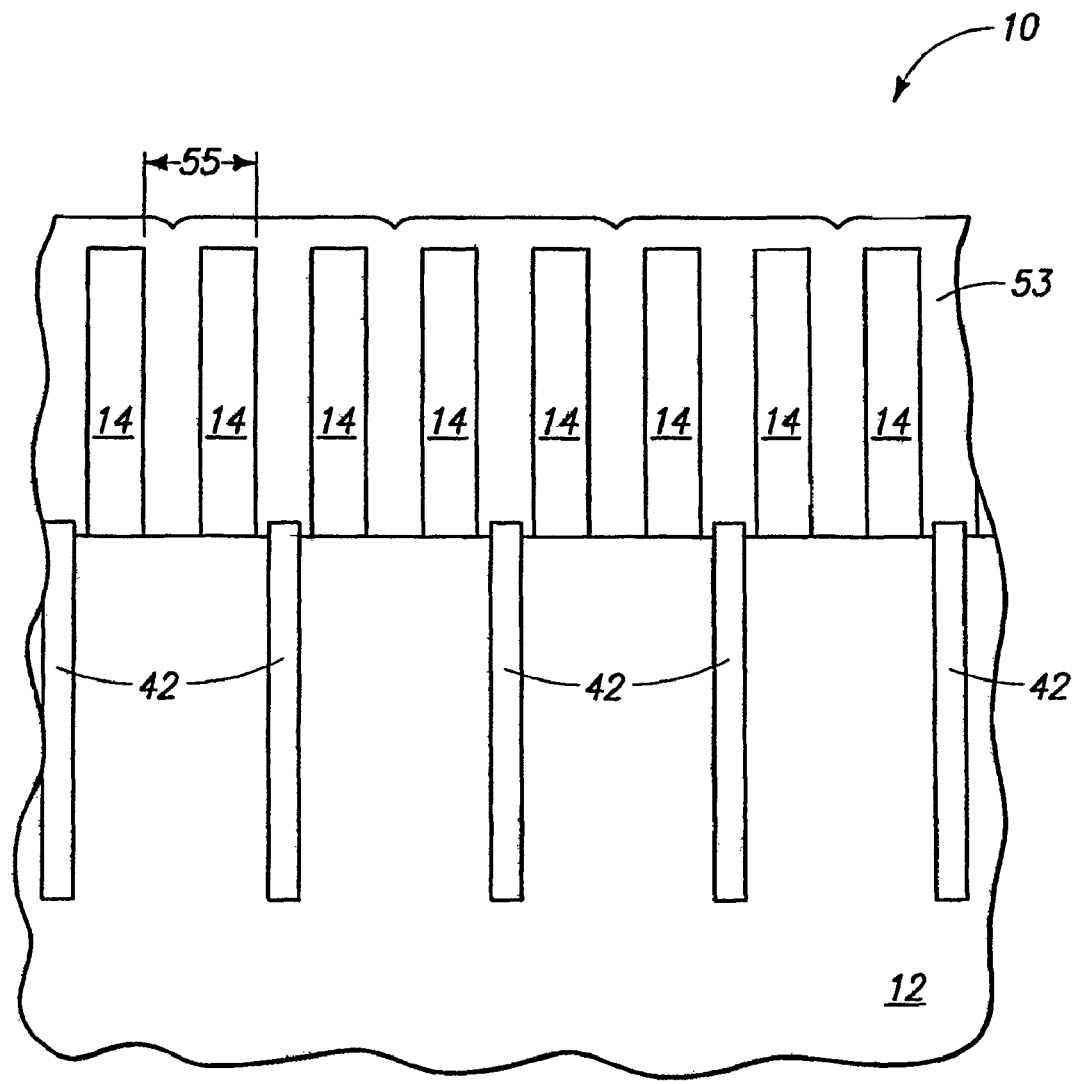
F I G 44

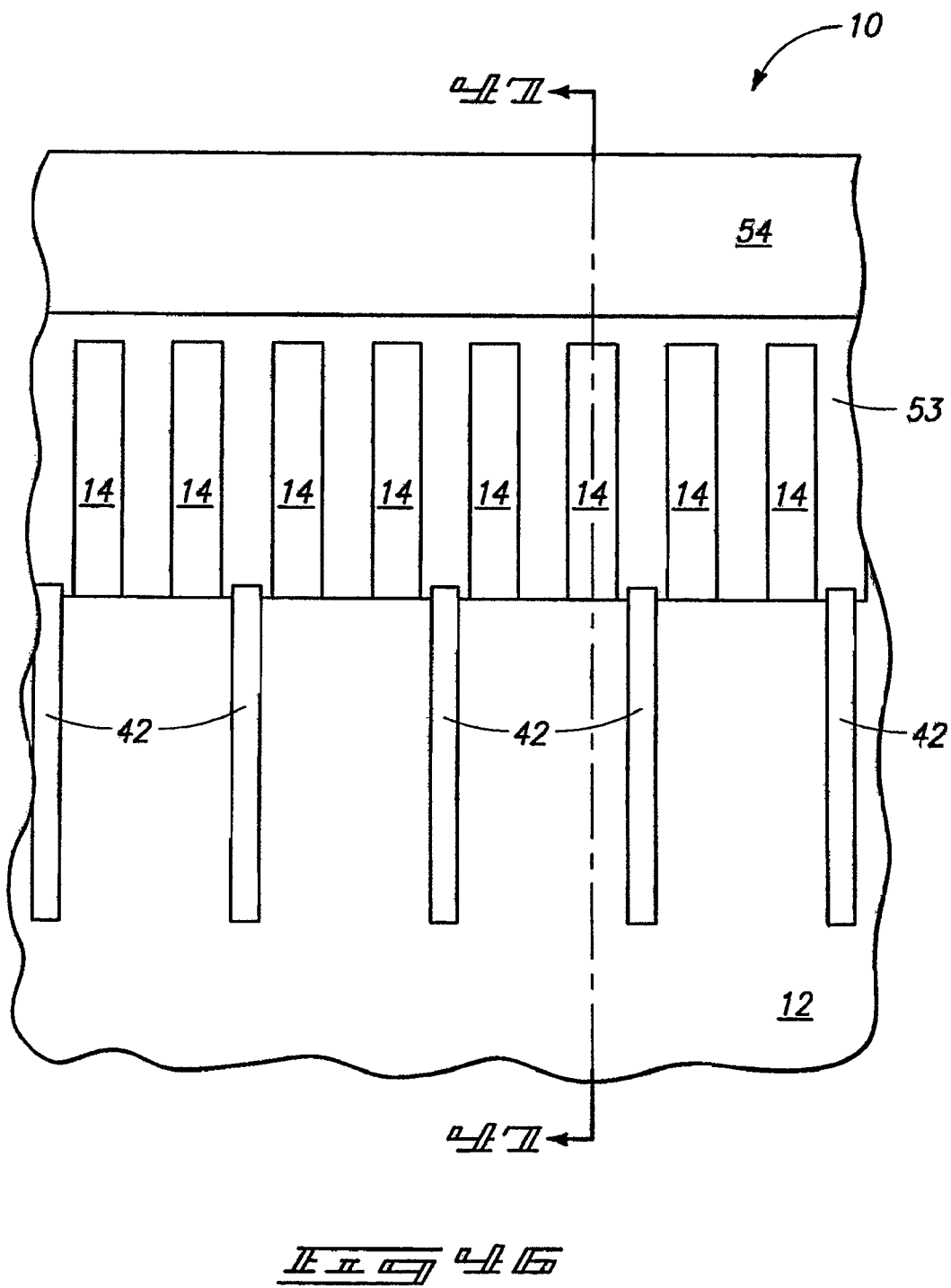
_Fig 46_

$\text{Fig 47}$

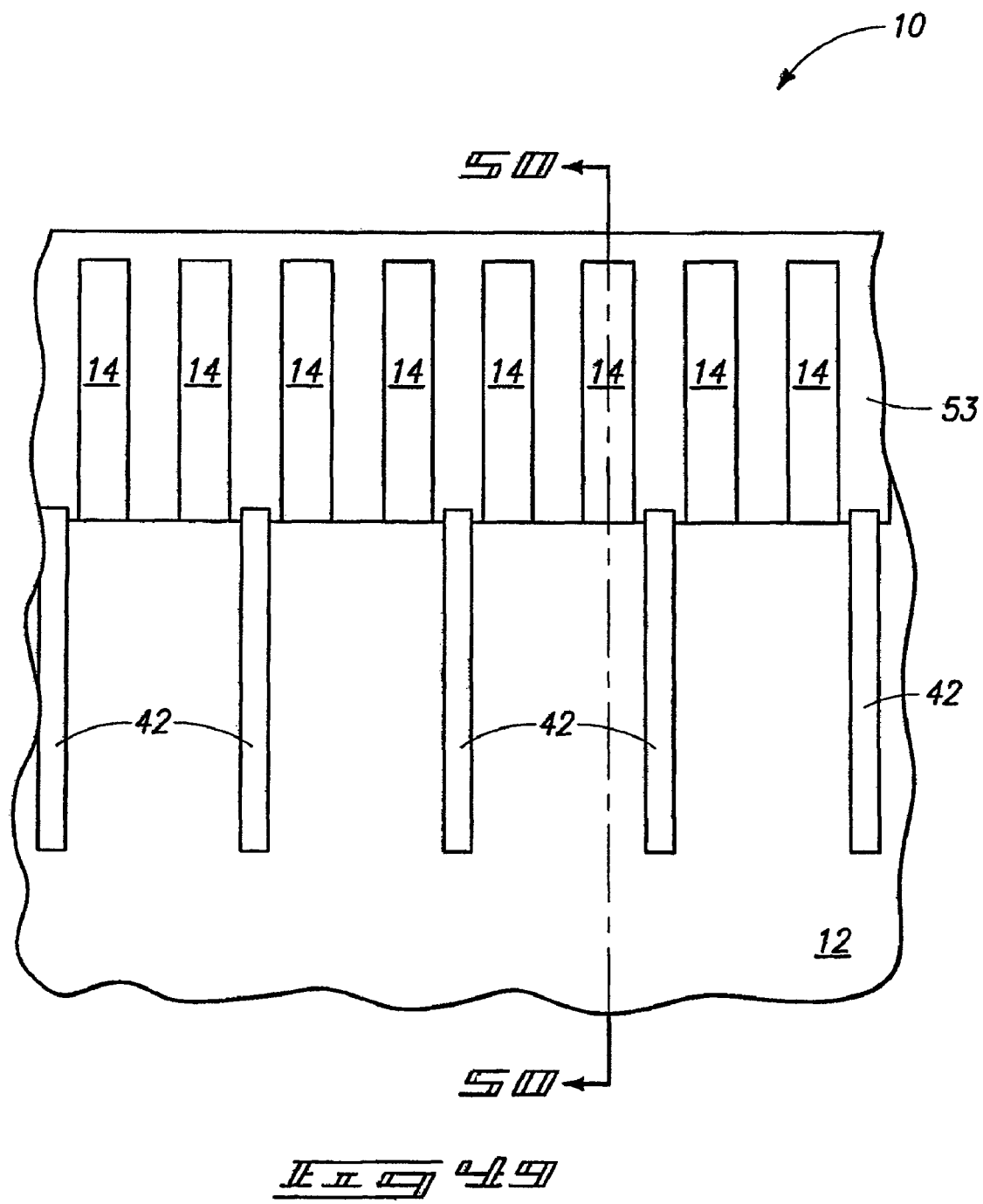
F I G 49

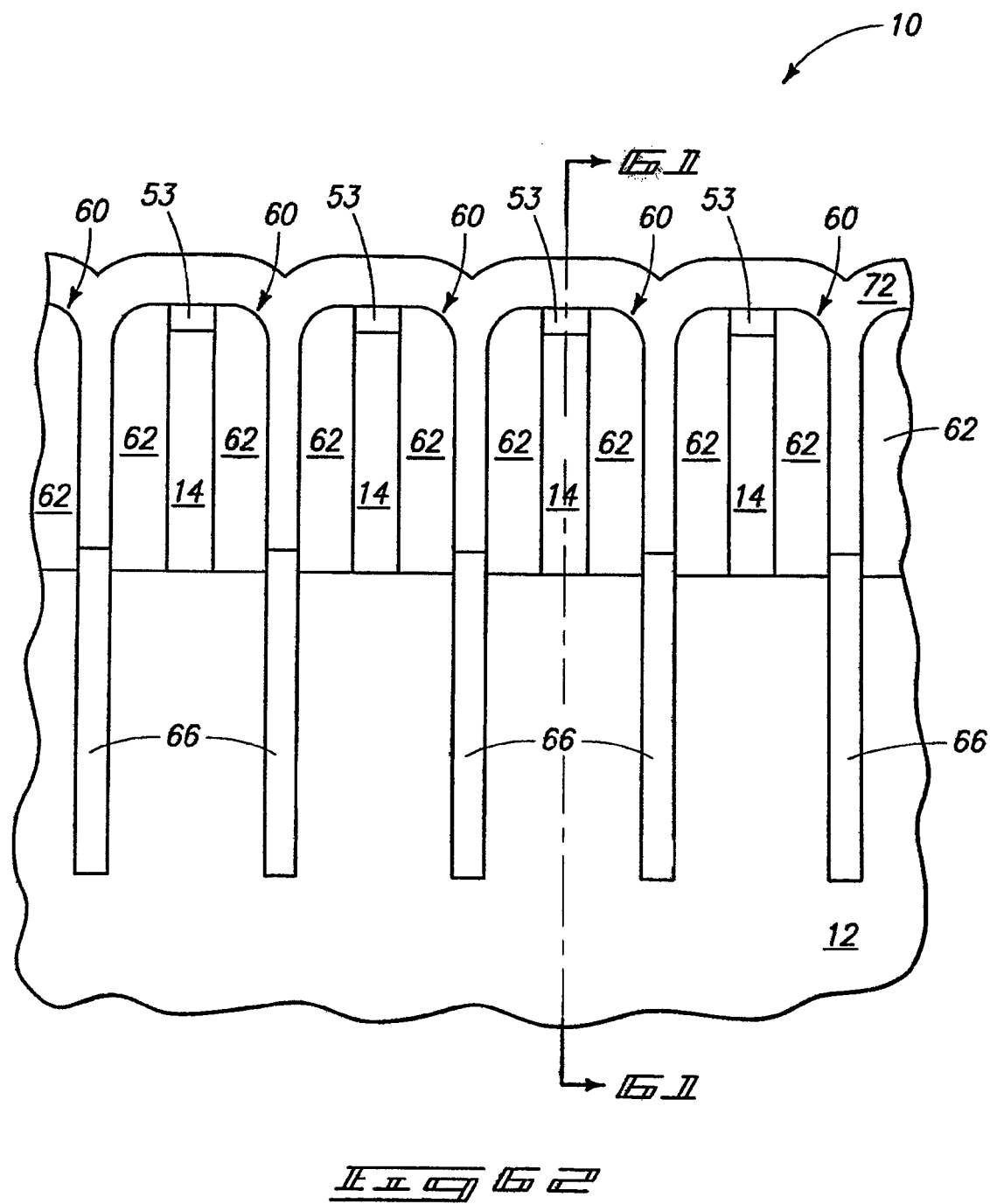
F I G 6 2

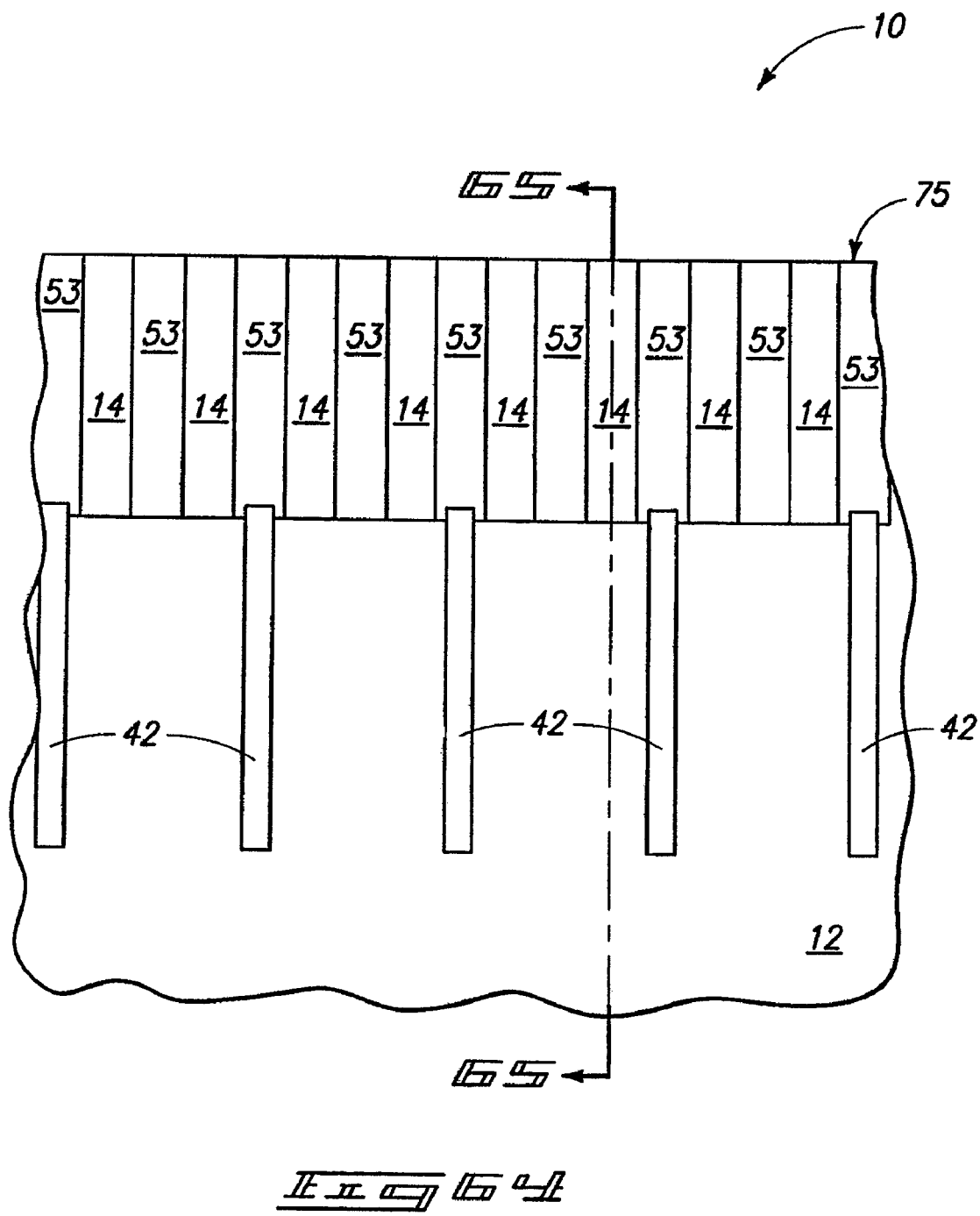
F I G 64

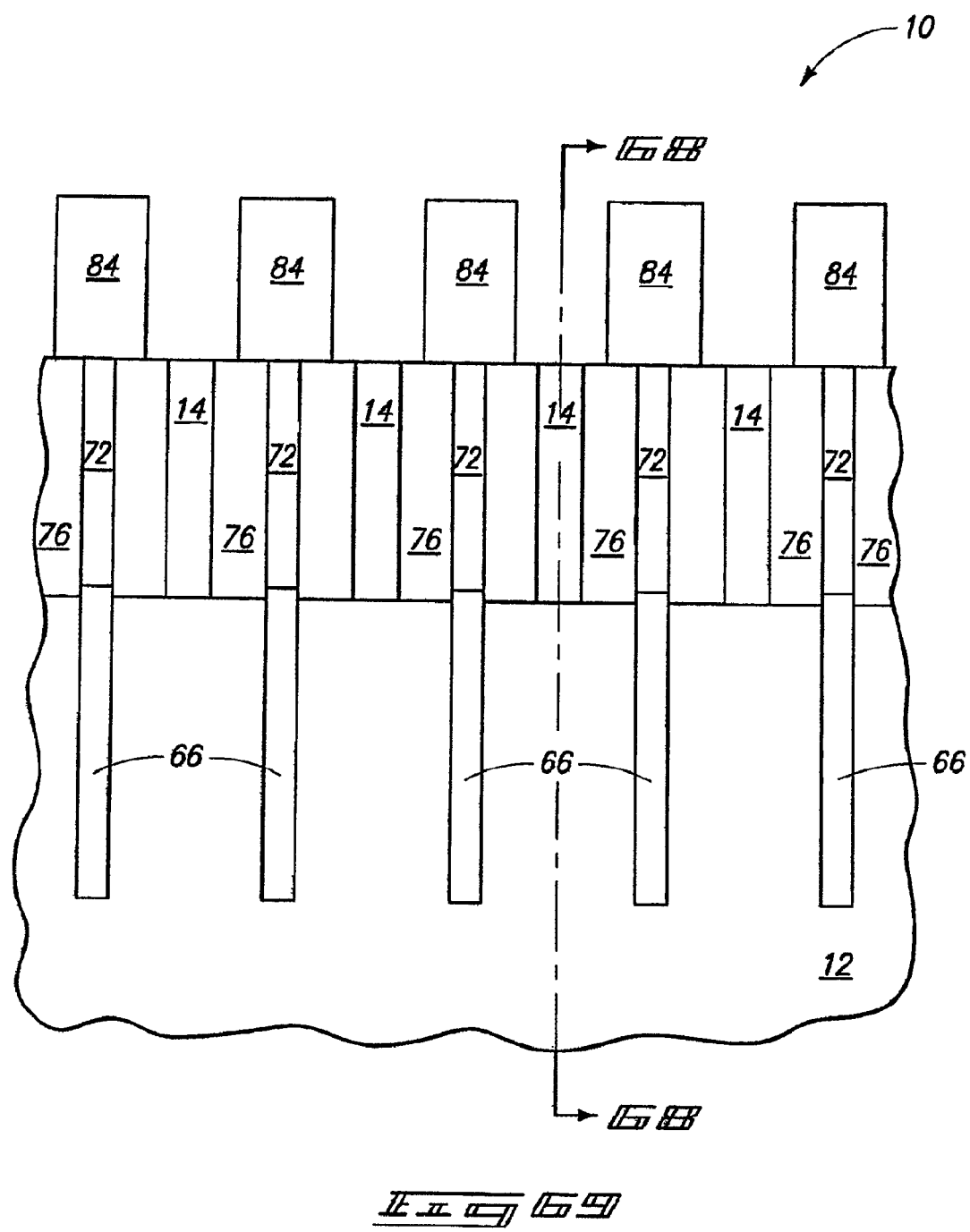
_Fig 69_

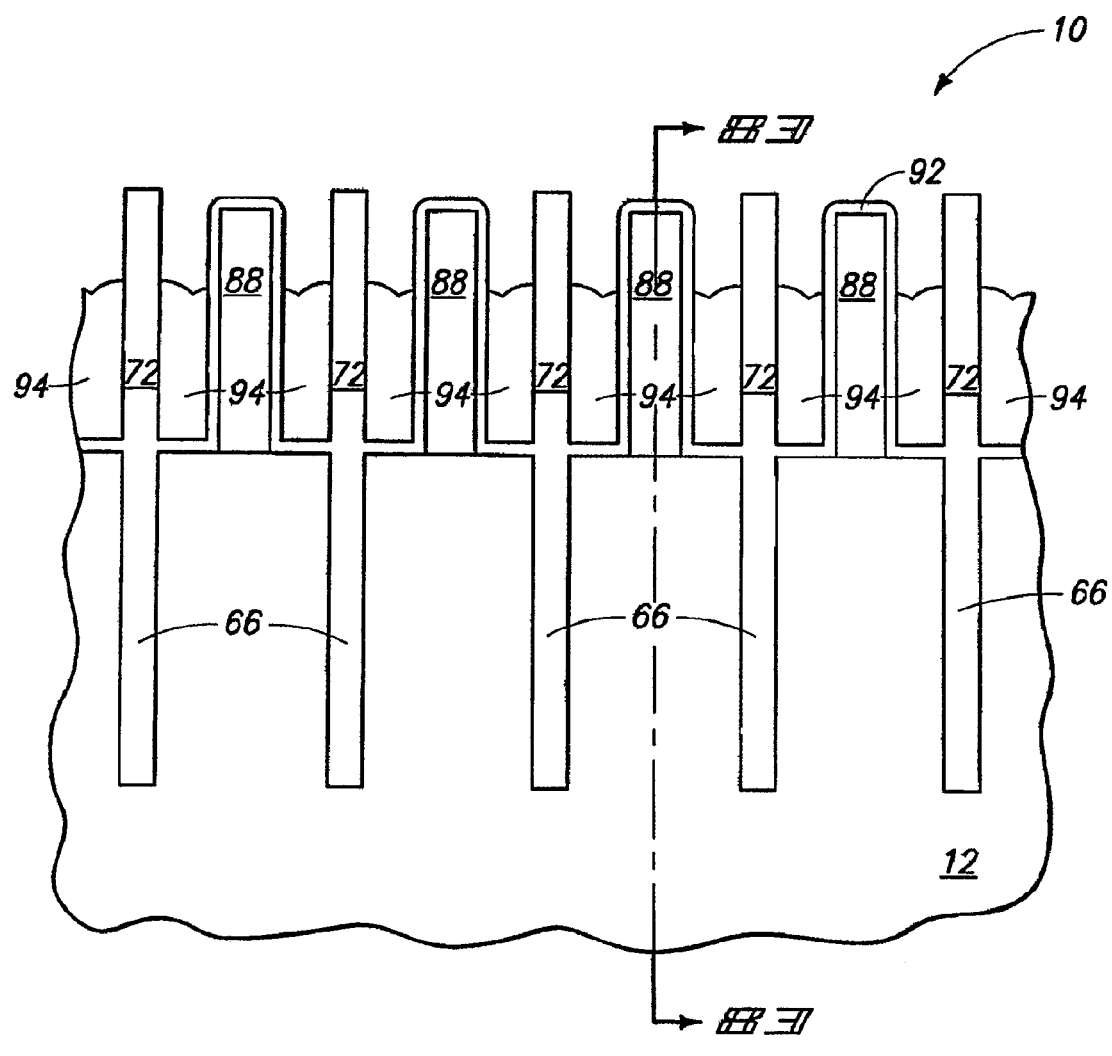
F I G 84

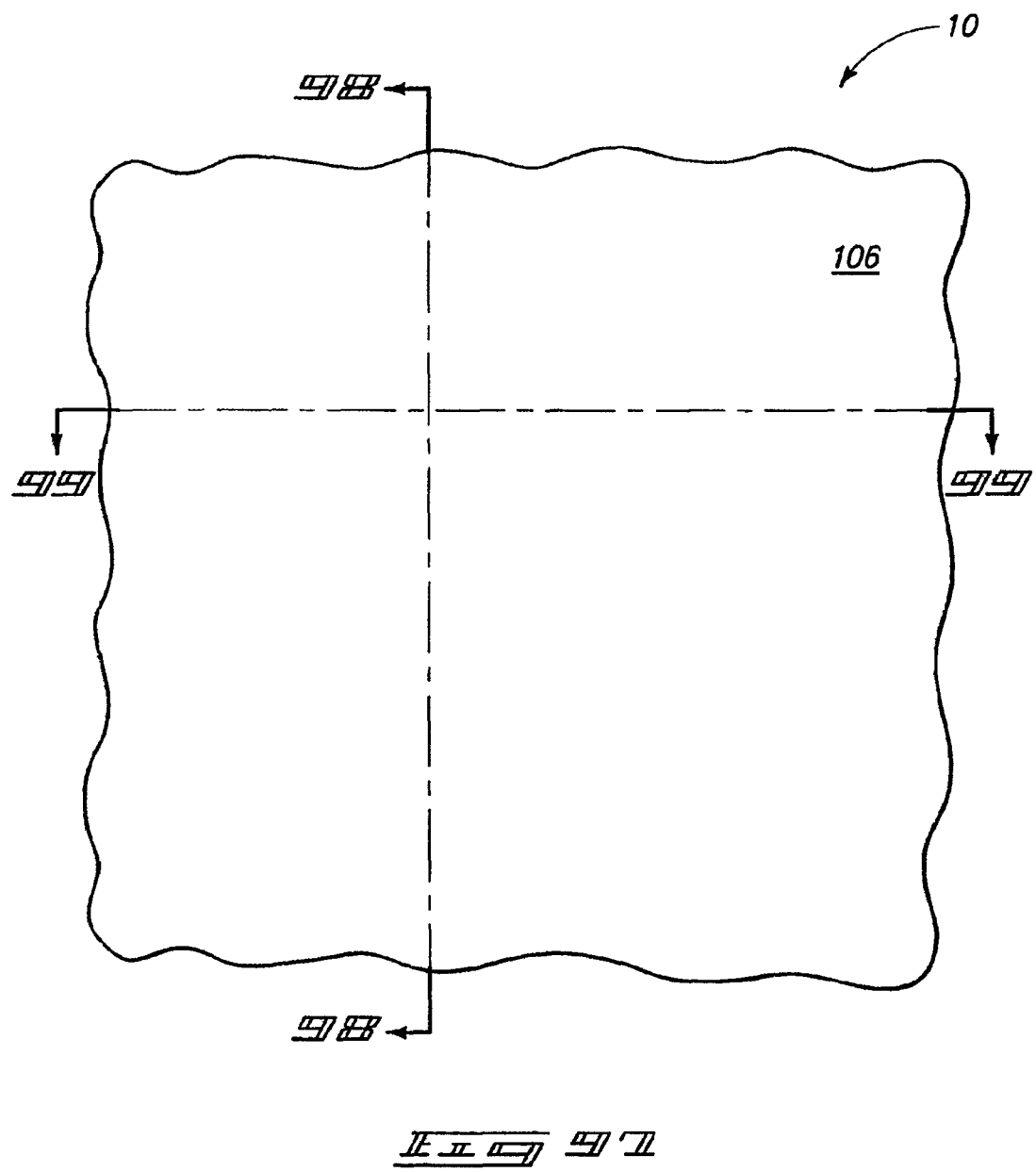
_Fig 97_

$F\!I\!G\ 108$

SEMICONDUCTOR STRUCTURE INCLUDING GATELINE SURROUNDING SOURCE AND DRAIN PILLARS

This application is a divisional of U.S. patent application Ser. No. 11/201,824 (filed 10 Aug. 2005), which is a divisional of U.S. patent application Ser. No. 10/855,429 (filed 26 May 2004). The entire disclosure of both of these priority applications is hereby incorporated by reference herein.

TECHNICAL FIELD

The invention pertains to semiconductor structures, memory device constructions, and methods for forming semiconductor structures.

BACKGROUND OF THE INVENTION

A continuing goal of semiconductor device application is to increase the level of device integration, or in other words to increase the density of devices across a supporting substrate. Methods for increasing the density can include decreasing the size of individual devices, and/or increasing the packing density of the devices (i.e., reducing the amount of space between adjacent devices). In order to develop higher levels of integration, it is desired to develop new device constructions which can be utilized in semiconductor applications, and to develop new methods for fabricating semiconductor device constructions.

A relatively common semiconductor device is a memory device, with a dynamic random access memory (DRAM) cell being an exemplary memory device. A DRAM cell comprises a transistor and a memory storage structure, with a typical memory storage structure being a capacitor. Modern applications for semiconductor devices can utilize vast numbers of DRAM unit cells. It would therefore be desirable to develop new semiconductor device constructions applicable for utilization in DRAM structures, and it would also be desirable to develop new methods for fabricating DRAM structures.

Although the invention was motivated from the perspective of improving DRAM structures and methods of forming such structures, the invention is not to be limited to such aspects. Rather, the invention is only limited by the accompanying claims as literally worded, without interpretive or other limiting reference to the specification and drawings, and in accordance with the doctrine of equivalents.

SUMMARY OF THE INVENTION

In one aspect, the invention encompasses a method of forming a semiconductor structure. A semiconductor substrate is provided, and first and second materials are formed over the substrate. The first and second materials are selectively etchable relative to one another. The first material is formed to be a lattice, and the second material is formed to be repeating regions spaced from one another by segments of the lattice. The repeating regions form an array. The array has a defined first pitch along a first axis and a defined second pitch along a second axis substantially orthogonal to the first axis. The second pitch is about twice as big as the first pitch. At least some of the first material of the lattice is replaced with one or more conductive materials of a gateline, and at least some of the second material is replaced with doped semiconductor material to form vertically-extending source/drain regions.

In one aspect, the invention encompasses a semiconductor structure. The structure includes a semiconductor substrate and a gateline lattice over the substrate. The lattice defines an array of non-gateline regions spaced from one another by segments of the lattice. The array has a defined first pitch along a first axis and a defined second pitch along a second axis substantially orthogonal to the first axis. The second pitch is about twice as big as the first pitch. The non-gateline regions comprise vertically-extending source/drain regions.

In one aspect, the invention encompasses a memory device construction. The construction includes a semiconductor substrate, and a gateline over the substrate. The construction further includes a pair of vertically-extending source/drain regions over the substrate and at least partially surrounded by the gateline. One of the source/drain regions is a first source/drain region and consists essentially of conductively-doped epitaxial silicon, and the other source/drain region is a second source/drain region which consists essentially of conductively-doped silicon which is not epitaxial. The source/drain regions are gatedly connected to one another through the gateline. A memory storage device is electrically connected to either the first source/drain region or the second source/drain region. A digit line is electrically connected to whichever of the first and second source/drain regions is not electrically connected to the memory storage device.

BRIEF DESCRIPTION OF THE DRAWINGS

Preferred embodiments of the invention are described below with reference to the following accompanying drawings.

FIGS. 2 and 3 are along the lines 2-2 and 3-3, respectively, of FIG. 1; FIG. 3 is along the line 3-3 of FIG. 2; and FIG. 2 is along the line 2-2 of FIG. 3.

FIGS. 4-6 are a diagrammatic, fragmentary top view and cross-sectional side views, respectively, of the fragments of FIGS. 1-3, shown at a processing stage subsequent to that of FIGS. 1-3. FIGS. 5 and 6 are along the lines 5-5 and 6-6 of FIG. 4, respectively; FIG. 6 is along the line 6-6 of FIG. 5; and FIG. 5 is along the line 5-5 of FIG. 6.

FIGS. 7-9 are a fragmentary, diagrammatic top view and cross-sectional side views of the construction of FIGS. 1-3 shown at a processing stage subsequent to that of FIGS. 4-6. FIGS. 8 and 9 are along the lines 8-8 and 9-9, respectively, of FIG. 7; FIG. 9 is along the line 9-9 of FIG. 8; and FIG. 8 is along the line 8-8 of FIG. 9.

FIGS. 11 and 12 are along the lines 11-11 and 12-12, respectively, of FIG. 10; FIG. 12 is along the line 12-12 of FIG. 11; and FIG. 11 is along the line 11-11 of FIG. 12.

FIGS. 14 and 15 are along the lines 14-14 and 15-15 of FIG. 13; FIG. 15 is along the line 15-15 of FIG. 14; and FIG. 14 is along the line 14-14 of FIG. 15.

FIGS. 17 and 18 are along the lines 17-17 and 18-18, respectively, of FIG. 16; FIG. 18 is along the line 18-18 of FIG. 17; and FIG. 17 is along the line 17-17 of FIG. 18.

FIGS. 20 and 21 are along the lines 20-20 and 21-21, respectively, of FIG. 19; FIG. 21 is along the line 21-21 of FIG. 20; and FIG. 20 is along the line 20-20 of FIG. 21.

FIGS. 23 and 24 are along the lines 23-23 and 24-24 of FIG. 22; FIG. 24 is along the line 24-24 of FIG. 23; and FIG. 23 is along the line 23-23 of FIG. 24.

FIGS. 26 and 27 are along the lines 26-26 and 27-27, respectively, of FIG. 25; FIG. 27 is along the line 27-27 of FIG. 26; and FIG. 26 is along the line 26-26 of FIG. 27.

FIGS. 28-30 are a fragmentary, diagrammatic top view and cross-sectional side views of the construction of FIGS. 1-3 shown at a processing stage subsequent to that of FIGS. 24-26. FIGS. 29 and 30 are along the lines 29-29 and 30-30 of FIG. 28; FIG. 30 is along the line 30-30 of FIG. 29; and FIG. 29 is along the line 29-29 of FIG. 30.

FIGS. 32 and 33 are along the lines 32-32 and 33-33, respectively, of FIG. 31; FIG. 33 is along the line 33-33 of FIG. 32; and FIG. 32 is along the line 32-32 of FIG. 33.

FIGS. 35-37 are a fragmentary, diagrammatic top view and cross-sectional side views of the construction of FIGS. 1-3 shown at a processing stage subsequent to that of FIGS. 31-33. FIGS. 36 and 37 are along the lines 36-36 and 37-37, respectively, of FIG. 35; FIG. 37 is along the line 37-37 of FIG. 36; and FIG. 36 is along the line 36-36 of FIG. 37.

FIGS. 39 and 40 are along the lines 39-39 and 40-40 of FIG. 38; FIG. 40 is along the line 40-40 of FIG. 39; and FIG. 39 is along the line 39-39 of FIG. 40.

FIGS. 42 and 43 are along the lines 42-42 and 43-43 of FIG. 41; FIG. 43 is along the line 43-43 of FIG. 42; and FIG. 42 is along the line of 42-42 of FIG. 43.

FIG. 44 is a diagrammatic view of the construction of FIG. 43 where structures which would typically have the same composition are shown merged with one another. The representation of FIG. 44 will be utilized in the figures that follow FIG. 44.

FIGS. 45-47 are a fragmentary, diagrammatic top view and cross-sectional side views of the construction of FIGS. 1-3 shown at a processing stage subsequent to that of FIGS. 41-43. FIGS. 46 and 47 are along the lines 46-46 and 47-47 of FIG. 45; FIG. 47 is along the line 47-47 of FIG. 46; and FIG. 46 is along the line 46-46 of FIG. 47.

FIGS. 48-50 are a fragmentary, diagrammatic top view and cross-sectional side views of the construction of FIGS. 1-3 shown at a processing stage subsequent to that of FIGS. 45-47. FIGS. 49 and 50 are along the lines of 49-49 and 50-50 of FIG. 48; FIG. 50 is along the line of 50-50 of FIG. 49; and FIG. 49 is along the line of 49-49 of FIG. 50.

FIGS. 52 and 53 are along the lines 52-52 and 53-53 of FIG. 51; FIG. 53 is along the line 53-53 of FIG. 52; and FIG. 52 is along the line 52-52 of FIG. 53.

FIGS. 55 and 56 are along the lines 55-55 and 56-56 of FIG. 54; FIG. 56 is along the line 56-56 of FIG. 55; and FIG. 55 is along the line 55-55 of FIG. 56.

FIGS. 58 and 59 are along the lines 58-58 and 59-59 of FIG. 57; FIG. 59 is along the line 59-59 of FIG. 58; and FIG. 58 is along the line 58-58 of FIG. 59.

FIGS. 60-62 are a diagrammatic, fragmentary top view and cross-sectional side views of the construction of FIGS. 1-3 shown at a processing stage subsequent to that of FIGS. 57-59. FIGS. 61 and 62 are along the lines 61-61 and 62-62 of FIG. 60; FIG. 62 is along the line 62-62 of FIG. 61; and FIG. 61 is along the line 61-61 of FIG. 62.

FIGS. 63-65 are a diagrammatic, fragmentary top view and cross-sectional side views of the construction of FIGS. 1-3 shown at a processing stage subsequent to that of FIGS. 60-62. FIGS. 64 and 65 are along the lines 64-64 and 65-65 of FIG. 63; FIG. 65 is along the lines 65-65 of FIG. 64; and FIG. 64 is along the line 64-64 of FIG. 65.

FIGS. 67-69 are a diagrammatic, fragmentary top view and cross-sectional side views of the construction of FIGS. 1-3 shown at a processing stage subsequent to that of FIGS. 63-65. FIGS. 68 and 69 are along the lines 68-68 and 69-69 of FIG. 67; FIG. 69 is along the line 69-69 of FIG. 68; and FIG. 68 is along the line 68-68 of FIG. 69.

FIGS. 71 and 72 are along the lines 71-71 and 72-72 of FIG. 70; FIG. 72 is along the line 72-72 of FIG. 71; and FIG. 71 is along the line 71-71 of FIG. 72.

FIGS. 74 and 75 are along the lines 74-74 and 75-75 of FIG. 73; FIG. 75 is along the line 75-75 of FIG. 74; and FIG. 74 is along the line 74-74 of FIG. 75.

FIGS. 77 and 78 are along the lines 77-77 and 78-78 of FIG. 76; FIG. 78 is along the line 78-78 of FIG. 77; and FIG. 77 is along the line 77-77 of FIG. 78.

FIGS. 80 and 81 are along the lines 80-80 and 81-81 of FIG. 79; FIG. 81 is along the line 81-81 of FIG. 80; and FIG. 80 is along the line 80-80 of FIG. 81.

FIGS. 82-84 are a diagrammatic, fragmentary top view and cross-sectional side views of the construction of FIGS. 1-3 shown at a processing stage subsequent to that of FIGS. 79-81. FIGS. 83 and 84 are along the lines 83-83 and 84-84 of FIG. 82; FIG. 84 is along the line 84-84 of FIG. 83; and FIG. 83 is along the line 83-83 of FIG. 84.

FIGS. 86 and 87 are along the lines 86-86 and 87-87 of FIG. 85; FIG. 87 is along the line 87-87 of FIG. 86; and FIG. 86 is along the line 86-86 of FIG. 87.

FIGS. 89 and 90 are along the lines 89-89 and 90-90 of FIG. 88; FIG. 90 is along the line 90-90 of FIG. 89; and FIG. 89 is along the line 89-89 of FIG. 90.

FIGS. 92 and 93 are along the lines 92-92 and 93-93 of FIG. 91; FIG. 93 is along the line 93-93 of FIG. 92; and FIG. 92 is along the line 92-92 of FIG. 93.

FIGS. 95 and 96 are along the lines 95-95 and 96-96 of FIG. 94; FIG. 96 is along the line 96-96 of FIG. 95; and FIG. 95 is along the line 95-95 of FIG. 96.

FIGS. 97-99 are a fragmentary, diagrammatic top view and cross-sectional side views of the construction of FIGS. 1-3 shown at a processing stage subsequent to that of FIGS. 94-96. FIGS. 98 and 99 are along the lines 98-98 and 99-99 of FIG. 97; FIG. 99 is along the line 99-99 of FIG. 98; and FIG. 98 is along the line 98-98 of FIG. 99.

FIGS. 101 and 102 are along the lines 101-101 and 102-102 of FIG. 100; FIG. 101 is along the line 101-101 of FIG. 102; and FIG. 102 is along the line 102-102 of FIG. 101.

FIGS. 104 and 105 are along the lines 104-104 and 105-105 of FIG. 103; FIG. 105 is along the line 105-105 of FIG. 104; and FIG. 104 is along the line 104-104 of FIG. 105.

FIGS. 107 and 108 are along the lines 107-107 and 108-108 of FIG. 106; FIG. 108 is along the line 108-108 of FIG. 107; and FIG. 107 is along the line 107-107 of FIG. 108.

FIGS. 110 and 111 are along the lines 110-110 and 111-111 of FIG. 109; FIG. 110 is along the line 110-110 of FIG. 111; and FIG. 111 is along the line 111-111 of FIG. 110.

FIGS. 113 and 114 are along the lines 113-113 and 114-114 of FIG. 112; FIG. 114 is along the line 114-114 of FIG. 113; and FIG. 113 is along the line 113-113 of FIG. 114.

FIGS. 116 and 117 are along the lines 116-116 and 117-117 of FIG. 115; FIG. 116 is along the line 116-116 of FIG. 117; and FIG. 117 is along the line 117-117 of FIG. 116.

FIGS. 119 and 120 are along the lines 119-119 and 120-120 of FIG. 118; FIG. 120 is along the line 120-120 of FIG. 119; and FIG. 119 is along the line 119-119 of FIG. 120.

FIGS. 122 and 123 are along the lines 122-122 and 123-123 of FIG. 121; FIG. 123 is along the line 123-123 of FIG. 122; and FIG. 122 is along the line 122-122 of FIG. 123.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods by which a semiconductor construction is formed to comprise a gateline lattice surrounding a plurality of source/drain regions. In some aspects of the invention, such construction can be incorporated into a DRAM array by forming digit lines over and in electrical connection with some of the source/drain regions, and by also forming a plurality of capacitor constructions in electrical connection with some of the source/drain regions.

Figure 1:
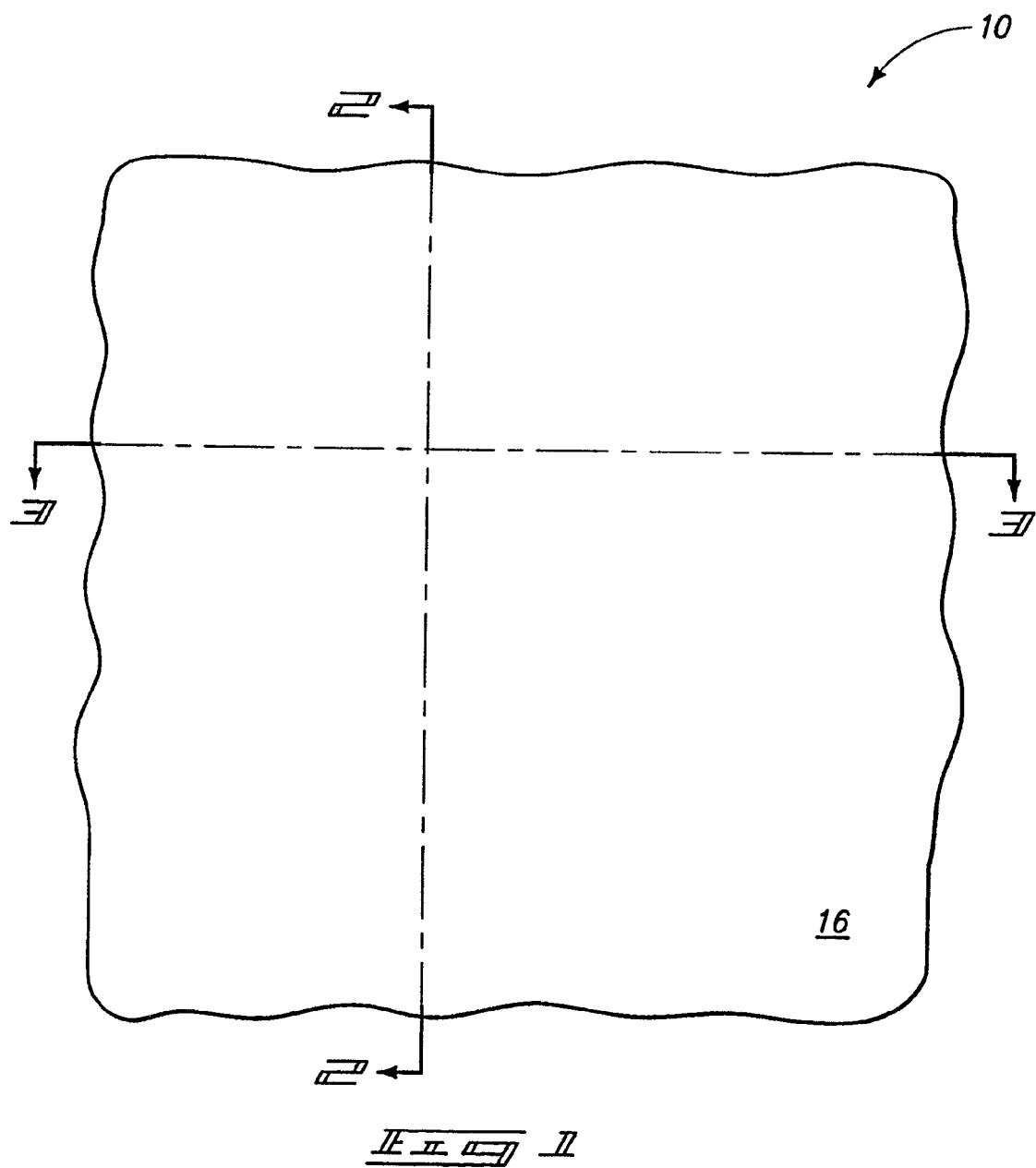
FIGS. 1-3 are a diagrammatic, fragmentary top view and cross-sectional side views of a semiconductor construction at a preliminary processing stage.
Figure 2:
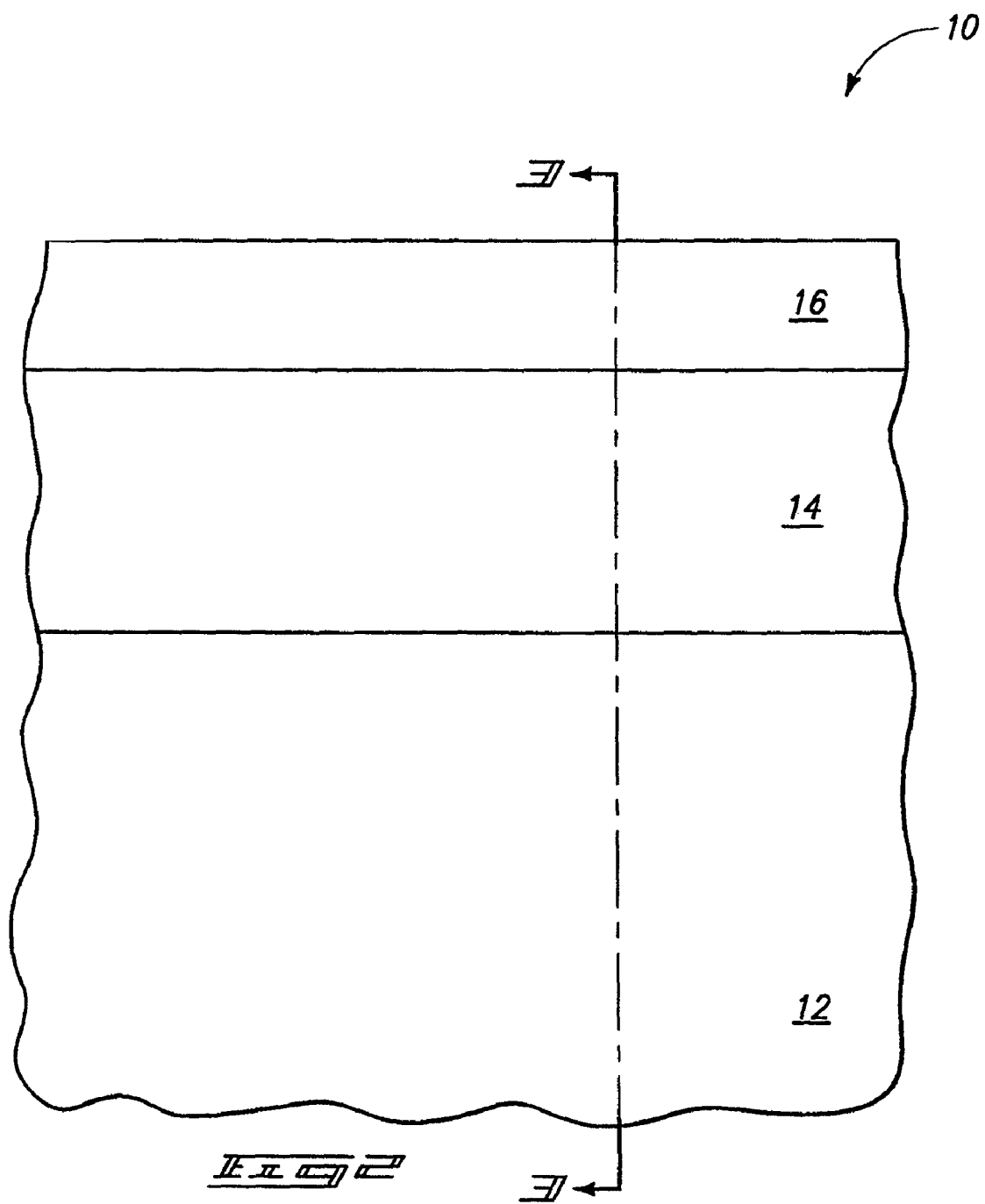
Figure 3:
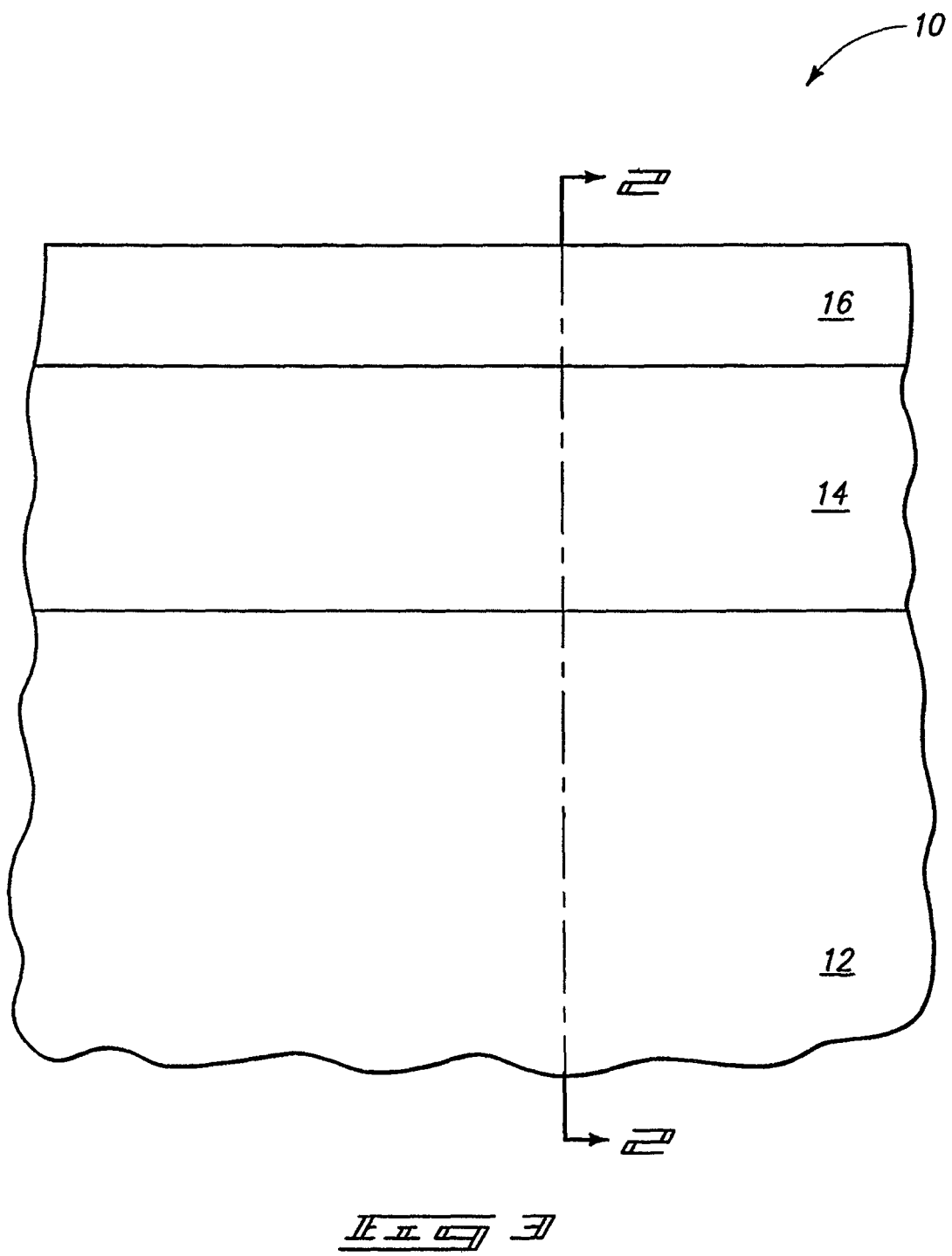

Exemplary aspects of the invention are described with reference to FIGS. 1-123. Referring initially to FIGS. 1-3, a semiconductor construction 10 is illustrated at a preliminary processing stage. Construction 10 comprises a substrate 12. Substrate 12 can comprise, consist essentially of, or consist of appropriately-doped monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 further comprises a material 14 over substrate 12. In particular aspects, material 14 can comprise, consist essentially of, or consist of silicon dioxide, and can be formed to a thickness of, for example, about 3,000 Å.

A layer 16 is over material 14. Layer 16 can comprise, consist essentially of, or consist of silicon, such as, for example, polycrystalline silicon, and can be formed to a thickness of, for example, about 1,000 Å. In particular aspects (discussed below) layer 16 can be patterned and utilized as a hard mask. Accordingly, layer 16 can be referred to as a "hard mask layer" in some aspects of the invention.

In specific aspects of the invention, the structures 12, 14 and 16 of construction 10 can be referred to as a first semiconductor material, oxide-containing material, and silicon-containing hard mask, respectively. In such aspects it is to be understood that material 14 can comprise silicon dioxide and/or any other suitable oxide, and that material 16 can comprise polycrystalline silicon or any other suitable form of silicon. Further, it is to be understood that other semiconductor materials (discussed below) will ultimately be formed over construction 10, and accordingly material 12 can be referred to as a first semiconductor material to distinguish material 12 from the subsequent semiconductor materials formed thereover.

Figure 4:
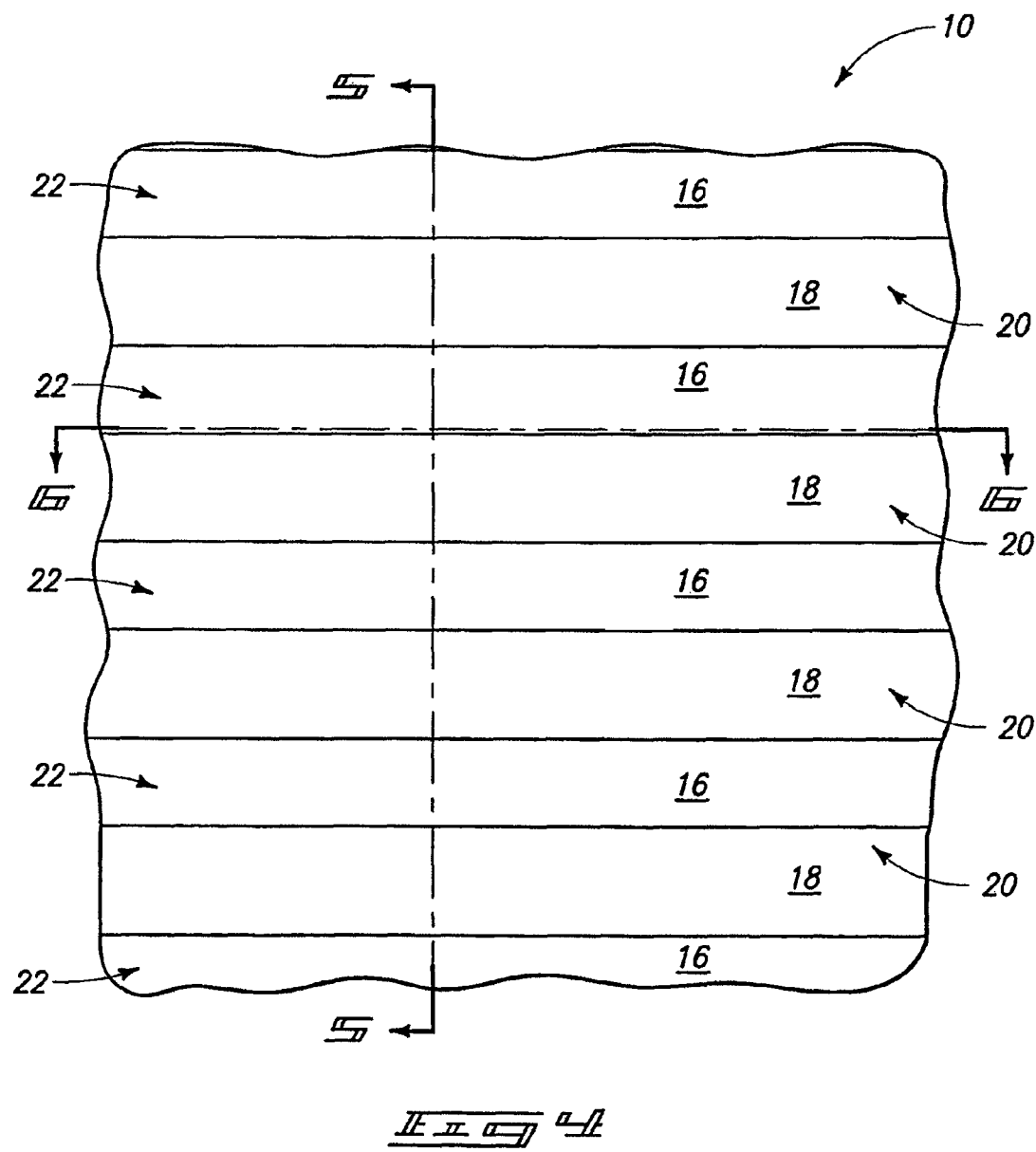

Referring next to FIGS. 4-6, a patterned masking material 18 is formed over layer 16. Masking material 18 can, for example, comprise, consist essentially of, or consist of photoresist, and can be photolithographically patterned into the shown configuration. The patterned material 18 is formed as a plurality of spaced lines 20, with such lines being separated from one another by gaps 22. There is a pitch 19 of the lines and gaps defined by the combined distance of a gap 22 and a line 18. The lines 20 can be considered to extend along a defined horizontal direction.

Figure 8:
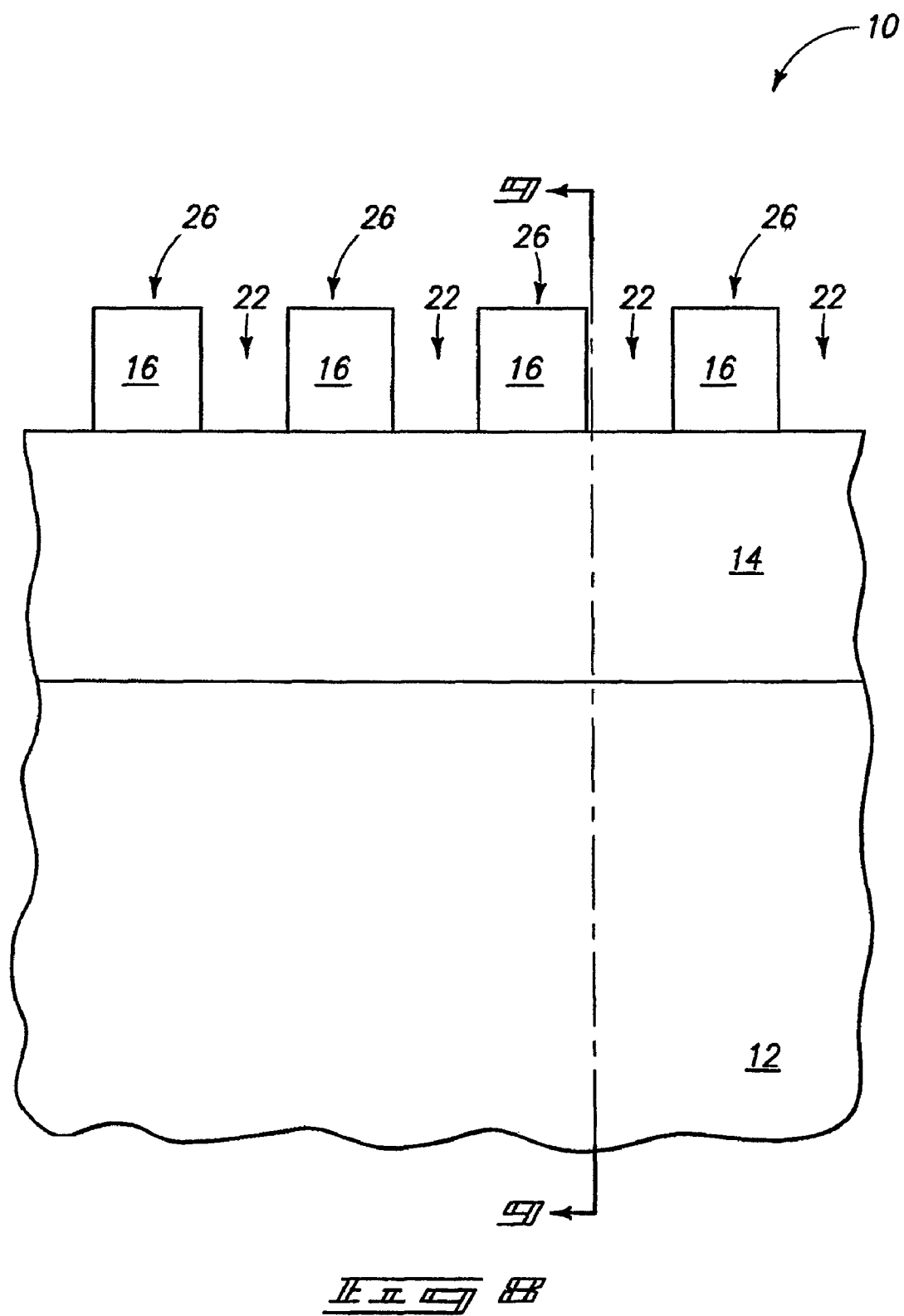
Figure 9:
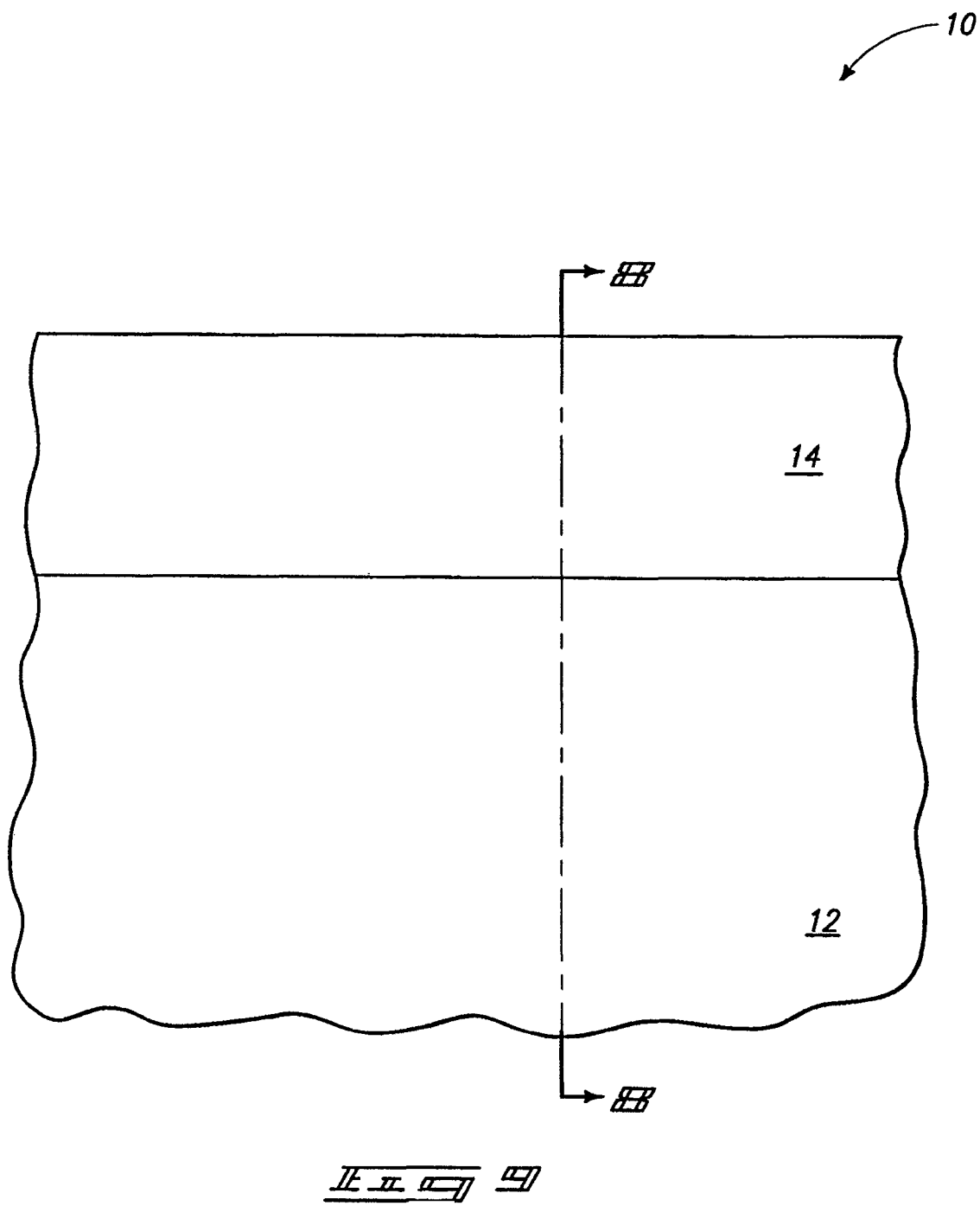

Referring next to FIGS. 7-9, the pattern from patterned masking material 18 (FIGS. 4-6) is transferred to hard mask layer 16. Specifically, gaps 22 are transferred through the hard mask layer to leave spaced lines 26 of the hard mask layer 16 remaining over material 14. Subsequently, the masking material 18 (FIGS. 4-6) is removed. The lines 26 can be considered to extend along the same defined horizontal direction as the lines 20 (FIGS. 4-6).

Figure 10:
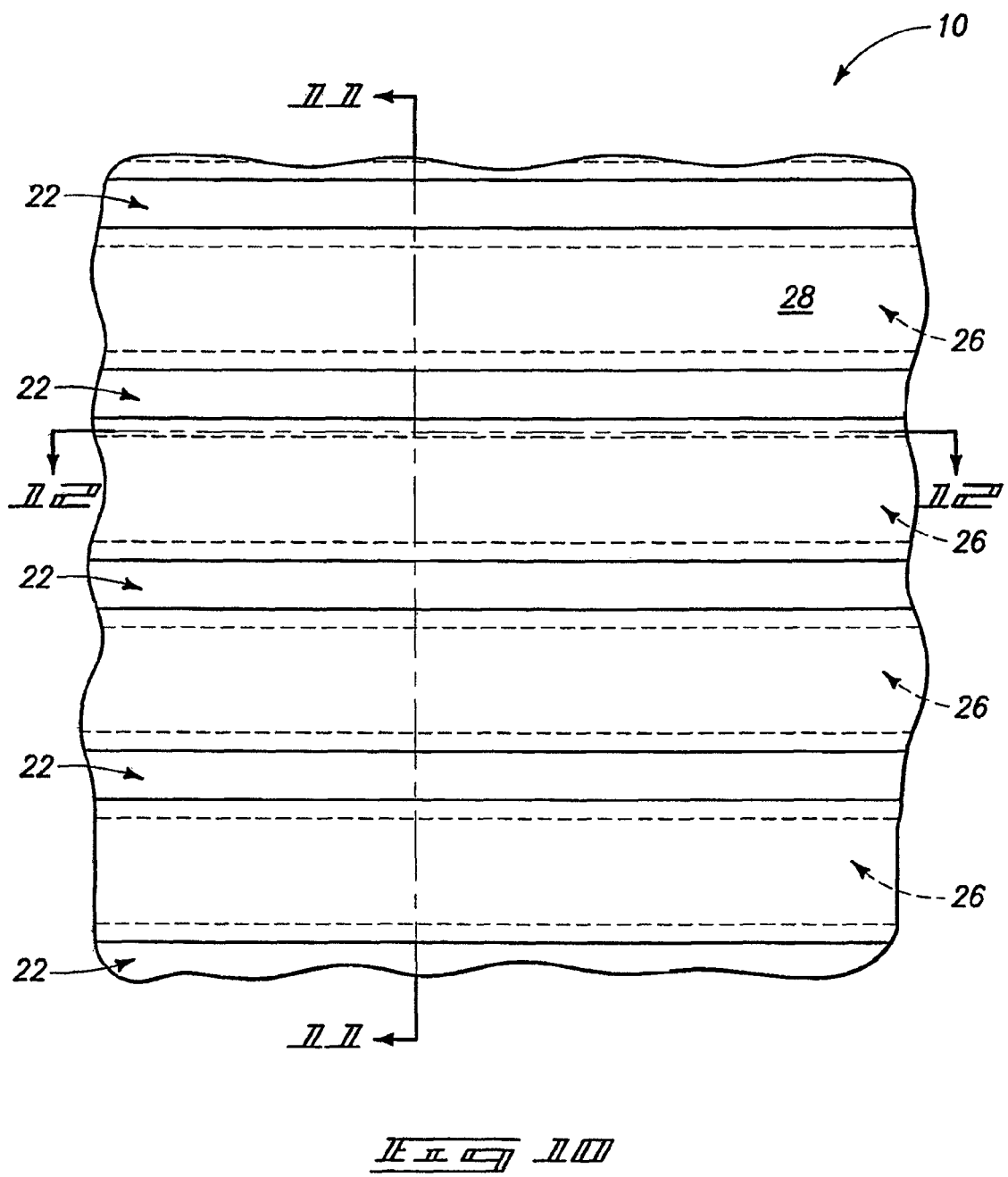
FIGS. 10-12 are a diagrammatic, fragmentary top view and cross-sectional side views of the construction of FIGS. 1-3, shown at a processing stage subsequent to that of FIGS. 7-9.
Figure 11:
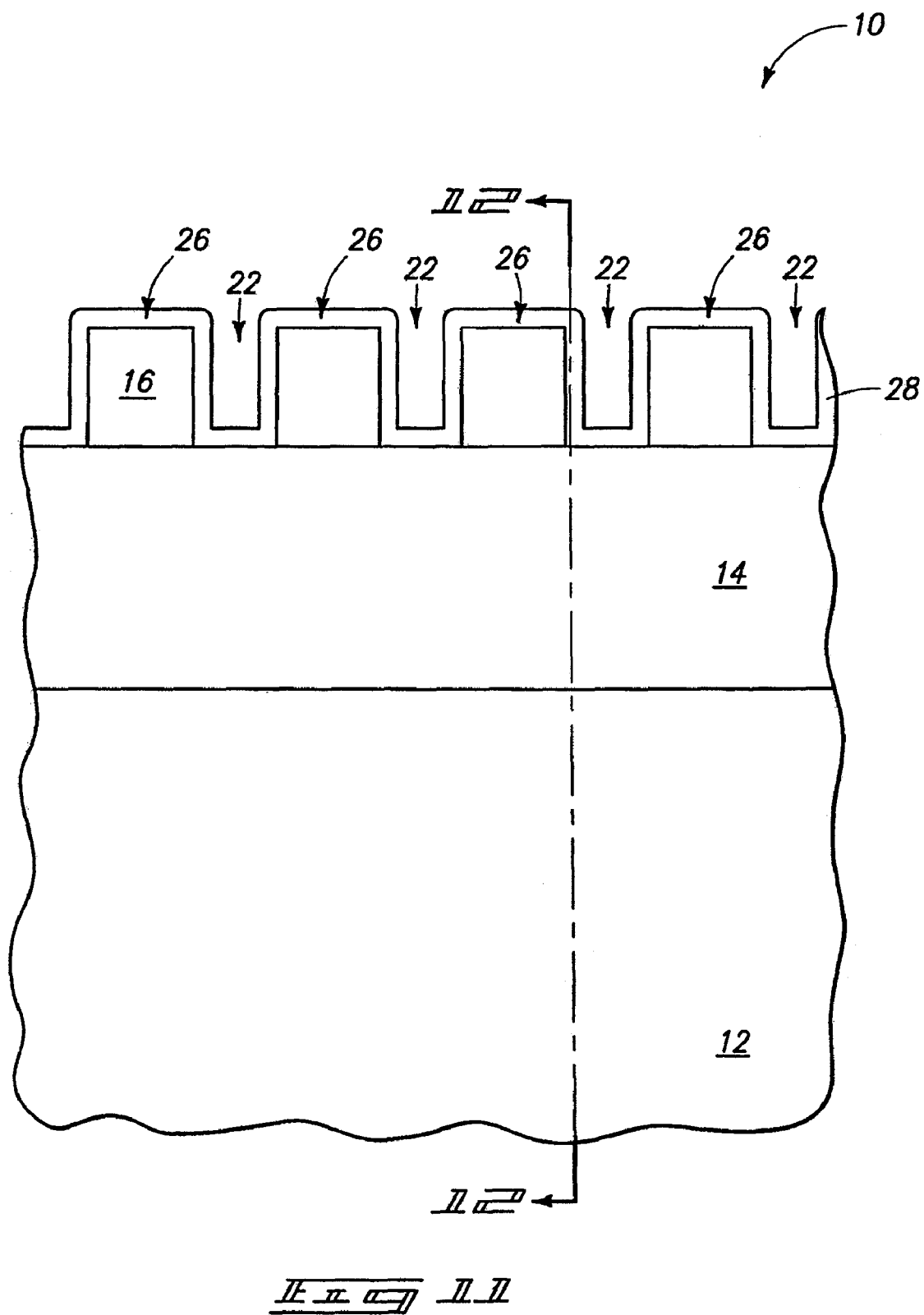
Figure 12:
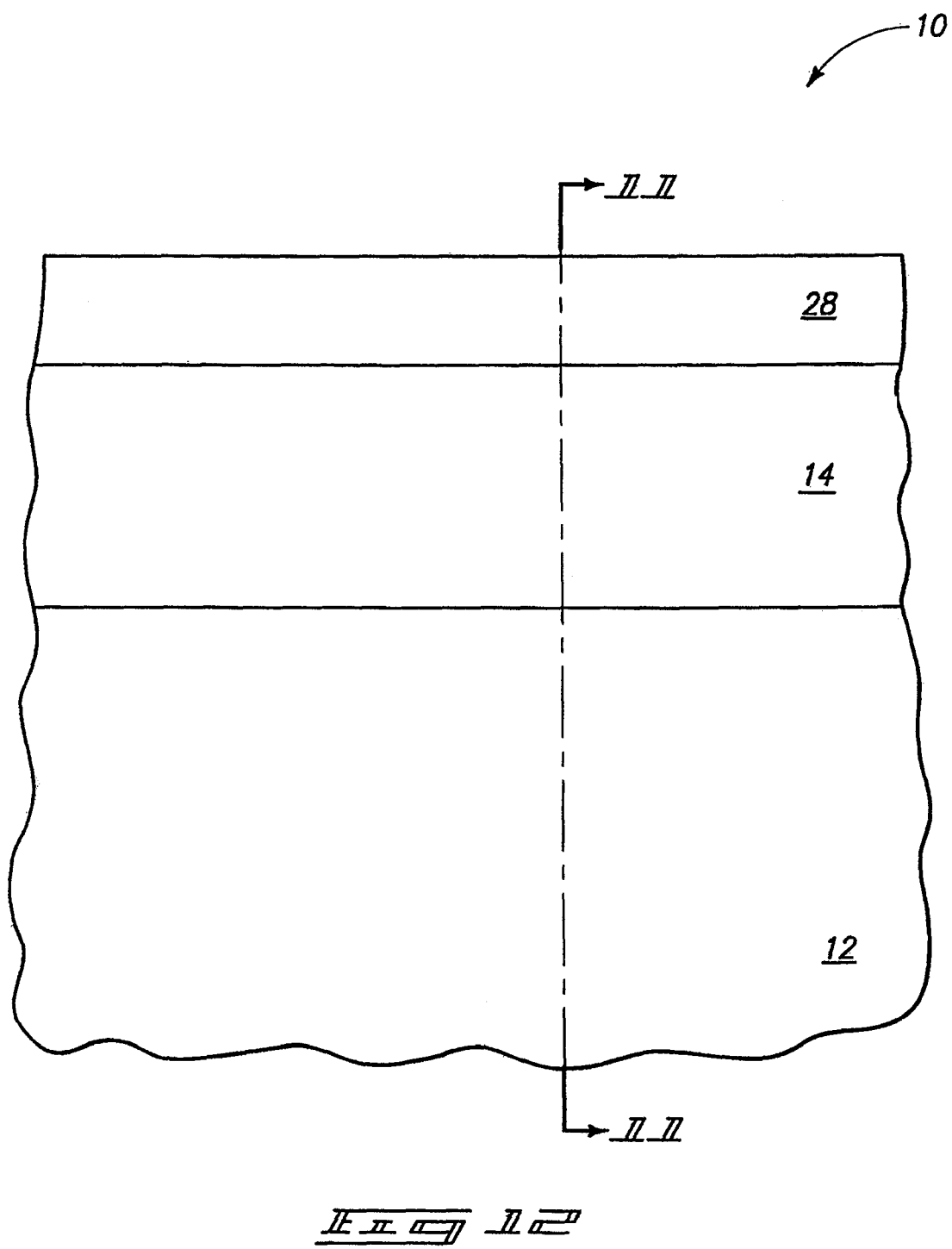

Referring next to FIGS. 10-12, a thin layer of material 28 is formed over the lines 26 and within gaps 22 to narrow the gaps. Material 28 can, for example, comprise, consist essentially of, or consist of a nitride-containing material, such as, for example, silicon nitride. Material 28 can be formed to a thickness of, for example, about 160 Å. The lines 26 are shown in dashed-line view in FIG. 10 to indicate that the lines are beneath the material 28.

Figure 13:
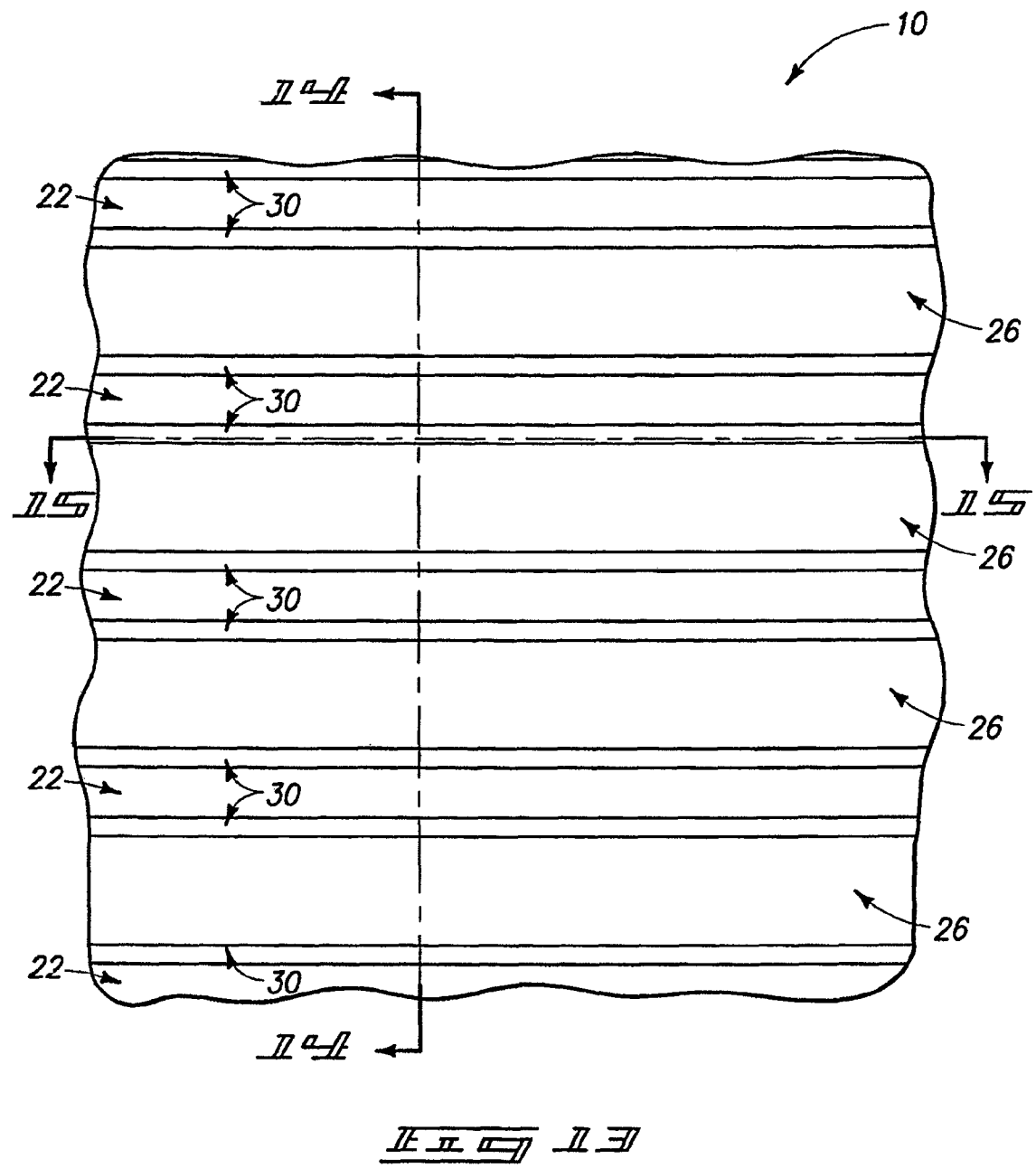
FIGS. 13-15 are a diagrammatic, fragmentary top view and cross-sectional side views of the construction of FIGS. 1-3 shown at a processing stage subsequent to that of FIGS. 10-12.
Figure 14:
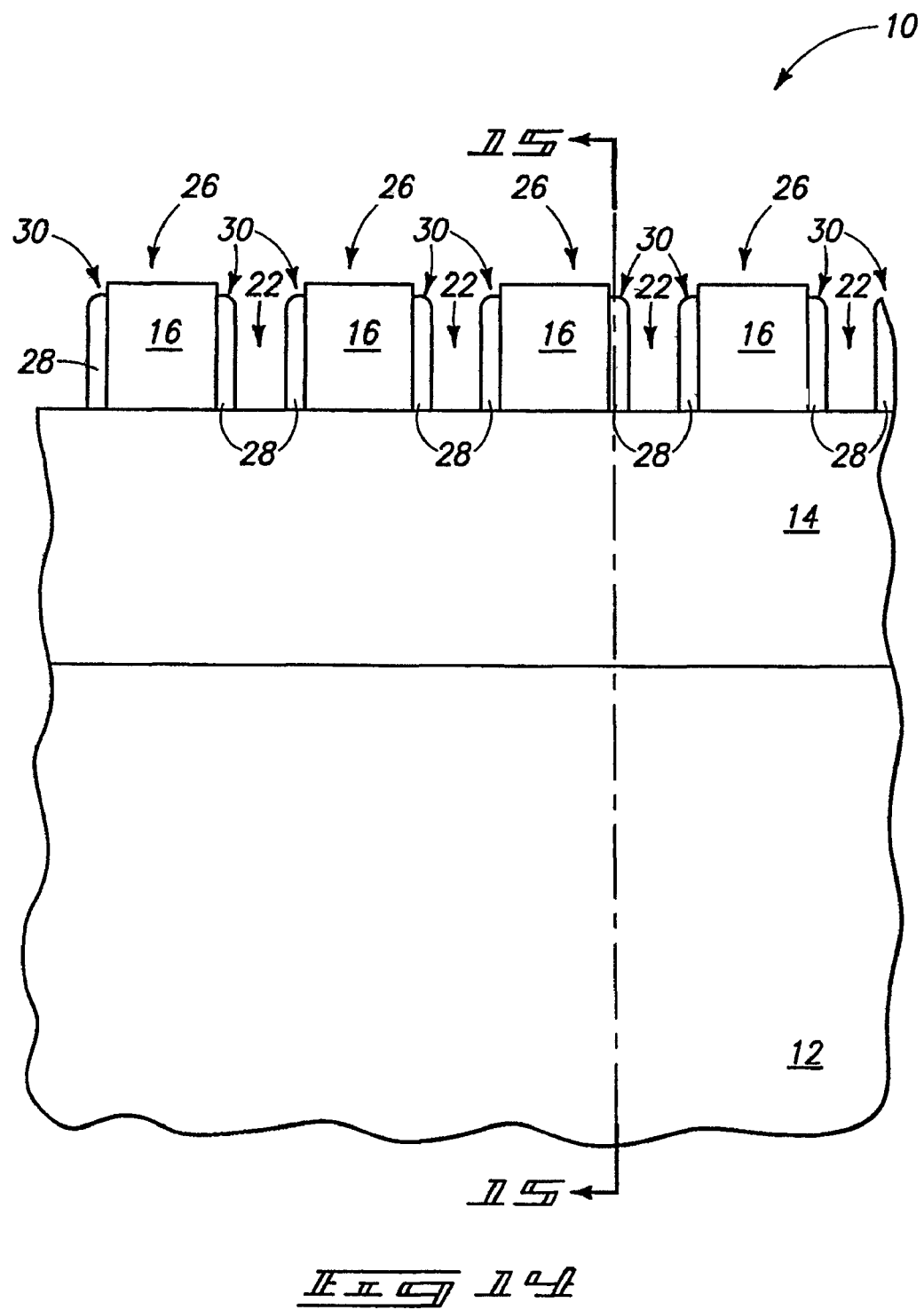
Figure 15:
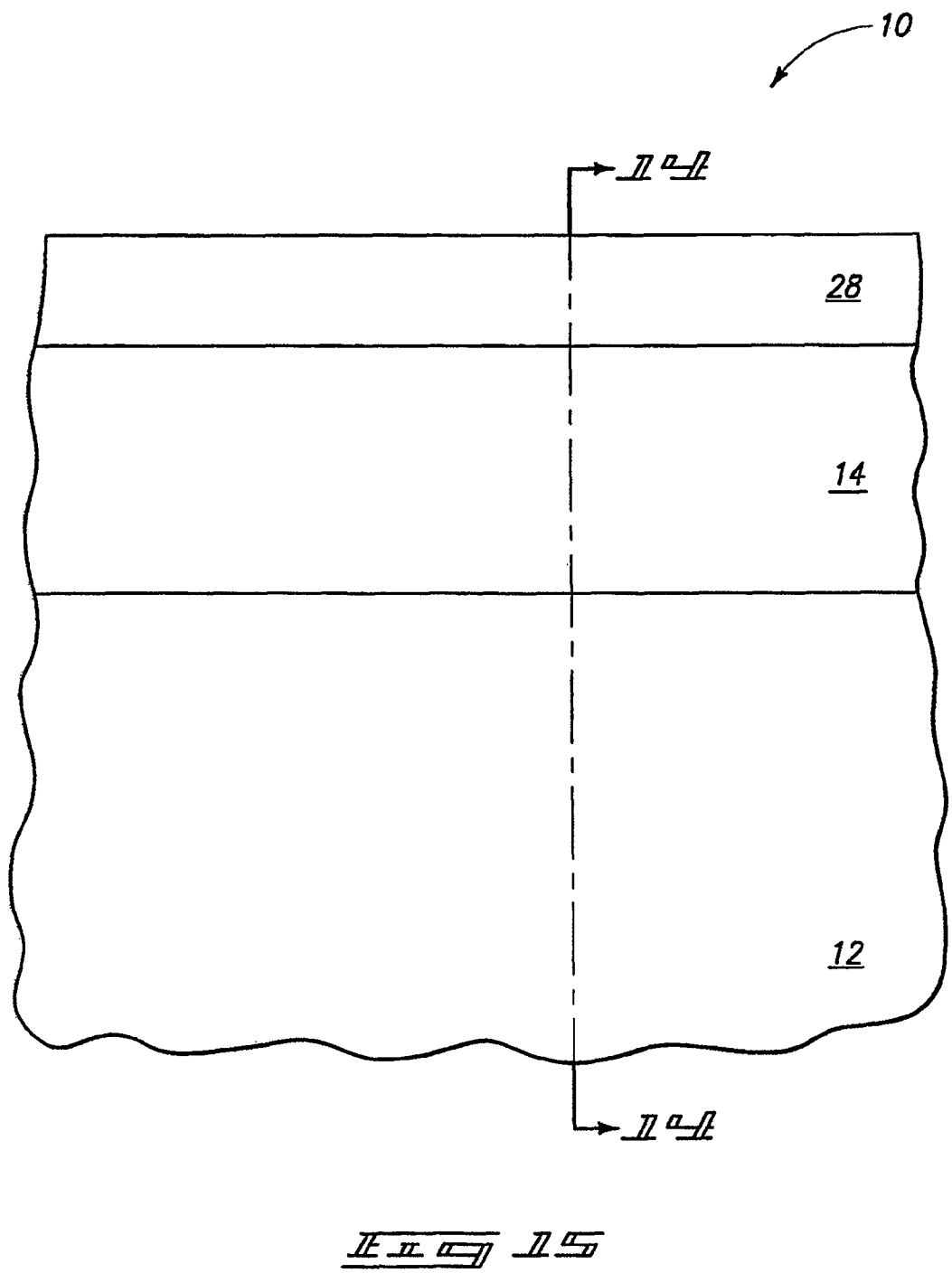

Referring next to FIGS. 13-15, material 28 is patterned into spacers 30 with an anisotropic etch. After formation of the spacers 30, narrowed gaps 22 extend to an upper surface of material 14.

Figure 16:
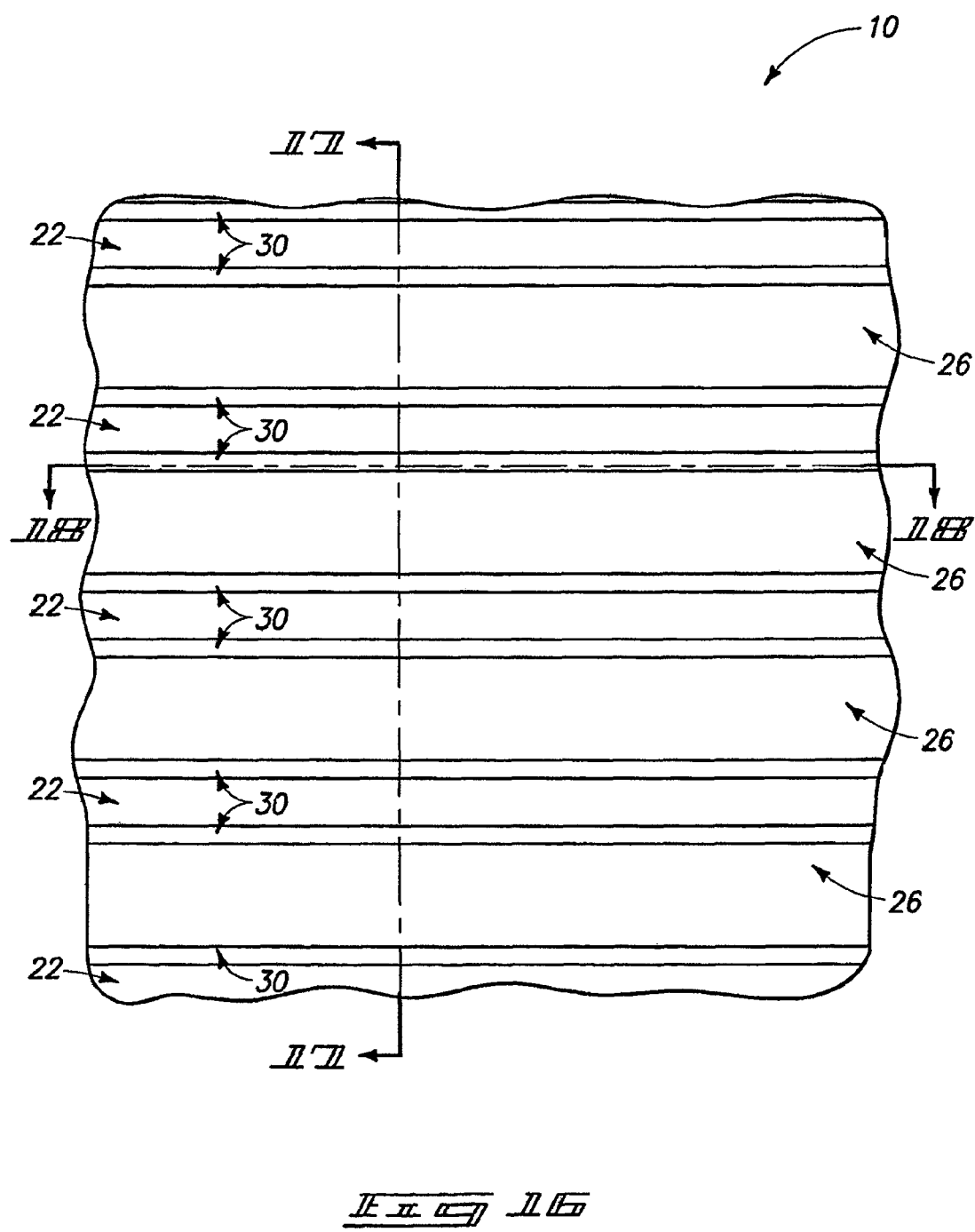
FIGS. 16-17 are a diagrammatic, fragmentary top view and cross-sectional side views of the construction of FIGS. 1-3 shown at processing stage subsequent to that of FIGS. 13-15.
Figure 17:
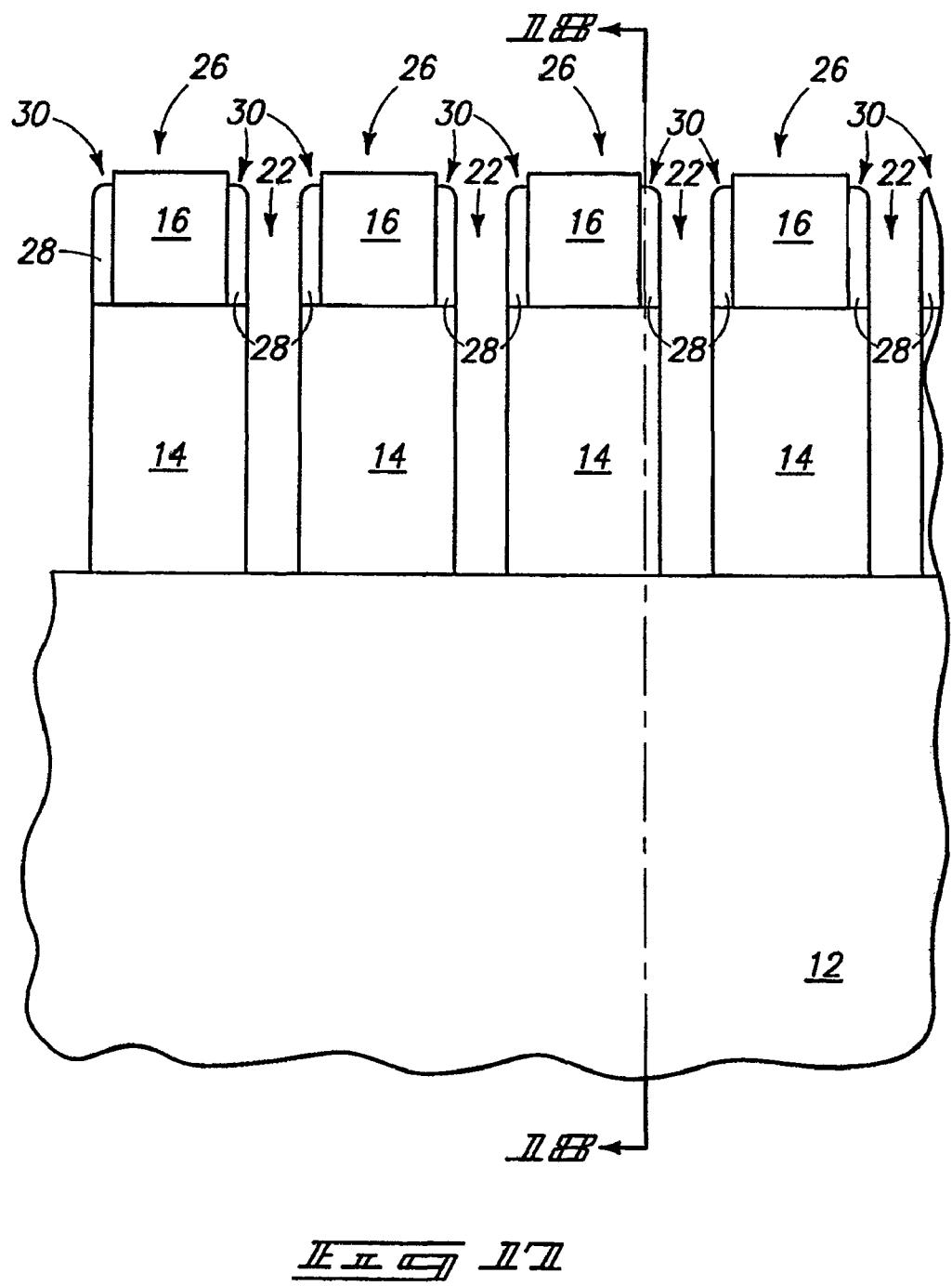
Figure 18:
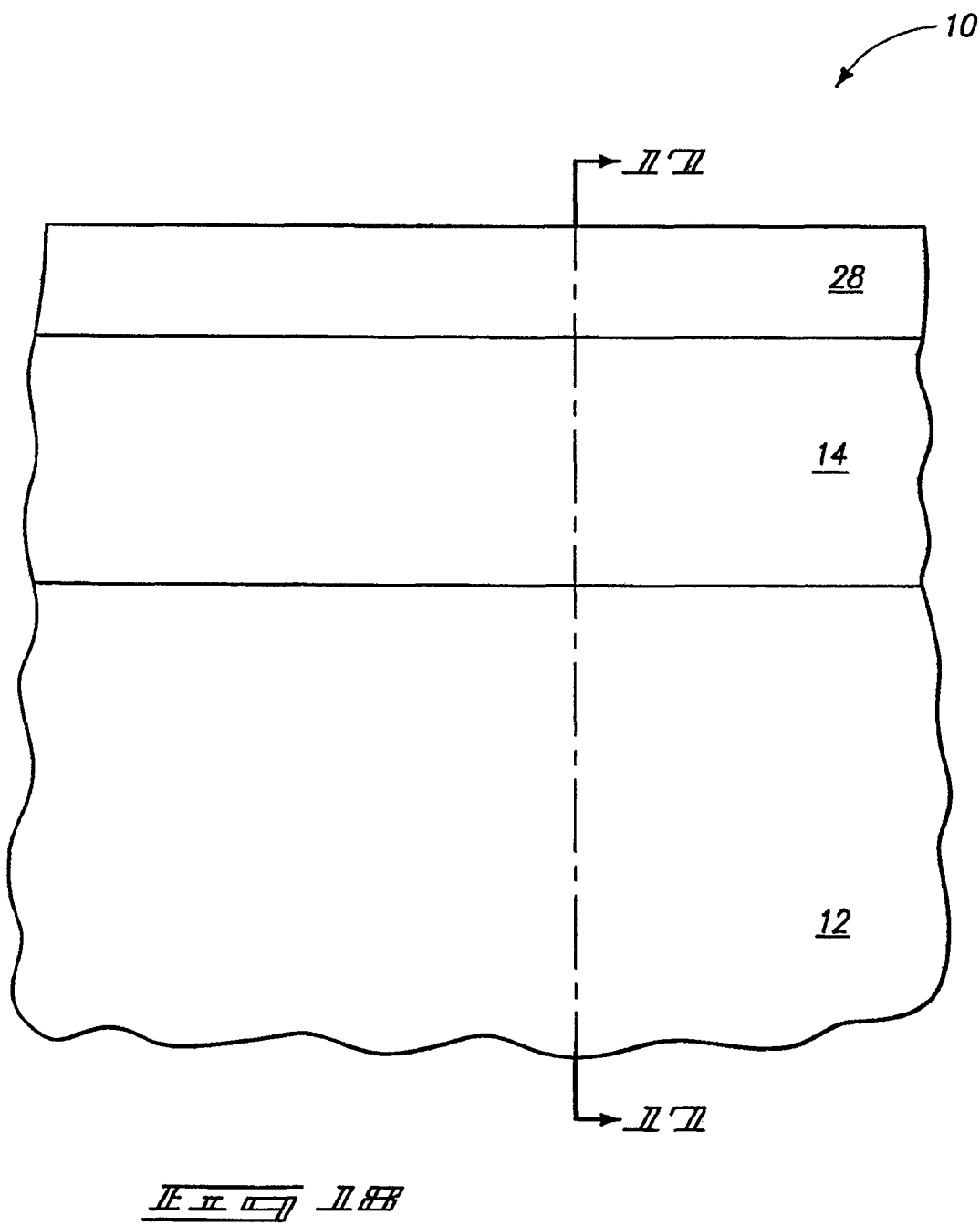

Referring next to FIGS. 16-18, the narrowed gaps 22 are extended through material 14. Gaps 22 at the processing stage of FIGS. 16-18 correspond to openings extending to an upper surface of substrate 12. The gaps are shaped as trenches longitudinally elongated along the horizontally-defined direction of the lines 20 of patterned mask 18 (FIGS. 4-6).

Figure 19:
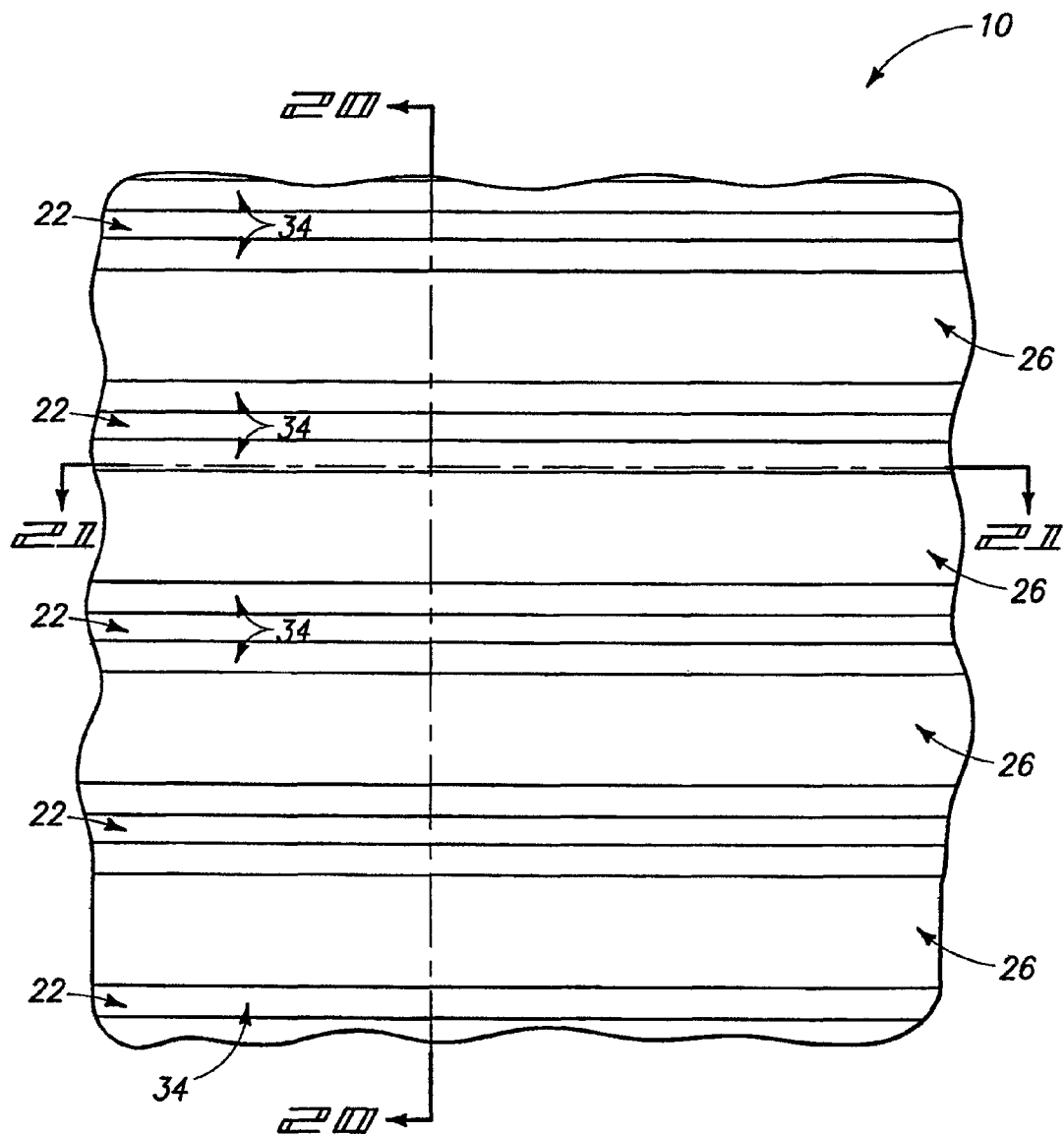
FIGS. 19-21 are a diagrammatic, fragmentary top view and cross-sectional side views, respectively, of the construction of FIGS. 1-3 shown at a processing stage subsequent to that of FIGS. 16-18.
Figure 20:
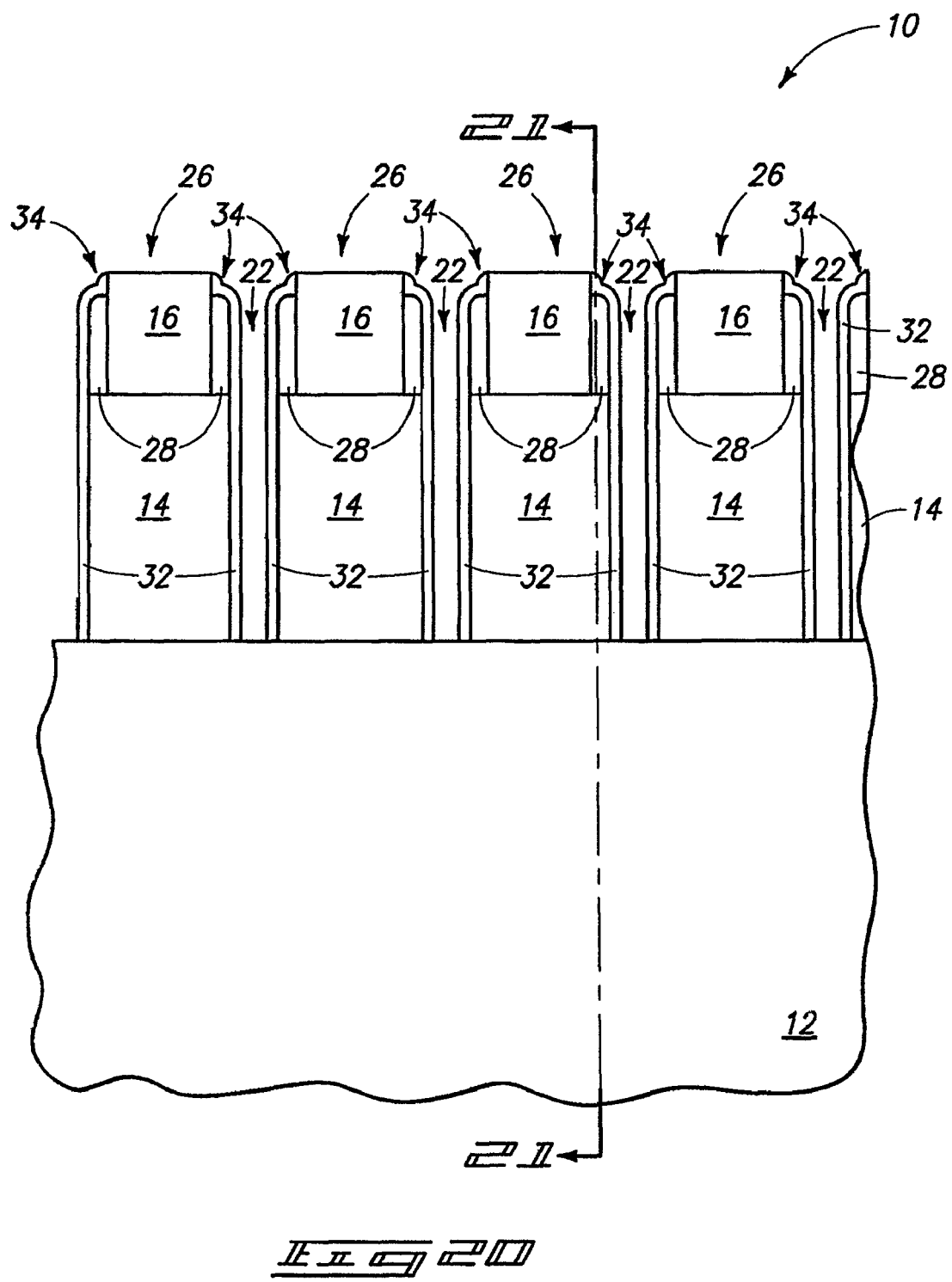
Figure 21:
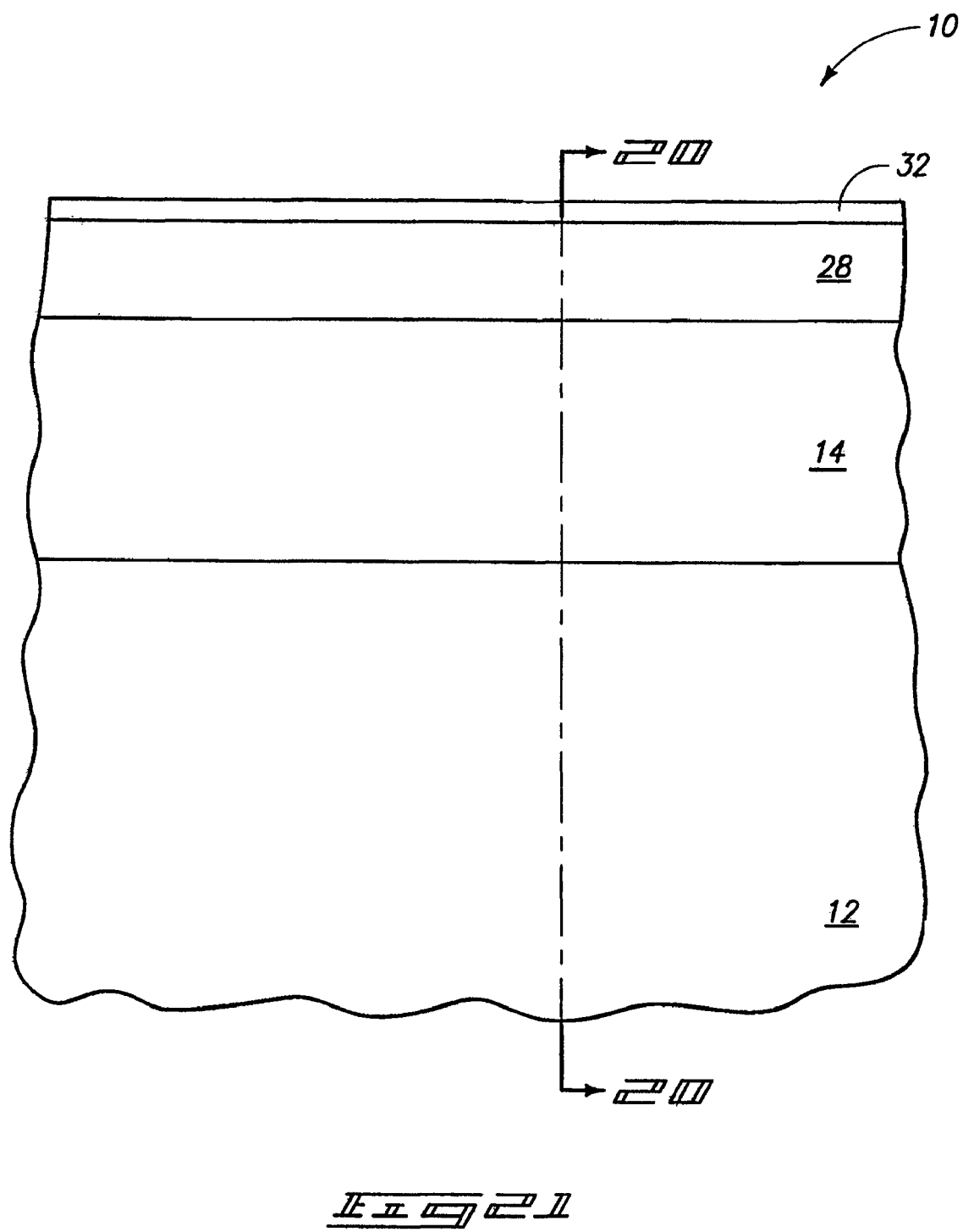

Referring next to FIGS. 19-21, spacers 32 are formed within openings 22 to narrow the openings. Spacers 32 can, for example, comprise, consist essentially of, or consist of a nitride-containing material, such as, for example, silicon nitride. Spacers 32 can be formed by providing a thin layer of nitride-containing material (such as, for example, a layer approximately 80 Å thick of silicon nitride) over lines 26 and within openings 22, and subsequently utilizing an anisotropic etch to convert the layer to the shown spacers 32.

Spacers 32 and 28 together form spacer constructions 34. In some aspects, spacers 32 and 28 can be identical in composition to one another, and accordingly will merge together in the spacer constructions 34. The spacer constructions 34 narrow openings 22, and as can be seen in FIG. 19 form strips extending longitudinally in the horizontal direction along interior lateral peripheries of the trenches corresponding to openings 22.

Figure 22:
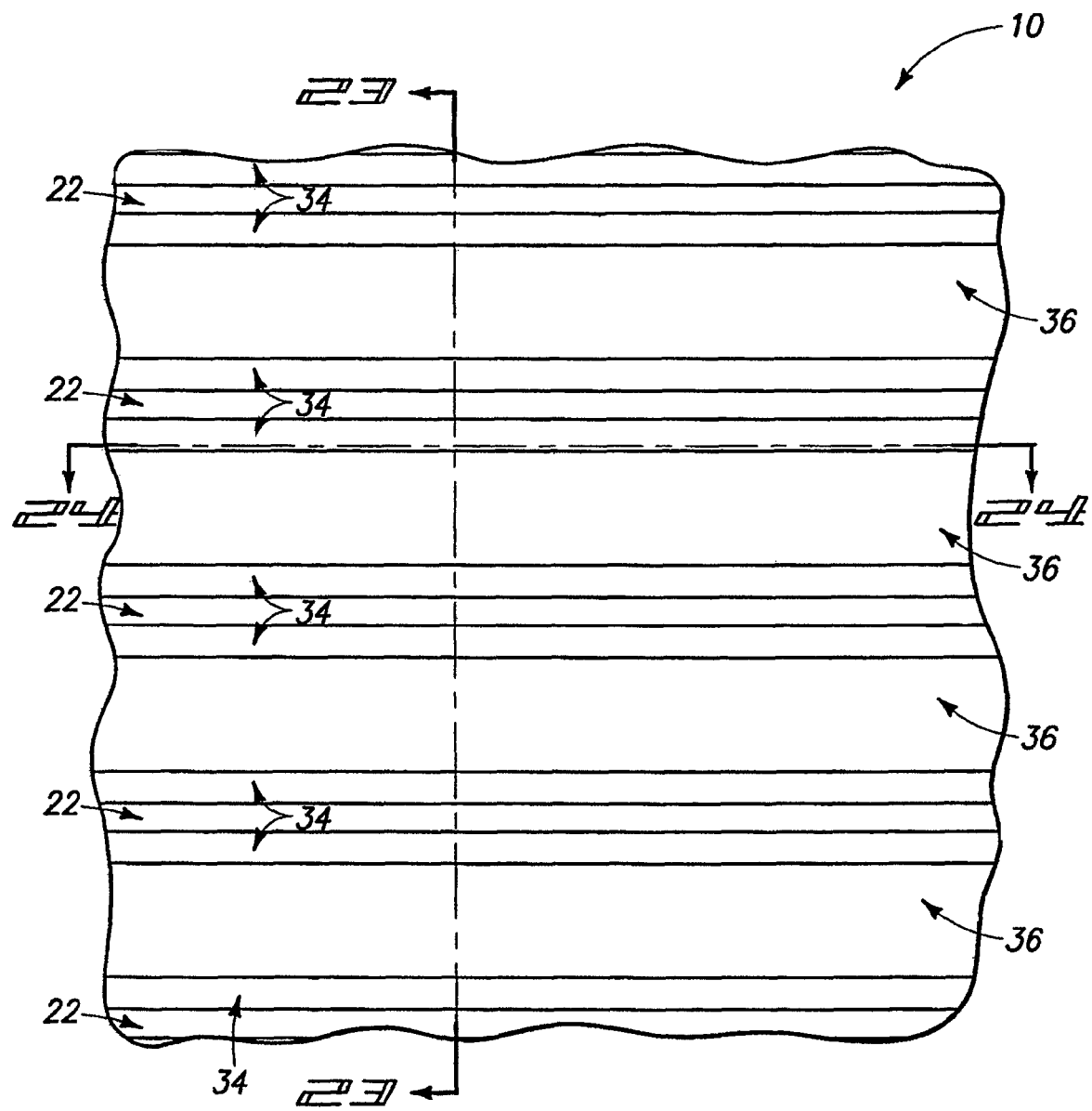
FIGS. 22-24 are a diagrammatic, fragmentary top view and cross-sectional side views of the construction of FIGS. 1-3 shown at a processing stage subsequent to that of FIGS. 19-21.
Figure 23:
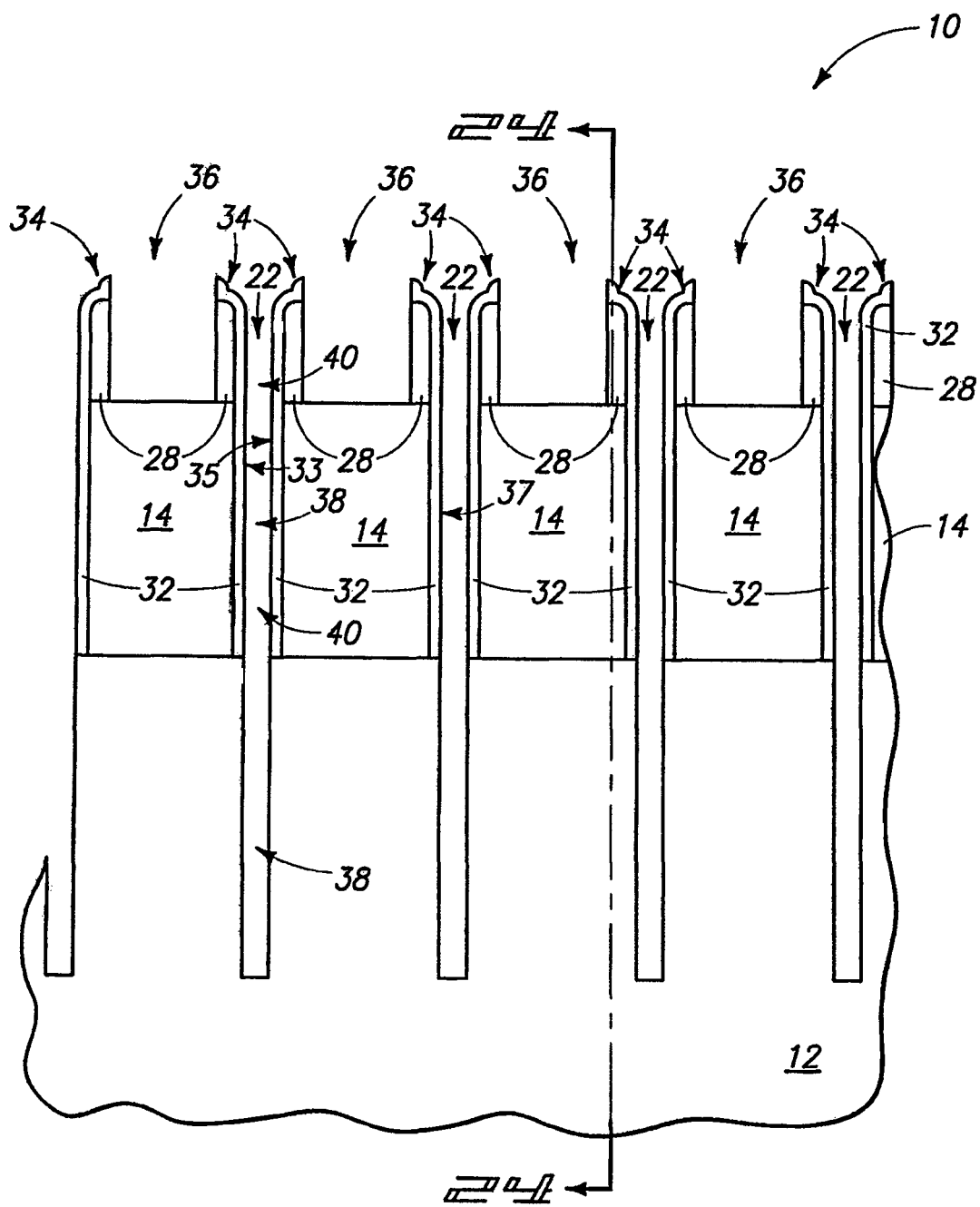
Figure 24:
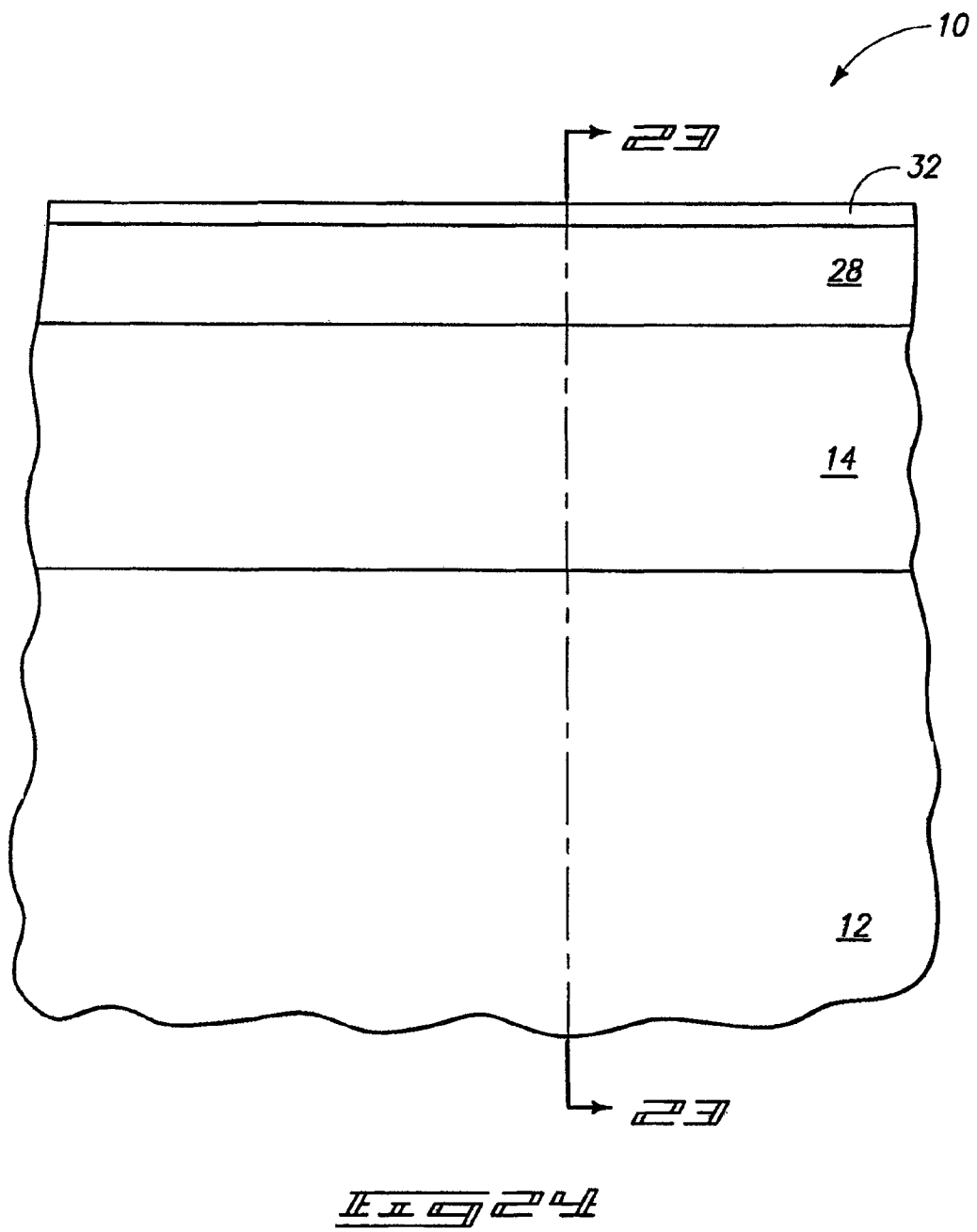

Referring next to FIGS. 22-24, openings 22 are extended into substrate 12 with a suitable etch. If substrate 12 comprises bulk silicon, the etch can be a dry etch. Such etch can extend openings 22 approximately 2,000 Å into the substrate 12.

Masking layer 16 (FIGS. 19-21) is removed at the processing stage of FIGS. 22-24. Such removal can occur before, after or during the extension of openings 22 into substrate 12. Typically, the etch utilized to extend openings 22 into substrate 12 would be nonselective relative to material of layer 16, and accordingly layer 16 will be removed during the extension of the openings into substrate 12.

The removal of hard mask material 16 leaves gaps 36 over material 14 and between the spacers 34. Accordingly, spacers 34 can be considered to form paired lines on either side of openings 22, or alternatively can be considered to form paired lines on either side of gaps 36. For instance, FIG. 23 shows three of the spacers 34 labeled as 33, 35 and 37. Spacers 33 and 35 can be considered to form a pair of lines on opposing sides of the gap 22 extending between the spacers. Alternatively, spacers 35 and 37 can be considered to form a pair of lines on opposing sides of the gap 36 extending between the spacers.

After openings 22 are extended into substrate 14, the openings can be considered to comprise a first portion 38 extending within the semiconductor substrate 12, and a second portion 40 over the first portion.

Figure 25:
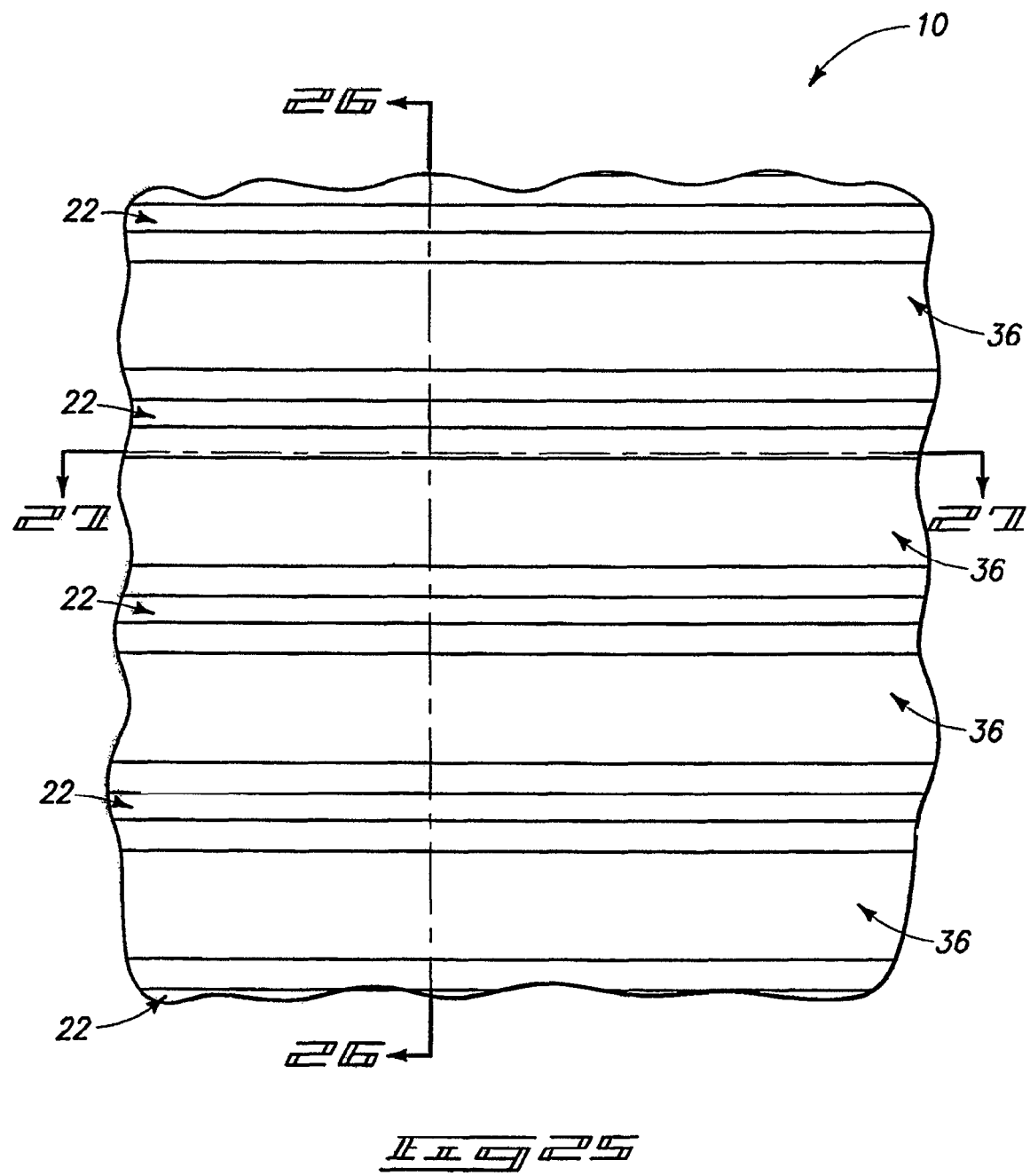
FIGS. 25-27 are a diagrammatic, fragmentary top view and cross-sectional side views of the construction of FIGS. 1-3 shown at a processing stage subsequent to that of FIGS. 21-23.
Figure 26:
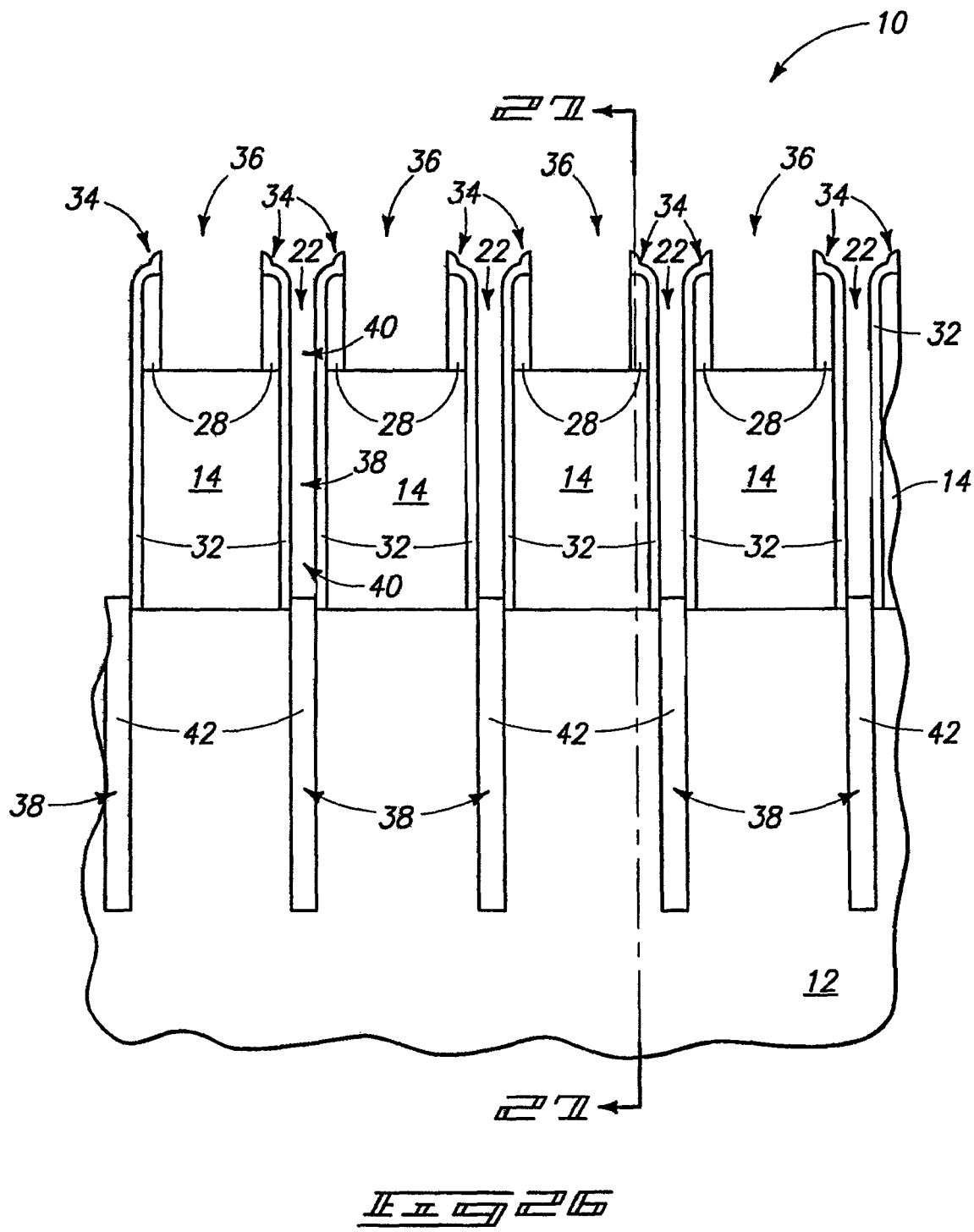
Figure 27:
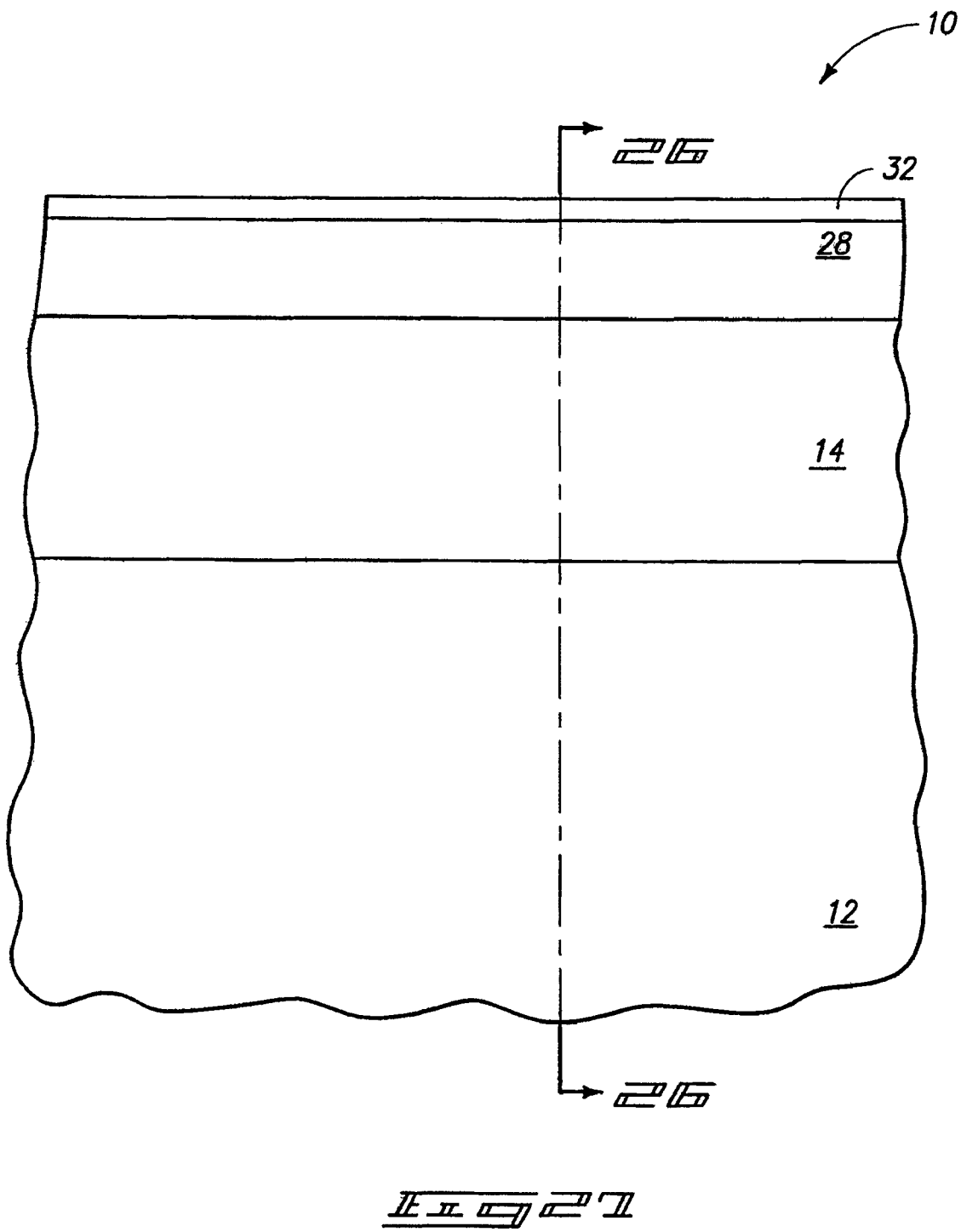

Referring next to FIGS. 25-27, dielectric material 42 is provided within the first portion 38 of openings 22 to fill the first portion, while leaving the second portion 40 of the openings not filled. Dielectric material 42 can, for example, comprise, consist essentially of, or consist of silicon dioxide. If substrate 12 comprises monocrystalline silicon, dielectric material 42 can be formed by oxidizing substrate 12. Suitable exemplary oxidation conditions are conditions which form oxide 42 to a thickness of about 100 Å, which can be sufficient to fill the lower portions of the openings 22.

Figure 28:
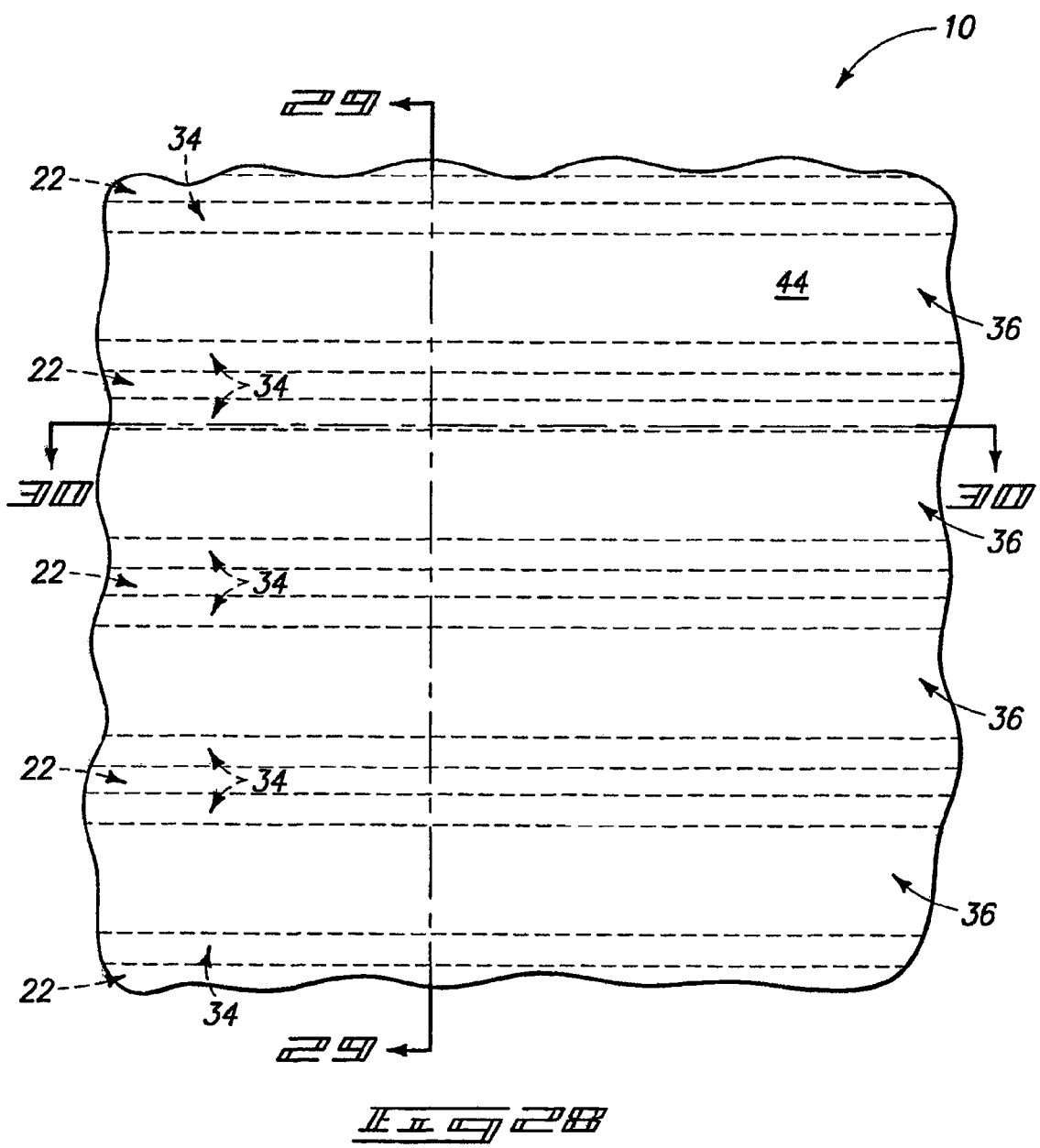
Figure 30:
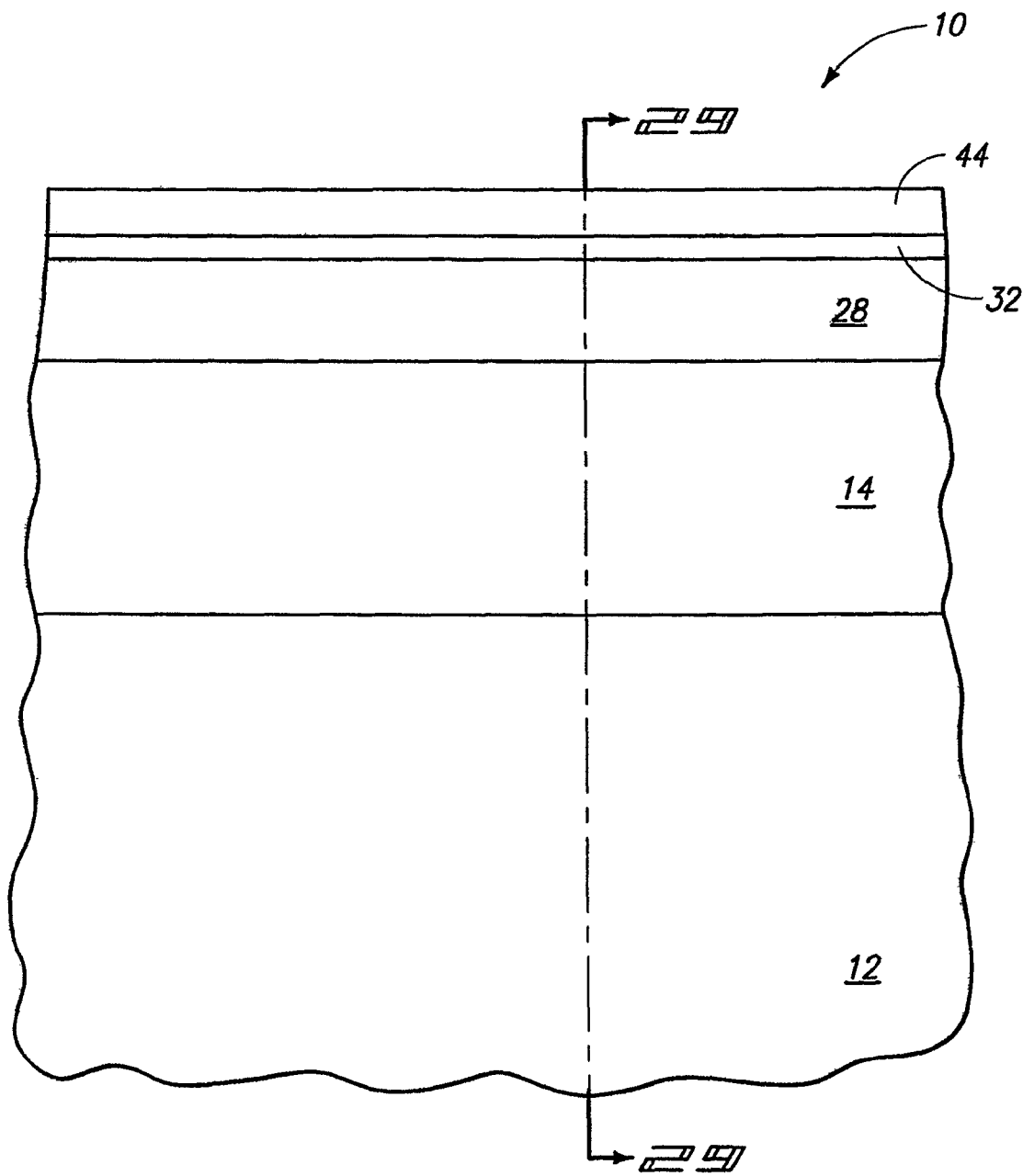

Referring next to FIGS. 28-30, a material 44 is provided within gaps 22 and 36. The material fills gaps 22 and narrows gaps 36. Material 44 can, for example, comprise, consist essentially of, or consist of a nitride-containing material, such as, silicon nitride. Material 44 can be formed to a thickness of, for example, about 160 Å.

Structures 34 are shown in dashed-line view in 28 to indicate that the structures are beneath material 44.

Figure 31:
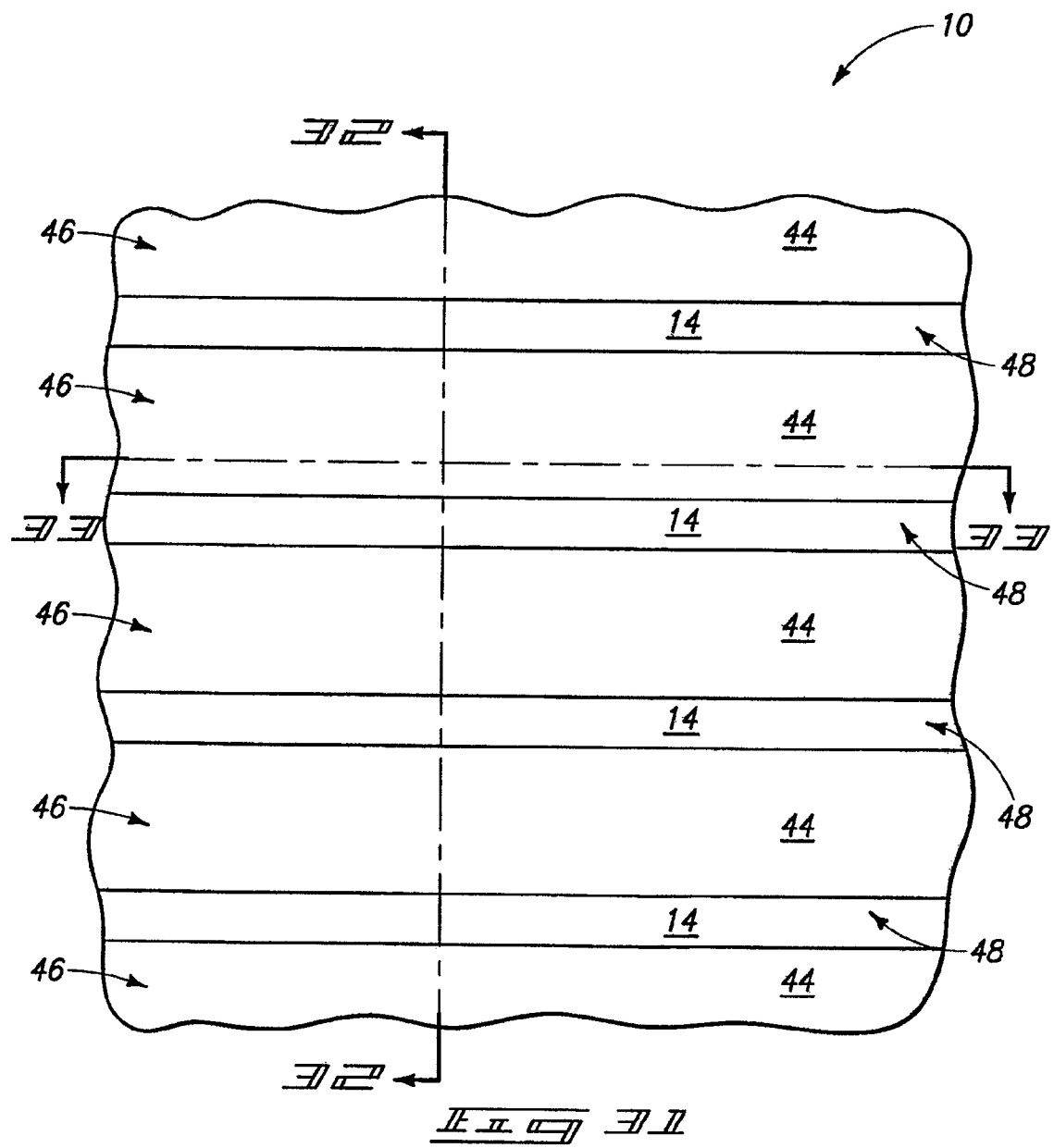
FIGS. 31-33 are a fragmentary, diagrammatic top view and cross-sectional side views of the construction of FIGS. 1-3 shown at a processing stage subsequent to that of FIGS. 27-29.
Figure 32:
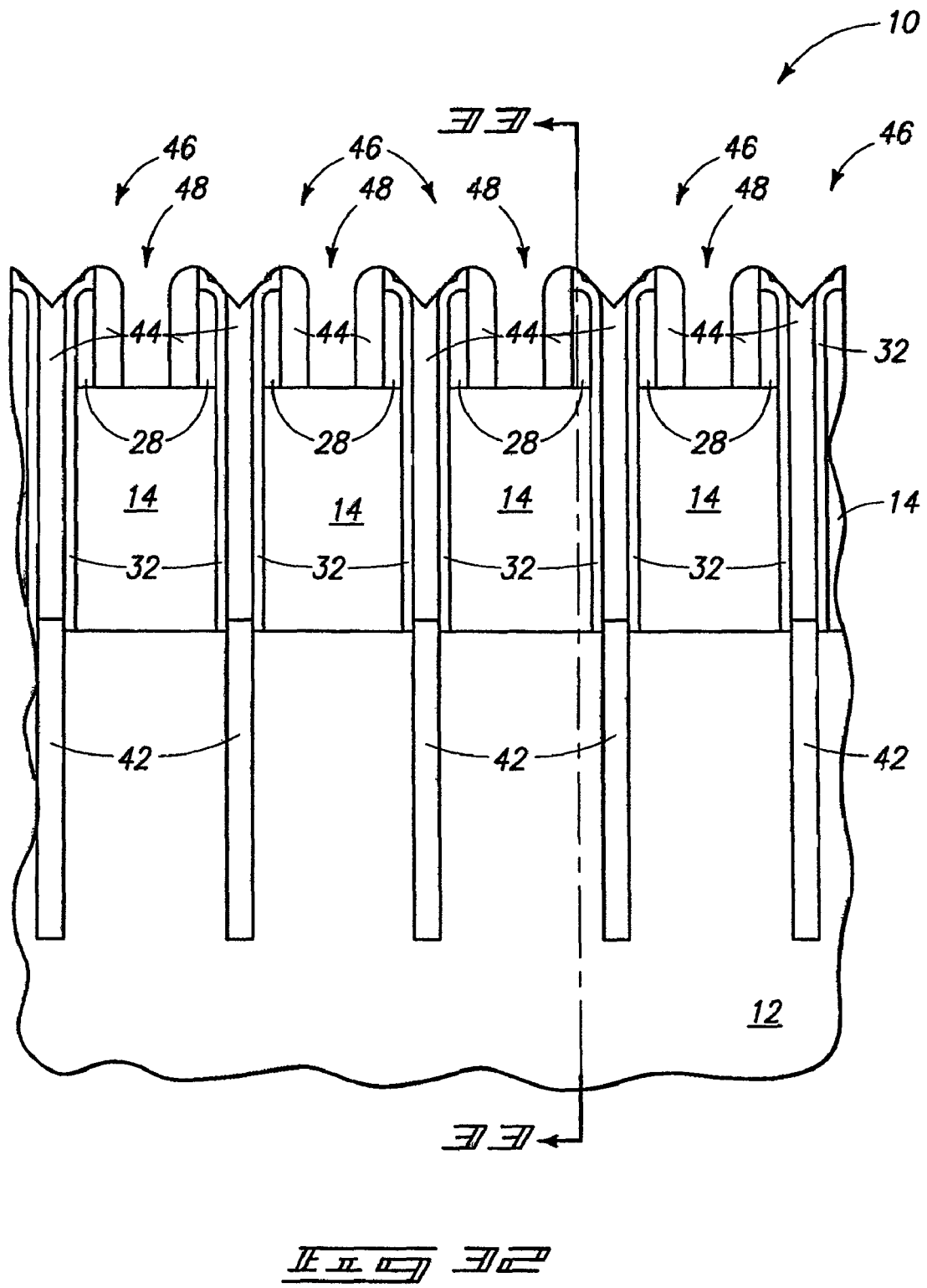
Figure 33:
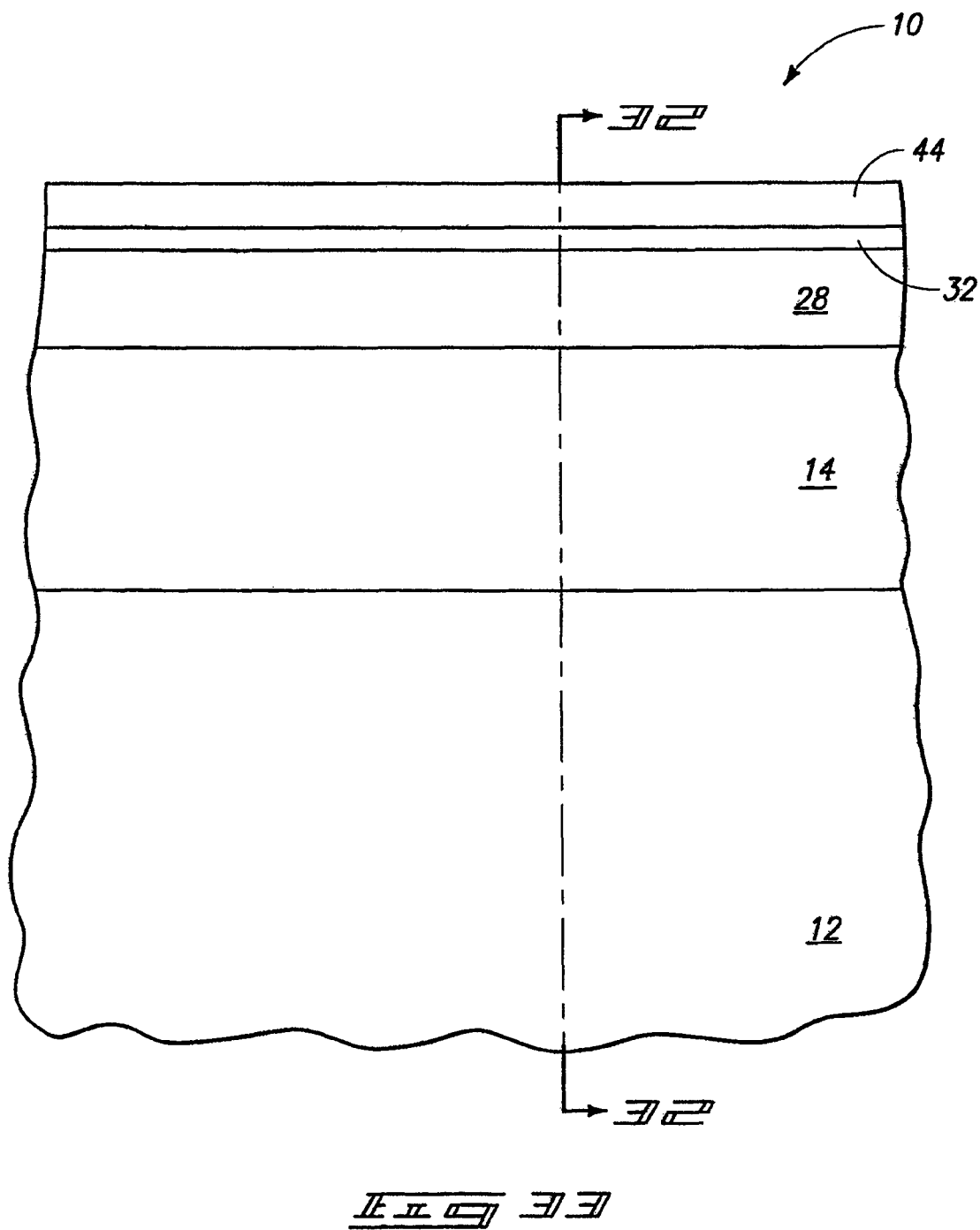

Referring next to FIGS. 31-33, material 44 is subjected to an appropriate etch to form spaced pillars 46. The pillars 46 extend over material 14. Gaps 48 are between the spaced pillars and separate the pillars from one another. Gaps 48 are over oxide material 14, with each gap extending horizontally linearly along a horizontally-extending line of the oxide material 14. Gaps 48 can be referred to as second gaps to distinguish the gaps from the gaps 22 discussed previously.

Figure 34:
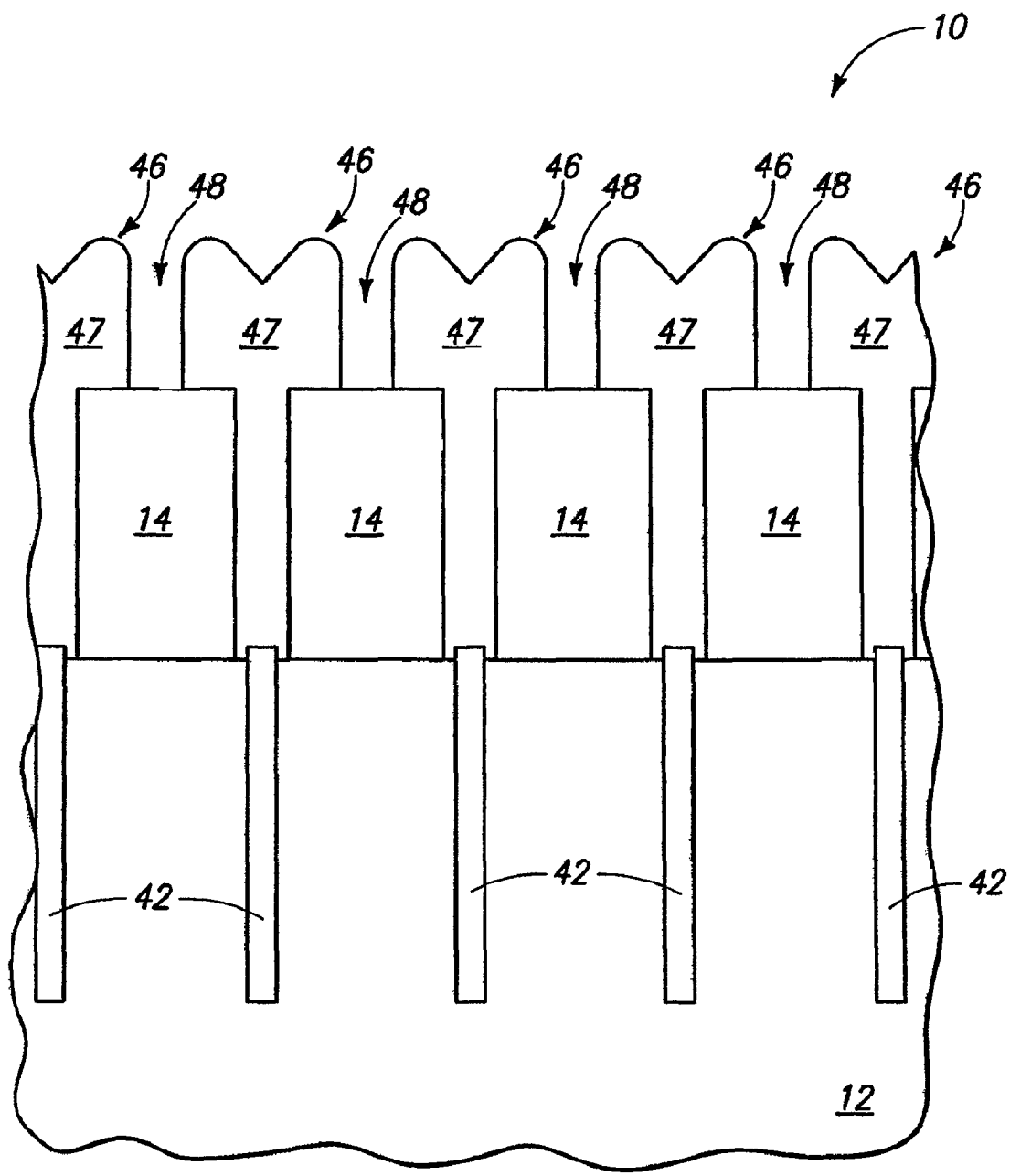
FIG. 34 is a diagrammatic, cross-sectional side view of the construction of FIG. 32 drawn to show structures typically comprising the same composition as one another merged into a single structure to simplify the drawing. The diagrammatic representation of FIG. 34 is utilized in the figures following FIG. 34.

Referring next to FIG. 34, such shows construction 10 at the processing stage of FIG. 32, but shows components which are typically of similar composition to one another merging into single components. Specifically, the materials 28, 32 and 44 would typically all consist essentially of the same composition as one another (such as, for example, silicon nitride), and accordingly pillars 46 would homogeneously comprise a single material. FIG. 34 thus shows the pillars 46 comprising the same homogeneous material, with such material being indicated by the label 47. The representation of FIG. 34 will be used in the drawings that follow in order to simplify the drawings, but it is to be understood that the aspect represented by FIG. 34 is but one aspect of the invention, and the invention encompasses other aspects in which the materials 28, 32 and 44 are not all the same composition as one another.

Figure 35:
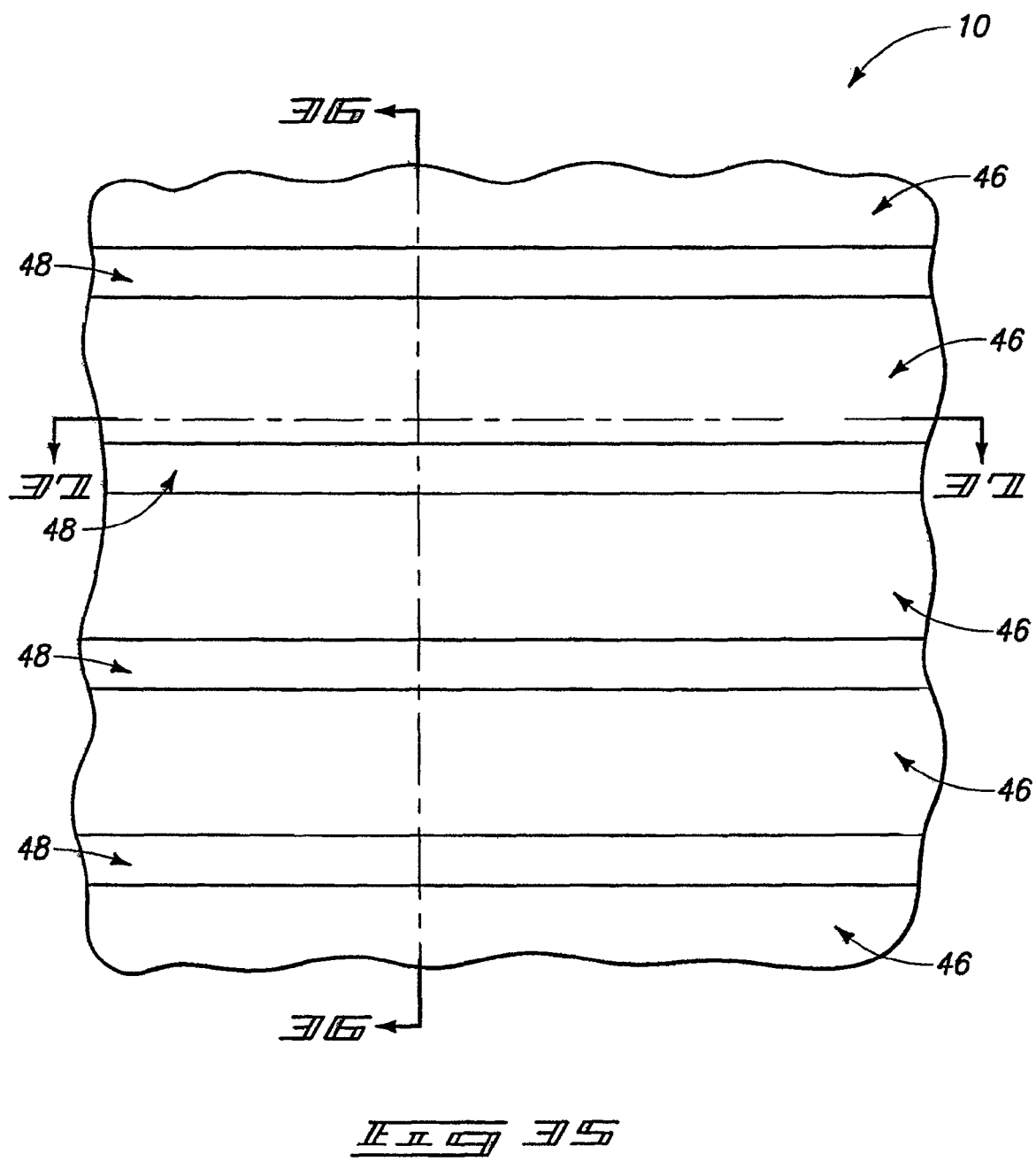
Figure 36:
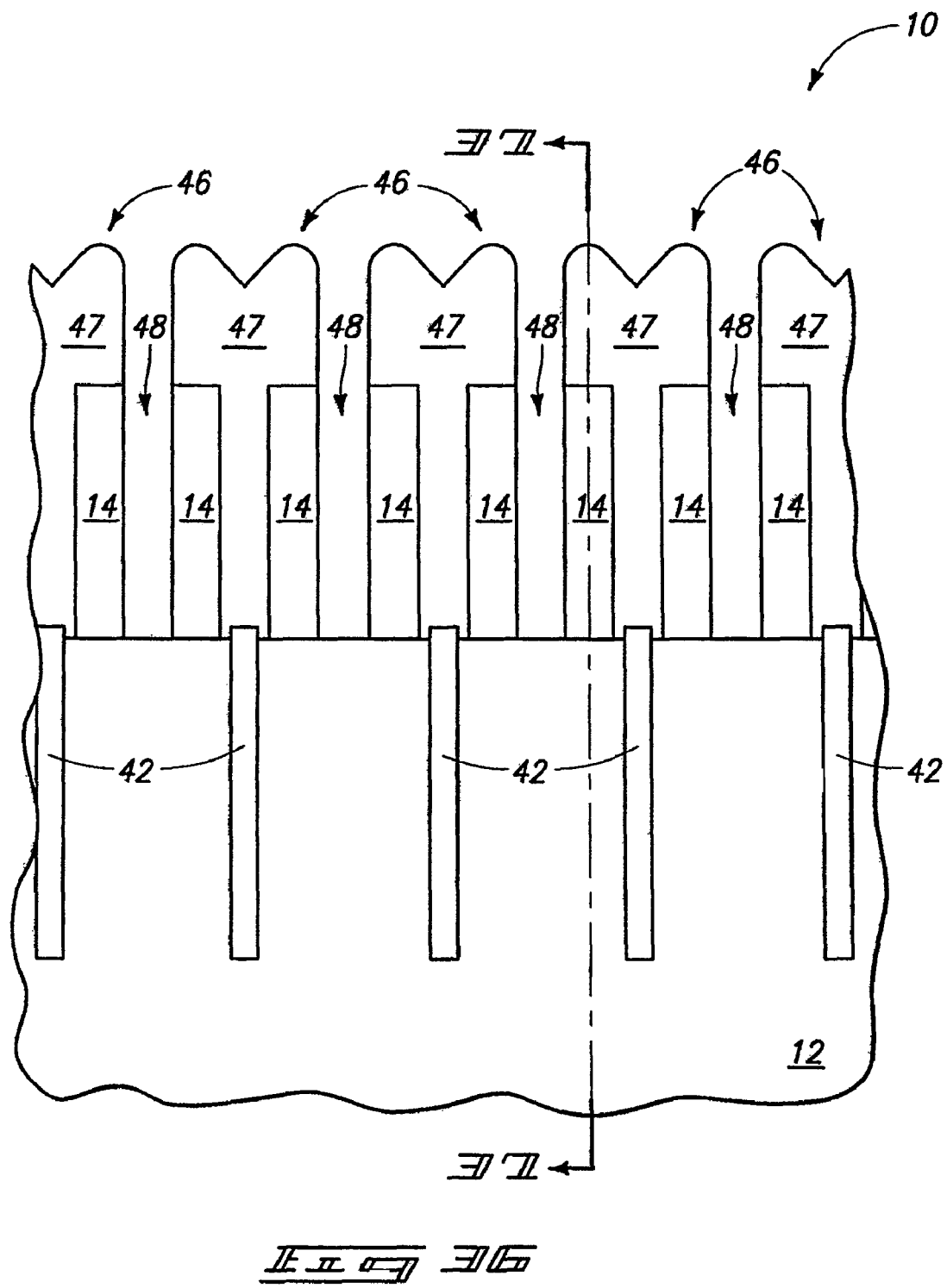

Referring next to FIGS. 35-37, gaps 48 are extended through material 14 with a suitable etch. In exemplary aspects, material 14 can consist essentially of silicon dioxide and material 47 can consist essentially of silicon nitride, and the etch can be a dry etch selective for silicon dioxide relative to silicon nitride. In some aspects of the invention, the processing described herein is utilized to form a DRAM array. In such aspects, it can be desired to protect a region peripheral to the array with photoresist or other suitable protective material during the etch utilized to extend openings 48 to substrate 12.

Figure 38:
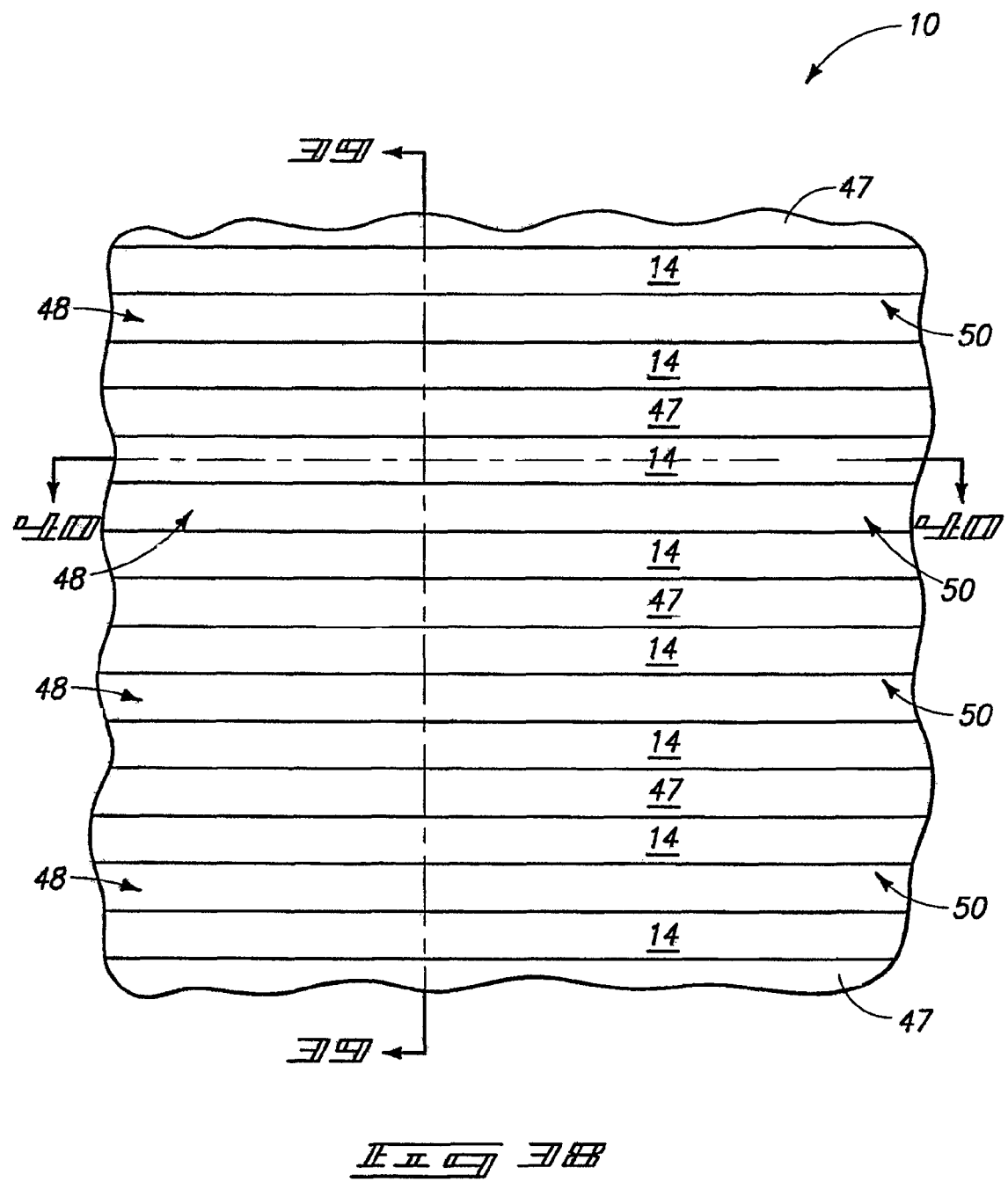
FIGS. 38-40 are a fragmentary, diagrammatic top view and cross-sectional side views of the construction of FIGS. 1-3 shown at processing stage subsequent to that of FIGS. 35-37.
Figure 39:
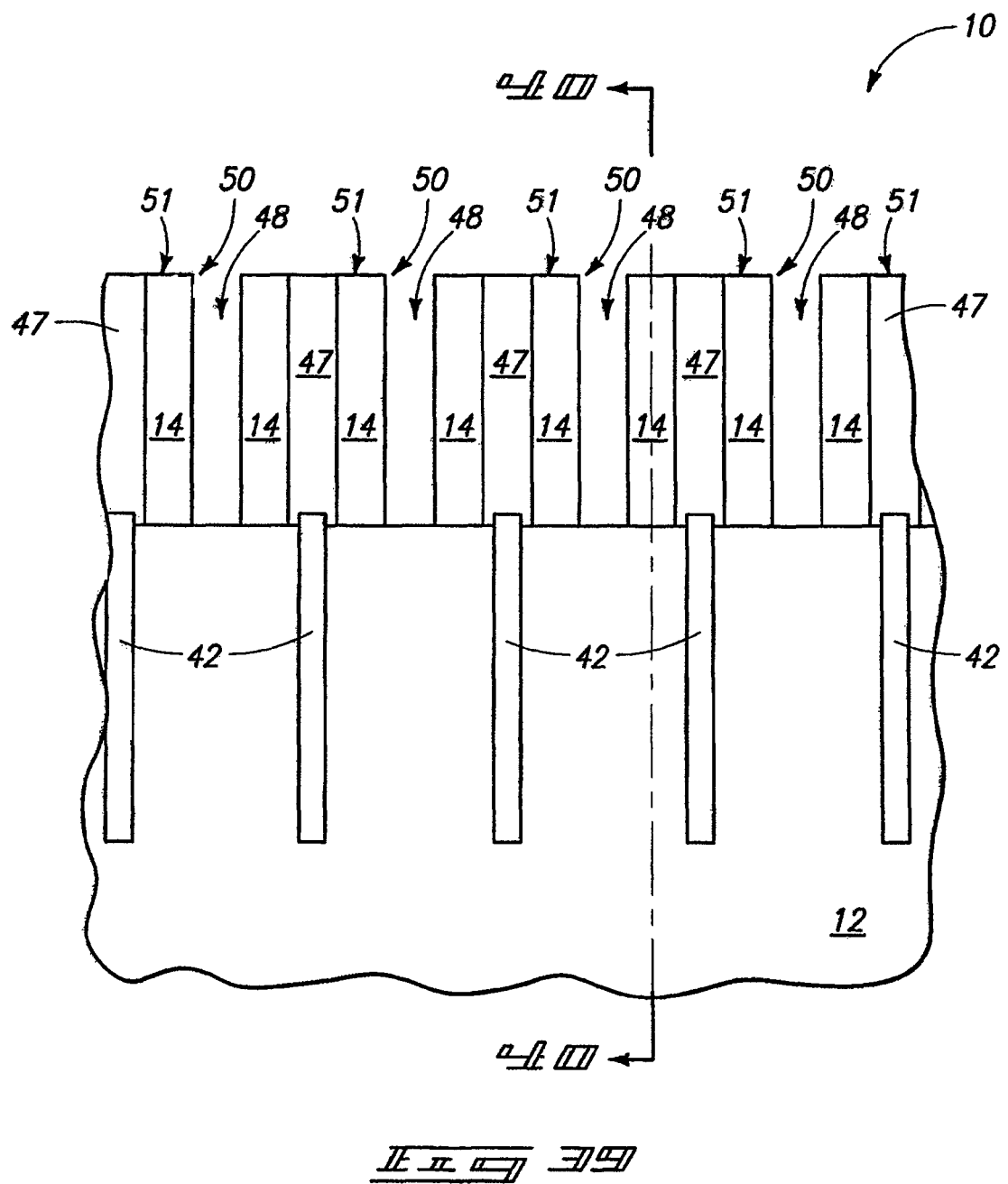
Figure 40:
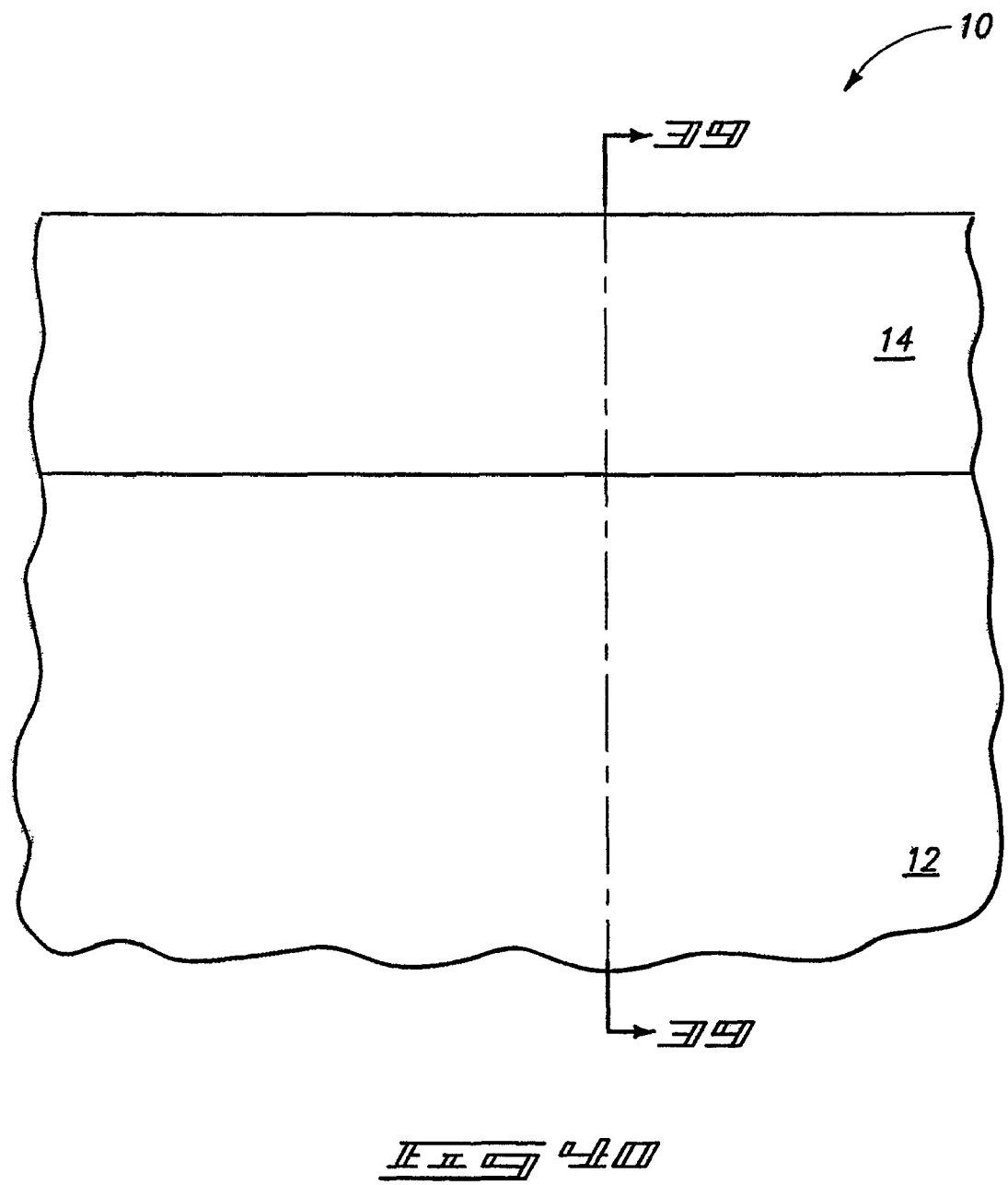

Referring next to FIGS. 38-40, construction 10 is subjected to planarization (such as, for example, chemical-mechanical polishing) to planarize an upper surface of the construction. Such planarization removes material 47 from over material 14 to create resultant pillars 50 comprising planarized upper surfaces 51. Each of the pillars comprises a single line of material 47 sandwiched between a pair of lines of material 14. The lines extend along the horizontal direction, as can be seen in FIG. 38. The pillars 50 are separated from one another by the gaps 48.

Although upper surface 51 is shown at about the same elevational location as the original upper surface of material 14, it is to be understood that the planarization can remove some of material 14 so that surface 51 is below the original surface of 14 in some aspects of the invention. The height of the pillars 50 remaining after the chemical-mechanical polishing can be, in some aspects of the invention, about 5500 Å.

Figure 41:
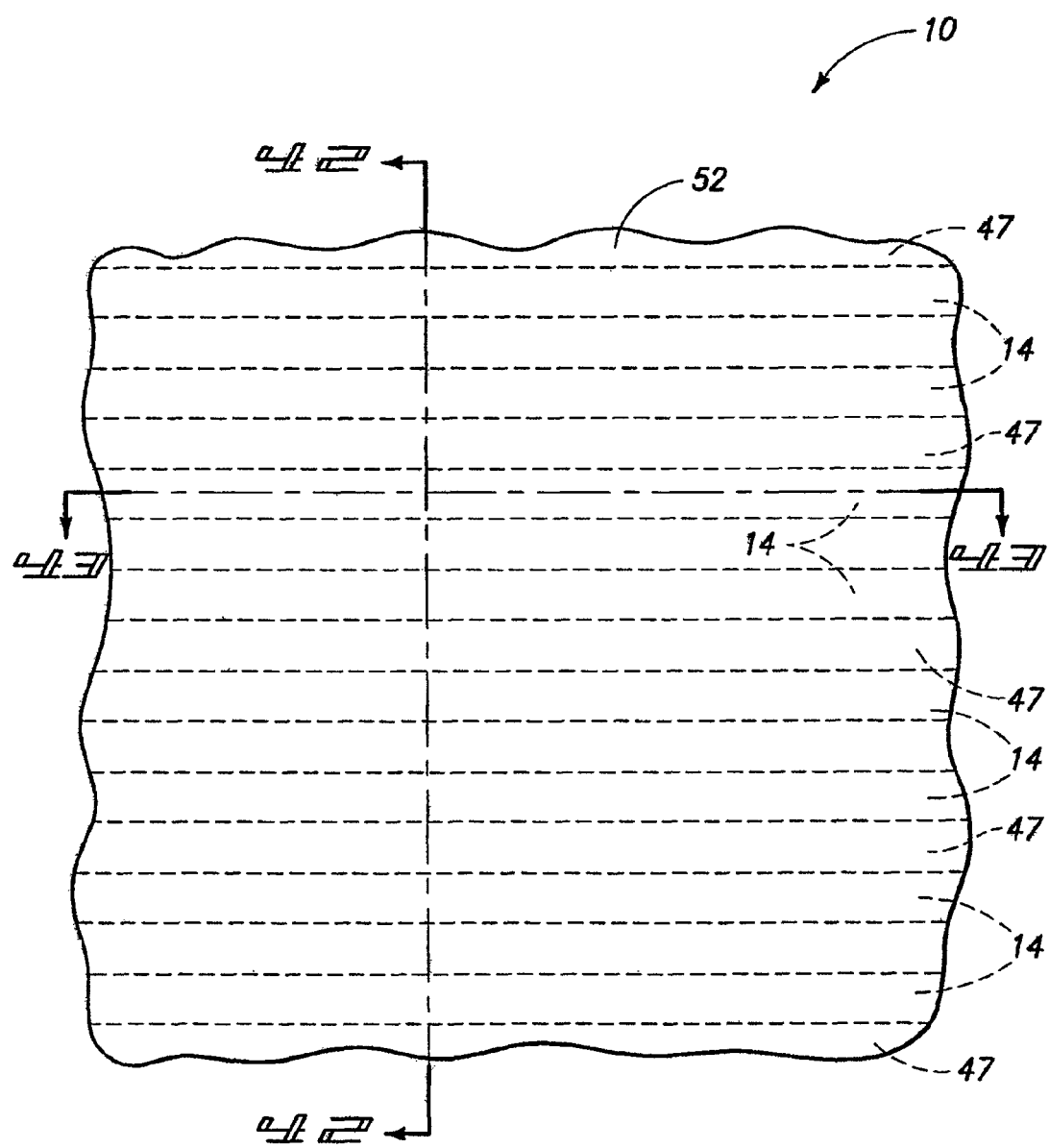
FIGS. 41-43 are a fragmentary, diagrammatic top view and cross-sectional side views of the construction of FIGS. 1-3 shown at a processing stage subsequent to that of FIGS. 38-40.
Figure 42:
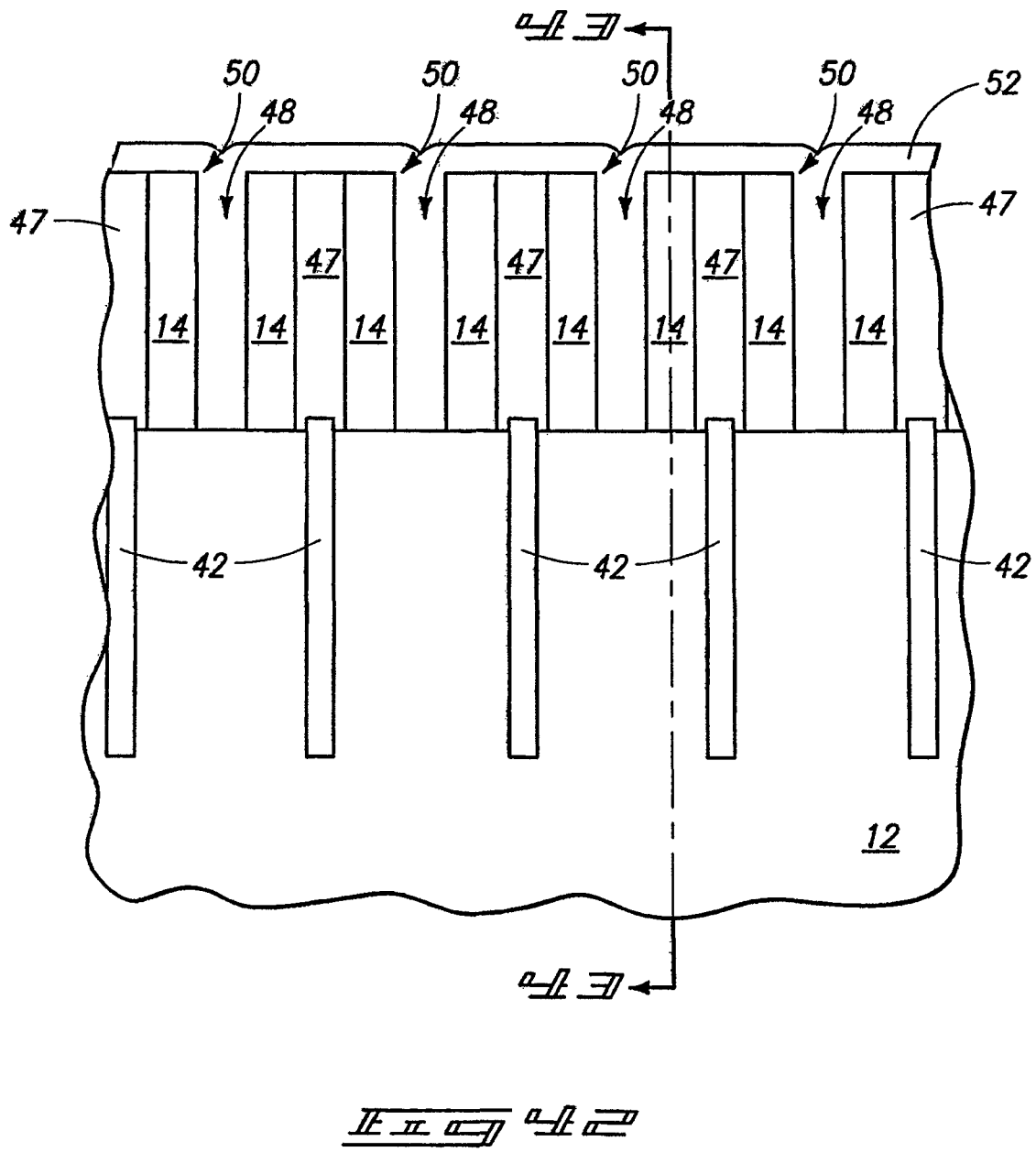
Figure 43:
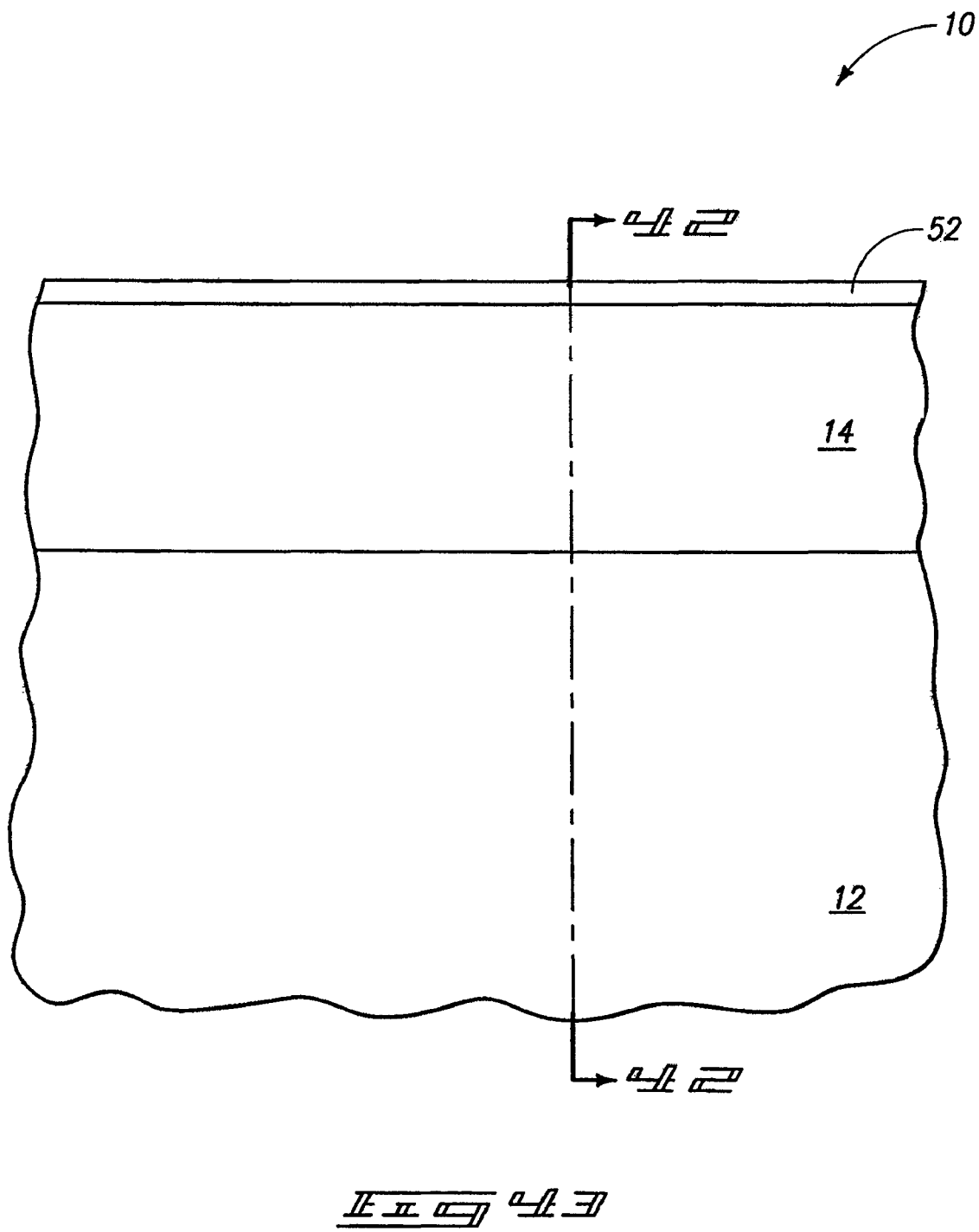

Referring next to FIGS. 41-43, a material 52 is deposited within gaps 48, and over pillars 50 (the pillars can also be referred to as lines, in that the pillars extend longitudinally in the horizontal direction). Material 52 can, for example, comprise, consist essentially of, or consist of a nitride-containing material, such as, for example, silicon nitride. In particular aspects of the invention, material 52 is provided to a thickness of about 200 Å, which is sufficient to completely fill gaps 48. Layers 14 and 47 are shown in dashed-line view in FIG. 41 to indicate that such layers are beneath the material 52.

In particular aspects of the invention, materials 52 and 47 will comprise the same composition as one another, and accordingly will merge into a single structure. Such aspects are shown in FIG. 44, in which a single material 53 represents the combination of materials 52 and 47. Material 53 can, for example, comprise, consist essentially of, or consist of silicon nitride. The aspect of FIG. 44 will be utilized in the drawings following FIG. 44 in order to simply the drawings. Accordingly, the drawings will utilize composition 53 in place of the compositions 47 and 52 (FIG. 42). However, it is to be understood that the invention encompasses aspects in which compositions 47 and 52 differ from one another. There is a repeating pattern in FIG. 44 comprised by pedestals 14 and the material 53 in the gaps between the pedestals, with such pattern defining a pitch 55 comprising the distance of one gap and one of the pedestals 14.

Figure 45:
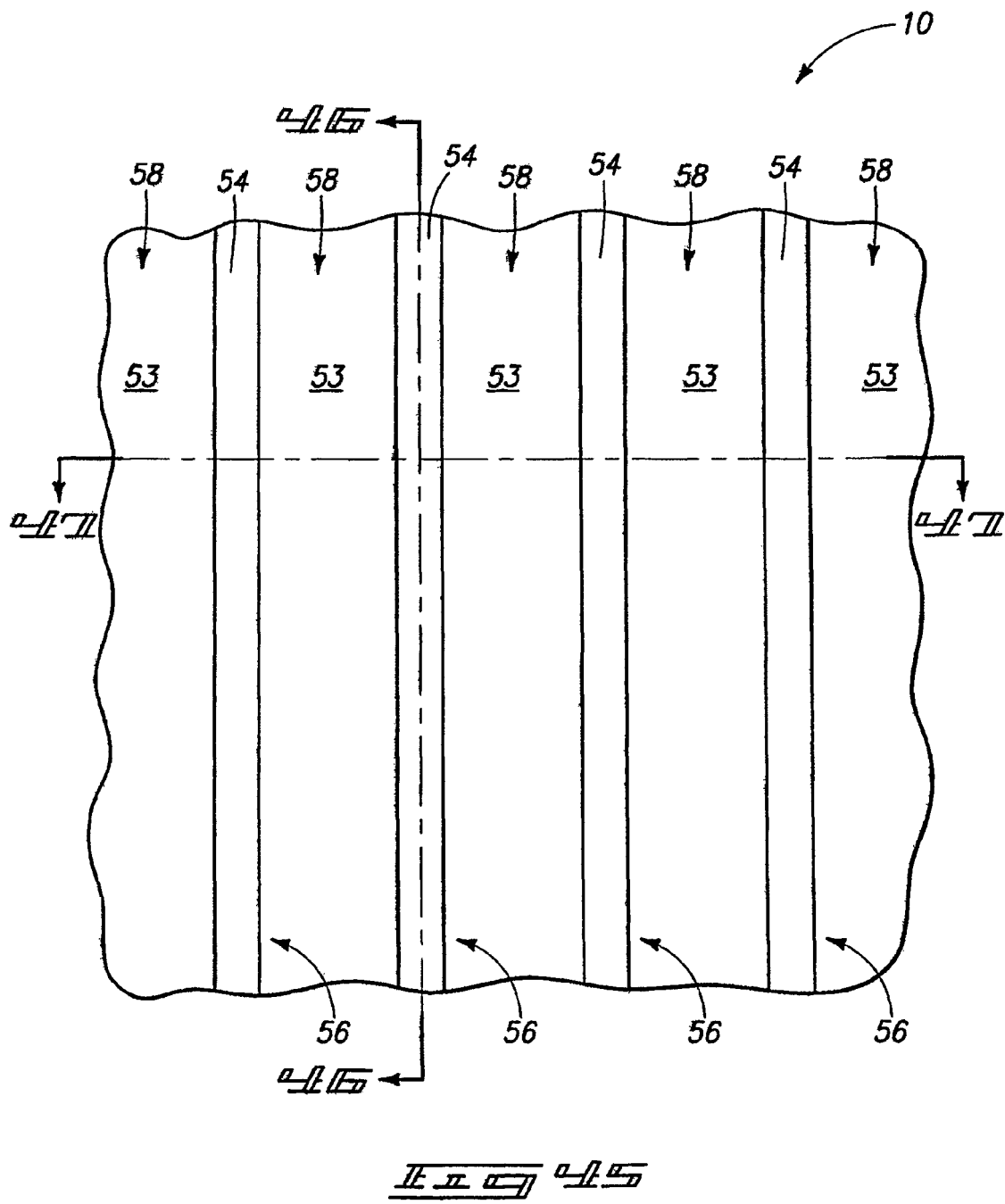
Figure 47:
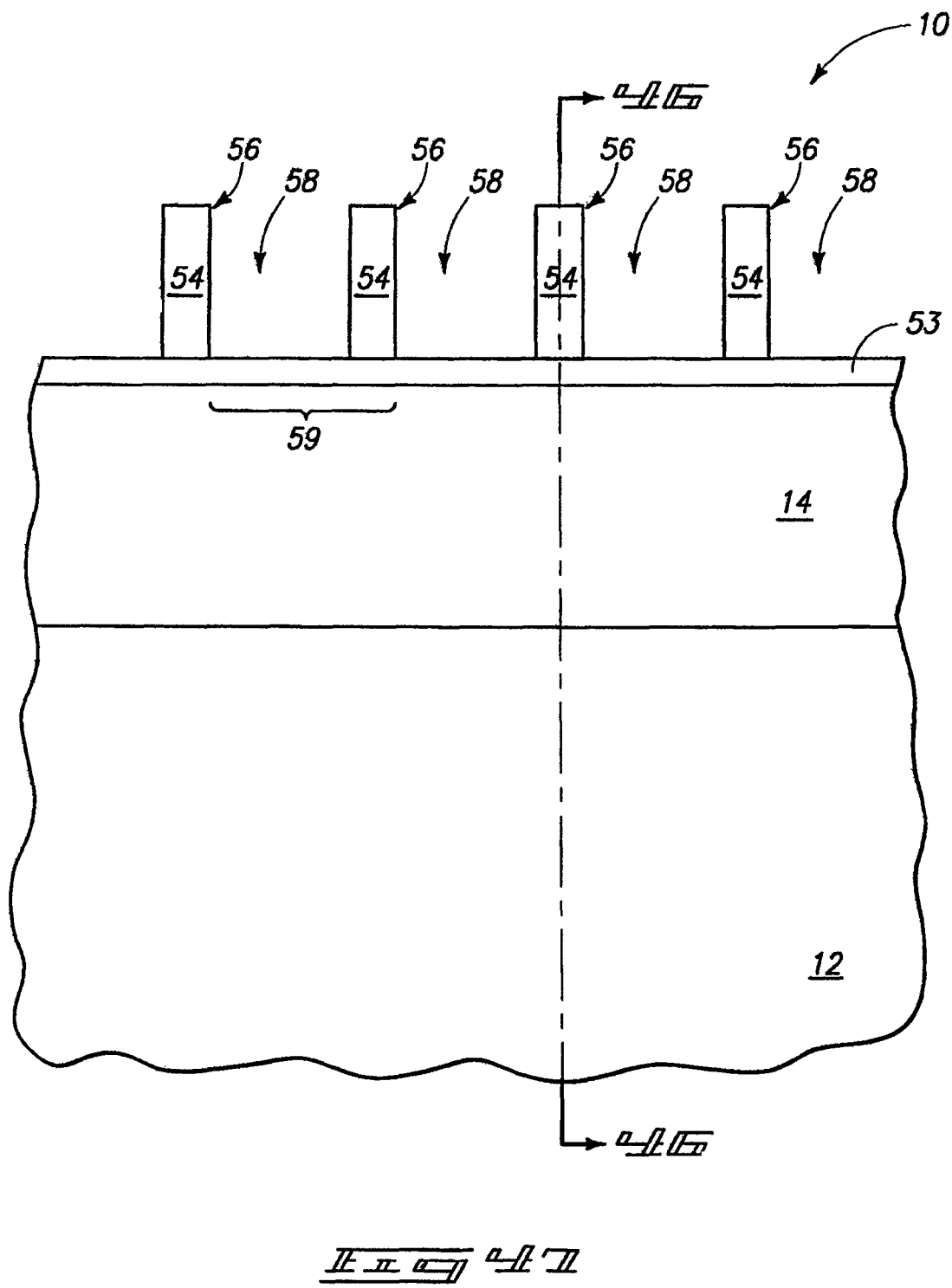

Referring to FIGS. 45-47, a patterned masking material 54 is provided over material 53. Masking material 54 can comprise, for example, photoresist, and accordingly can be patterned by photolithographic processing. Patterned material 54 comprises a plurality of vertically-extending lines 56 which are spaced from one another by gaps 58.

The lines 56 and spaces 58 form a repeating pattern, with such pattern having a pitch 59 defined as the distance of one gap 58 and one line 56. In particular aspects of the invention, the pitch 59 and the pitch 19 (FIG. 5) will be about the same as one another, and the pitch 55 (FIG. 44) will be about one-half of the pitches 19 and 59.

Figure 48:
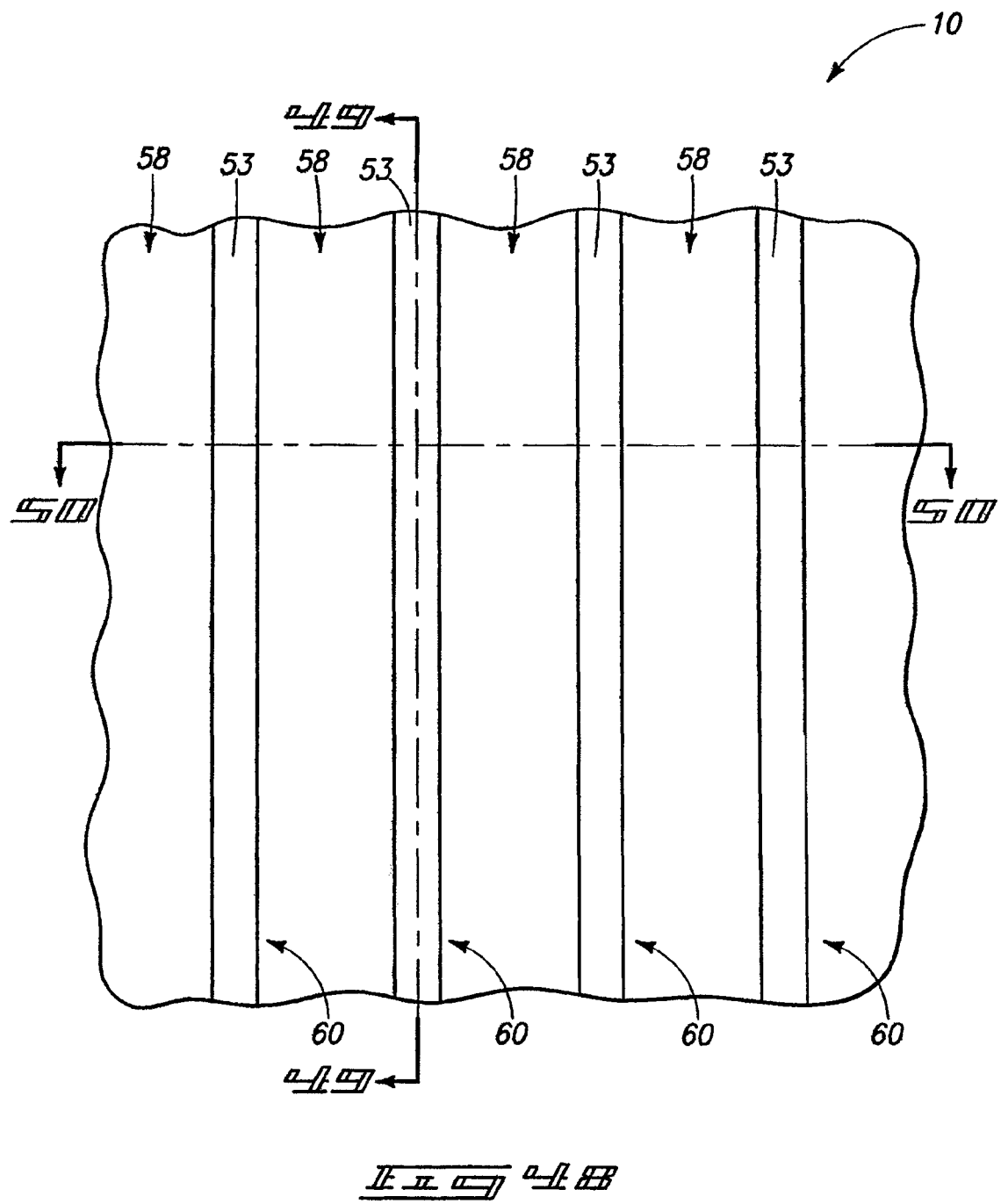
Figure 50:
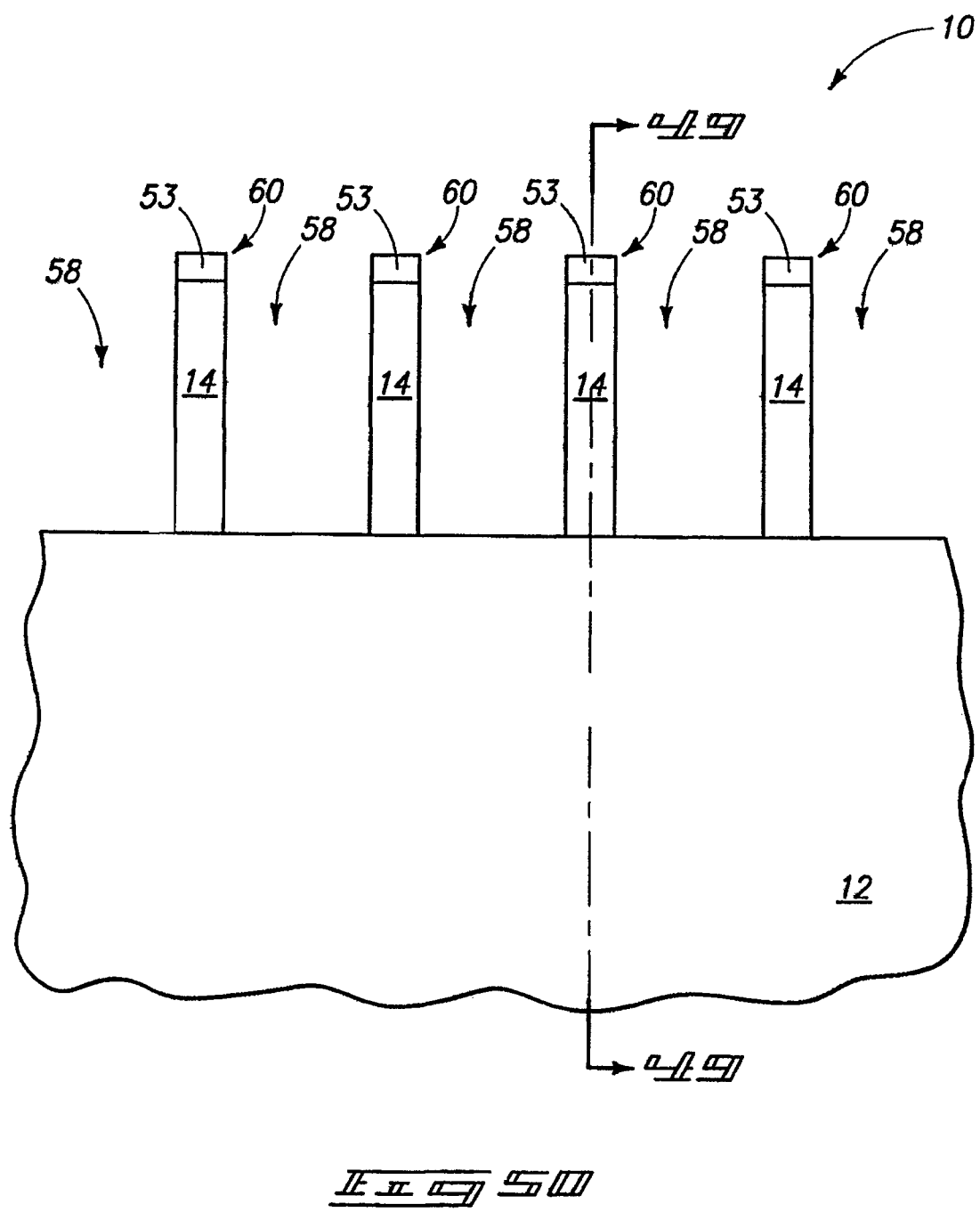

Referring next to FIGS. 48-50, gaps 58 are extended through materials 53 and 14, and subsequently masking layer 54 (FIGS. 45-47) is removed. Such forms vertically-extending lines 60 from materials 14 and 53. Such lines can be considered to be separated from one another by vertically-extending trenches corresponding to the openings 58.

Figure 51:
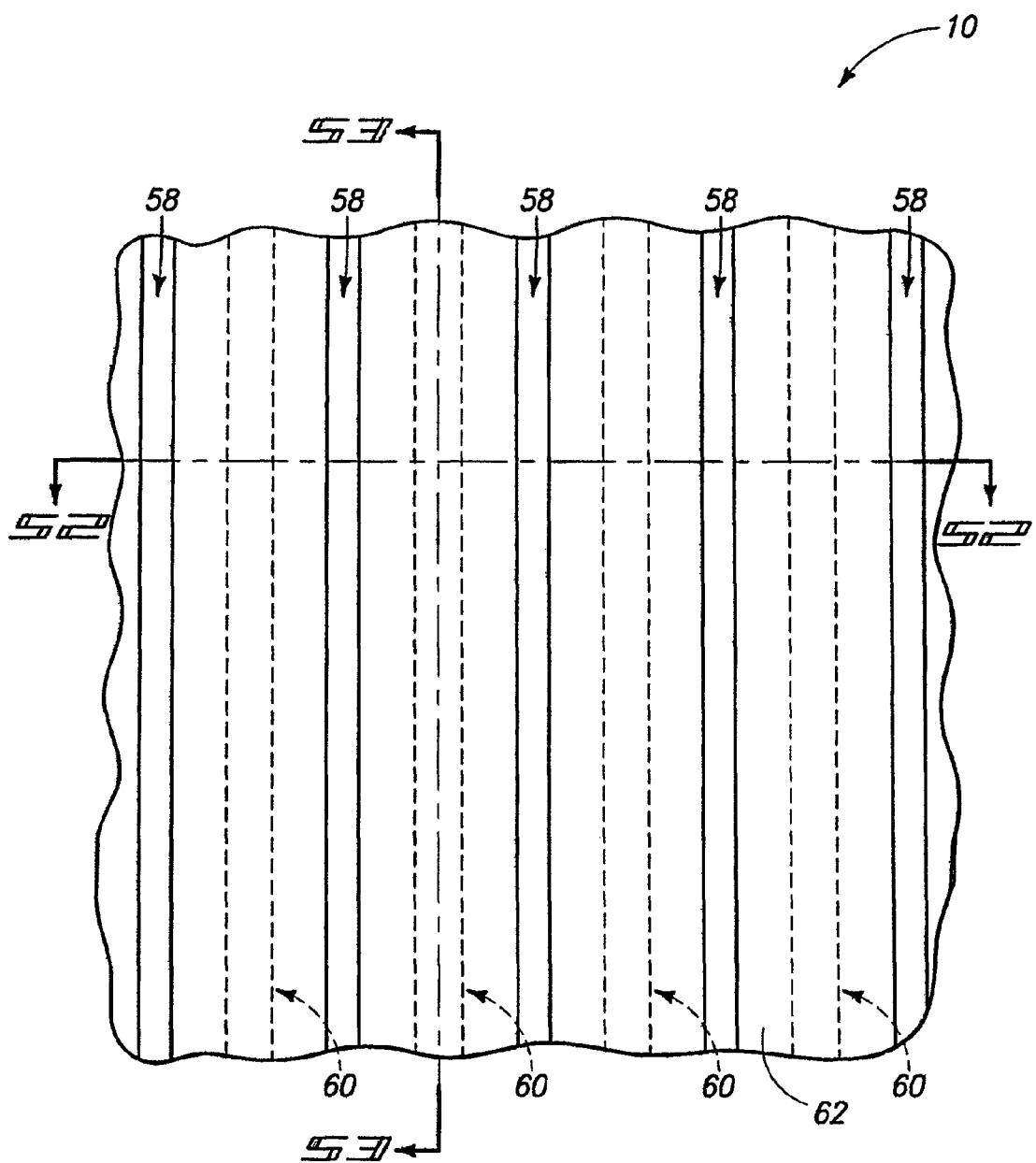
FIGS. 51-53 are a fragmentary, diagrammatic top view and cross-sectional side views of the construction of FIGS. 1-3 shown at a processing stage subsequent to that of FIGS. 48-50.
Figure 52:
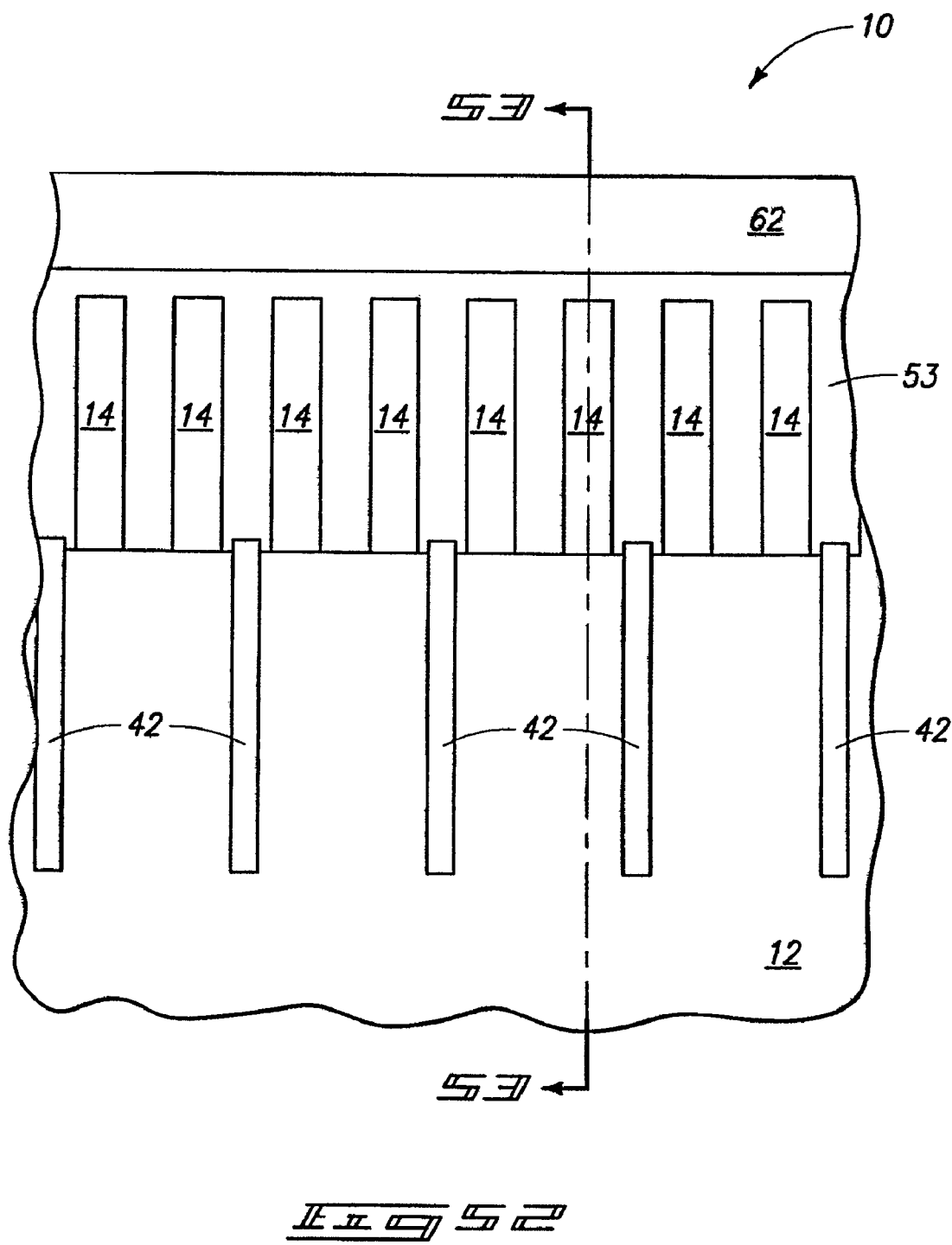
Figure 53:
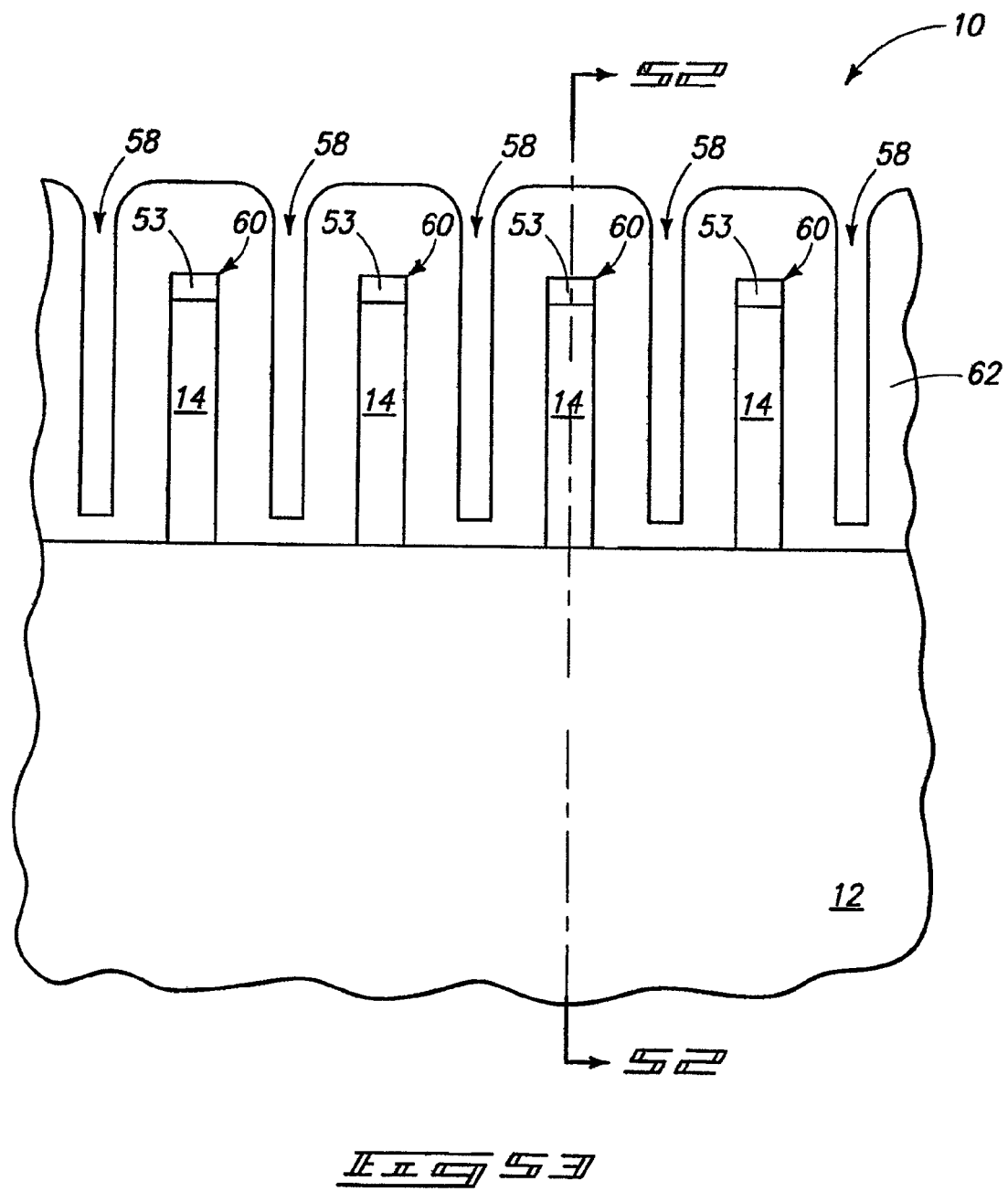

Referring next to FIGS. 51-53, a material 62 is provided over lines 60 and within gaps 58. Material 62 can, for example, comprise, consist essentially of, or consist of silicon nitride, and can be formed to a thickness of about 375 Å. Material 62 partially fills gaps 58 to narrow the gaps. Lines 60 are shown in dashed-line view in FIG. 51 to indicate that the lines are beneath material 62.

Figure 54:
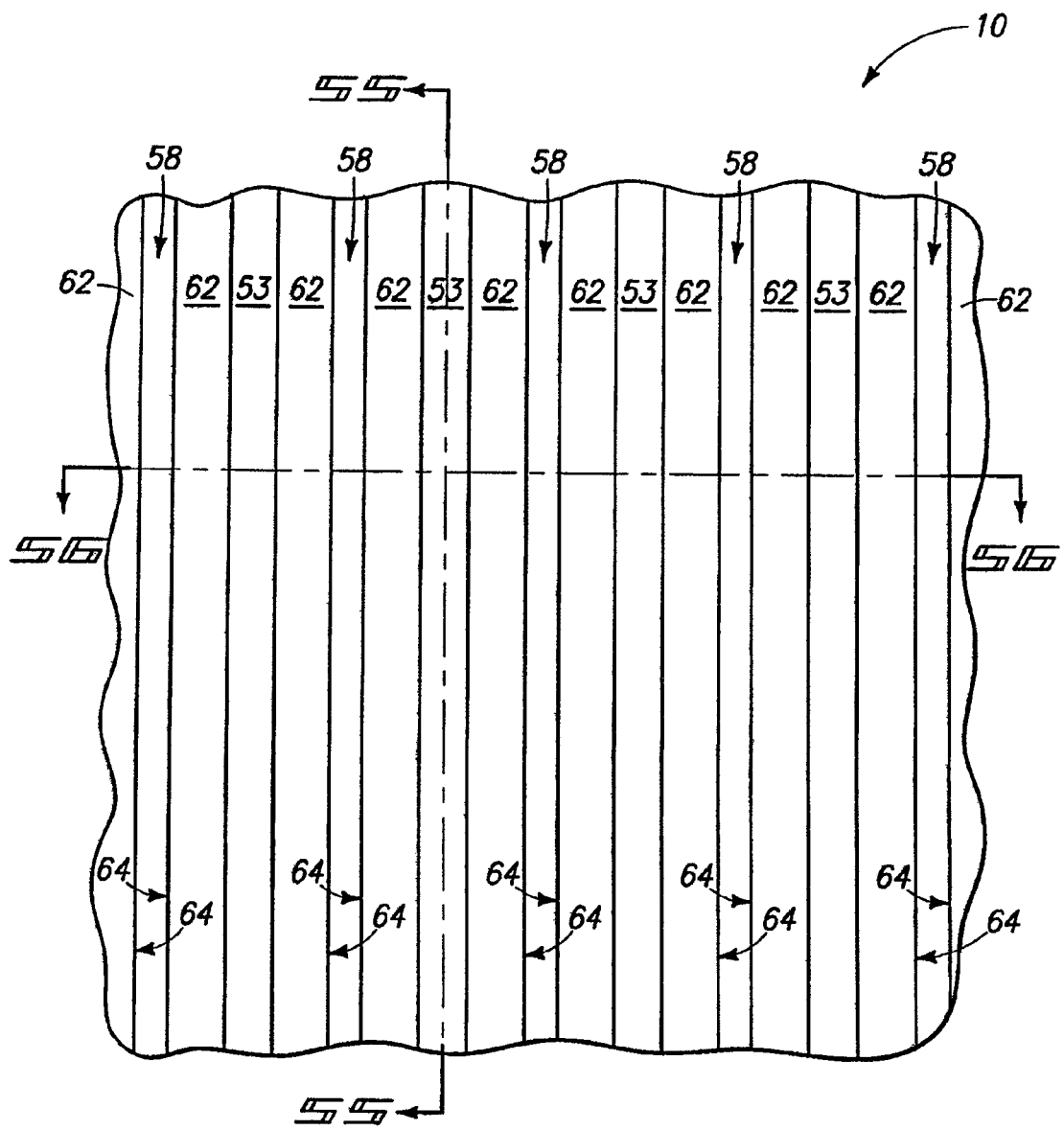
FIGS. 54-56 are a fragmentary, diagrammatic top view and cross-sectional side views of the construction of FIGS. 1-3 shown at a processing stage subsequent to that of FIGS. 51-53.
Figure 55:
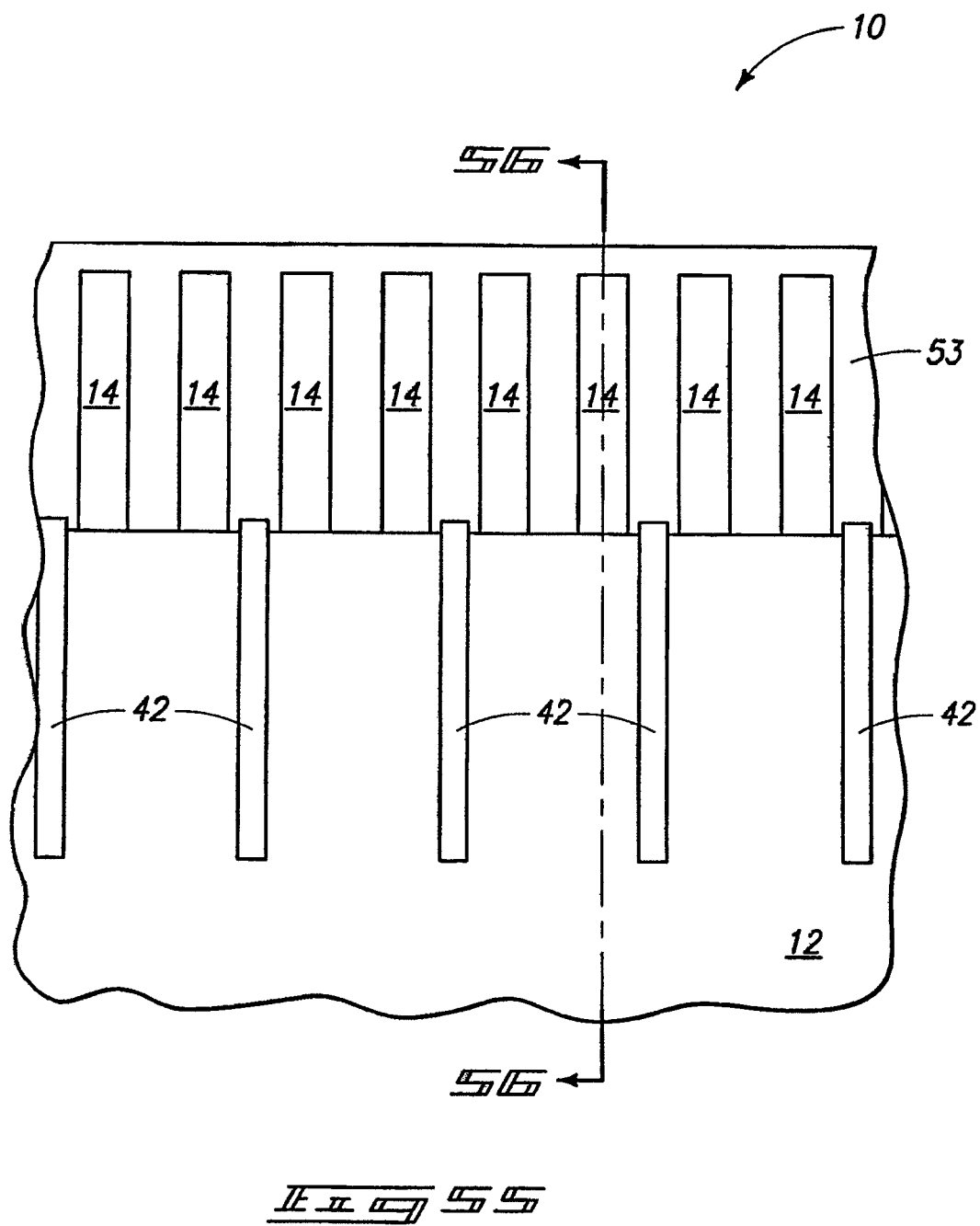
Figure 56:
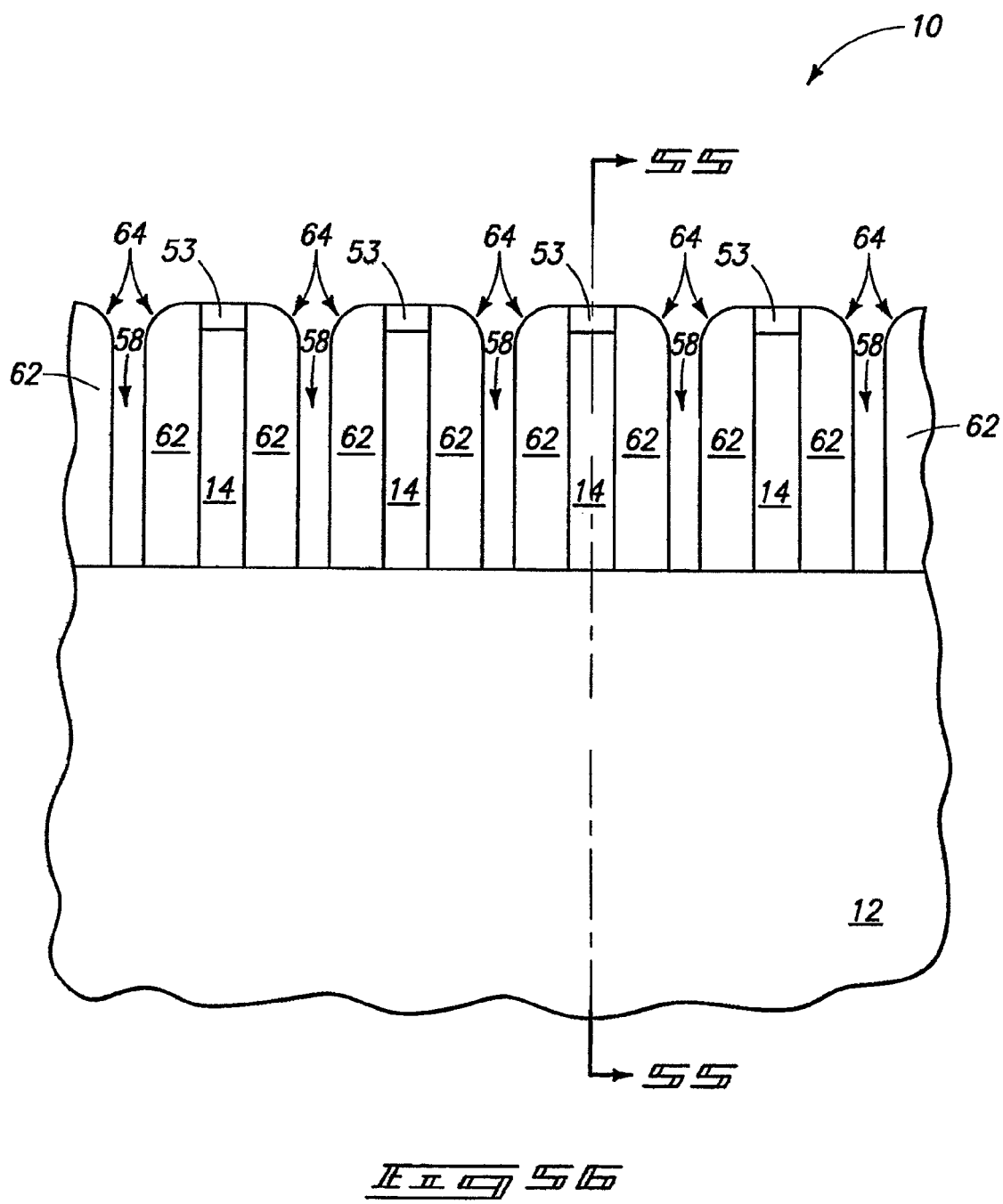

Referring next to FIGS. 54-56, material 62 is anisotropically etched to form spacers 64. After formation of spacers 64, gaps 58 extend between the spacers to an upper surface of substrate 12.

Figure 57:
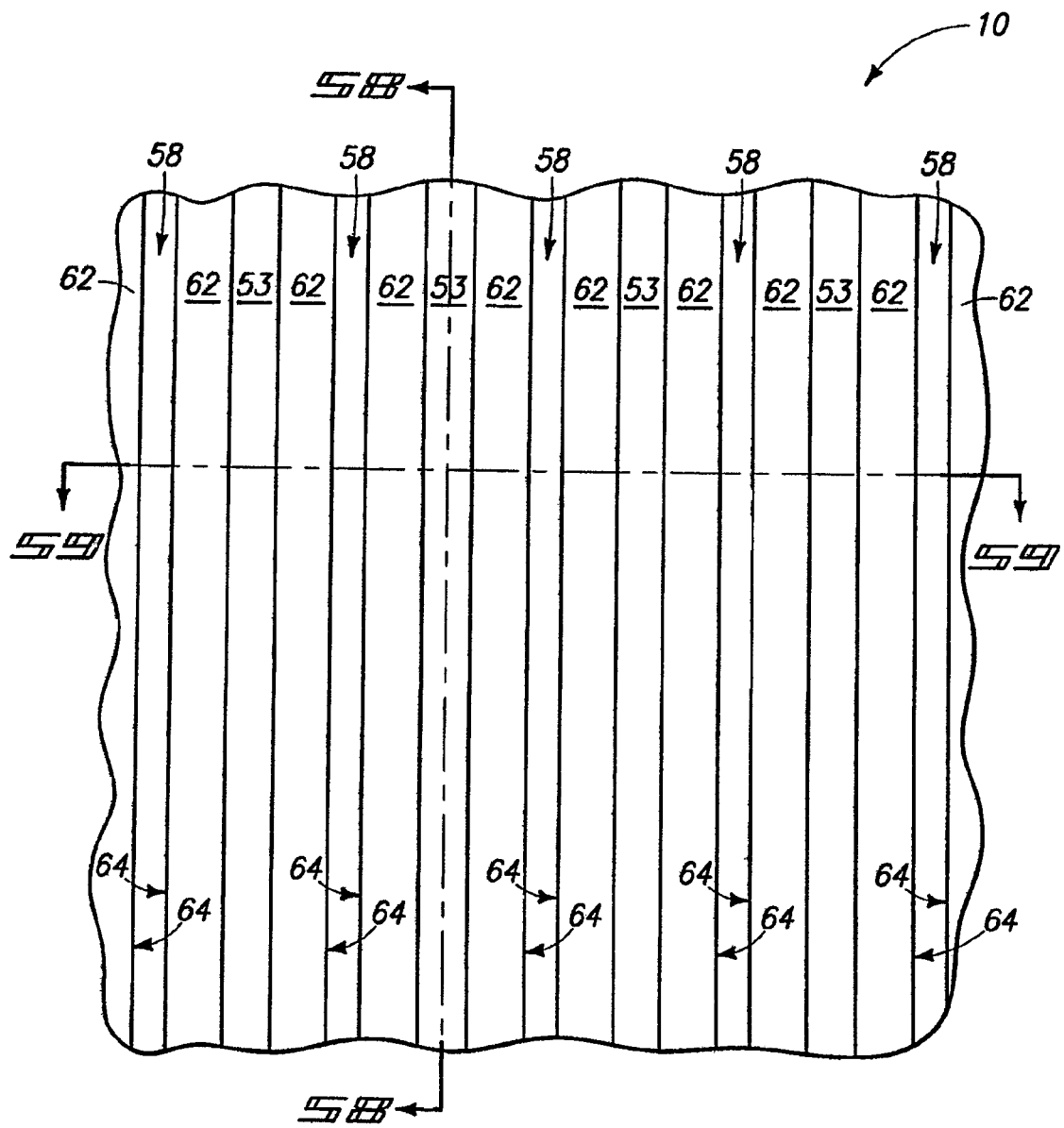
FIGS. 57-59 are a fragmentary, diagrammatic top view and cross-sectional side views of the construction of FIGS. 1-3 shown at a processing stage subsequent to that of FIGS. 54-56.
Figure 58:
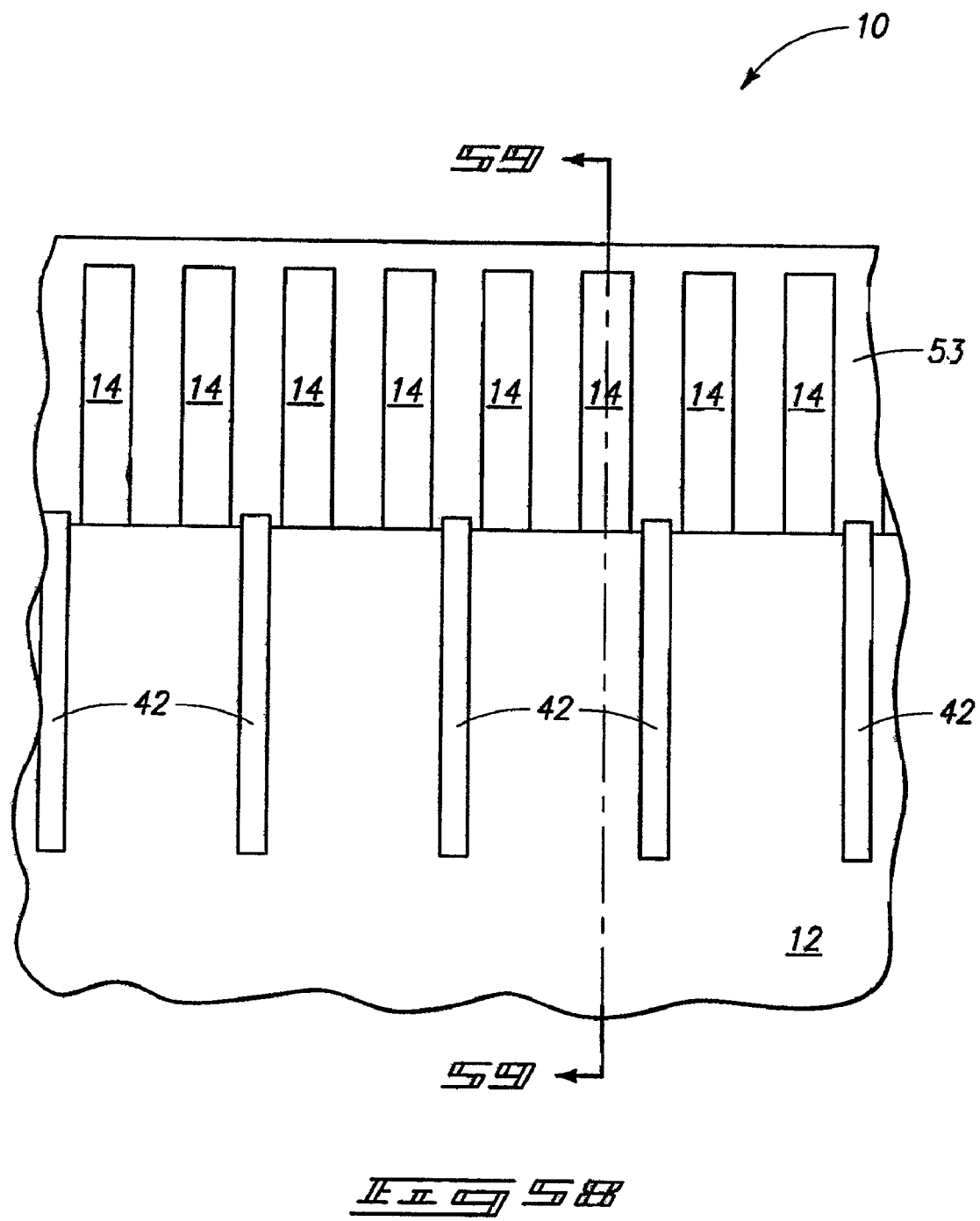
Figure 59:
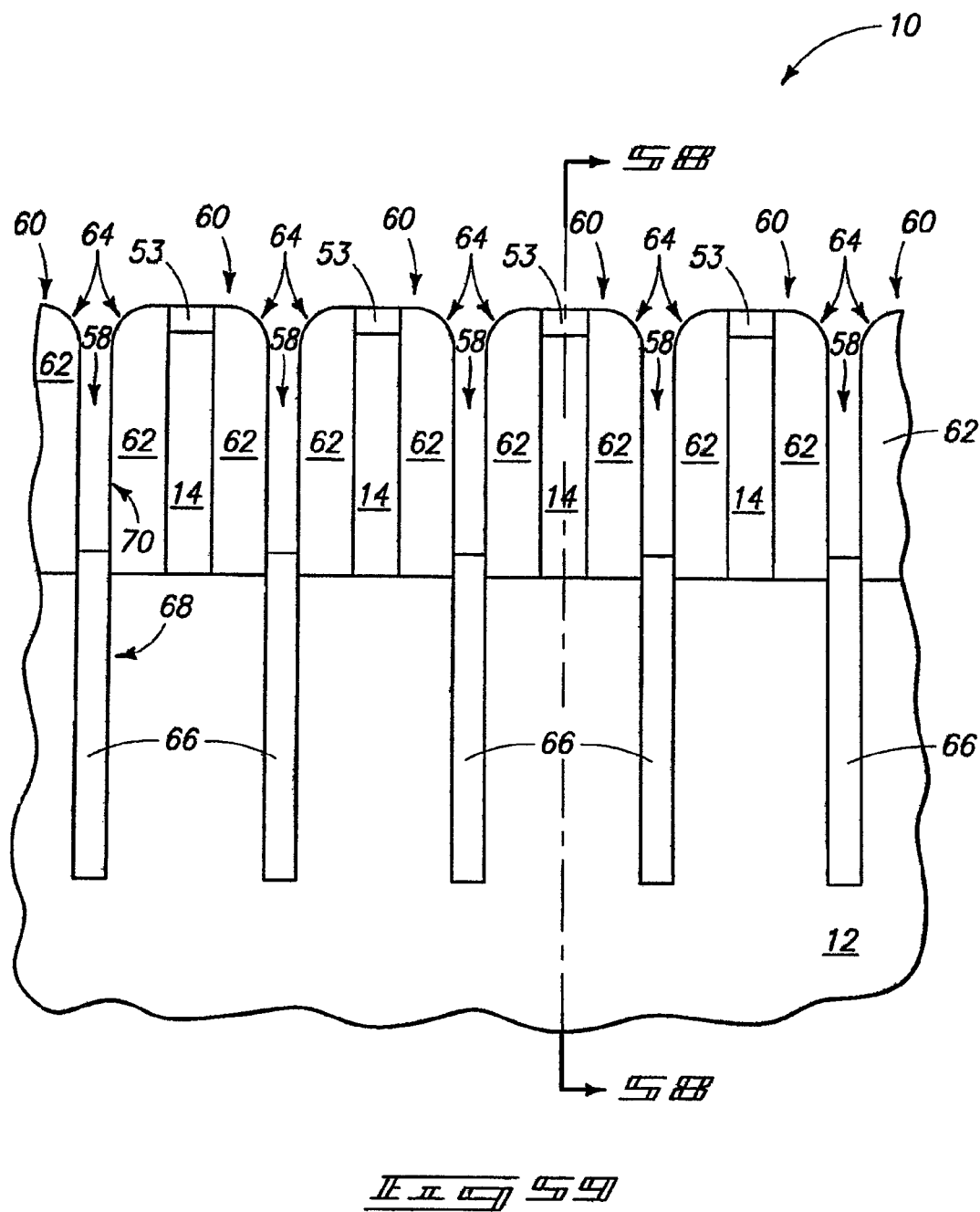

Referring next to FIGS. 57-59, openings 58 are extended into substrate 12 and subsequently a dielectric material 66 is formed within the openings. The openings can be extended into substrate 12 to a depth of, for example, about 2000 Å. Dielectric material 66 can comprise, for example, silicon dioxide, and in applications in which substrate 12 comprises monocrystalline silicon can be formed by oxidizing silicon. The openings 58 can be considered to considered to comprise a lower portion 68 and an upper portion 70, with the lower portion 68 being filled with dielectric material 66 and the upper portion 70 not being filled.

Figure 60:
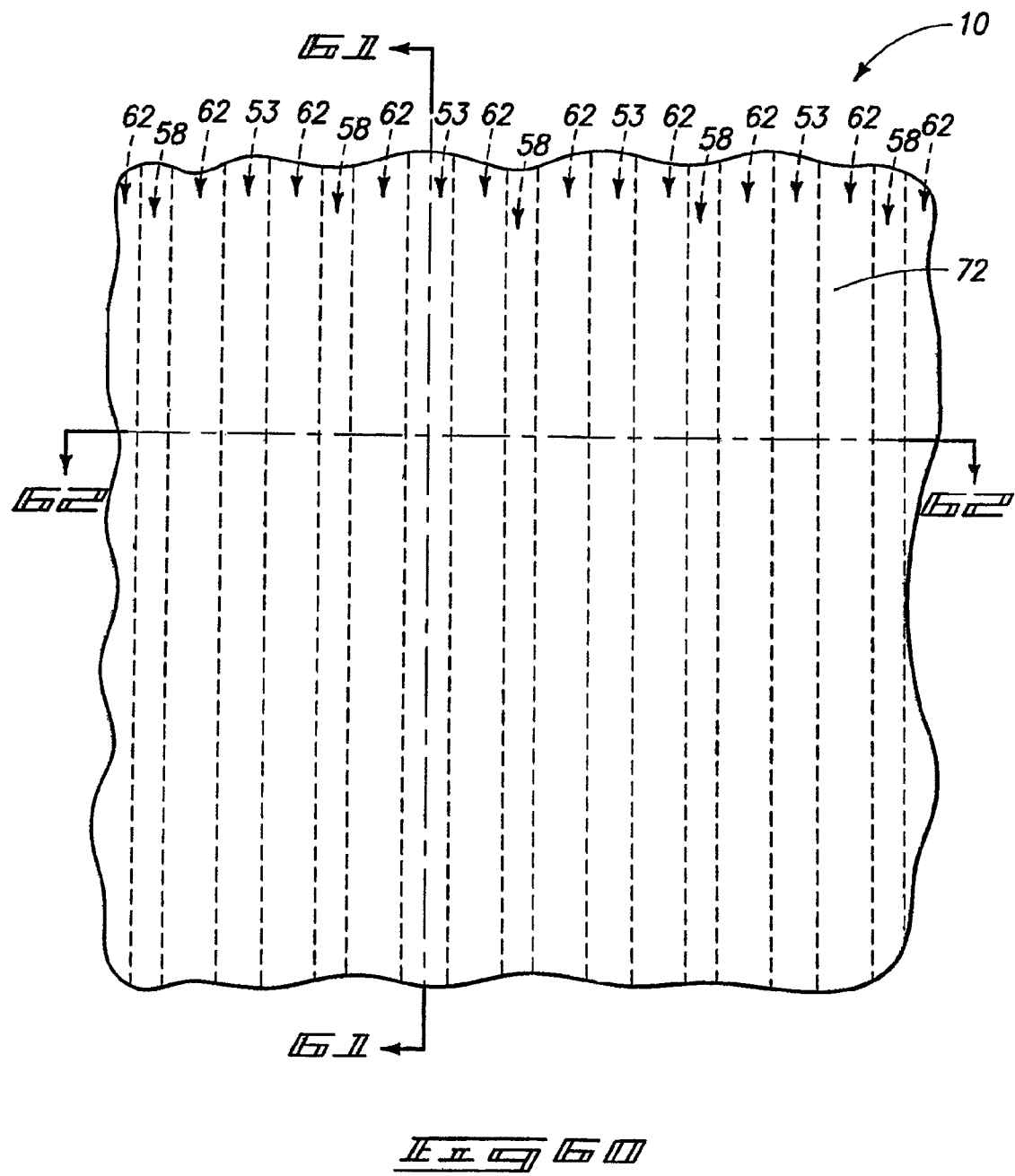
Figure 61:
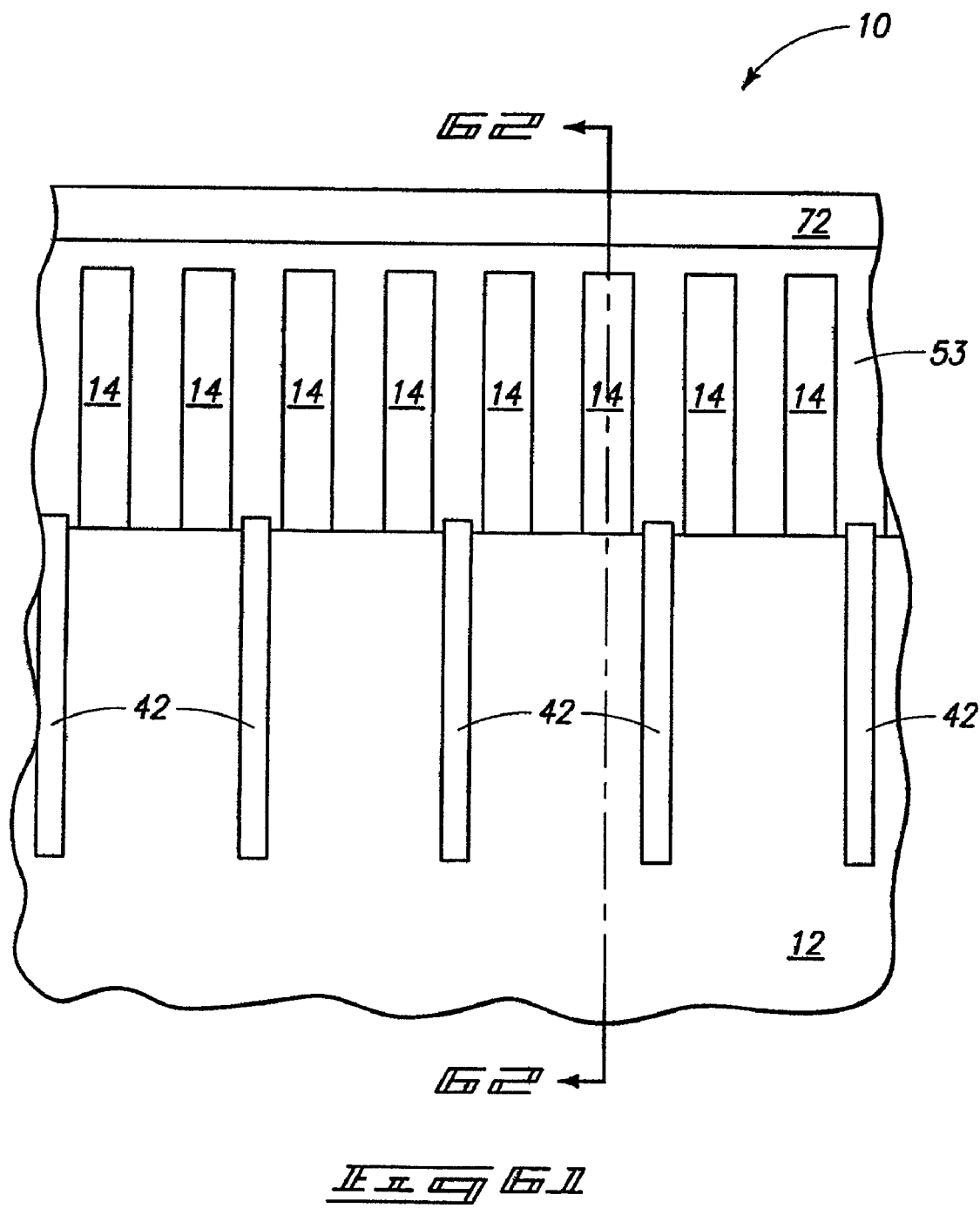

Referring next to FIGS. 60-62, a material 72 is formed over lines 60 and within gaps 58. Material 72 can, for example, comprise, consist essentially of, or consist of an oxide-containing material, such as, for example, silicon dioxide. In exemplary aspects, material 72 is deposited to a thickness of about 350 Å. The materials 53 and 62 are shown in dashed-line view in FIG. 60 to indicate that such materials are under material 72.

Figure 63:
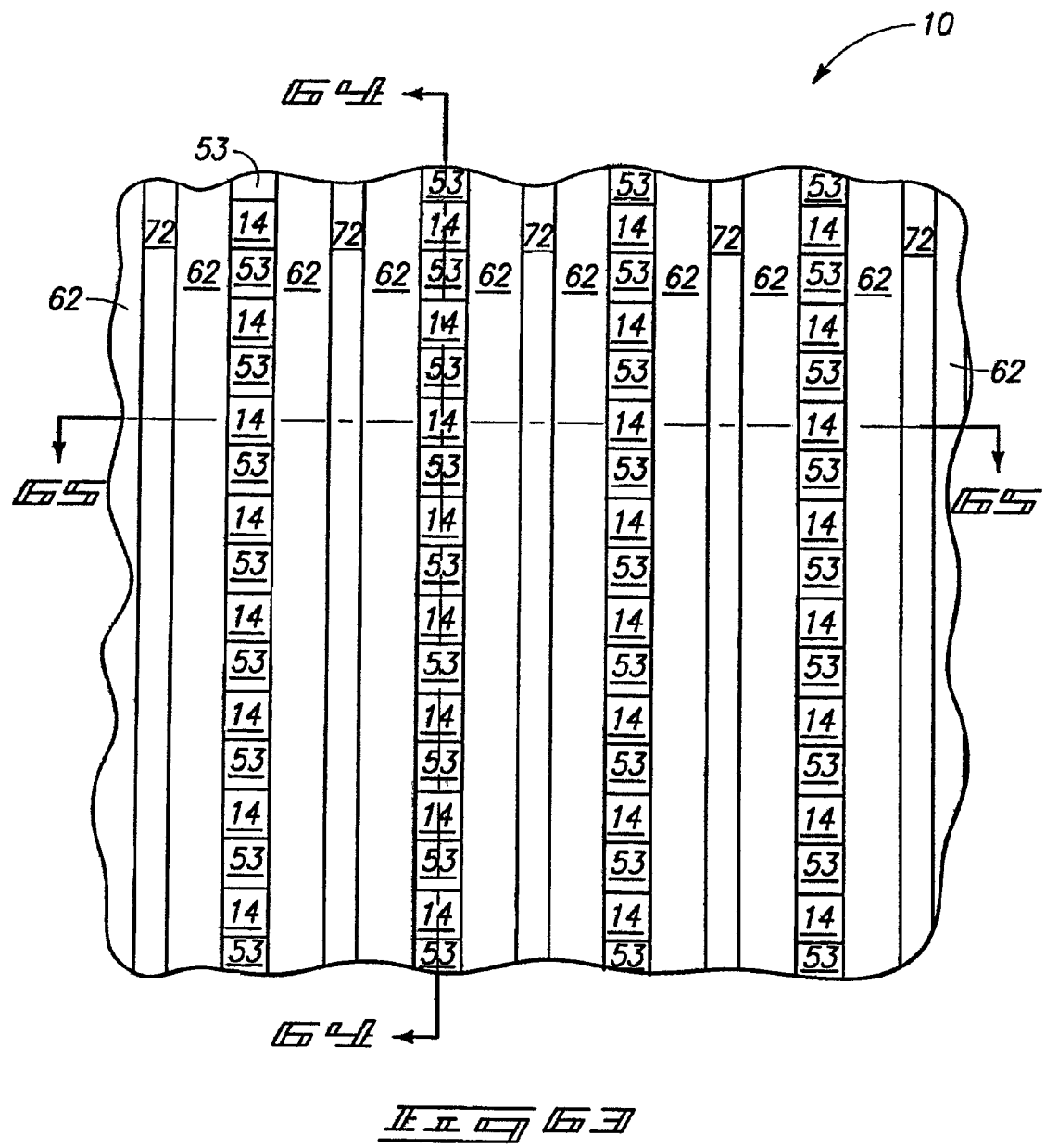
Figure 65:
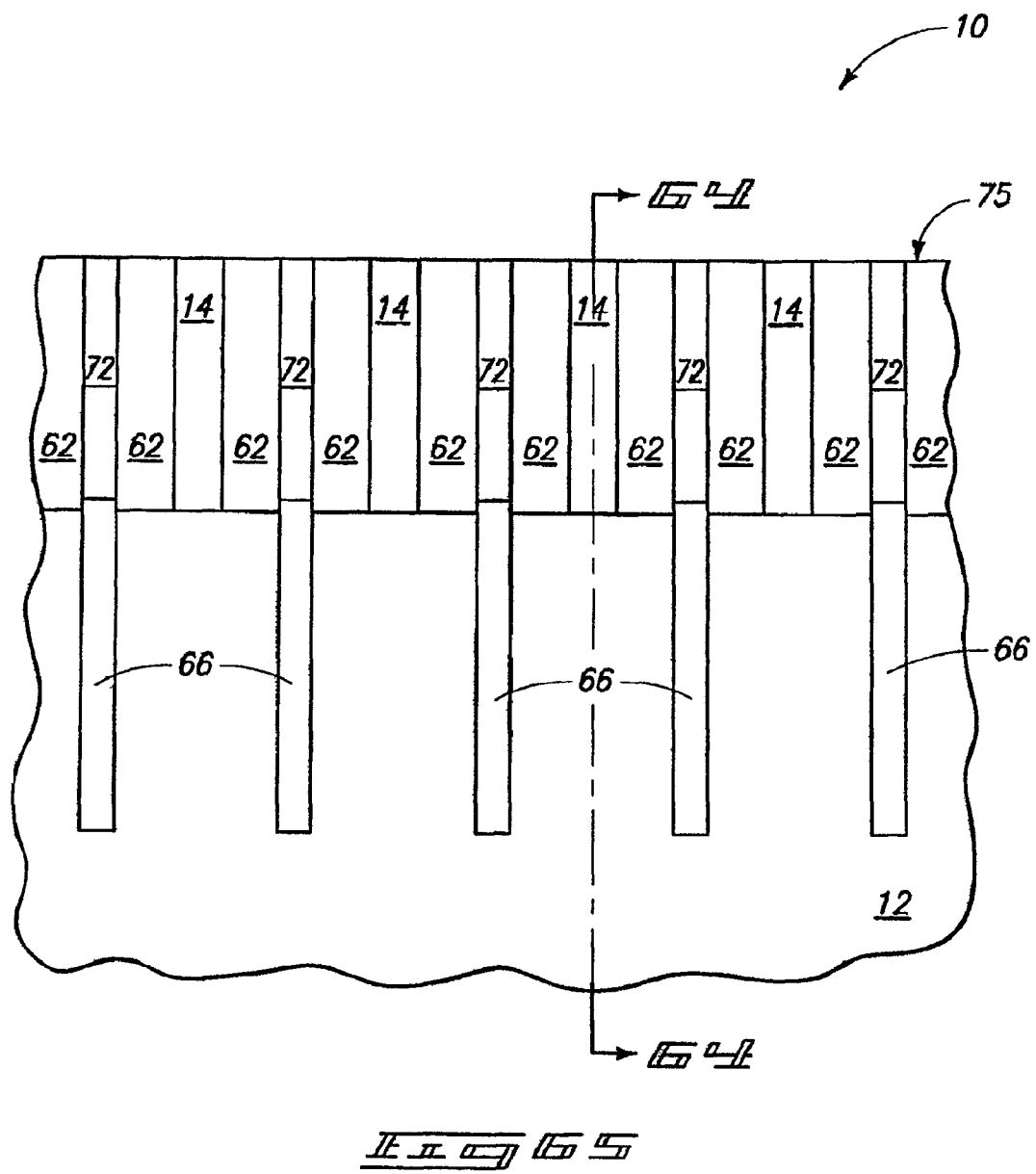

Referring next to FIGS. 63-65, an upper surface of construction 10 is subjected to planarization to form the planarized upper surface 75. The planarization removes materials 72 and 53 from over upper surfaces of material 14. The planarization can also remove some of material 14 so that the planarized surface 75 is beneath the initial elevational level of the upper surface of material 14. The planarization can be accomplished by, for example, chemical-mechanical polishing, and can be conducted to leave upper surface 75 about 5500 Å above an uppermost surface of substrate 12 in exemplary embodiments. After the planarization, the alternating layers 53 and 14 extend along a vertical direction and the alternating layers 14, 62 and 72 extend along a horizontal direction, as illustrated in the top view of FIG. 63.

Figure 66:
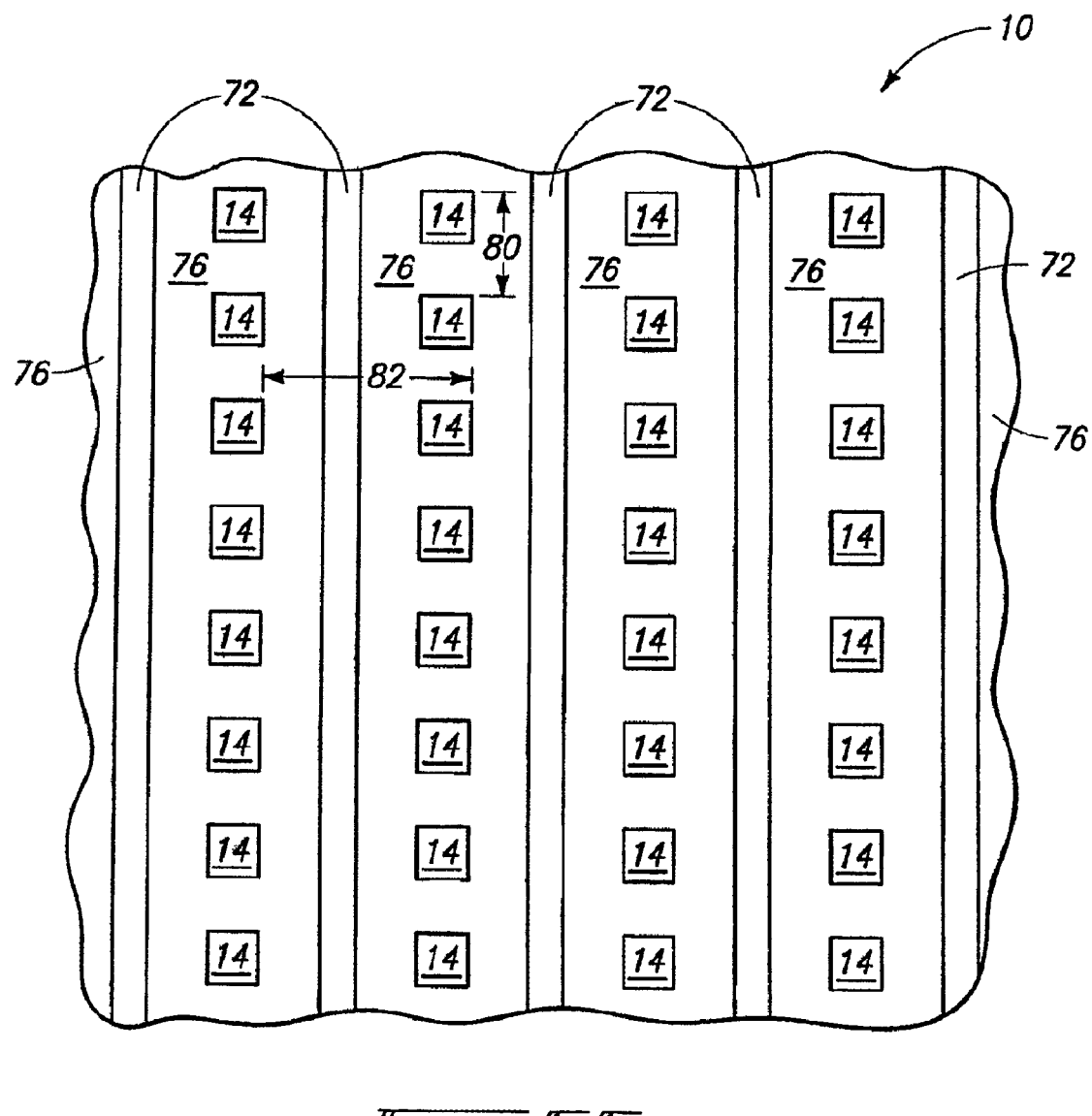
FIG. 66 is a diagrammatic top view of the construction of FIG. 64, shown with structures which would typically have the same composition as one another merging together to form common structures. The diagrammatic aspects of FIG. 66 will be used in the figures which follow FIG. 66.

In particular aspects, material 53 is (i.e. consists of) silicon nitride, material 14 is silicon dioxide, material 62 is silicon nitride, and material 72 is silicon dioxide. Accordingly, the planarized surface 75 of FIG. 64 extends across alternating layers of silicon nitride and silicon oxide; and similarly the planarized upper surface 75 of FIG. 65 also extends across alternating surfaces of silicon dioxide and silicon nitride. This concept is illustrated in FIG. 66, which is a simplified top view at the processing stage of FIG. 63 where layers which would typically have the same composition as one another are shown merged together. Specifically, layers 53 and 62 would typically comprise the same composition as one another, and can, in particular aspects, comprise, consist essentially of, or consist of silicon nitride. Such layers are shown merged together in FIG. 66 to form a single structure 76. The materials 14 and 72 are shown extending through the structure 76. In particular aspects, materials 14 and 72 will comprise the same composition as one another, and can, for example, comprise, consist essentially of, or consist of silicon dioxide.

Materials 76 and 14 can, in some aspects, be materials which are selectively etchable relative to one another. In such aspects, material 76 can be considered a first material which is formed in a lattice, and material 14 can be considered to be a second material which is formed to be repeating regions spaced by segments of the lattice. The repeating regions 14 form an array, with such array having a first pitch 80 along the a first axis of the array (with the pitch 80 being shown along a vertically-elongated axis of the shown array), and having a second pitch 82 along a second axis which is substantially orthogonal to the first axis (with the shown second pitch being along a horizontally-extending axis of the array). The second pitch is about twice as big as the first pitch.

Although the invention is described with the first material 76 being silicon nitride and the second material 14 being silicon dioxide, it is to be understood that the materials can be reversed in other aspects of the invention. Accordingly, material 14 can comprise, consist essentially of, or consist of silicon nitride, and material 76 can comprise, consist essentially of, or consist of silicon dioxide.

The terms "horizontal" and "vertical" are utilized in reference to the top view of FIG. 66 to refer to axes which extend left-right across the page and up-down across the page, respectively. It is to be understood that the term "vertical" can also be utilized herein to refer to projections extending upwardly from a substrate, and accordingly the term "vertical" can be utilized in reference to the structure of, for example, FIG. 65 to refer to the projections 14, 62 and 72 as extending "vertically" from the upper surface of substrate 12. In order to avoid confusion introduced by using the term "vertically" to refer to both a lateral direction and an elevational direction, the terms "elevationally vertically elongated" and "elevationally elongated" can be used herein to refer to projections extending upwardly from a surface (such as, for example, the projections 14, 62 and 72 of FIG. 65).

The simplified diagram of FIG. 66 will be utilized in the figures following FIG. 66 in order to simplify the discussion that follows. However, it is to be understood that the invention encompasses aspects in which materials 53 and 62 (FIG. 63) are different from one another so that the materials do not merge into the single common structure 76.

Figure 67:
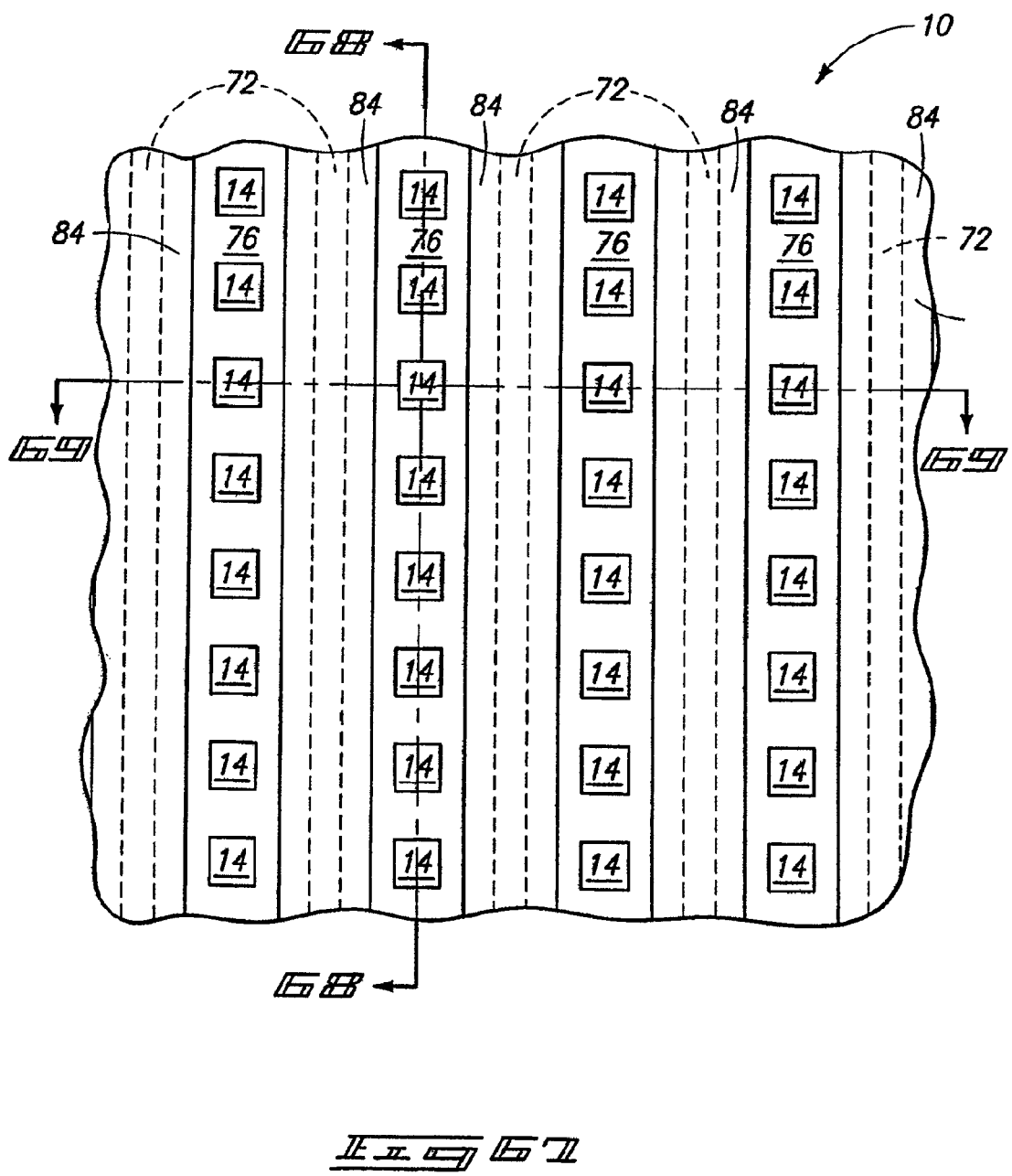
Figure 68:
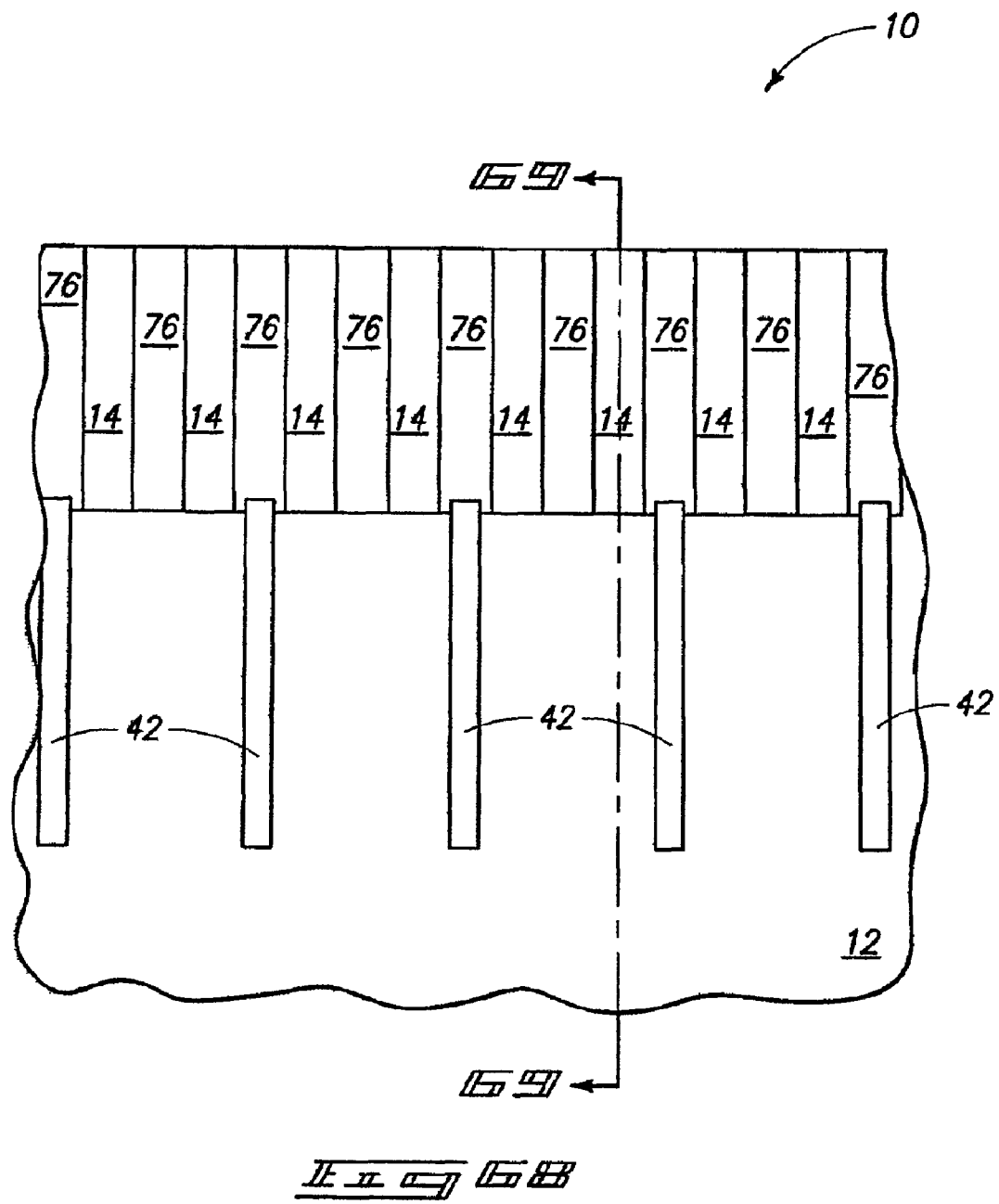

Referring next to FIGS. 67-69, a masking material 84 is formed over regions 72 to protect the regions from subsequent processing (discussed below). Masking material 84 can comprise, for example, photoresist, and can be patterned utilizing photolithographic processing. The masking material 84 forms vertically-extending lines (or strips) in the top view of FIG. 67. The material 72 is shown in dashed-line view in FIG. 67 to indicate the material 72 is beneath masking material 84 in the shown view. The cross-sections of FIGS. 68 and 69 have different labeling than those of FIGS. 64 and 65, in that the label 76 is utilized to refer to the materials 53 and 62 of FIGS. 64 and 65, to be consistent with the labeling convention described previously with reference to FIG. 66 and adopted in the figures following FIG. 66.

Figure 70:
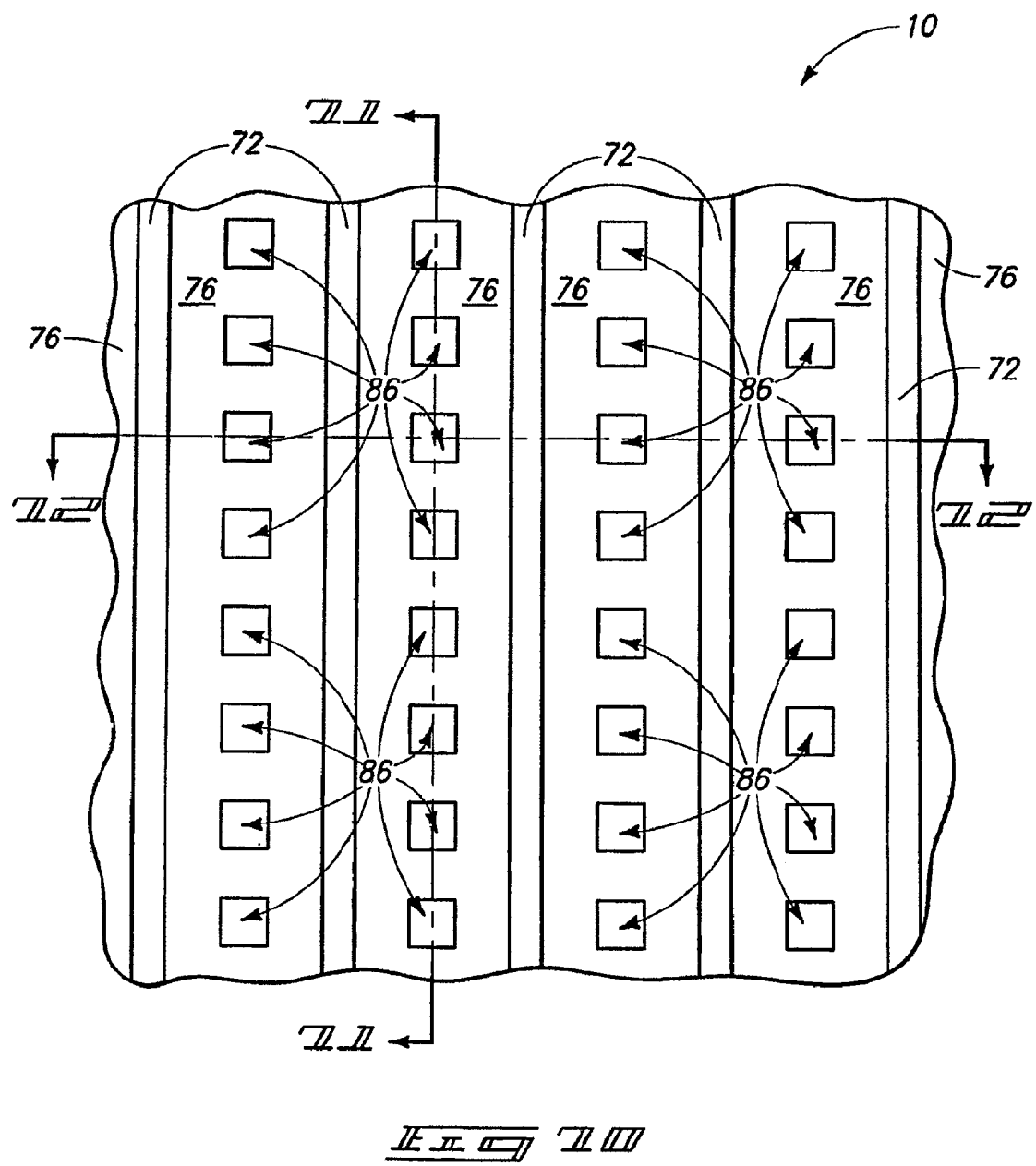
FIGS. 70-72 are a diagrammatic, fragmentary top view and cross-sectional side views of the construction of FIGS. 1-3 shown at a processing stage subsequent to that of FIGS. 67-69.
Figure 71:
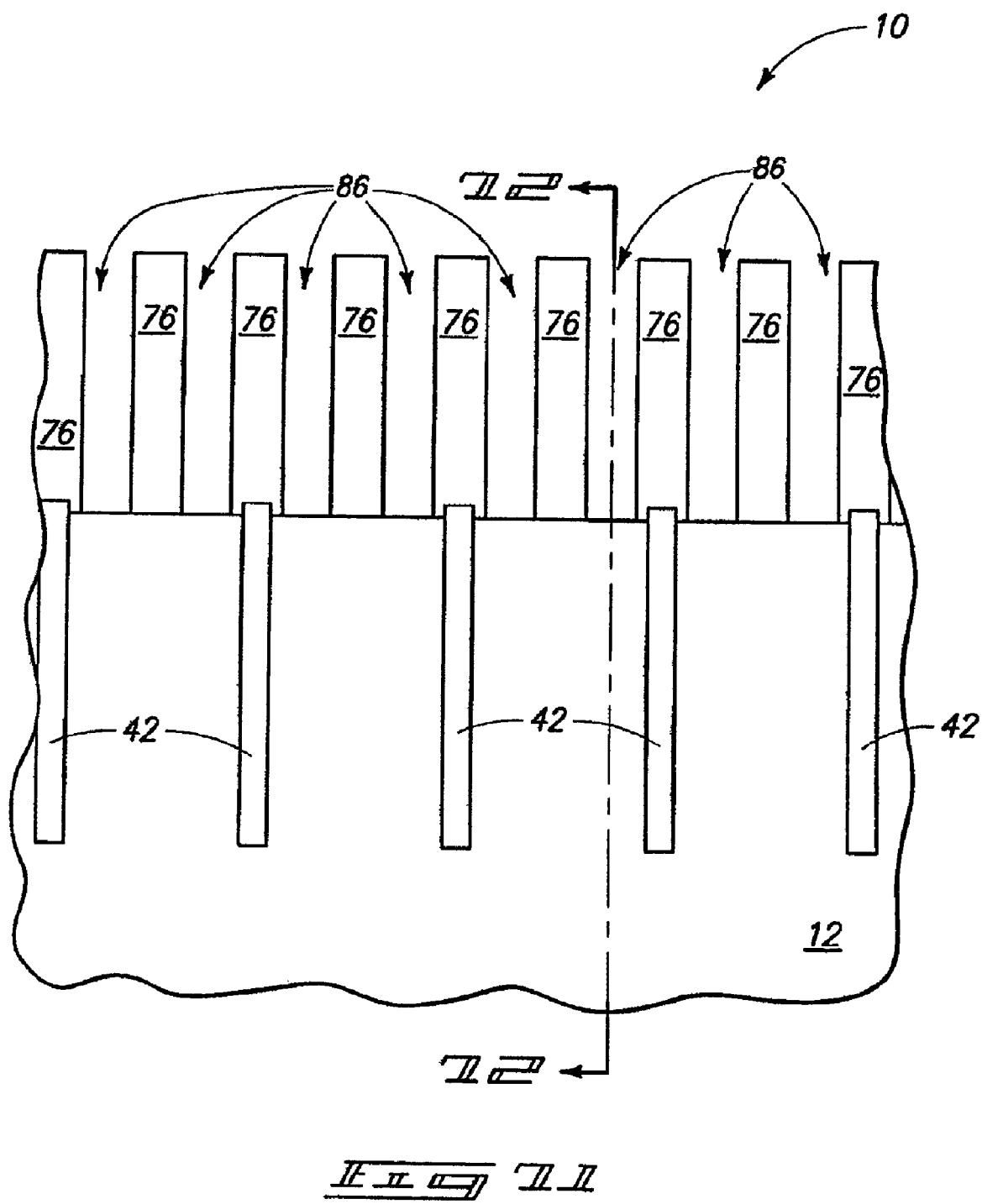
Figure 72:
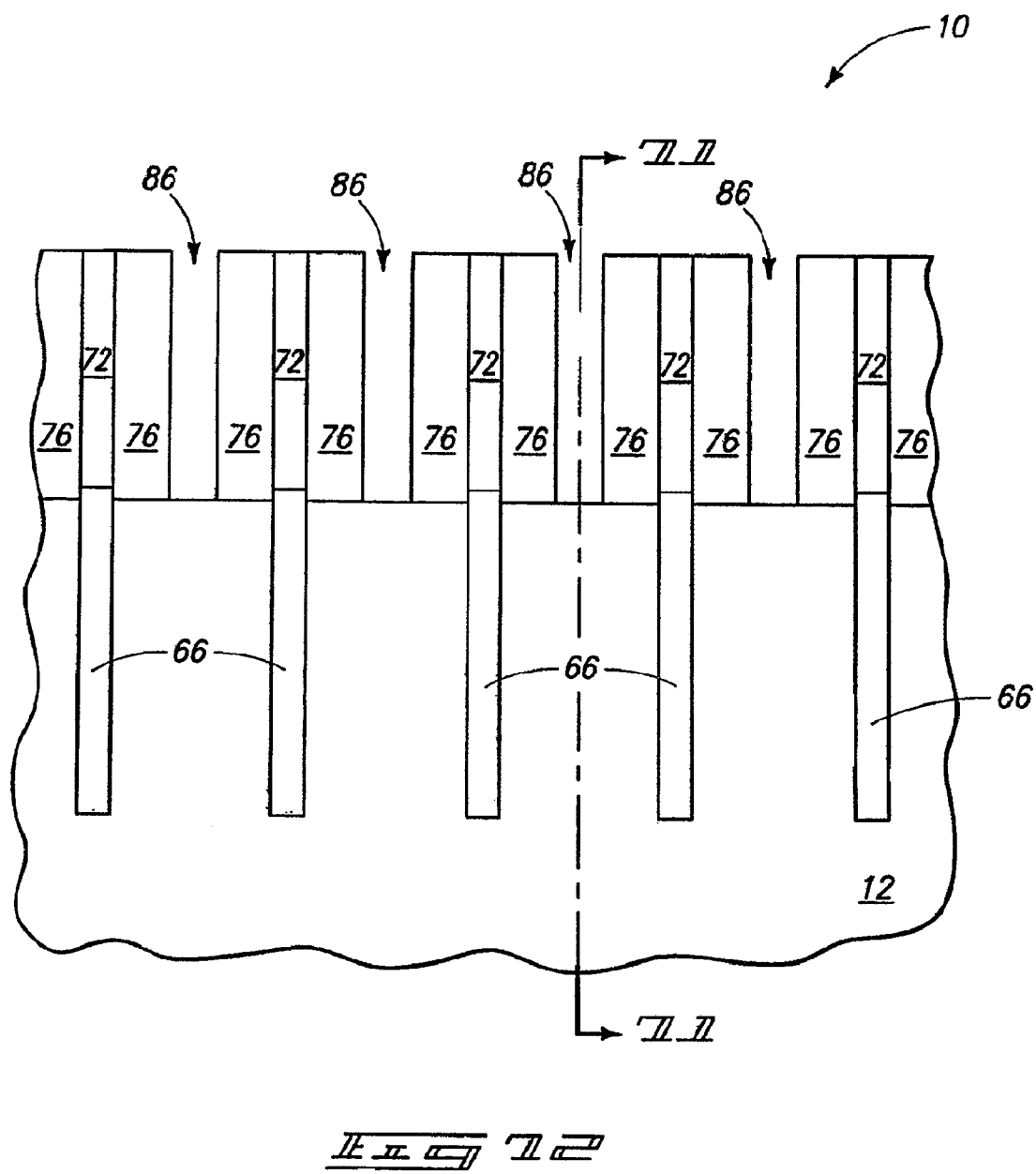

Referring next to FIGS. 70-72, material 14 is selectively removed relative to material 76, and subsequently masking material 84 (FIGS. 67-69) is removed. The removal of material 14 forms openings 86 extending through material 76 to an upper surface of substrate 12. If material 14 comprises silicon dioxide, and material 76 comprises silicon nitride, the selective removal of material 14 can be accomplished with, for example, a dry or wet oxide etch.

Figure 73:
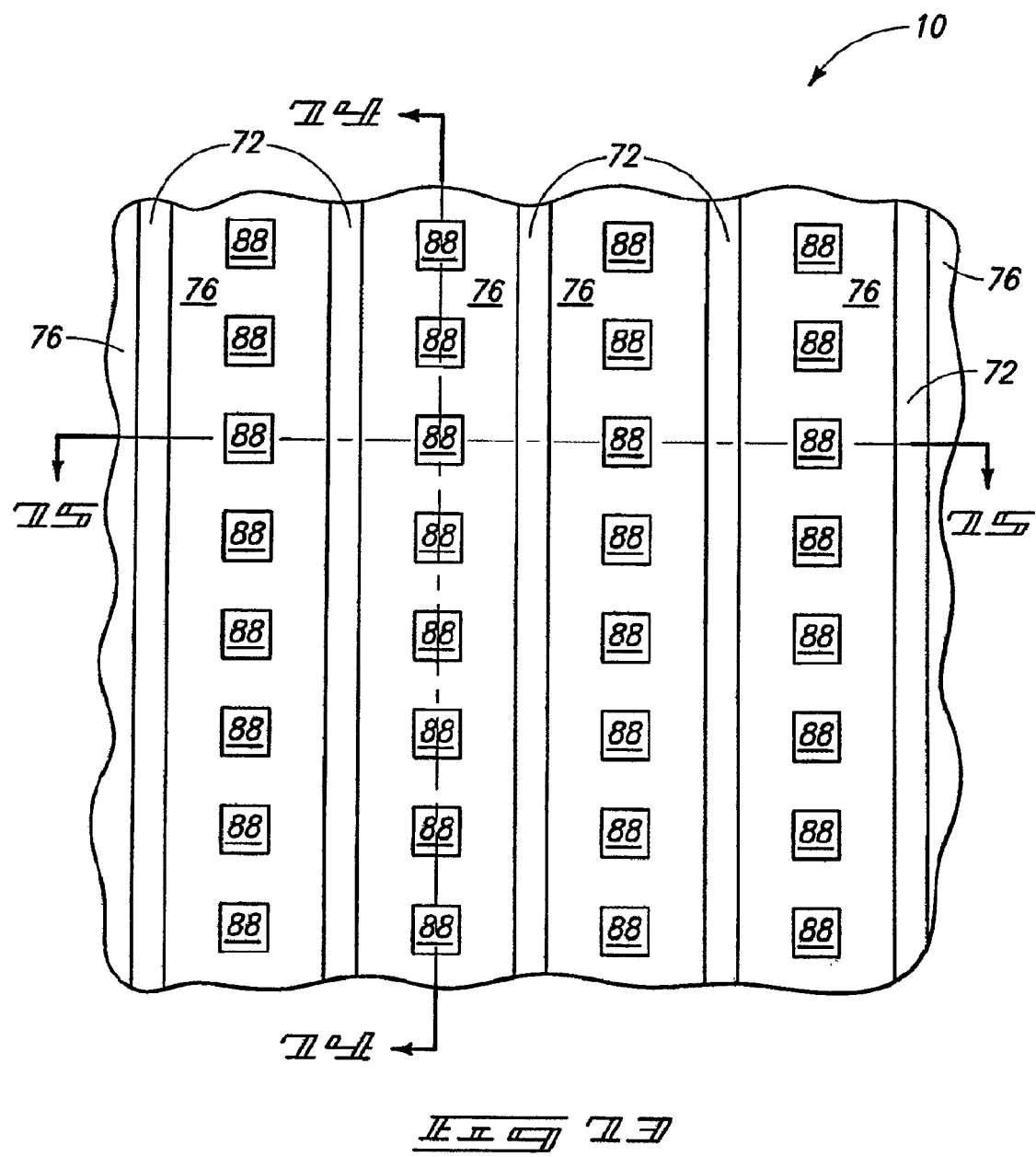
FIGS. 73-75 are a fragmentary, diagrammatic top view and cross-sectional side views of the construction of FIGS. 1-3 shown at a processing stage subsequent to that of FIGS. 70-72.
Figure 74:
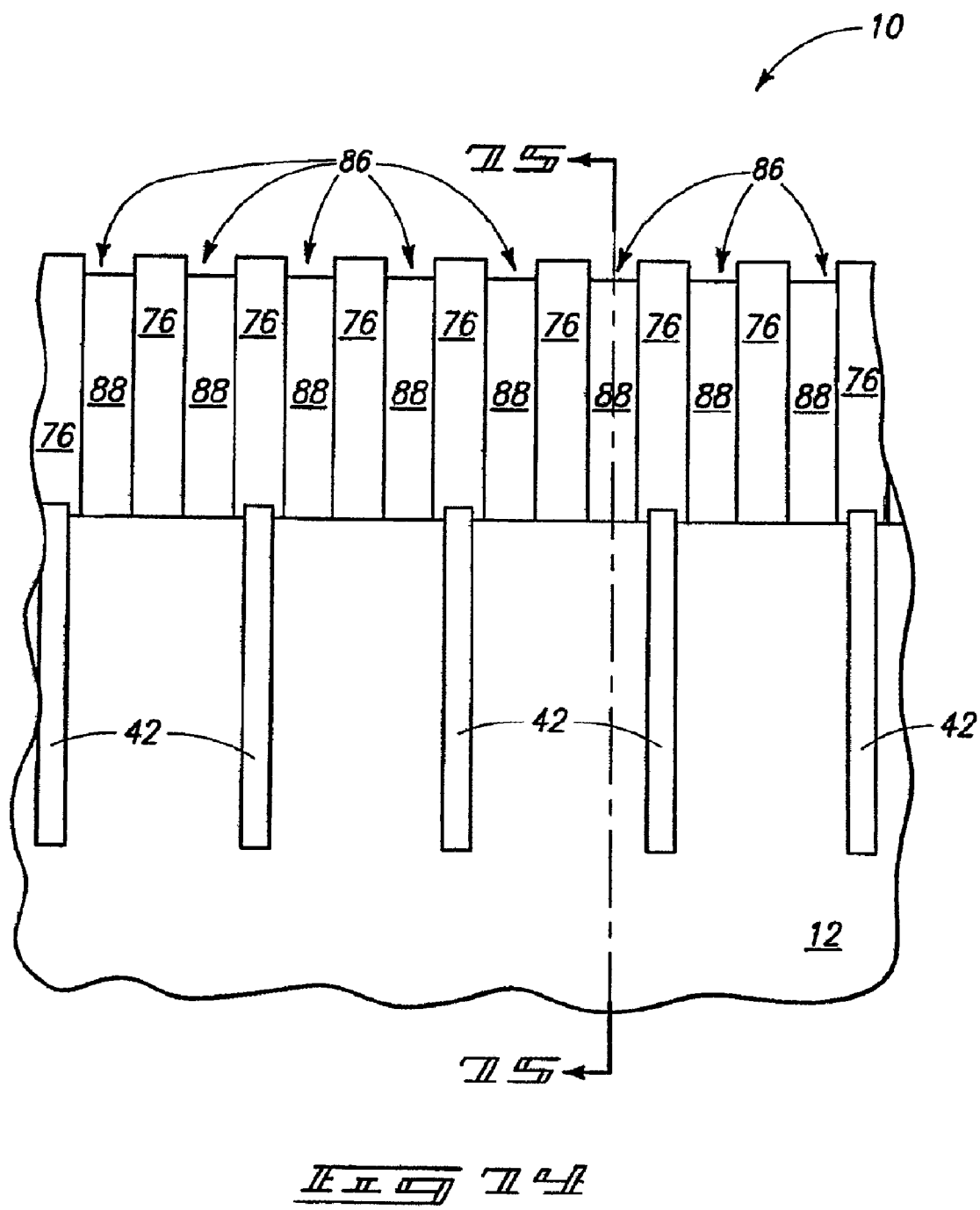
Figure 75:
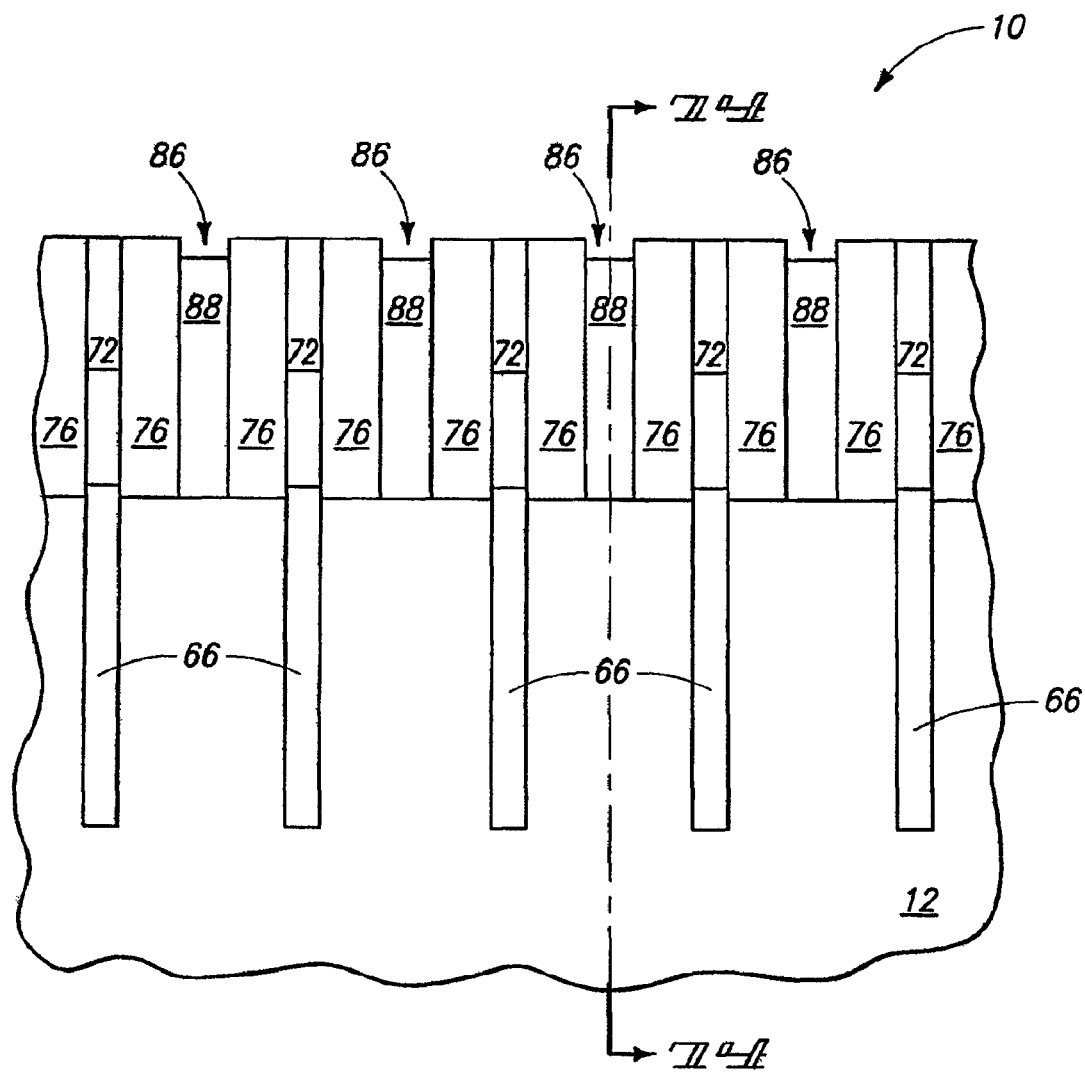

Referring next to FIGS. 73-75, semiconductor material 88 is formed within openings 86. Material 88 can be formed by, for example, forming polycrystalline silicon within openings 86 and over material 76, and subsequently removing the polycrystalline silicon from over material 76 by planarization or other suitable methods. Alternatively, if substrate 12 comprises a monocrystalline semiconductive material (such as, for example, monocrystalline silicon), material 88 can be epitaxially grown from an upper surface of substrate 12. Epitaxially grown semiconductor material is generally single crystal material, whereas non-epitaxially grown semiconductor material is typically not single crystal material. Rather, non-epitaxially grown semiconductor material is typically amorphous and/or polycrystalline.

Material 88 is shown having an uppermost surface which is elevationally below the uppermost surface of materials 76 and 72, but it is to be understood that the uppermost surface of material 88 can be coplanar with those of material 76 and 72, or can be elevationally above the surfaces of material 76 and 72, in various alternative aspects of the invention which are not shown.

Although all of the openings are shown simultaneously filled with material 88, it is to be understood that the openings can be divided into sets, with one set filled with semiconductor material 88 of one type and another set filled with semiconductor material 88 of another type. For instance, the semiconductor material 88 within openings 86 can ultimately correspond to source/drain regions, with some of the source/drain regions ultimately being connected to a digit line, and others of the source/drain regions ultimately being connected to memory storage devices (such as, for example, capacitors). The material 88 utilized in source/drain regions connected to digit lines can be one set and the material 88 utilized in source/drain regions connected to memory storage devices can be another set. Thus, the material 88 connected to digit lines can be a different semiconductor material than the material 88 connected to memory storage devices. For instance, the semiconductor material 88 ultimately connected to digit lines can be formed of epitaxial material, and the material 88 ultimately connected to memory storage devices can be formed of polycrystalline semiconductor material. P-n junctions in epitaxial silicon tend to be leakier than p-n junctions in bulk silicon, which can be advantageous in some aspects of the invention. Such aspects are discussed in more detail below relative to FIGS. 124-126.

The semiconductor material 88 can be conductively doped either as-deposited (i.e., can be in situ doped), and/or can be doped subsequent to the deposition with one or more suitable implants. Also, regions of substrate 12 proximate openings 86 can be appropriately conductively doped either prior to provision of material 88 within the openings, or after provision of material 88 with suitable implants and/or out-diffusion of dopant from material 88. In some aspects, substrate 12 will have appropriate conductivity-enhancing dopants provided therein at a processing stage prior to that of FIGS. 1-3, and specifically prior to formation of material 14 over the substrate. In alternative, or additional, aspects dopant will be provided in the substrate after the formation of openings 86 so that the dopant is self-aligned to the openings. Particular dopants that can be provided within substrate 12 and regions 88 in particular aspects of the invention are discussed below with reference to FIGS. 124-126.

In exemplary aspects of the invention, material 88 comprises, consists essentially of, or consists of epitaxially-grown silicon which is in-situ doped during the growth of the silicon, and which is grown to a thickness (i.e., a vertical height in FIGS. 74 and 75) of about 1400 Å.

Figure 76:
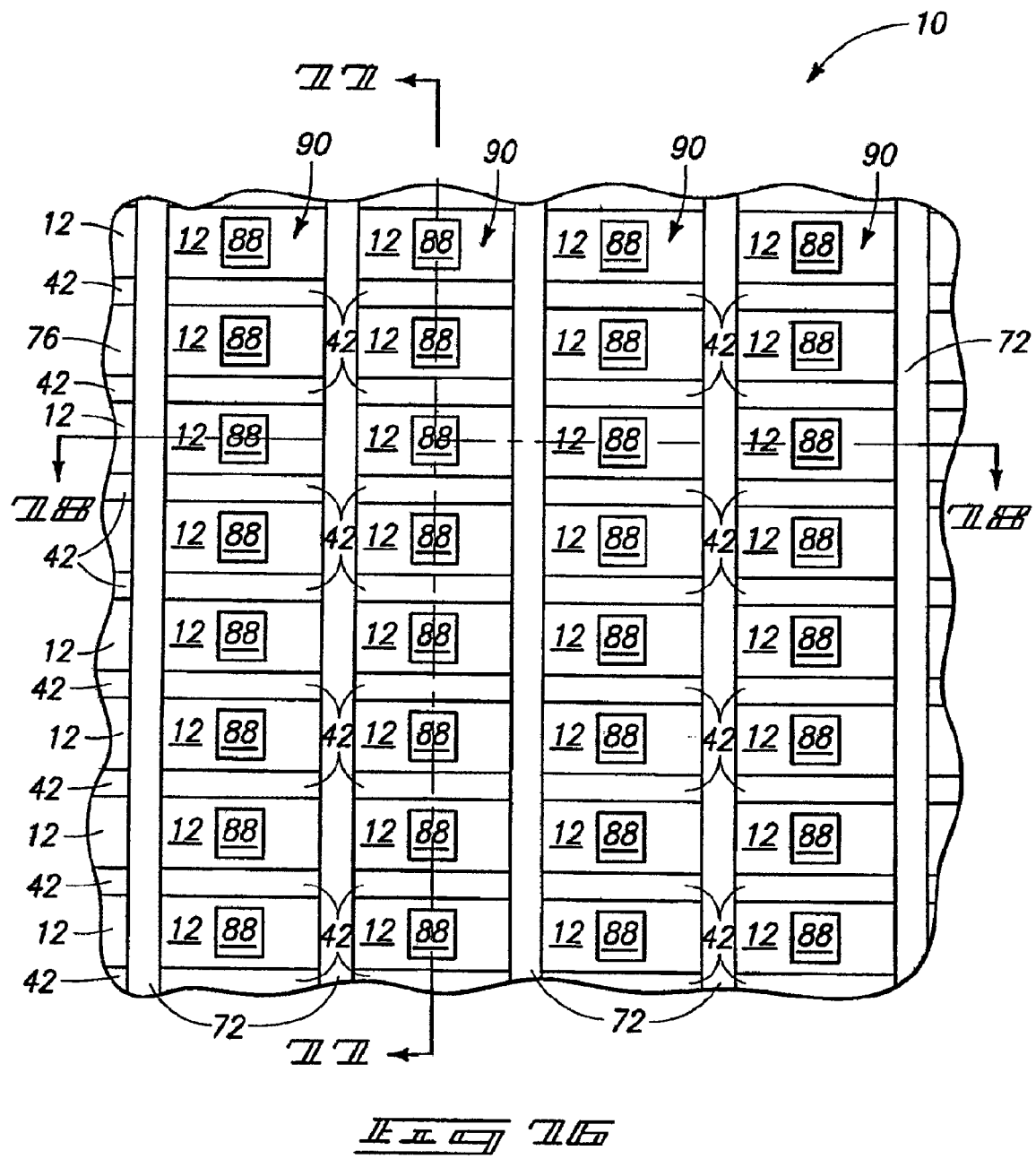
FIGS. 76-78 are a fragmentary, diagrammatic top view and cross-sectional side views of the construction of FIGS. 1-3 shown at a processing stage subsequent to that of FIGS. 73-75.
Figure 77:
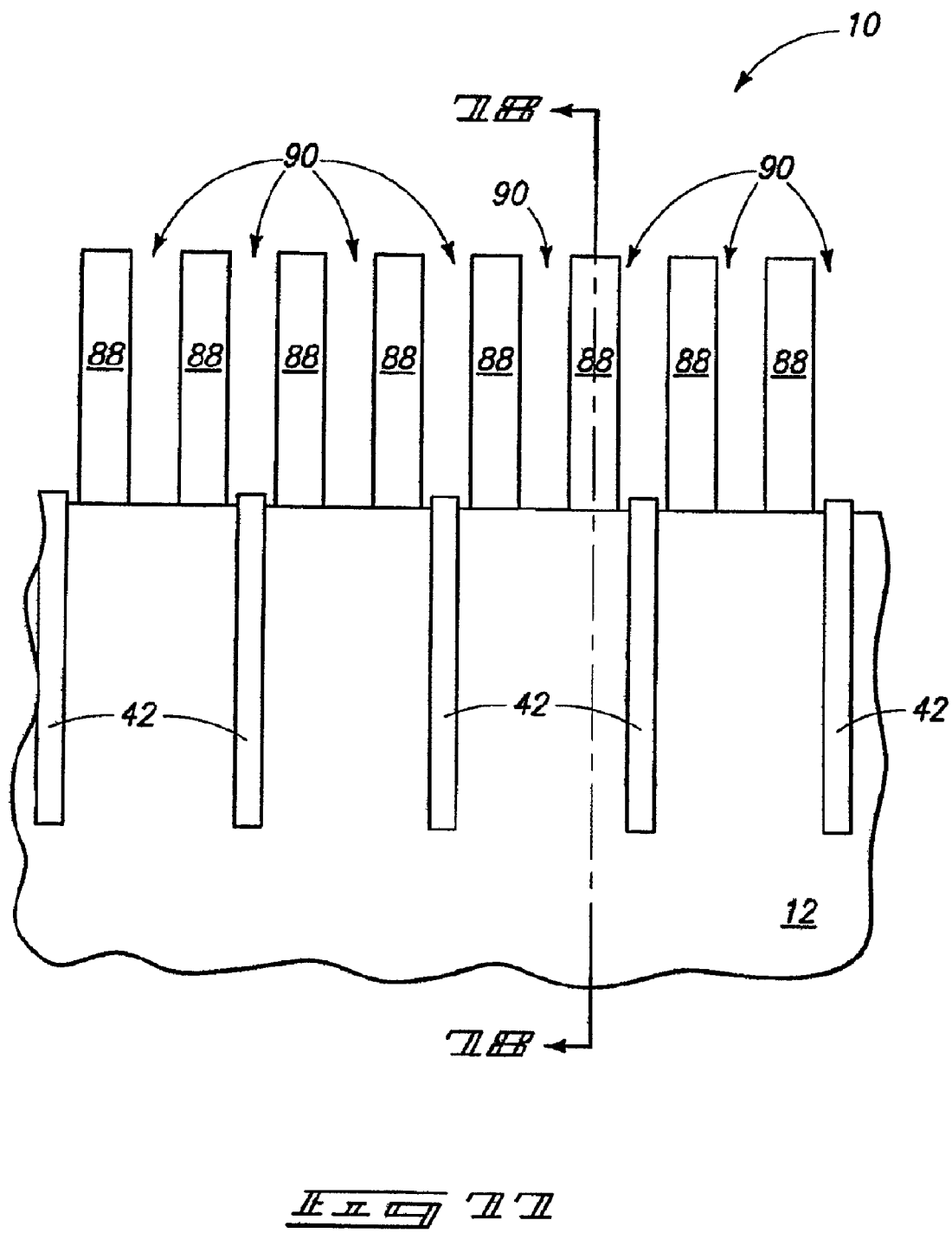
Figure 78:
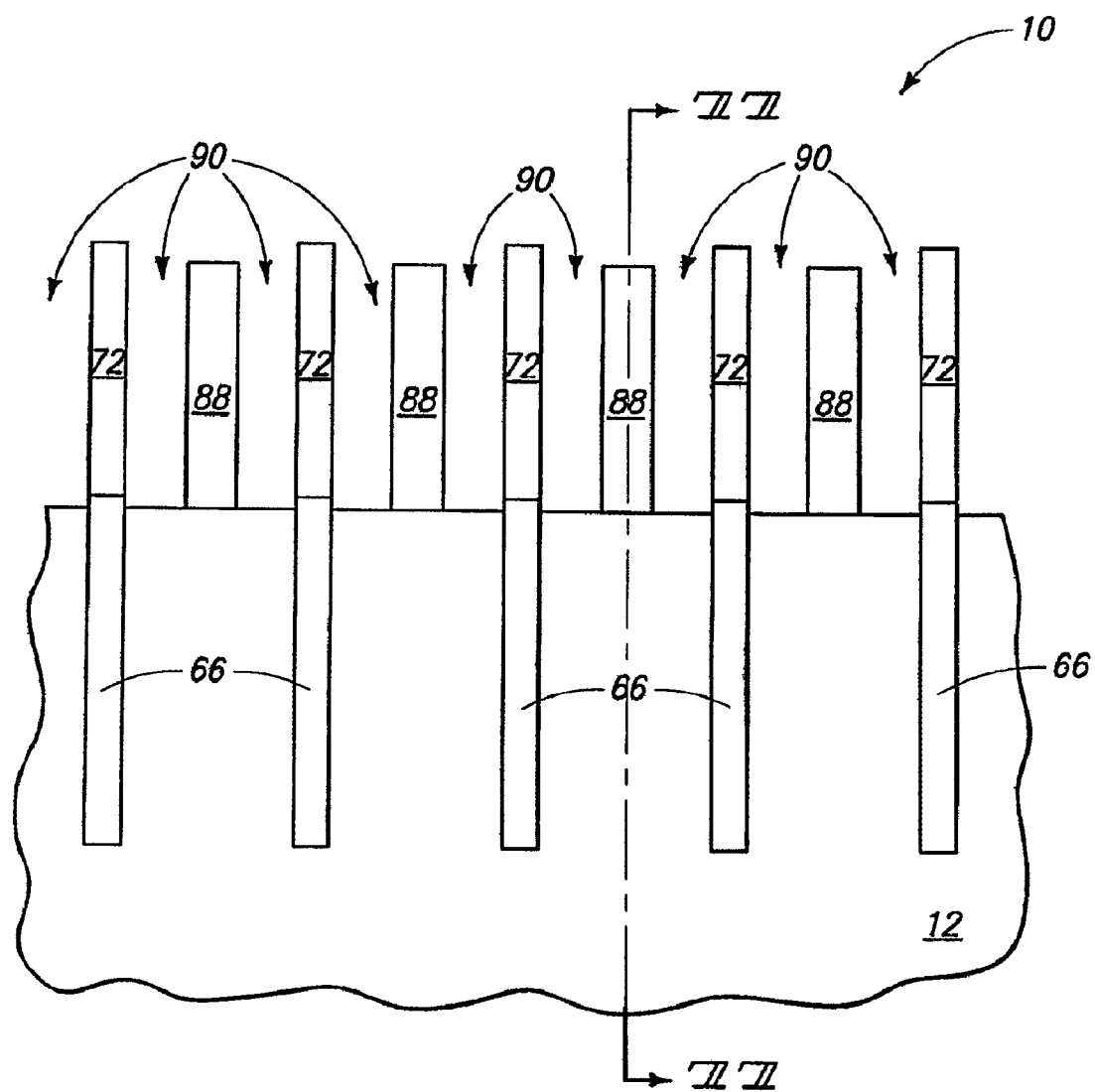

Referring next to FIGS. 76-78, material 76 (FIGS. 73-75) is removed to leave openings 90. The openings extend between the vertical lines of material 72 around the pillars of material 88. The openings 90 extend to the upper surface of substrate 12, and also to the upper surface of the dielectric material 42 formed within substrate 12.

The removal of material 76 is preferably selective for material 76 relative to materials 88 and 72 (with the term "selective" indicating that the conditions for removal of material 76 remove the material at a faster rate than such conditions remove materials 88 and 72, which can include, but is not limited to, aspects in which the rate of removal of materials 88 and 72 is about zero). In aspects in which material 76 consists of silicon nitride, material 88 consists of conductively-doped silicon, and material 72 consists silicon dioxide, the selective removal of material 76 can comprise a dry and/or wet etch of silicon nitride.

Figure 79:
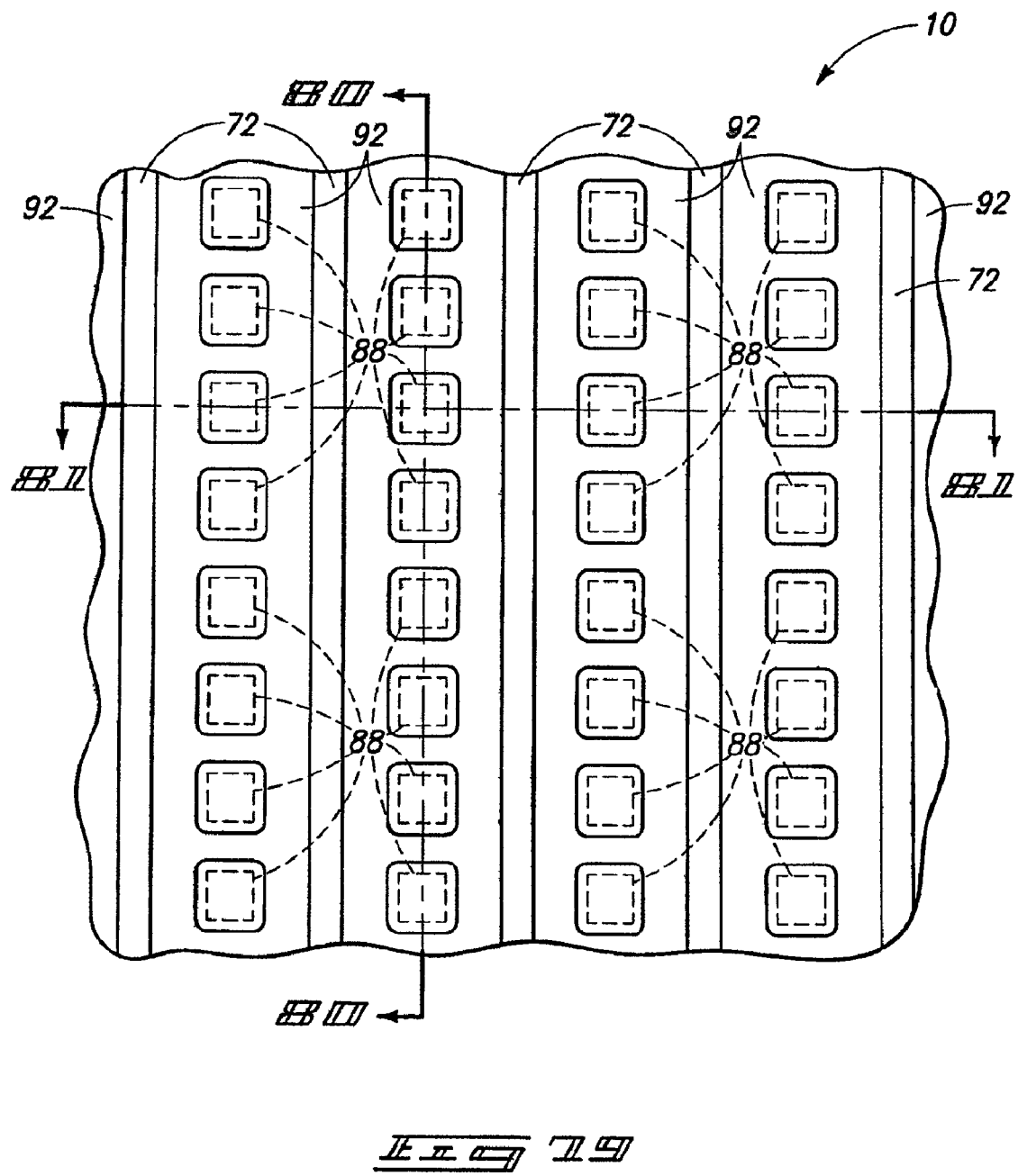
FIGS. 79-81 are a diagrammatic, fragmentary top view and cross-sectional side views of the construction of FIGS. 1-3 shown at a processing stage subsequent to that of FIGS. 76-78.
Figure 80:
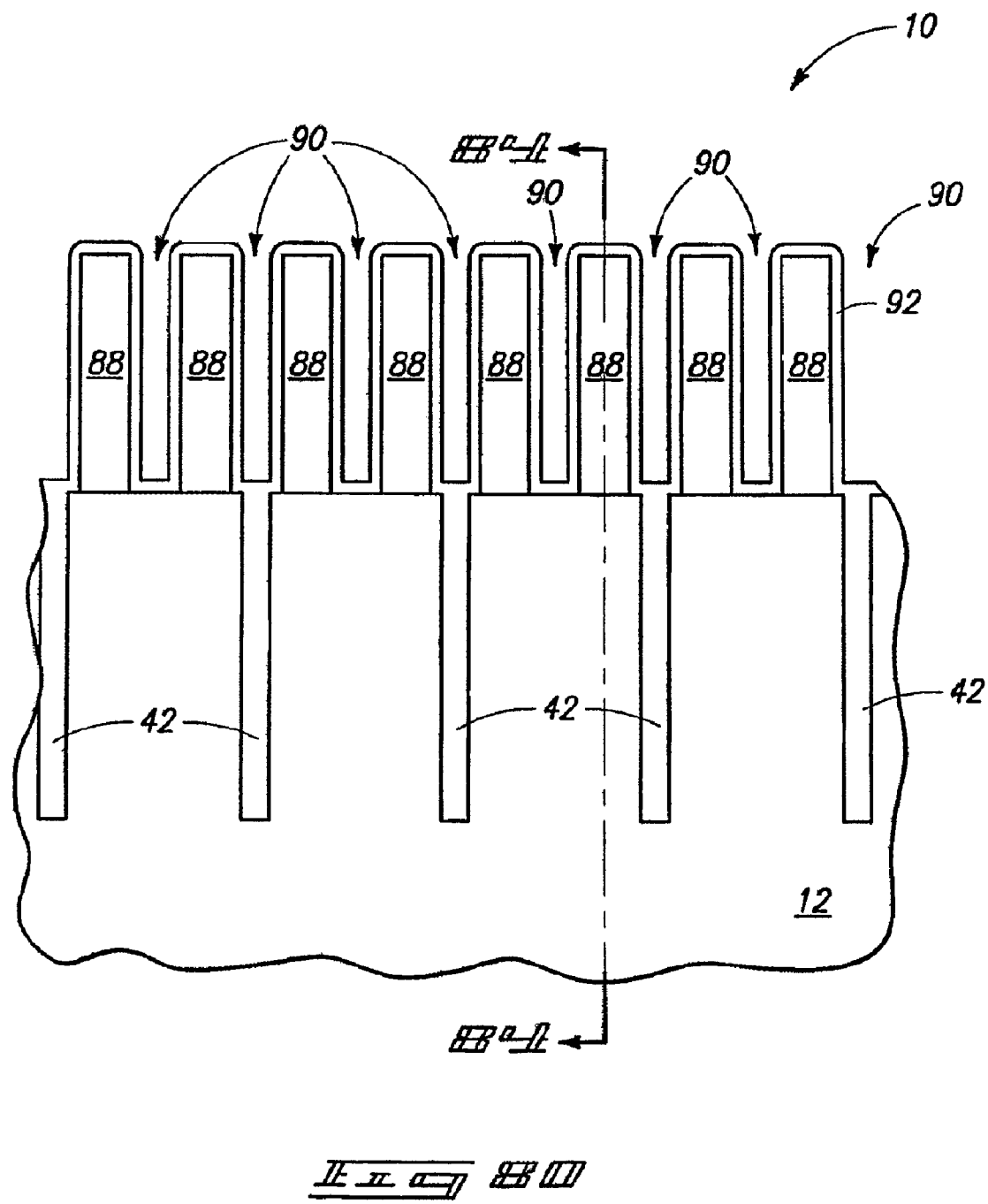
Figure 81:
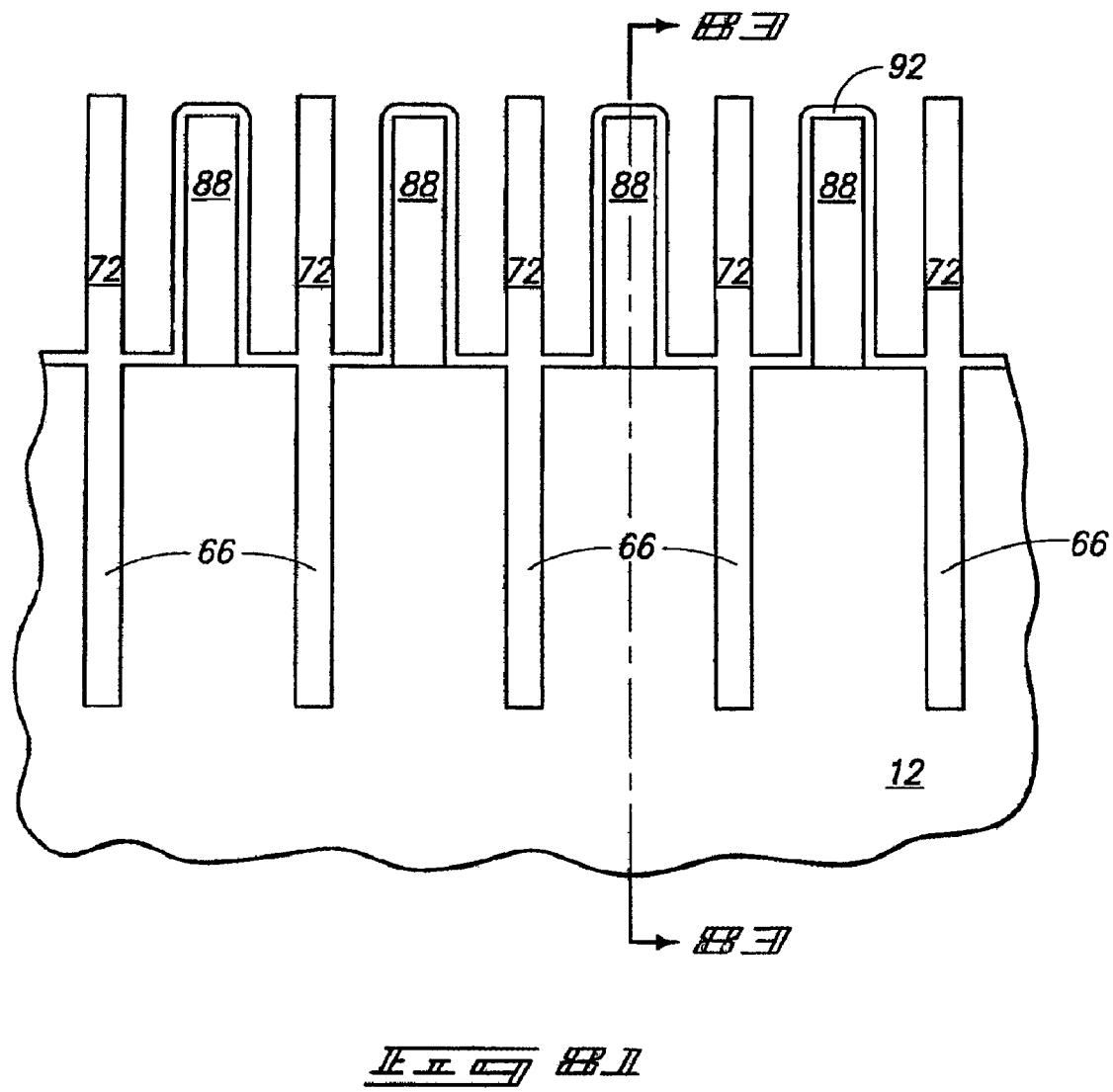

Referring next to FIGS. 79-81, a dielectric layer 92 is formed within openings 90, and specifically is formed over exposed surfaces of material 88 and substrate 12. Pedestals 88 are shown in dashed-line view in FIG. 79 to indicate that such pedestals are beneath the dielectric material 92 in such view.

If material 88 and substrate 12 comprise silicon, dielectric material 92 can comprise silicon dioxide and can be formed by oxidation of surfaces of substrate 12 and material 88. Dielectric 92 can thus comprise, consist essentially of, or consist of silicon dioxide. In the aspect of FIGS. 79-81, dielectric material 92, material 42, material 72 and material 66 are shown comprising the same composition as one another and merging into a common dielectric structure. Materials 92, 42, 72 and 66 would typically all comprise, consist essentially of, or consist of silicon dioxide. The merging of materials 92, 42, 72 and 66 simplifies the drawings, and such merging will be shown in the drawings following FIGS. 79-81, but it is to be understood that the invention also encompasses aspects in which one or more of materials 92, 42, 72 and 66 has a different composition than the others.

Dielectric material 92 can ultimately be utilized as a gate oxide, and in such aspects of the invention can be formed to a thickness of about 70 Å.

Figure 82:
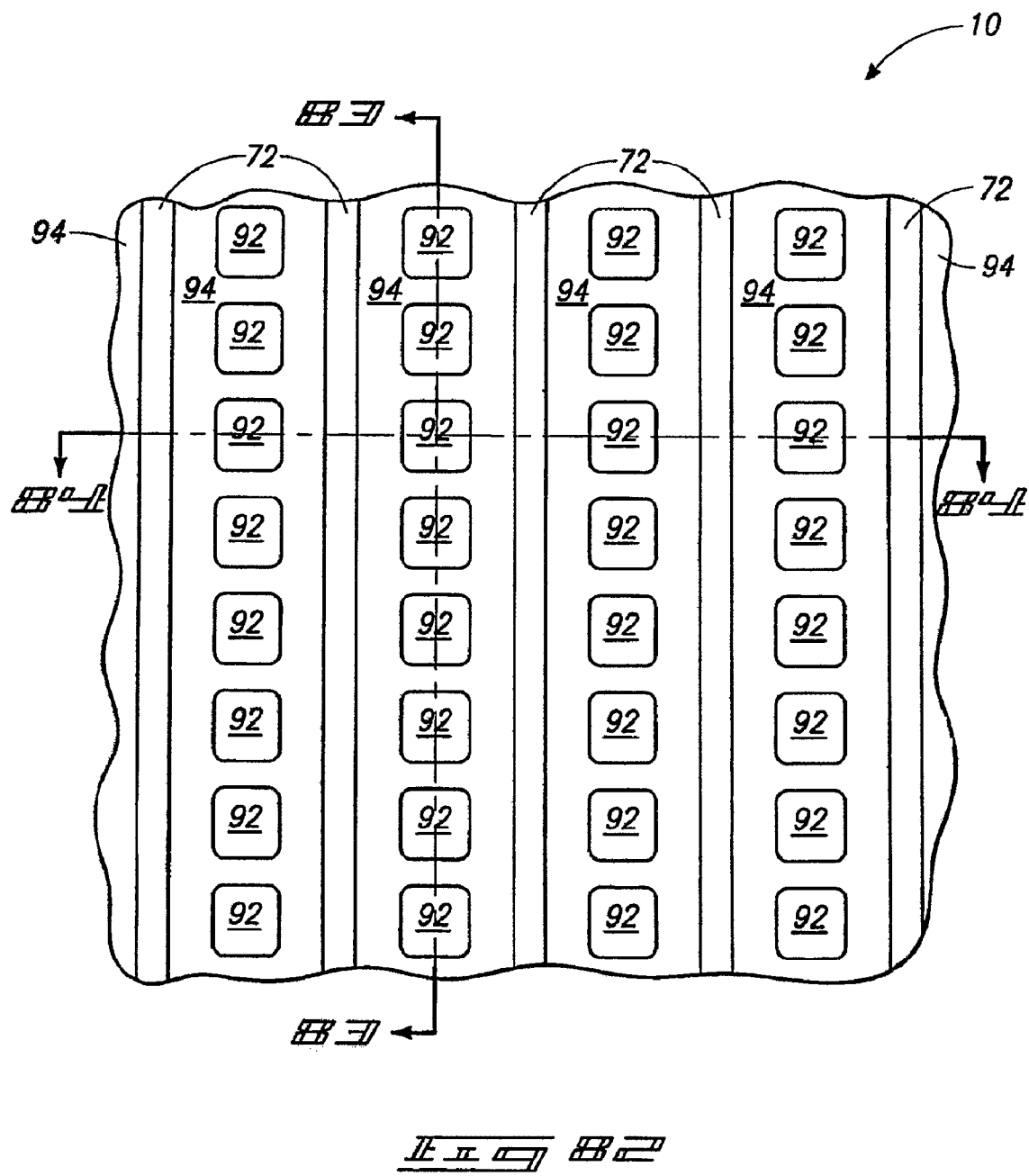
Figure 83:
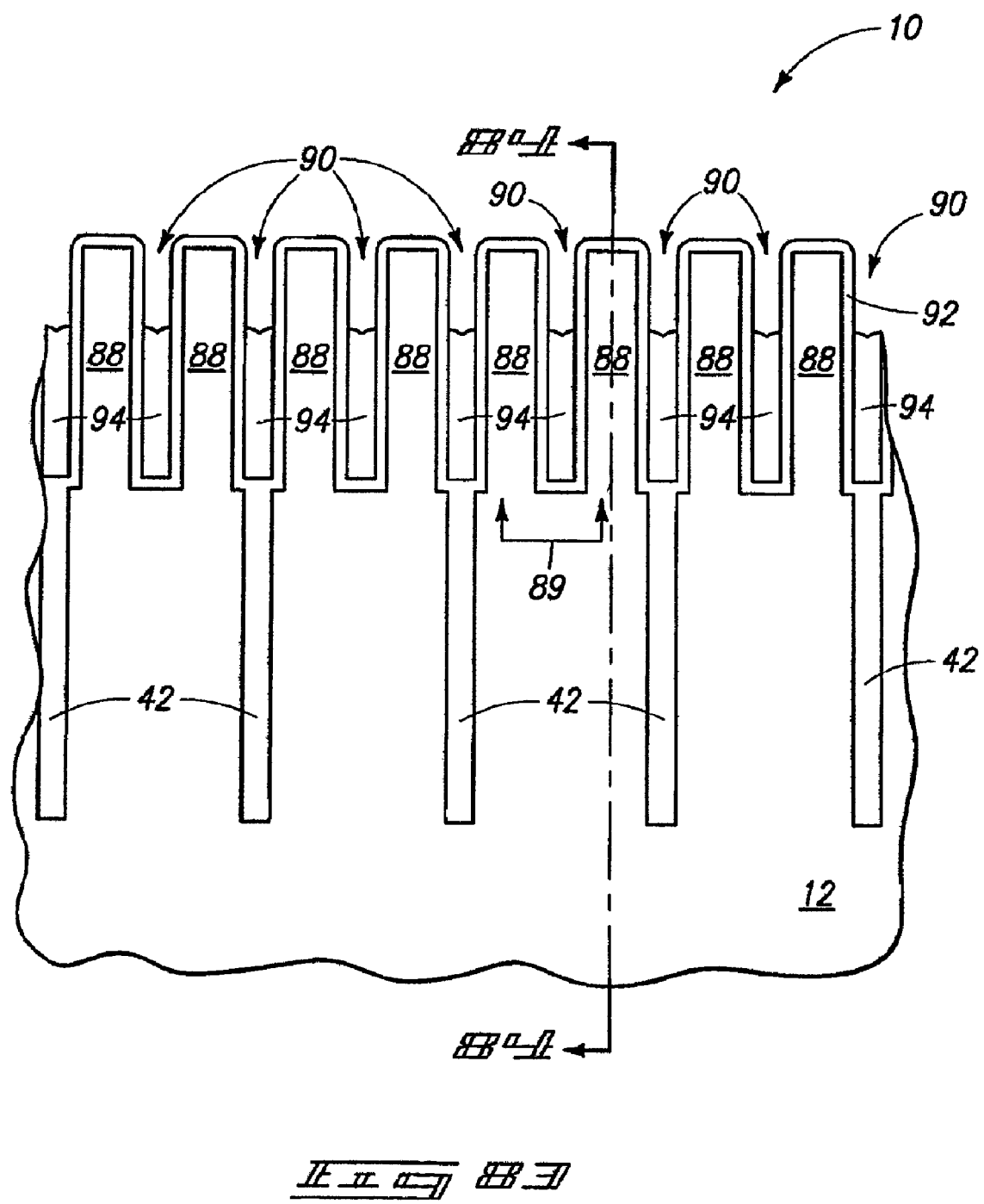

Referring next to FIGS. 82-84, gateline material 94 is formed within openings 90. Although material 94 is illustrated as being homogeneous in the figures, it is to be understood that the structure represented by the label "94" can comprise a plurality of different layers. In particular aspects, material 94 can comprise, consist essentially of, or consist of metal, metal alloys and/or conductively-doped silicon. It can be preferred that material 94 comprise, consist essentially of, or consist of conductively-doped polycrystalline silicon in some aspects of the invention. Material 94 is shown only partially filling openings 90, but it is to be understood that the invention encompasses other aspects (not shown) in which material 94 completely fills the openings. In an exemplary aspect, material 94 comprises conductively-doped polycrystalline silicon which is initially deposited to 300 Å thickness. Such thickness can be sufficient to completely fill openings 90 as the width of the openings is less than 600 Å. Thus, the polysilicon deposited to a thickness of 300 Å can form vertical pedestals within the openings having a height of 2000 Å or more. The polycrystalline silicon is then etched back with a dry etch so that the silicon within the openings 90 only extends to an upper elevational level of about 850 Å.

The gateline material 94 gatedly connects source/drain regions of pairs of pedestals of material 88 to form transistor constructions. A pair of pedestals which can be gatedly connected to one another and incorporated into a single transistor construction are identified by the label 89 in FIG. 83.

Figure 85:
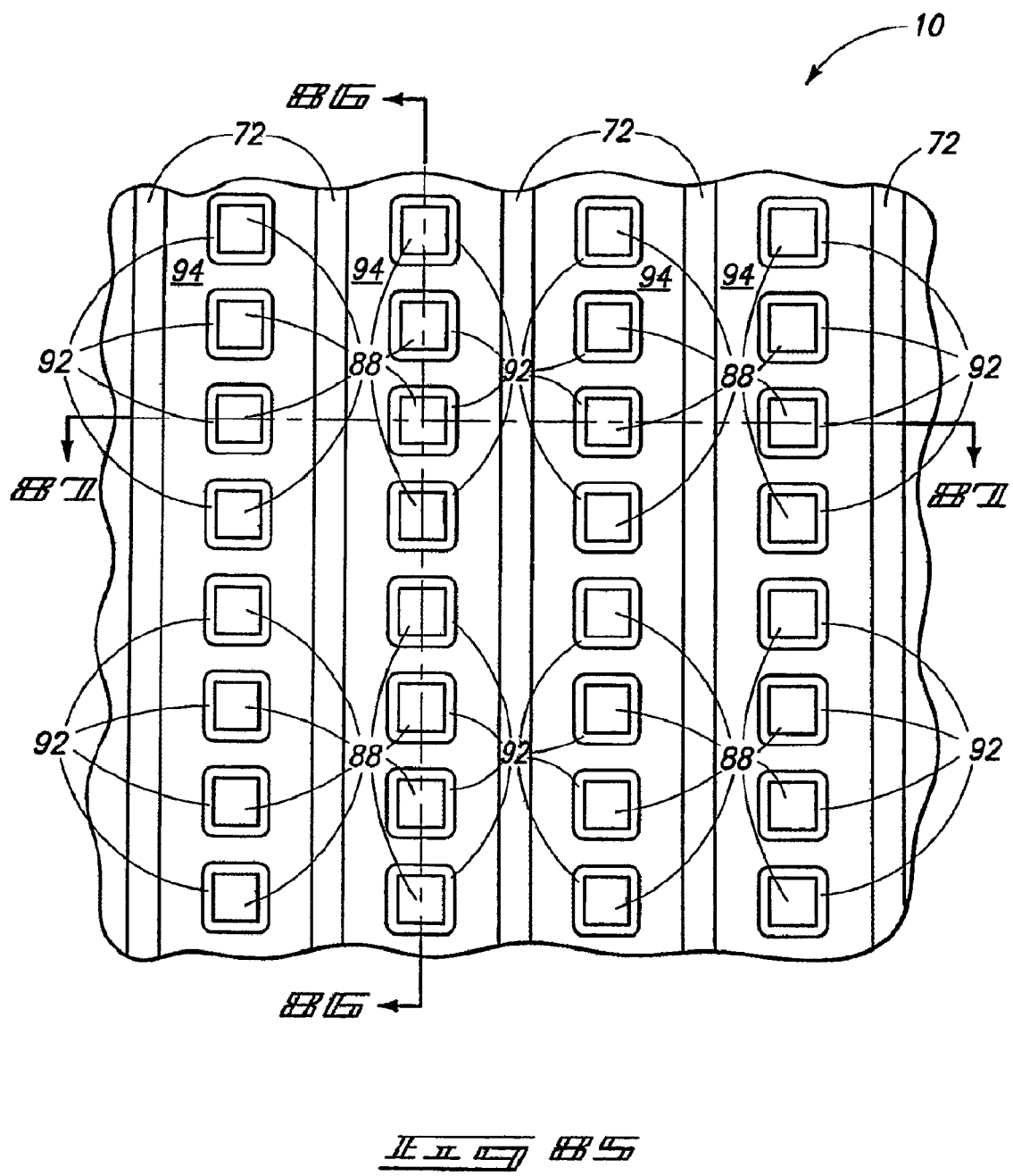
FIGS. 85-87 are a fragmentary, diagrammatic top view and cross-sectional side views of the construction of FIGS. 1-3 shown at a processing stage subsequent to that of FIGS. 82-84.
Figure 86:
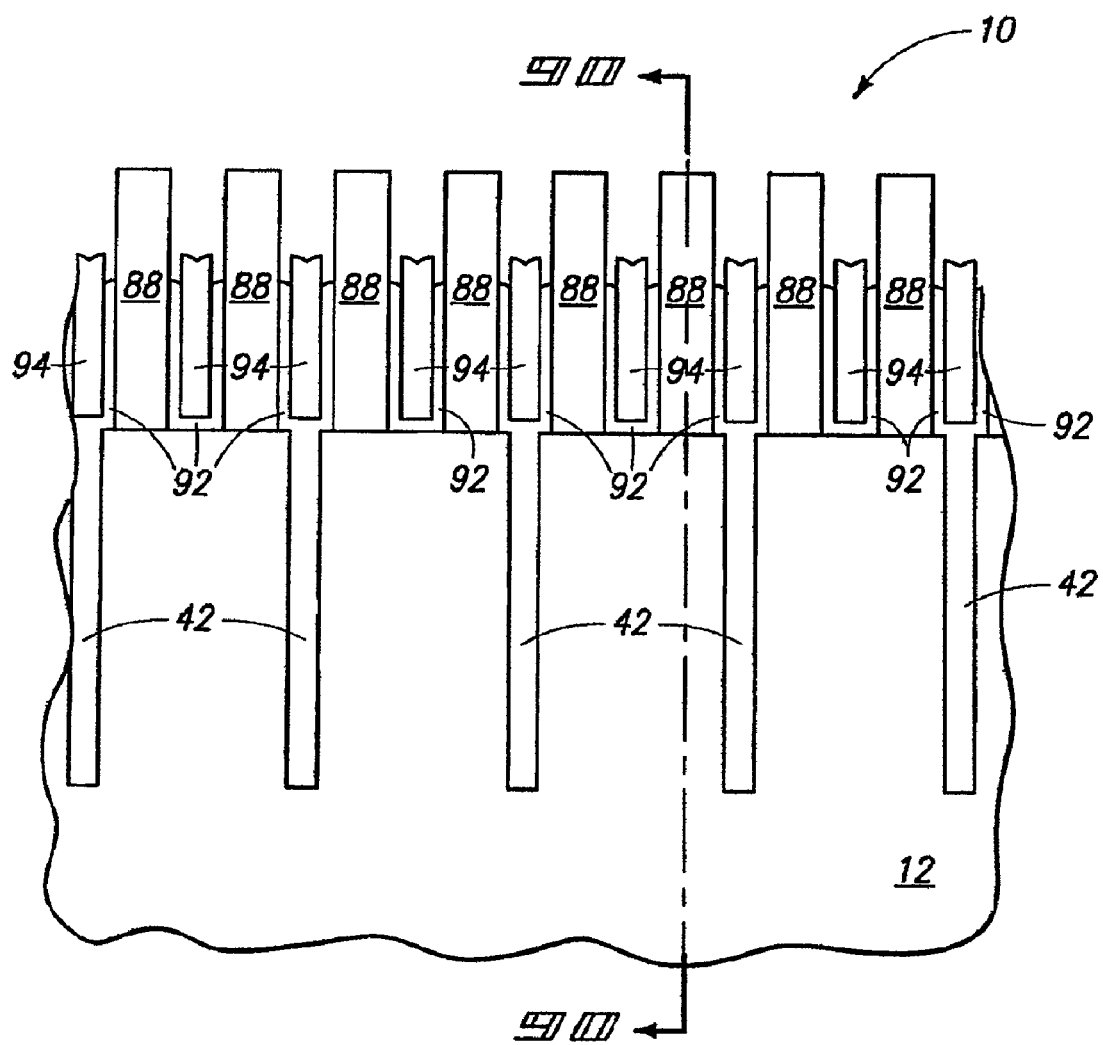
Figure 87:
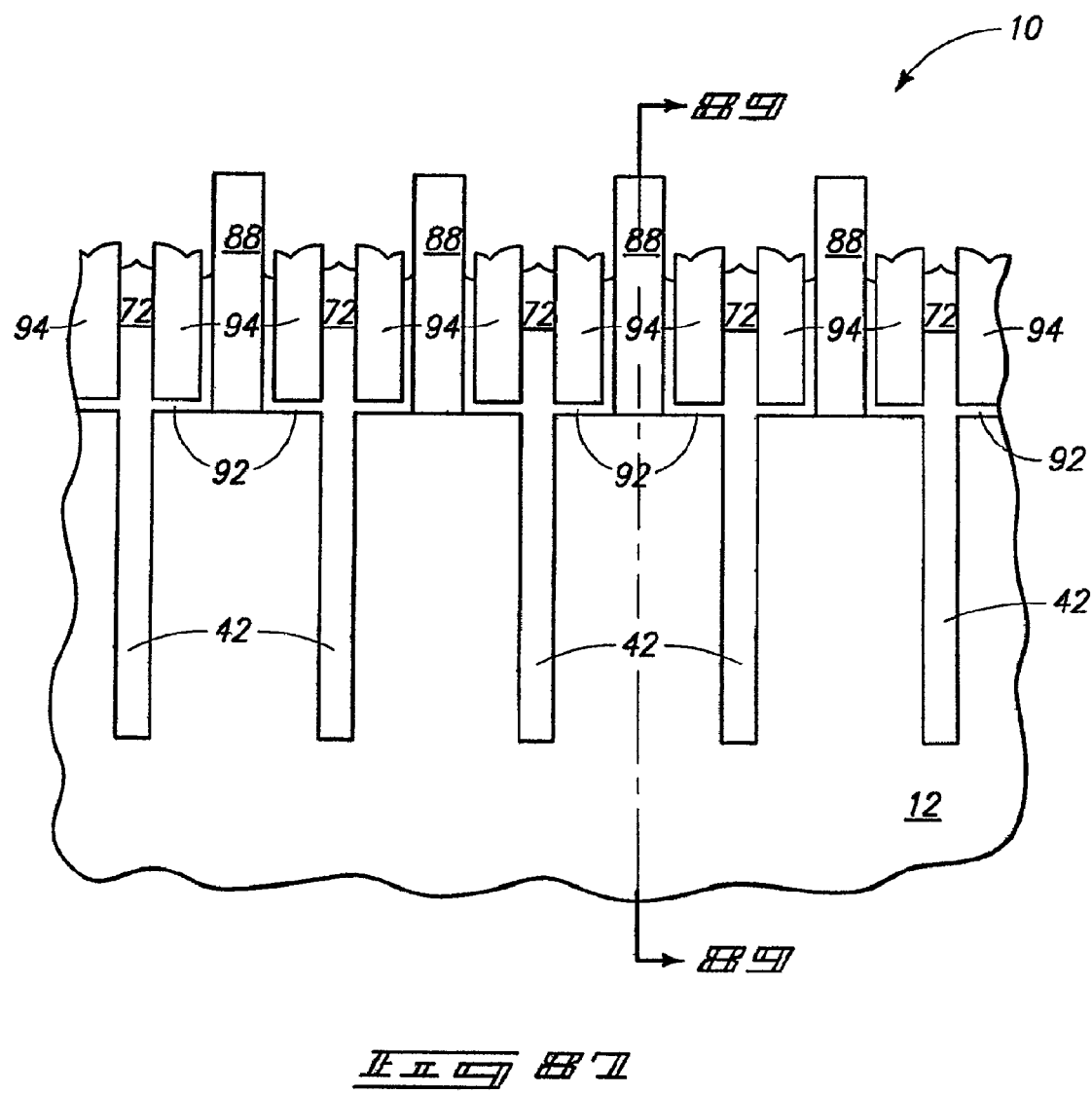

Referring next to FIGS. 85-87, construction 10 is subjected to appropriate conditions which remove exposed portions of material 72 and of dielectric 92. In exemplary aspects, both material 72 and dielectric 92 consist of silicon dioxide, and the conditions utilized to remove exposed portions of material 72 and dielectric 92 are a wet oxide etch which removes about 150 Å of oxide. The removal of the dielectric material from over pedestals 88 exposes upper surfaces of the pedestals.

Figure 88:
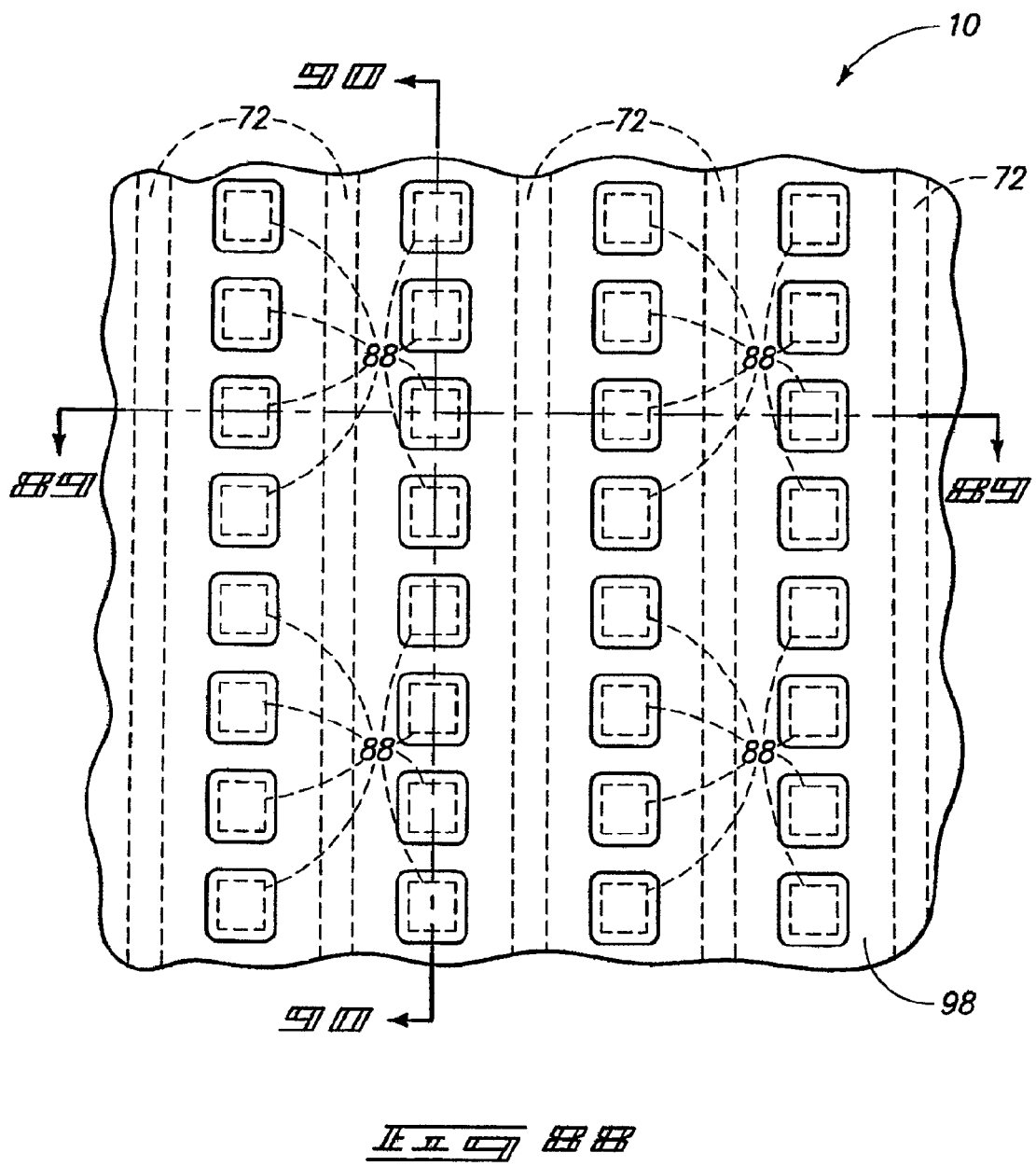
FIGS. 88-90 are a diagrammatic, fragmentary top view and cross-sectional side views of the construction of FIGS. 1-3 shown at a processing stage subsequent to that of FIGS. 85-87.
Figure 89:
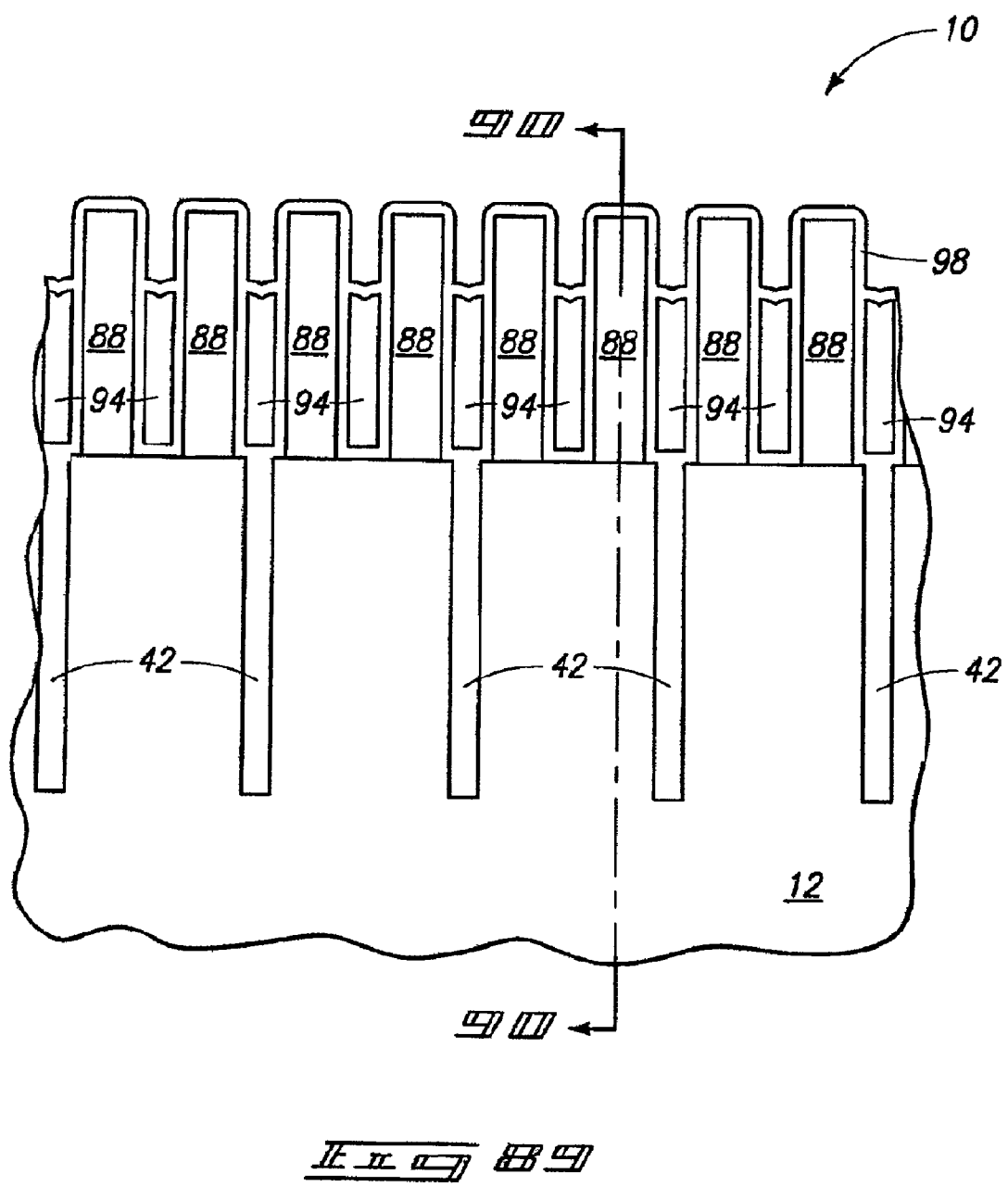
Figure 90:
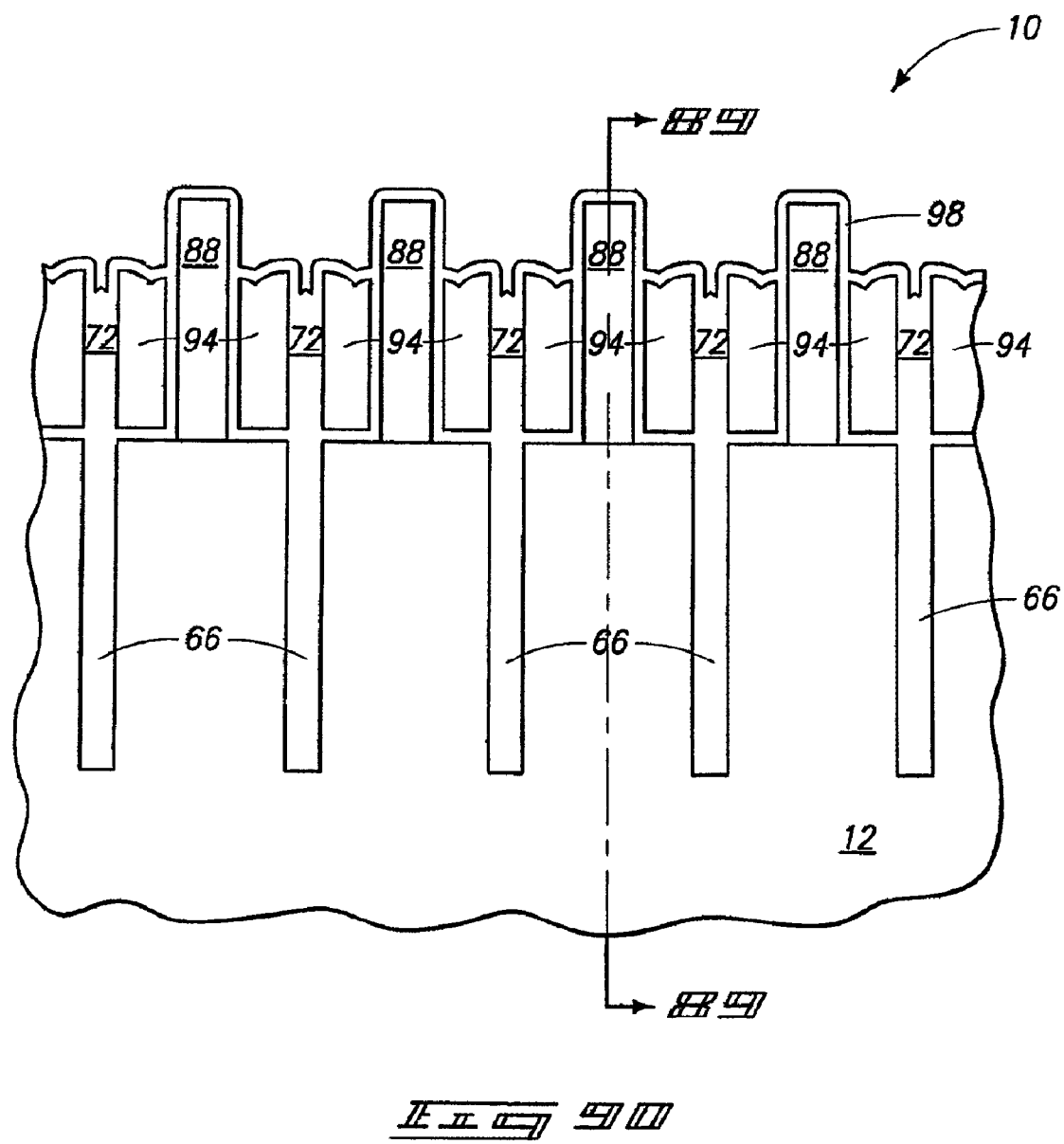

Referring next to FIGS. 88-90, a second dielectric material is formed over gateline material 94 and exposed surfaces of pedestals 88. In particular aspects, the second dielectric material comprises the same composition as first dielectric material 92 (FIGS. 85-87). For instance, the first and second dielectric materials can both comprise, consist essentially of, or consist of silicon dioxide. The second dielectric material is shown comprising the same composition as material 92, and accordingly the two dielectric materials merge to form a single dielectric material 98. In aspects in which the second dielectric material consists essentially of silicon dioxide, material 88 comprises silicon and material 94 comprises silicon, the second dielectric material can be formed by oxidation of exposed surfaces of materials 88 and 94. In such aspects, the second dielectric material can consist of silicon dioxide formed to a thickness of about 70 Å. The material 98 comprising the combined first and second dielectric materials can consist of silicon dioxide and have a thickness of about 70 Å throughout.

In particular aspects of the invention, pedestals 88 are vertically-elongated source/drain regions (specifically, elevationally vertically elongated), and material 94 is a gateline extending around the source/drain regions. It is noted that dielectric material 98 and gateline material 94 of FIGS. 88-90 have together replaced the first material 76 of FIG. 66, and vertically-elongated source/drain regions 88 have replaced the second material 14 of FIG. 66. Accordingly, the gateline material 94 of FIGS. 88-90 now forms a lattice comparable to the lattice formed by material 76 of FIG. 66, and the source/drain regions 88 form an array with repeating regions spaced from one another by segments of the lattice. The array has the first pitch along a first axis discussed with reference to FIG. 66, and the second pitch along a second axis orthogonal to the first axis, with the second pitch being about twice as big as the first pitch. In particular aspects, the first material 76 is silicon nitride and the second material 14 is non-nitride material (for example, silicon dioxide), and accordingly the invention encompasses replacing at least some of the silicon nitride lattice with one or conductive materials of a gateline, and replacing at least some of the non-nitride regions within the lattice with doped semiconductor material to form vertically-extending source/drain regions. In other aspects of the invention, the composition of the lattice 76 and the spaced regions 14 can be reversed, so that the lattice of FIG. 66 is silicon dioxide and the spaced regions 14 are non-oxide materials (for example, silicon nitride). In such aspects, at least some of the silicon dioxide lattice can be replaced with one or more conductive materials of the gateline, and at least some of the non-oxide regions 14 can be replaced with vertically-extending source/drain regions.

In the aspect of the invention of FIGS. 66-90, spaced regions 14 of FIG. 66 are replaced with source/drain material before the lattice material 76 is replaced with gateline material. It is to be understood, however, that the invention encompasses other aspects in which the lattice is replaced with one or more gateline materials before the regions 14 are replaced with source/drain materials.

Figure 91:
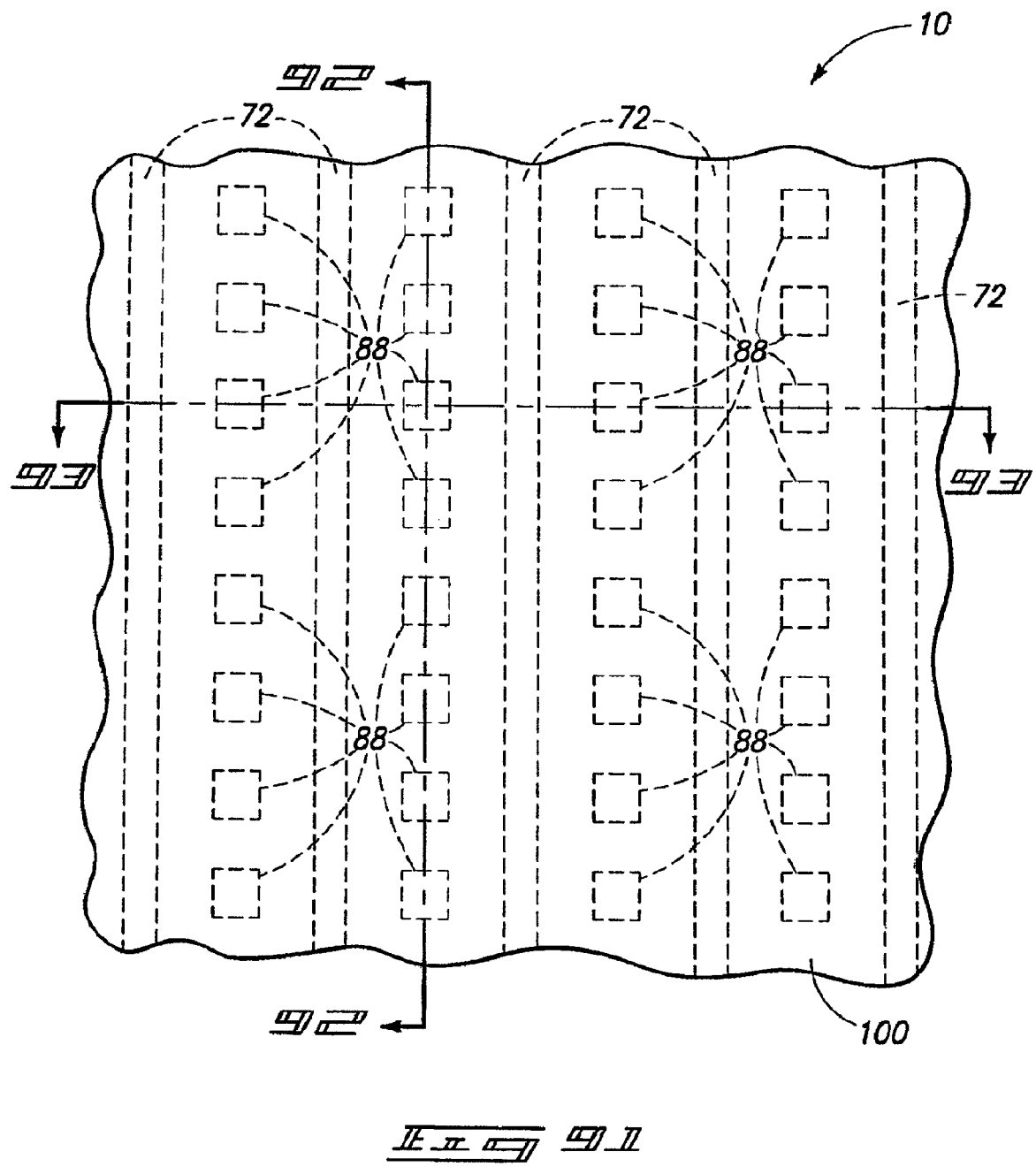
FIGS. 91-93 are a diagrammatic, fragmentary top view and cross-sectional side views of the construction of FIGS. 1-3 shown at a processing stage subsequent to that of FIGS. 88-90.
Figure 92:
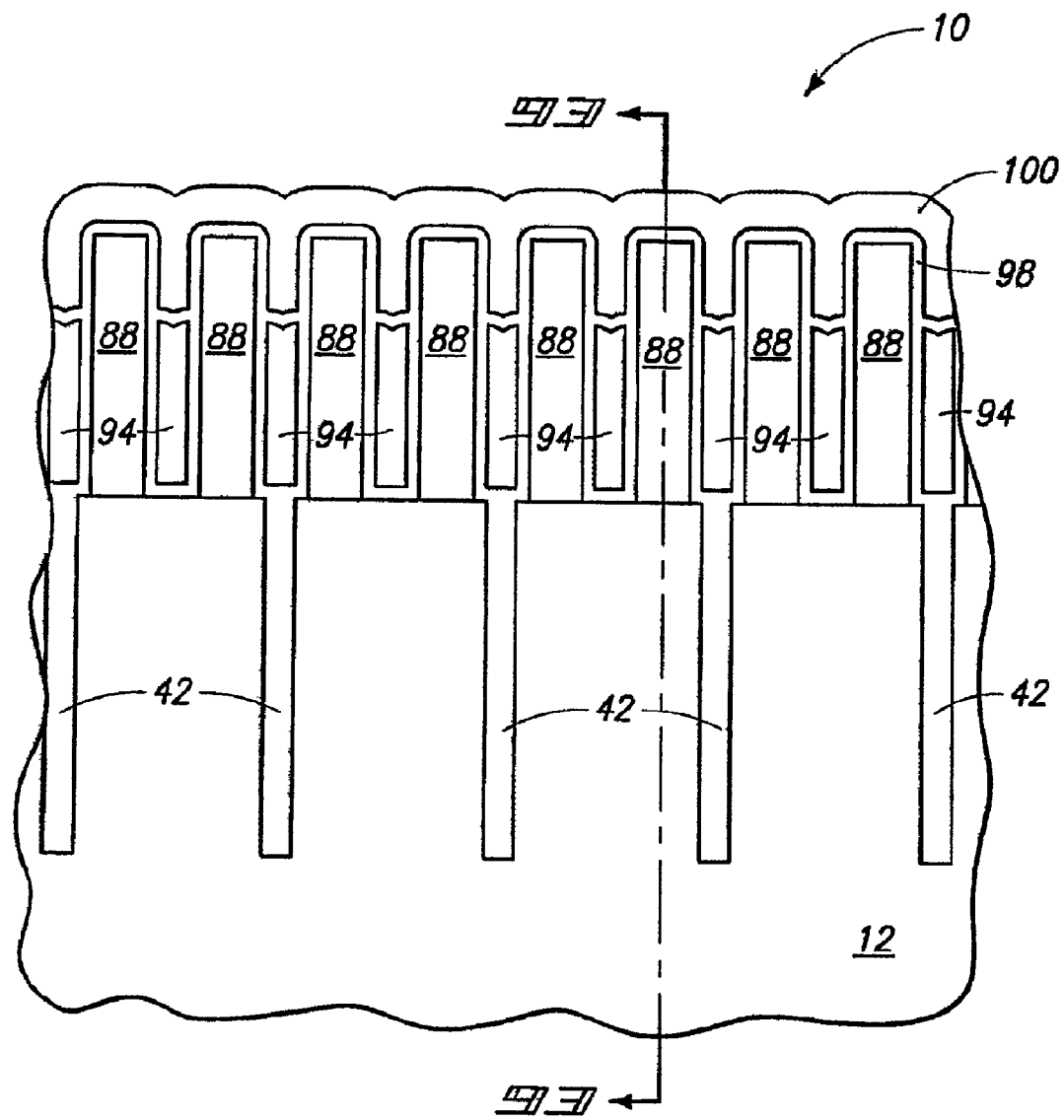
Figure 93:
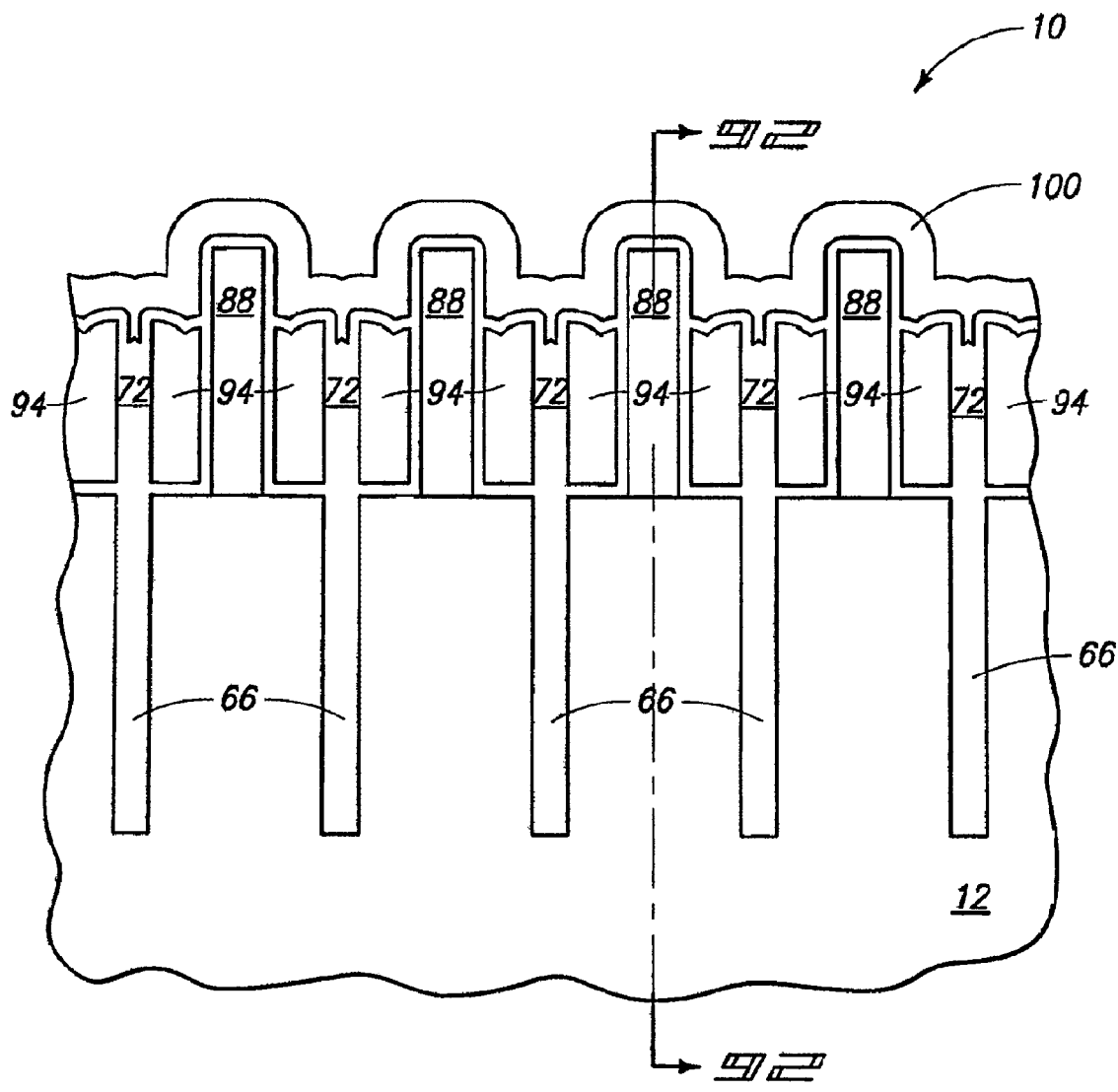

Referring next to FIGS. 91-93, an electrically insulative capping material 100 is formed over the dielectric material 98. Capping material 100 can comprise any suitable electrically insulative material, and in particular, aspects will comprise, consist essentially of, or consist of silicon nitride. Such silicon nitride can be formed to a thickness of, for example, about 200 Å. The materials 72 and 88 are shown in dashed-line view in FIG. 91 to indicate that such regions are below other materials in the shown view.

Figure 94:
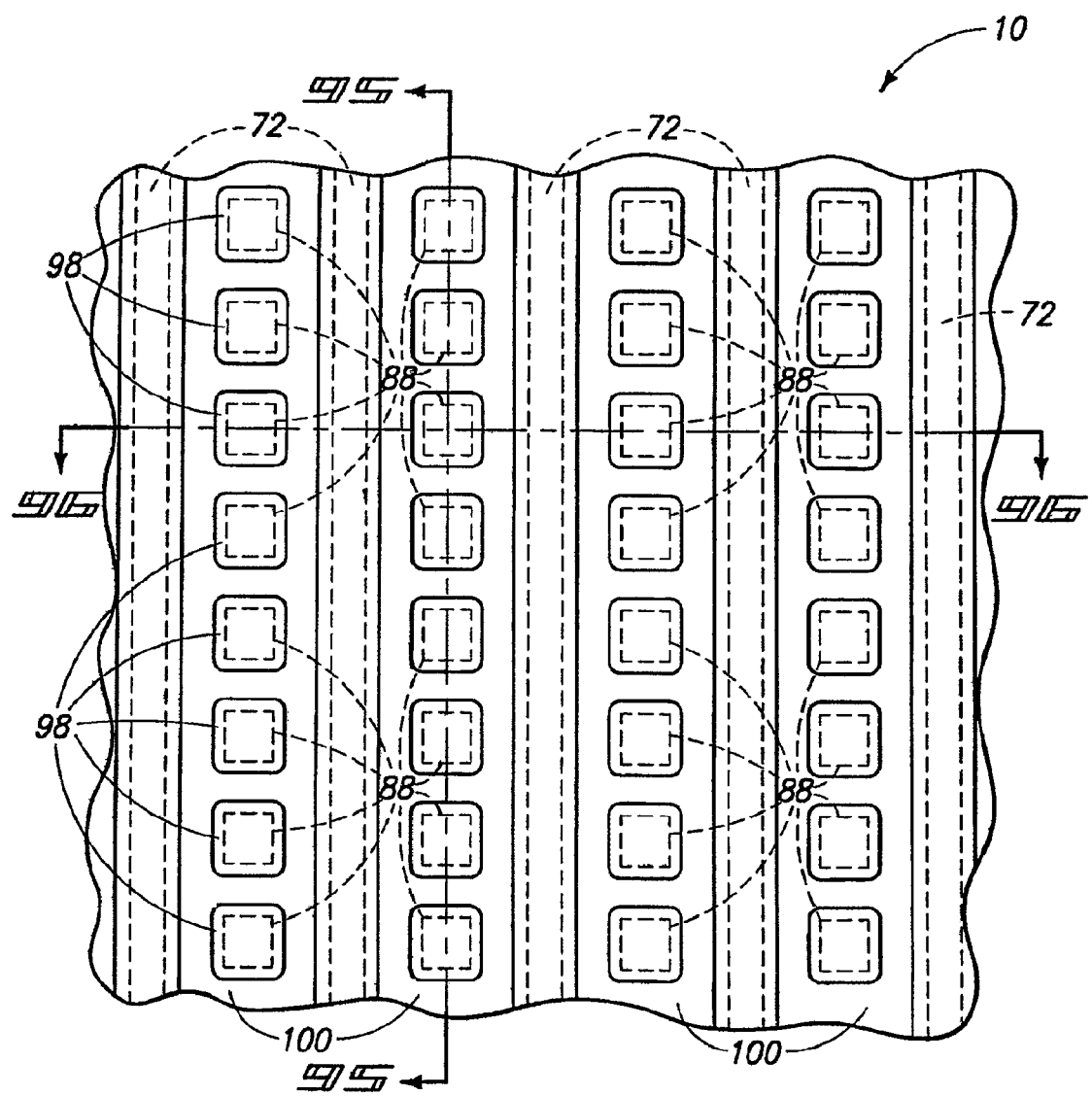
FIGS. 94-96 are a diagrammatic, fragmentary top view and cross-sectional side views of the construction of FIGS. 1-3 shown at a processing stage subsequent to that of FIGS. 91-93.
Figure 95:
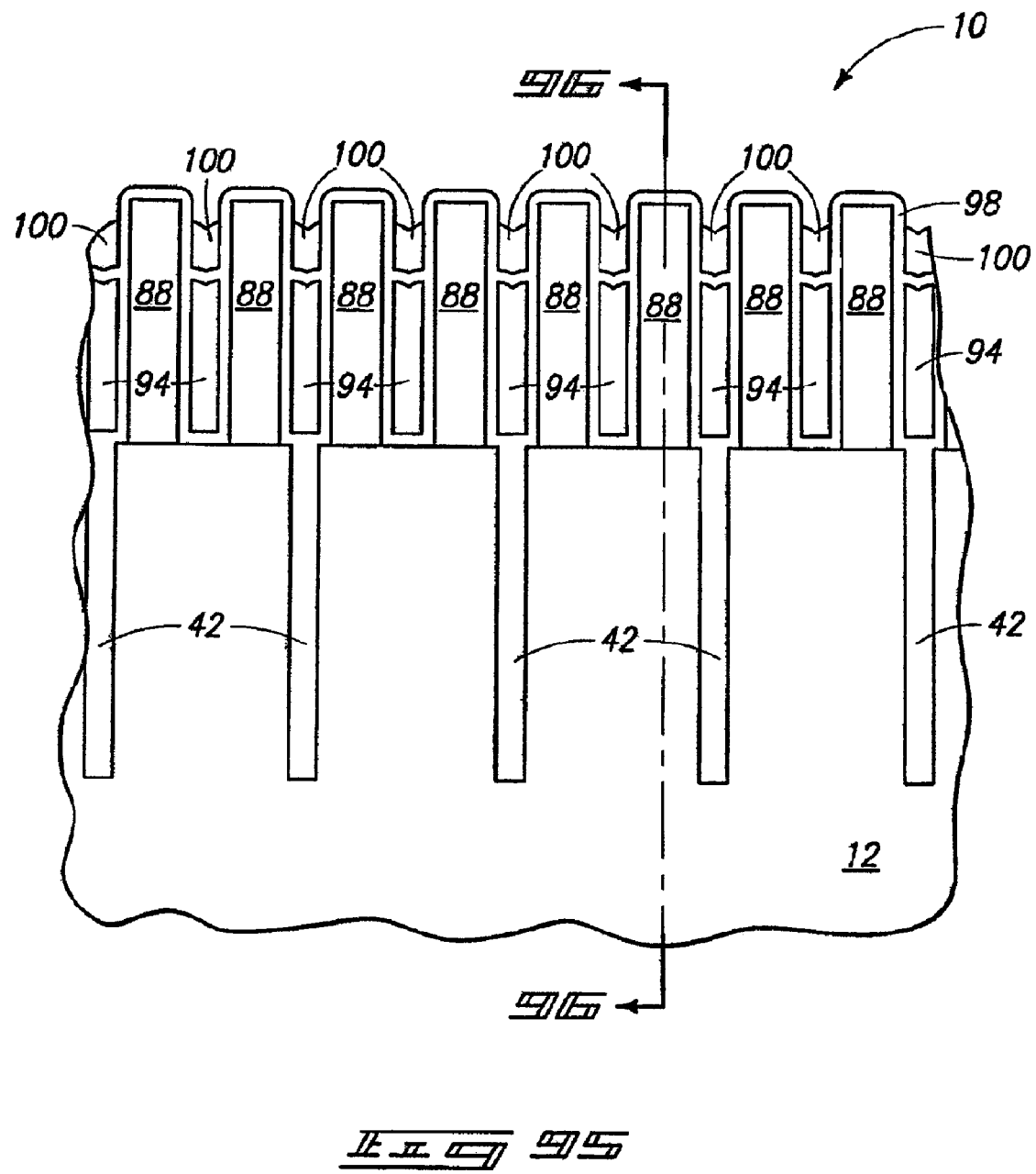
Figure 96:
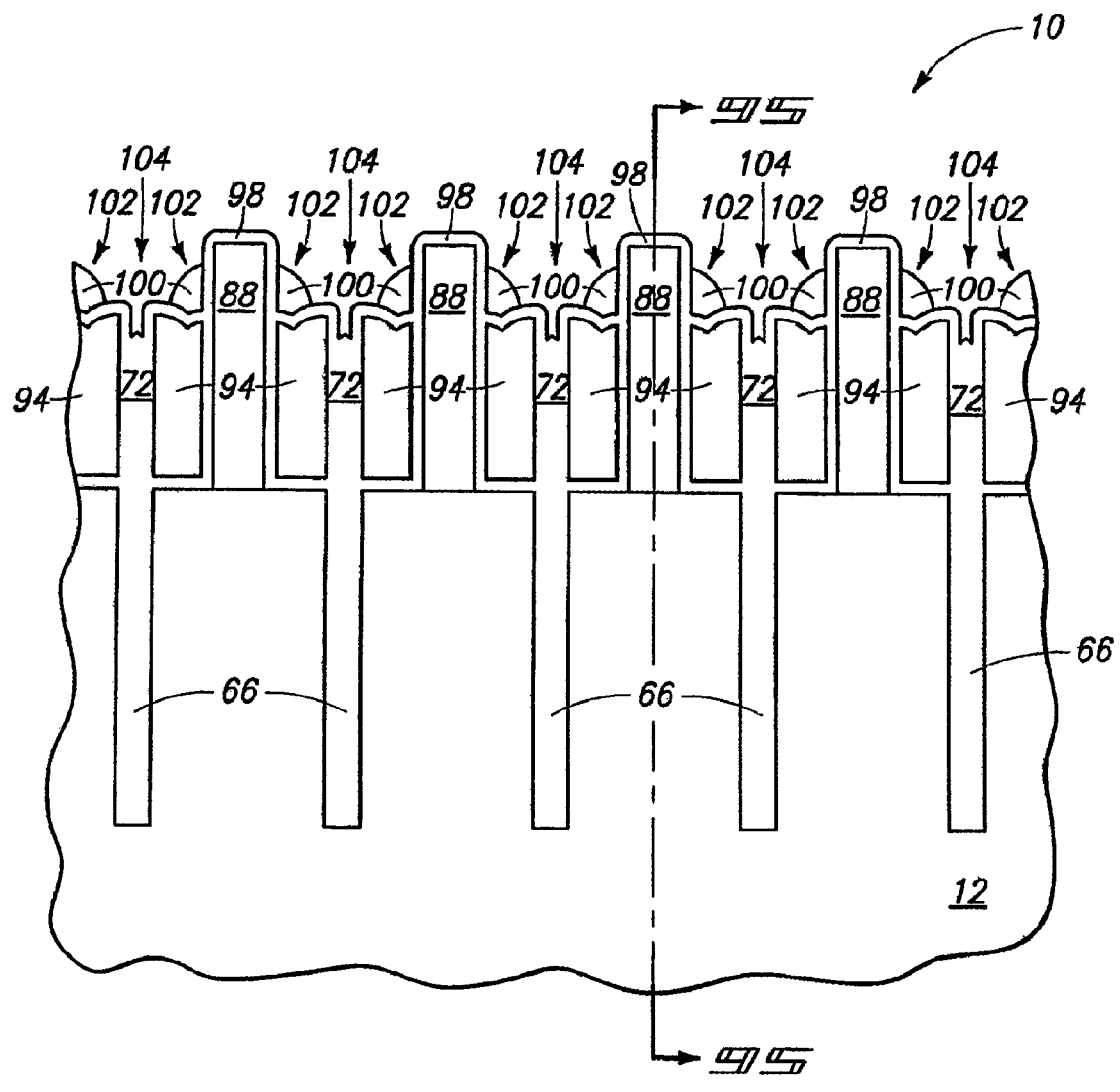

Referring next to FIGS. 94-96, material 100 is subjected to a spacer etch which forms spacers 102 and openings 104 extending between the spacers.

Figure 98:
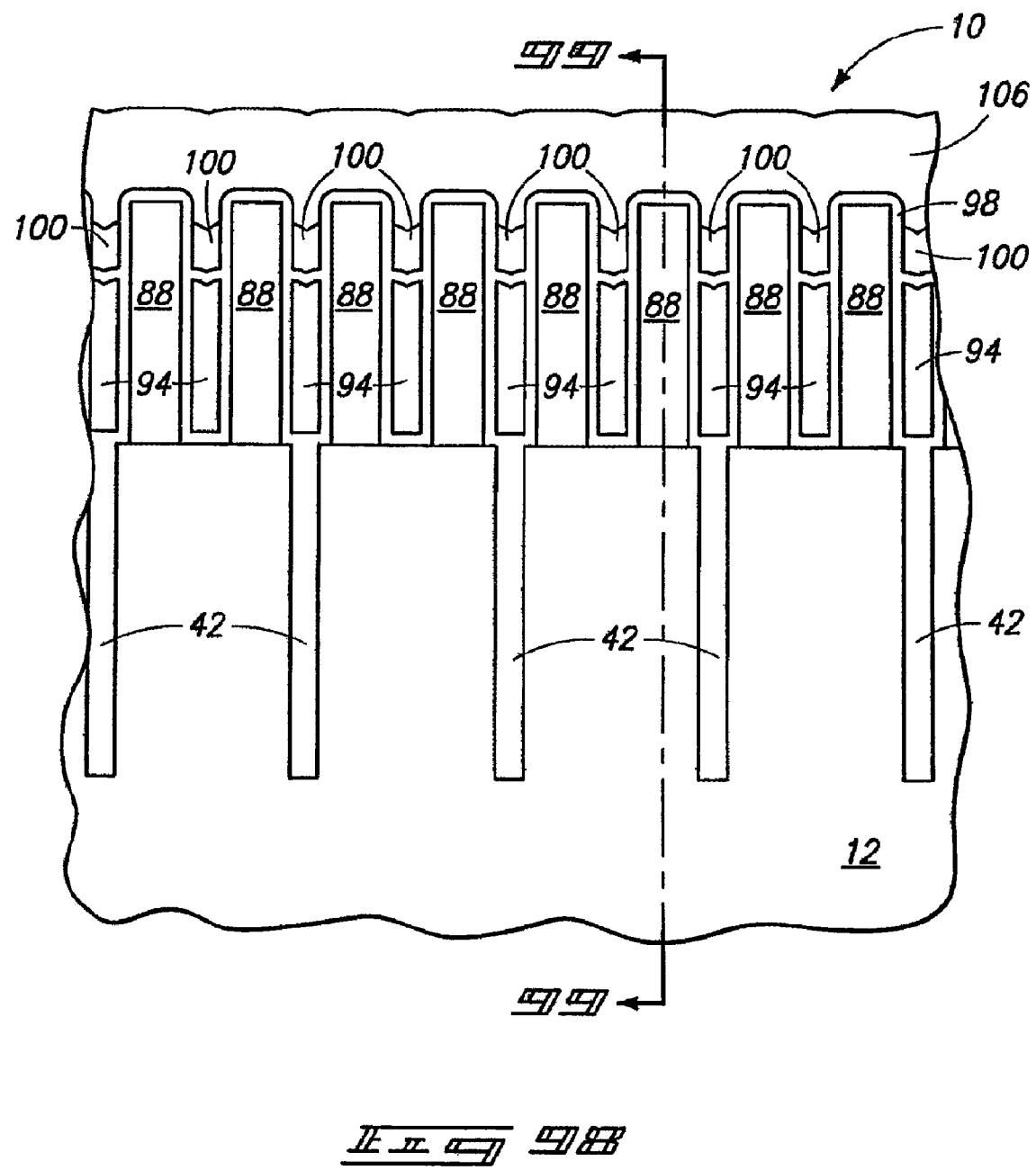
Figure 99:
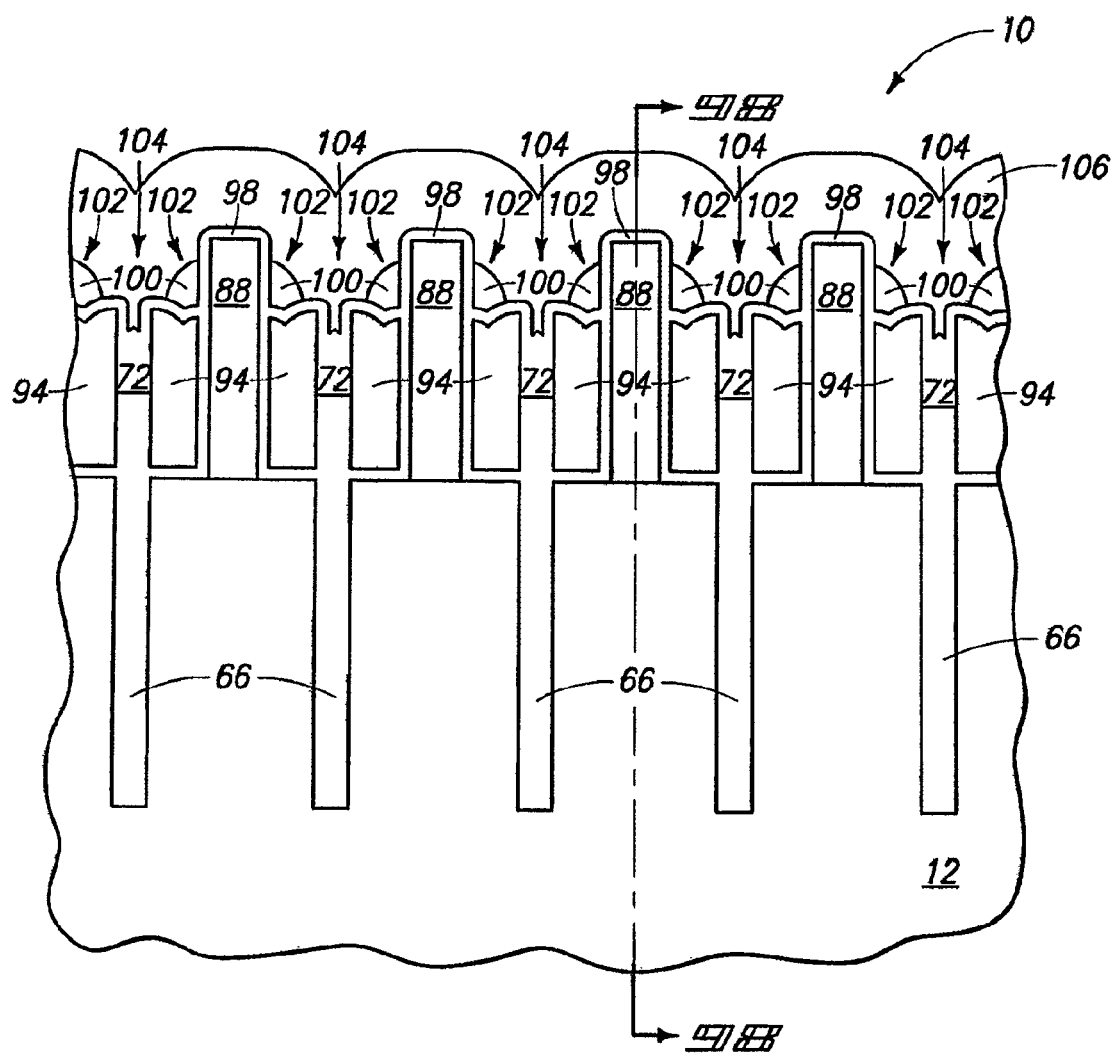

Referring next to FIGS. 97-99, an electrically insulative material 106 is formed over the spacers 102 of material 100, and within openings 104. Material 106 can comprise, consist essentially of, or consist of, for example, silicon dioxide, and can be formed to a thickness of, for example, about 500 Å.

Figure 100:
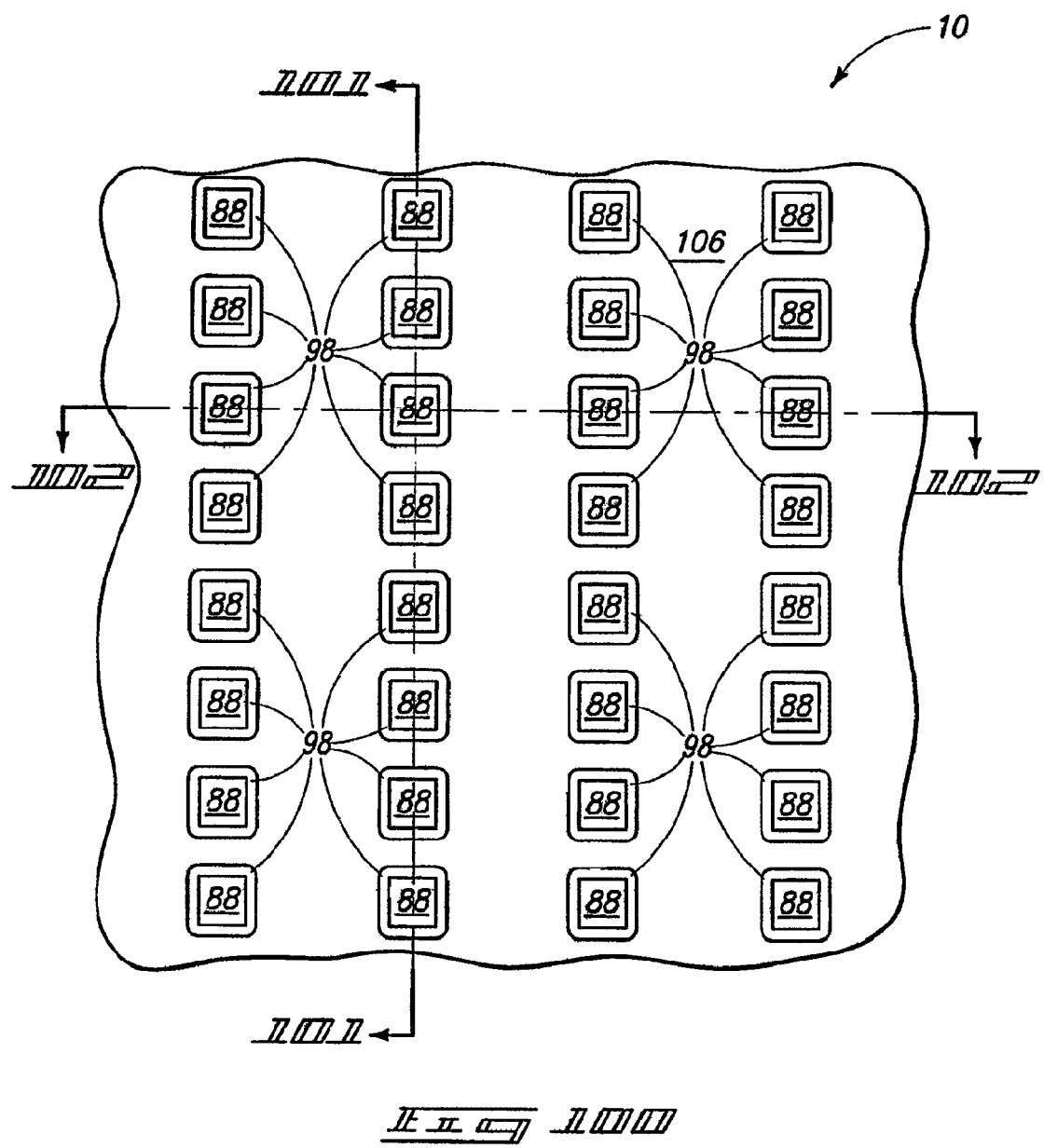
FIGS. 100-102 are a diagrammatic, fragmentary top view and cross-sectional side views of the construction of FIGS. 1-3 shown at a processing stage subsequent to that of FIGS. 97-99.
Figure 101:
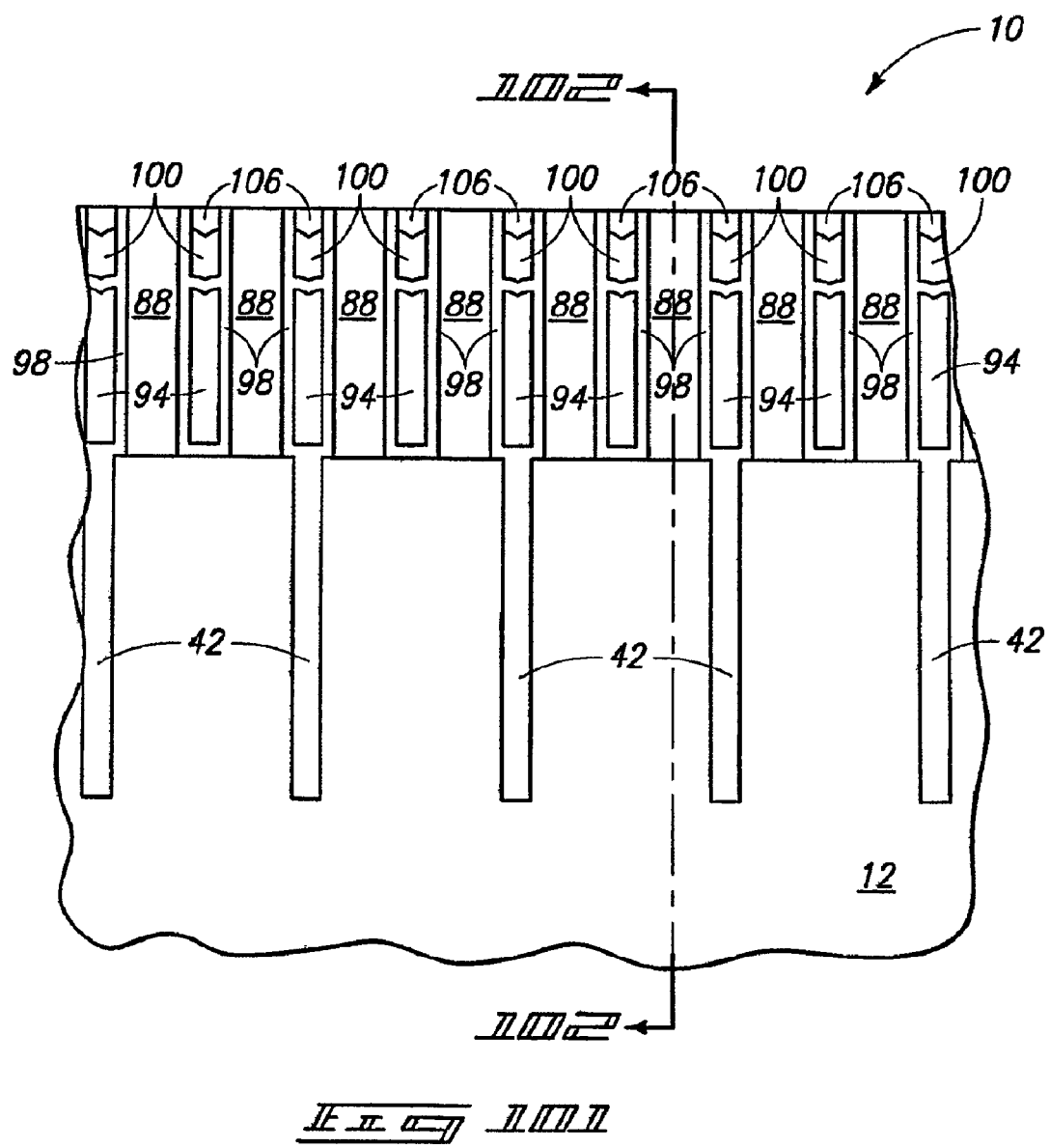
Figure 102:
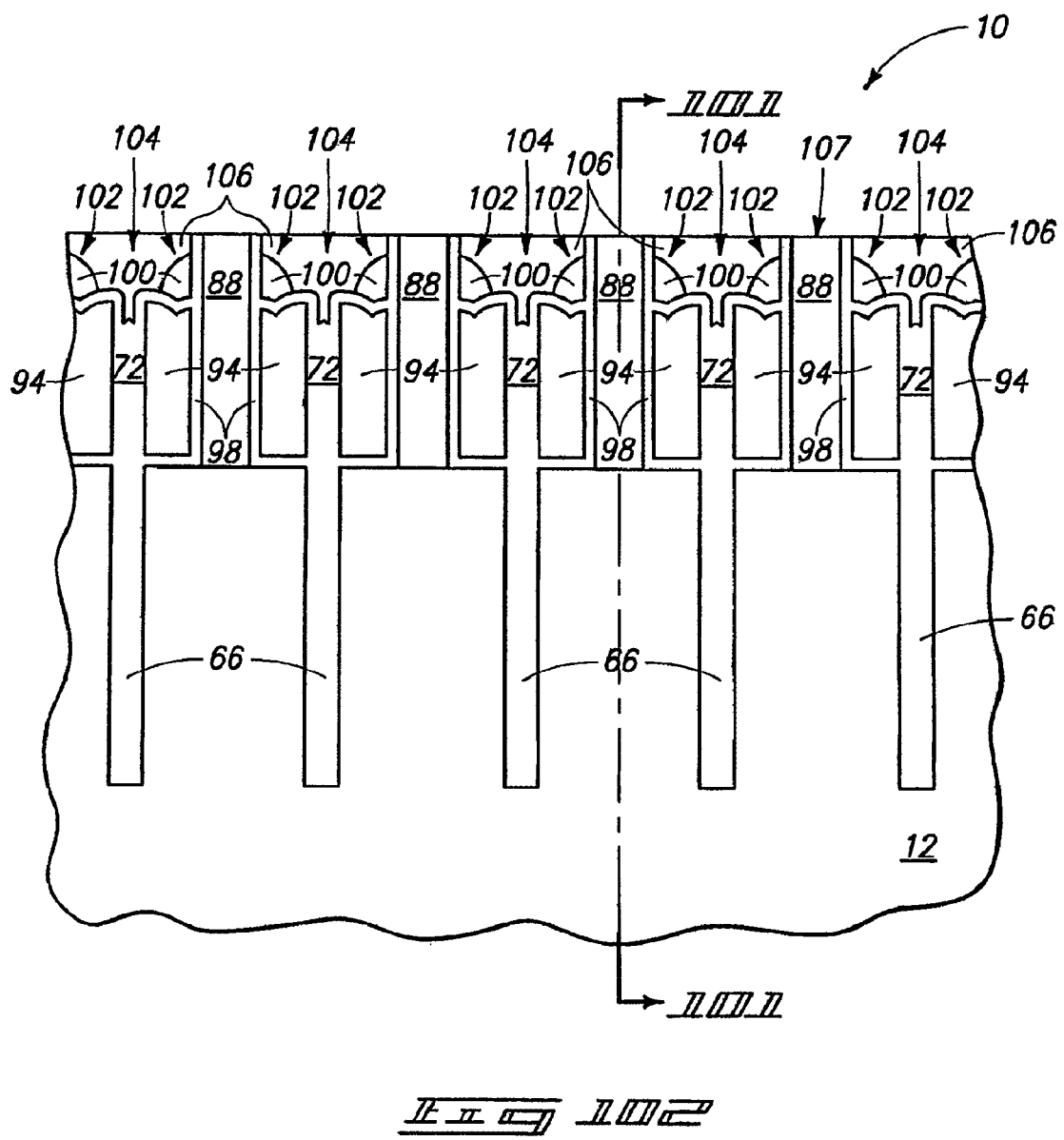

Referring next to FIGS. 100-102, an upper surface of construction 10 is planarized to remove materials 106 and 98 from over upper surfaces of pedestals 88, and to thereby expose the upper surfaces of pedestals 88. The planarization of material 106 forms a planarized surface 107. The planarization can be accomplished by, for example, chemical-mechanical polishing, and can be conducted down to an elevational level of about 4300 Å above the uppermost surface of substrate 12. The materials 106 and 98 can be identical to one another, and in particular aspects can both be silicon dioxide.

Figure 103:
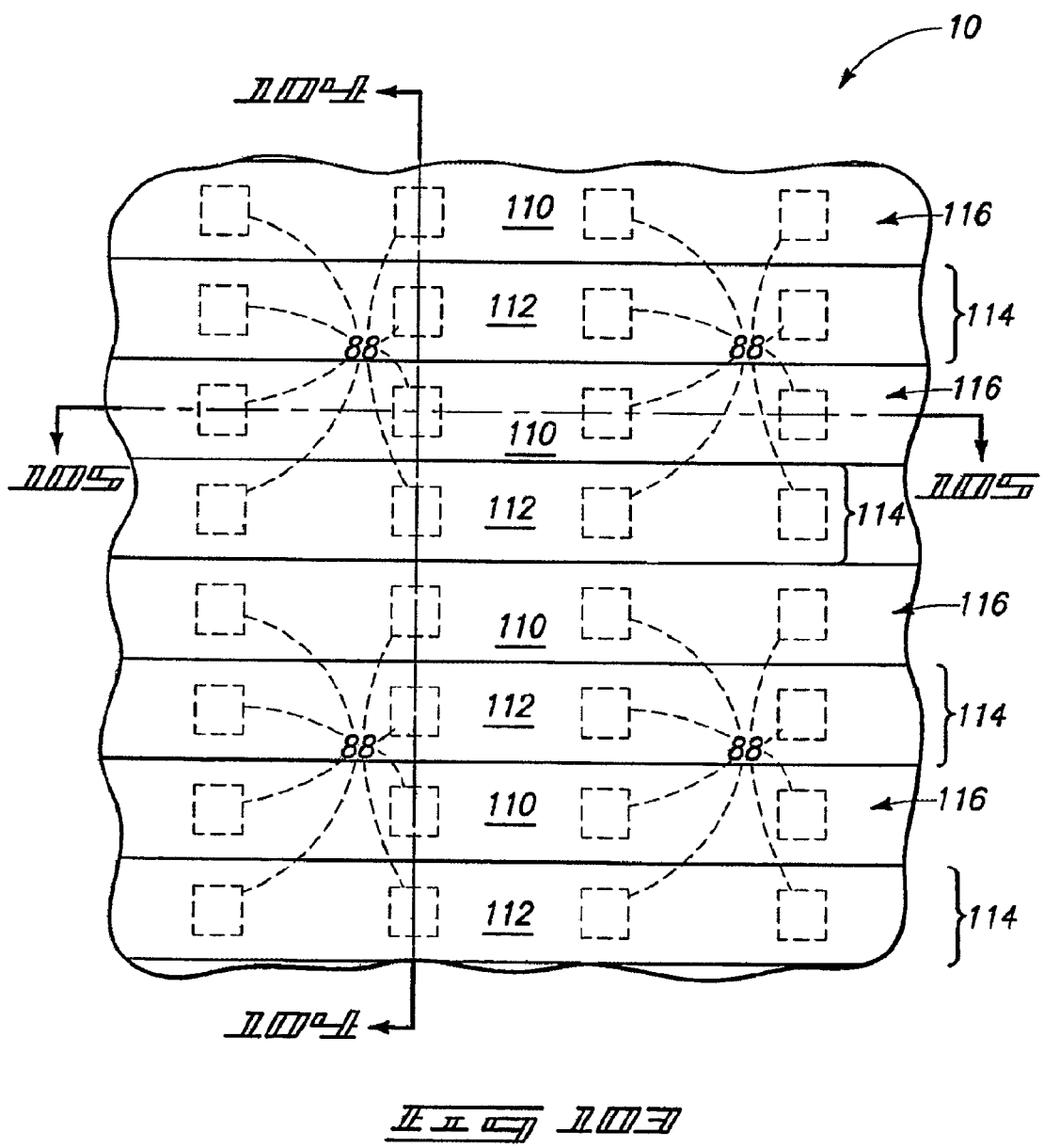
FIGS. 103-105 are a fragmentary, diagrammatic top view and cross-sectional side views of the construction of FIGS. 1-3 shown at a processing stage subsequent to that of FIGS. 100-102.
Figure 104:
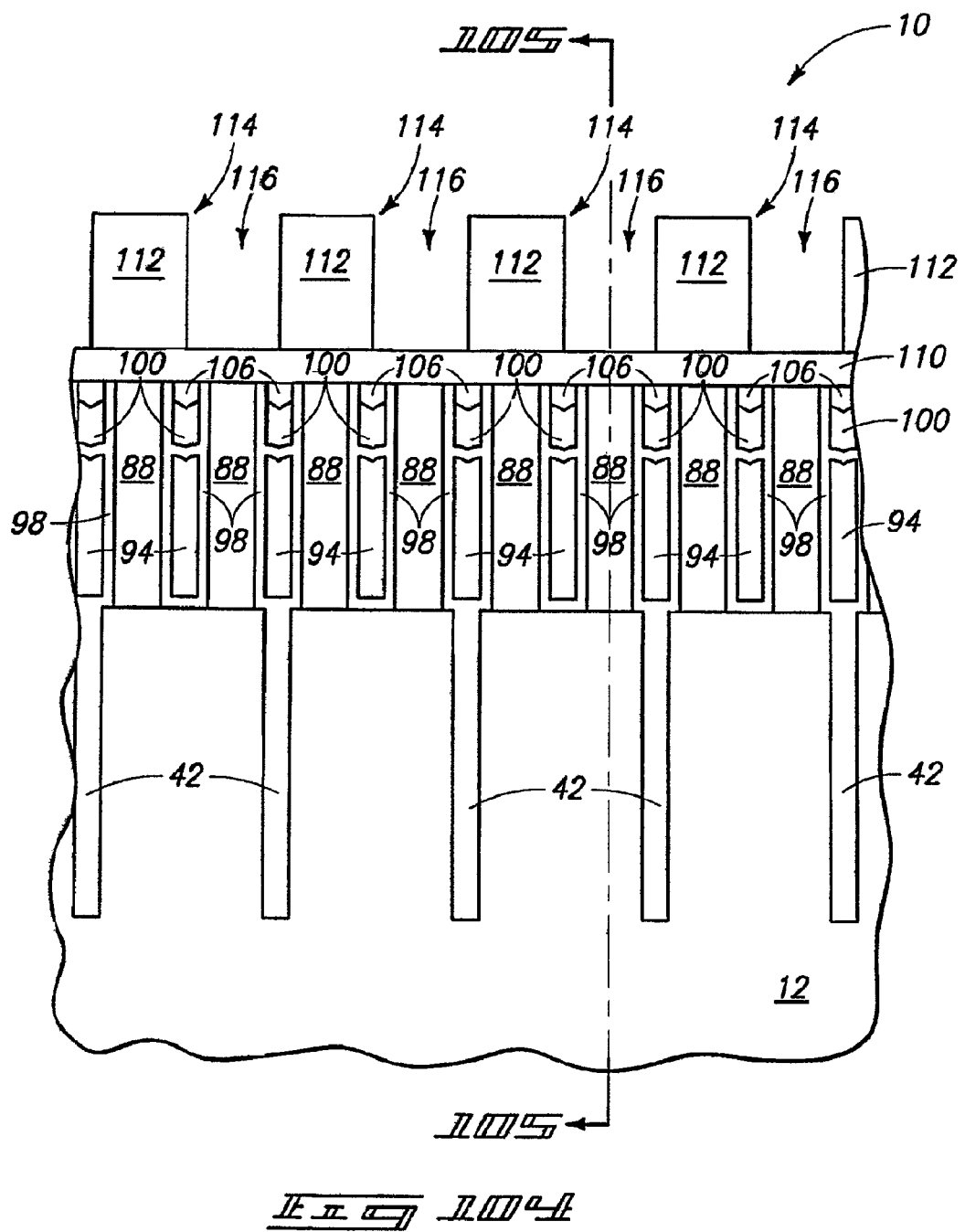
Figure 105:
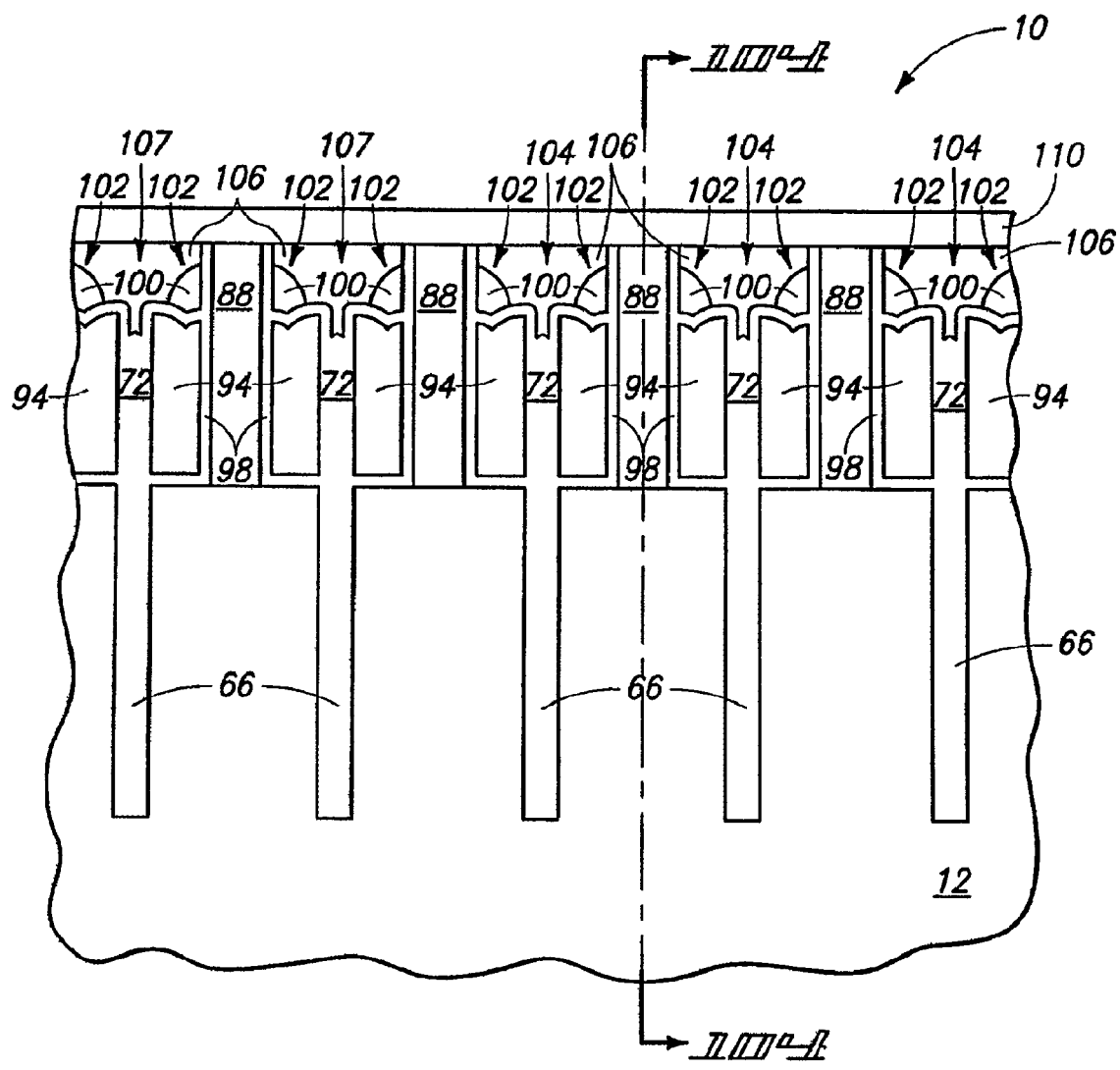

Referring next to FIGS. 103-105, a dielectric material 110 is formed over planarized surface 107 and a patterned masking material 112 is formed over dielectric material 110. Material 110 can comprise any suitable material, and in particular aspects will comprise, consist essentially of, or consist of silicon dioxide. If material 110 is silicon dioxide, such can be formed to an exemplary thickness of about 200 Å. Patterned masking material 112 can be, for example, photoresist, which is formed into the shown pattern with photolithographic processing. Material 112 is shown to form a plurality of horizontally-extending strips 114 in the views of FIGS. 103 and 104, with such strips being spaced from one another by gaps 116. Pedestals 88 are shown in dashed-line view in the top view of FIG. 103, to indicate that such pedestals have other materials thereover.

Figure 106:
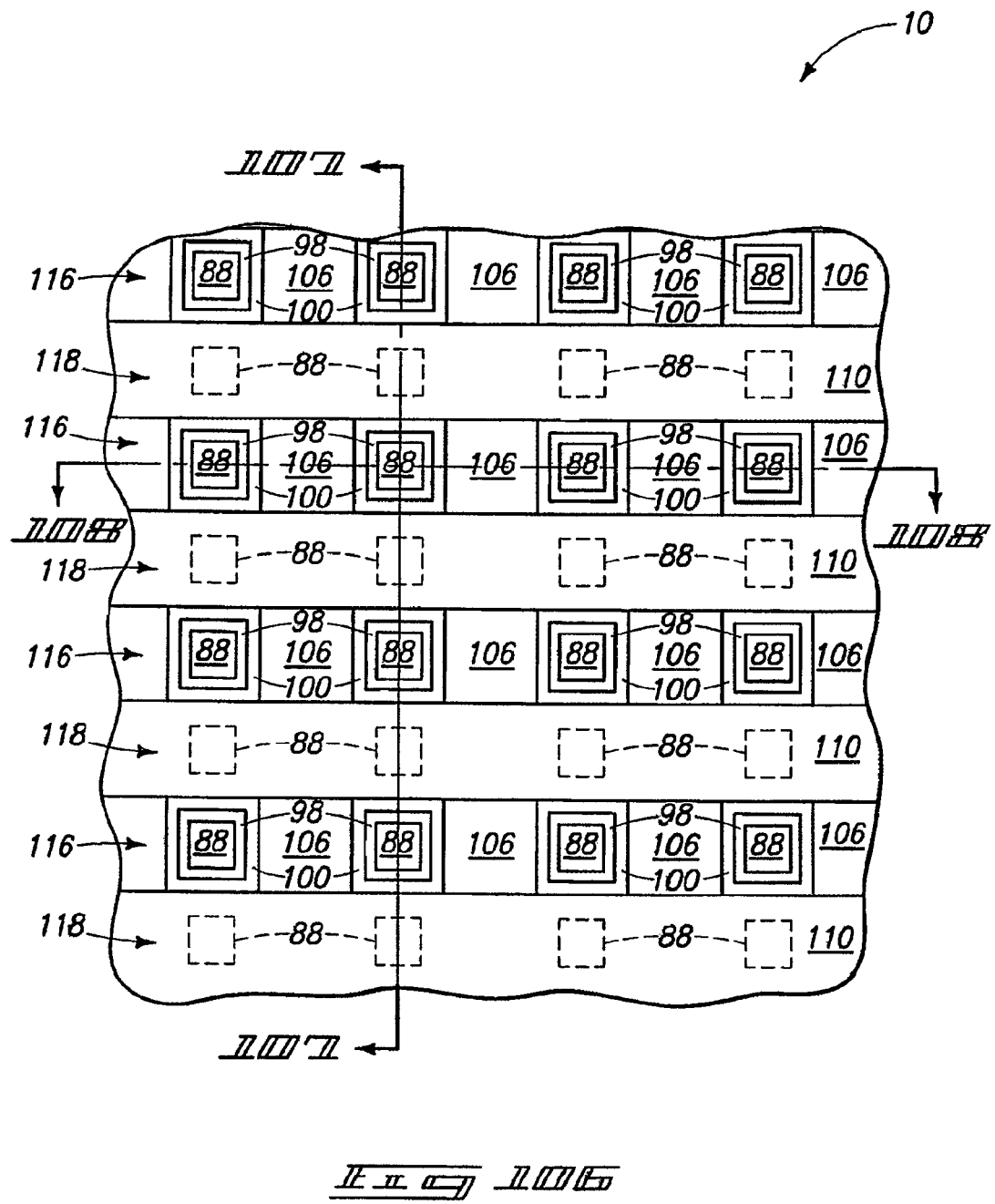
FIGS. 106-108 are a fragmentary, diagrammatic top view and cross-sectional side views of the construction of FIGS. 1-3 shown at a processing stage subsequent to that of FIGS. 103-105.
Figure 107:
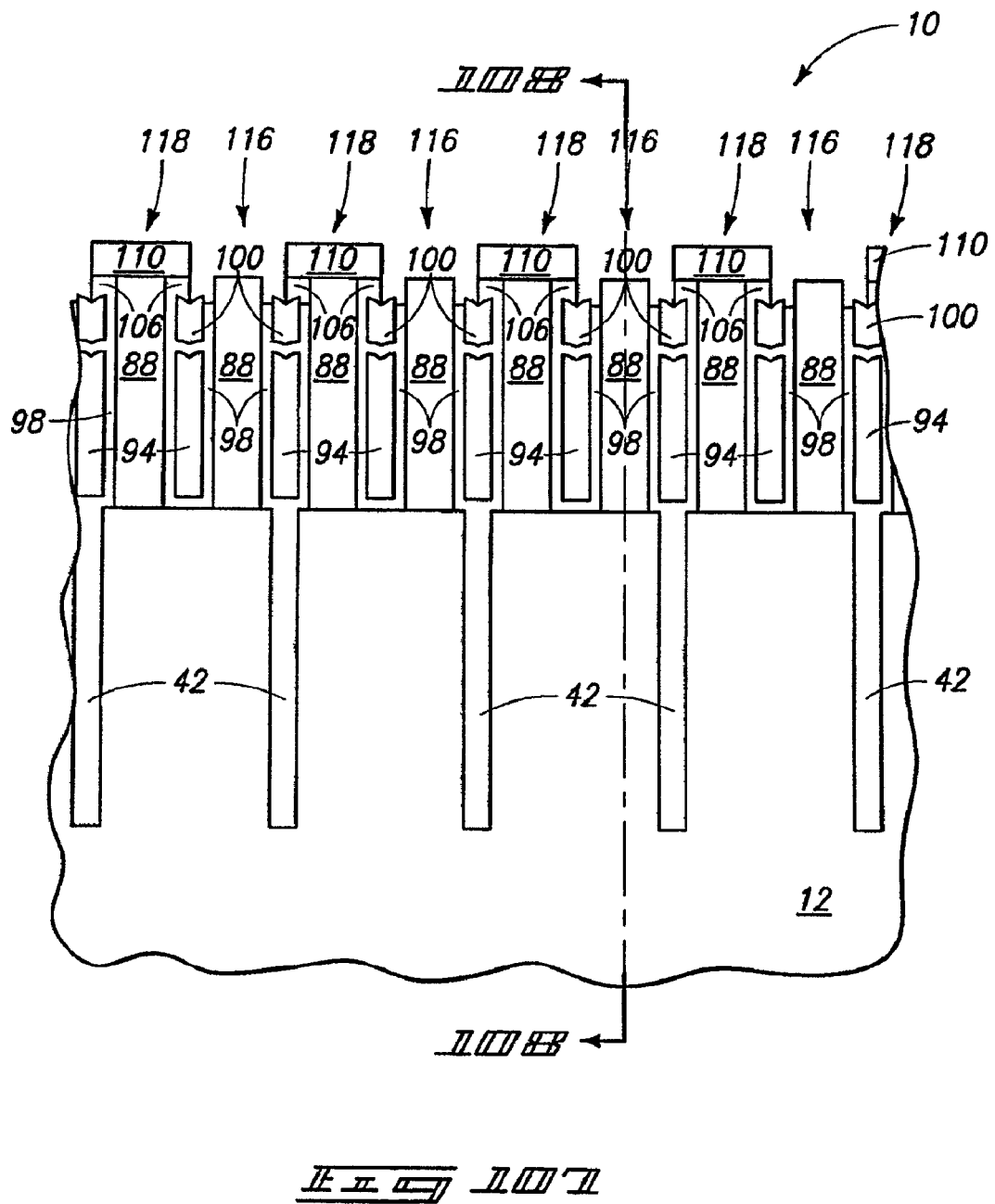
Figure 108:
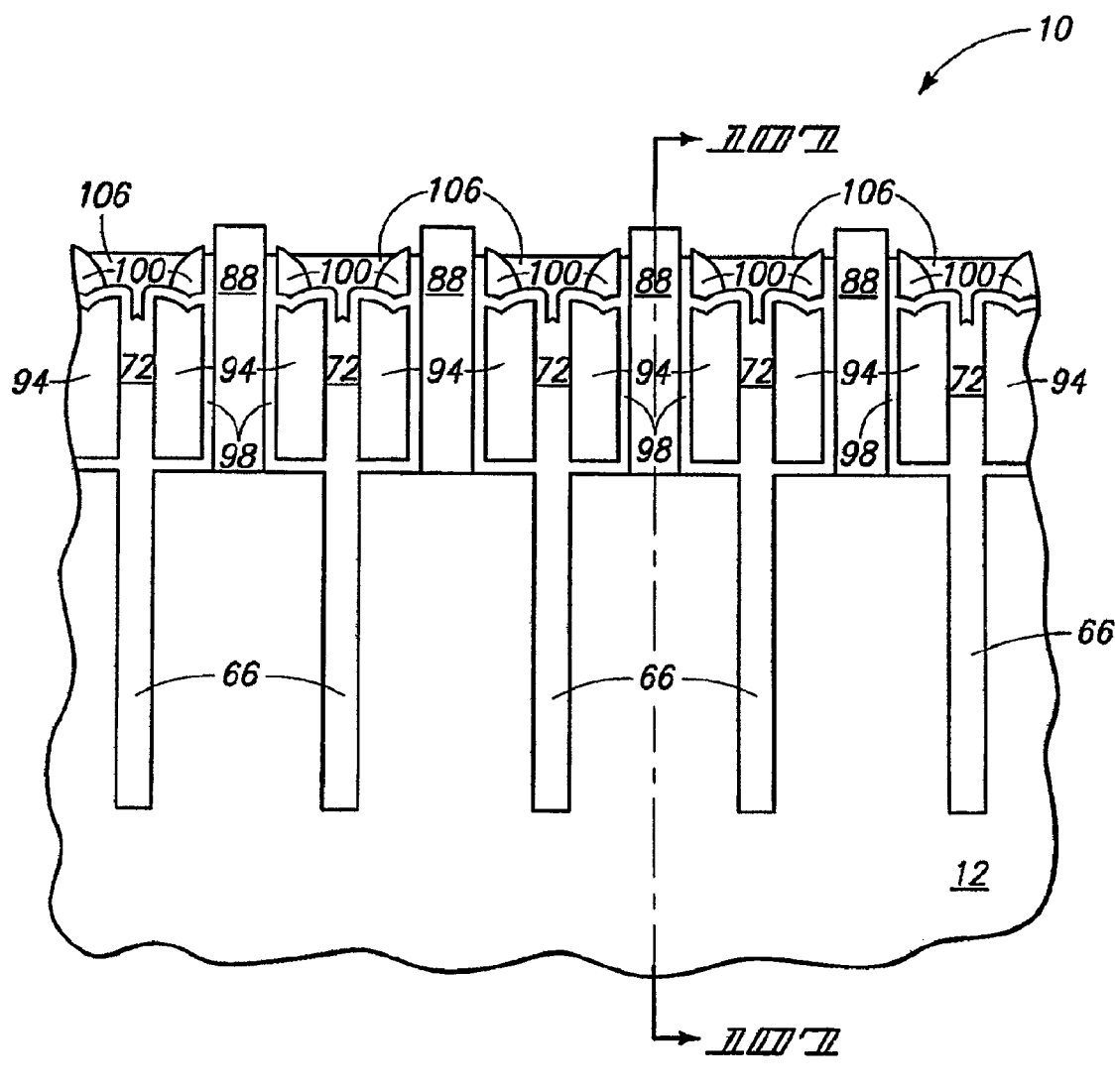

Referring next to FIGS. 106-108, gaps 116 are extended through material 110, and subsequently masking layer 112 (FIGS. 103-105) is removed. In aspects in which material 110 comprises silicon dioxide, the etch through material 110 can comprise a dry etch which removes at least about 300 Å of silicon dioxide. Such etch exposes upper surfaces of one set of the conductive pedestals, while leaving another set of the conductive pedestals covered by material 110. The exposed sets and covered sets alternate in horizontally-extending lines in the top view of FIG. 106. The exposed set of pedestals is ultimately connected to digit lines while the covered sets will ultimately be connected to memory storage devices, as will become more clear in the discussion that follows.

The material 110 remaining after gaps 116 are extended through material 110 is in the form of a plurality of lines 118 extending along a horizontal direction in the top view of FIG. 106.

Figure 109:
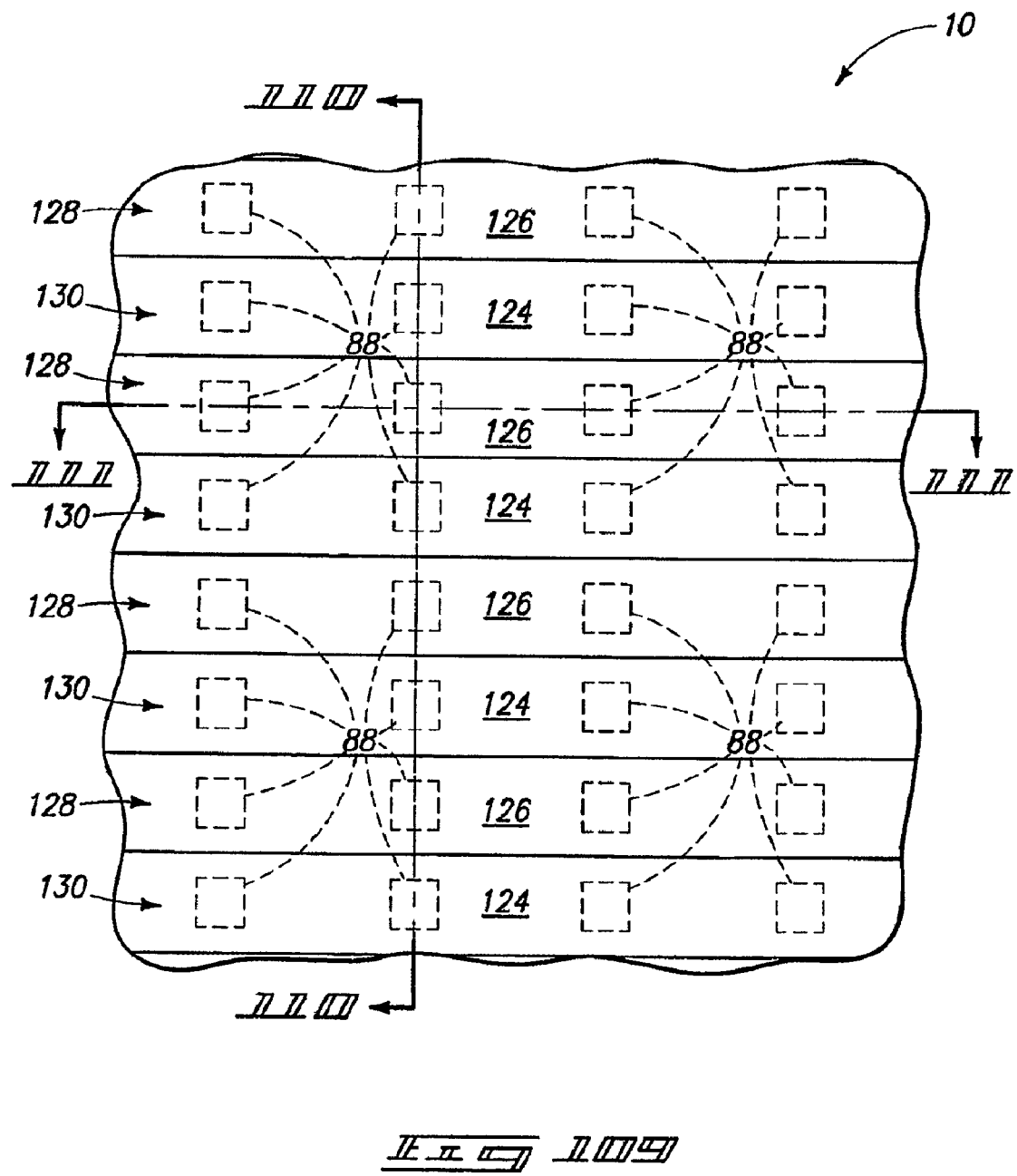
FIGS. 109-111 are a fragmentary, diagrammatic top view and cross-sectional side views of the construction of FIGS. 1-3 shown at a processing stage subsequent to that of FIGS. 106-108.
Figure 110:
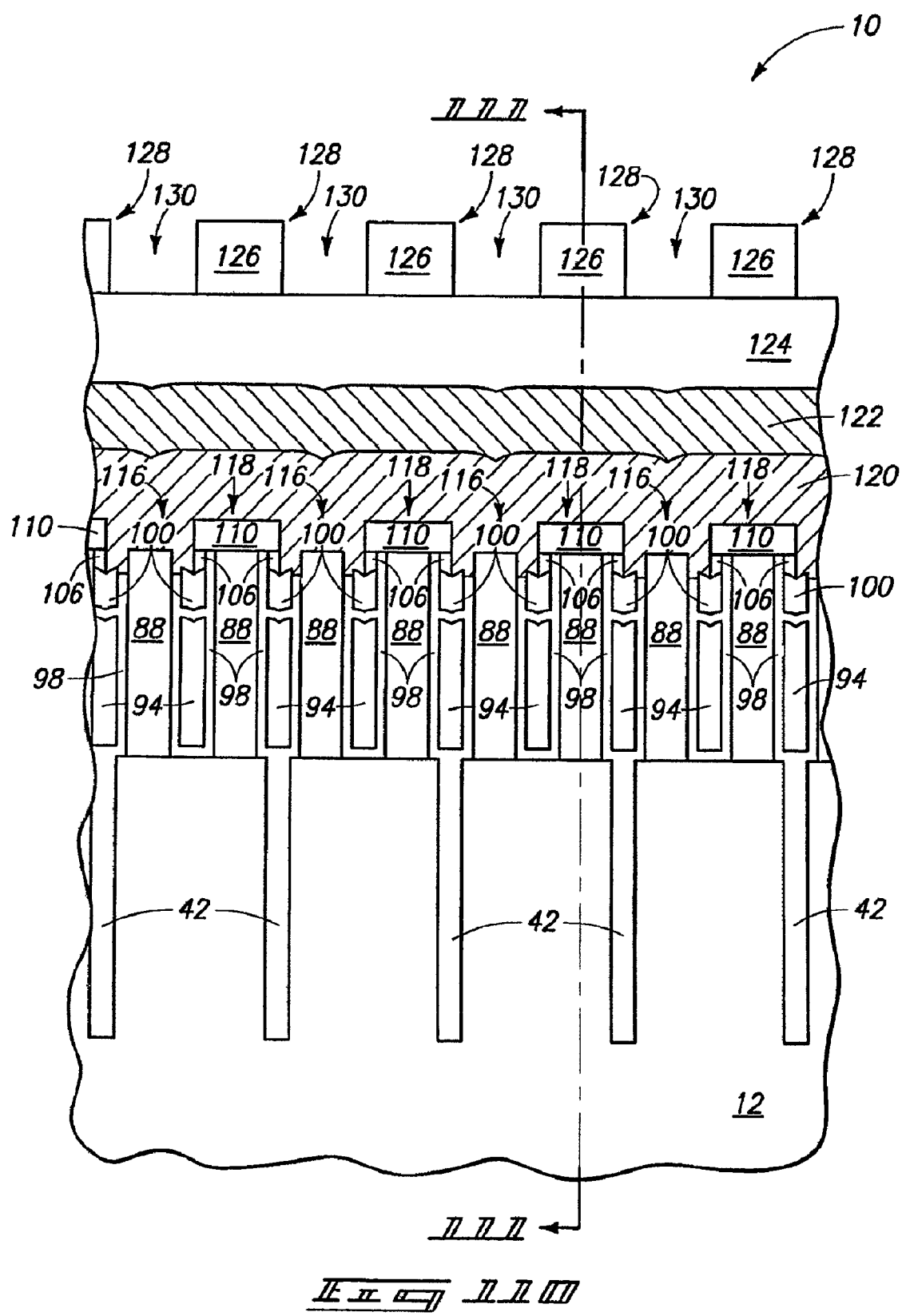
Figure 111:
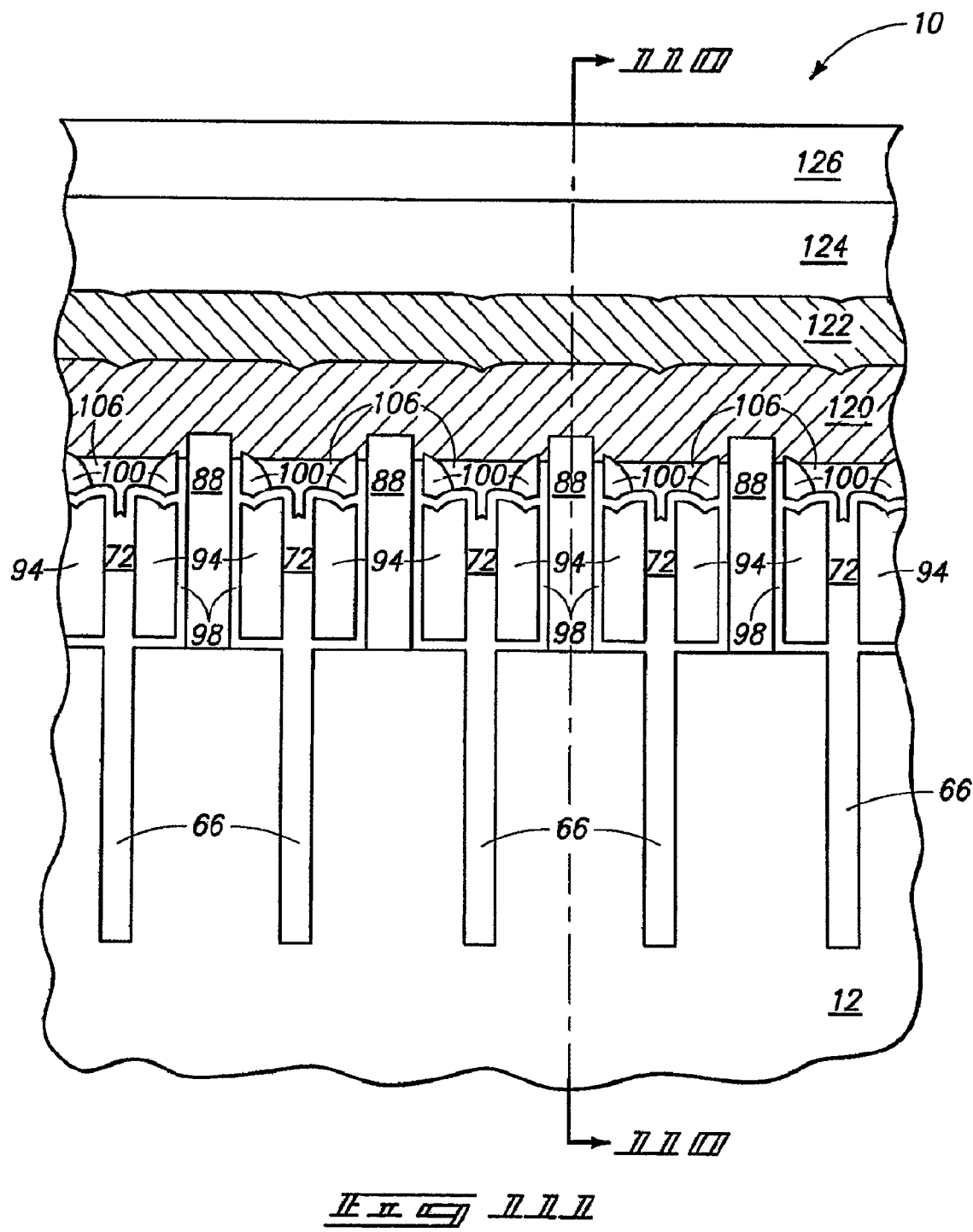

Referring next to FIGS. 109-111, a first conductive digit line material 120 is formed within gaps 116 and over the lines 118 of material 110. Conductive digit line material 120 contacts the set of pedestals exposed within gaps 116, but does not contact the set of pedestals protected by lines 118 of material 110. Conductive material 120 can comprise any suitable electrically conductive material, and in particular aspects will comprise, consist essentially of, or consist of conductively-doped silicon. For instance, material 120 can be conductively-doped polycrystalline silicon formed to a thickness of about 500 Å.

A second conductive digit line material 122 is formed over the first conductive digit line material 120. Second material 122 can comprise any suitable material, and in particular aspects will comprise, consist essentially of, or consist of metal and/or metal compounds. For instance, material 122 can comprise, consist essentially of, or consist of tungsten. In an exemplary application, material 122 can be tungsten formed to a thickness of about 500 Å.

An electrically insulative cap 124 is formed over second conductive layer 122. Electrically insulative cap can comprise any suitable material, and in particular aspects will be a nitride-containing material. For instance, cap 124 can be silicon nitride formed to a thickness of about 1000 Å.

A patterned masking material 126 is formed over cap 124. Masking material 126 can be, for example, photoresist formed into the shown pattern with photolithographic processing. Mask 126 is formed in a series of lines 128 spaced from one another by gaps 130. Mask 126 defines a digit line pattern. The lines 126 and gaps 130 are illustrated in the top view of FIG. 109 as extending in a horizontally-elongated direction. The pedestals 88 are shown in dashed-line view in FIG. 109 to indicate that the pedestals are beneath other materials.

Figure 112:
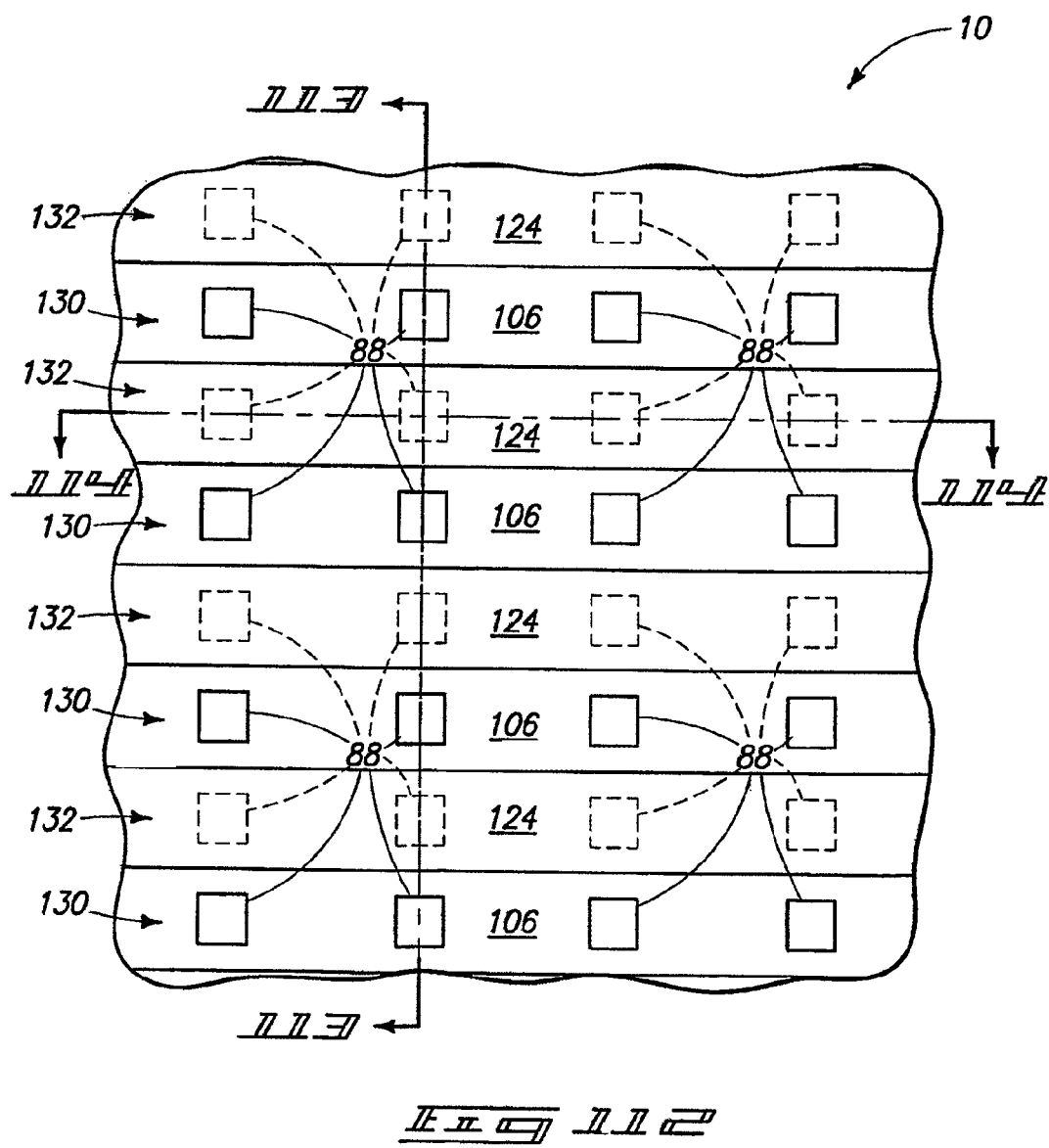
FIGS. 112-114 are a fragmentary, diagrammatic top view and cross-sectional side views of the construction of FIGS. 1-3 shown at a processing stage subsequent to that of FIGS. 109-111.
Figure 113:
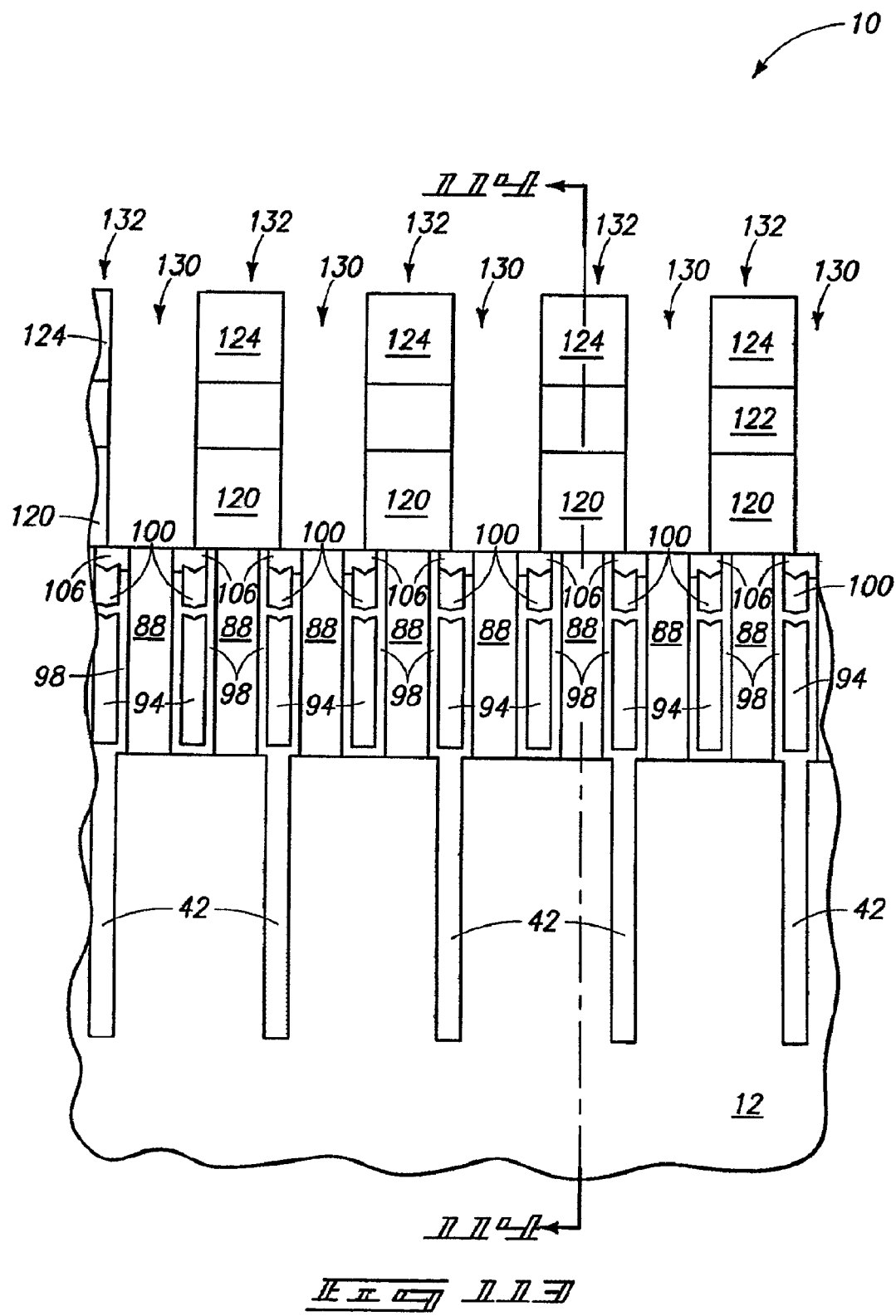
Figure 114:
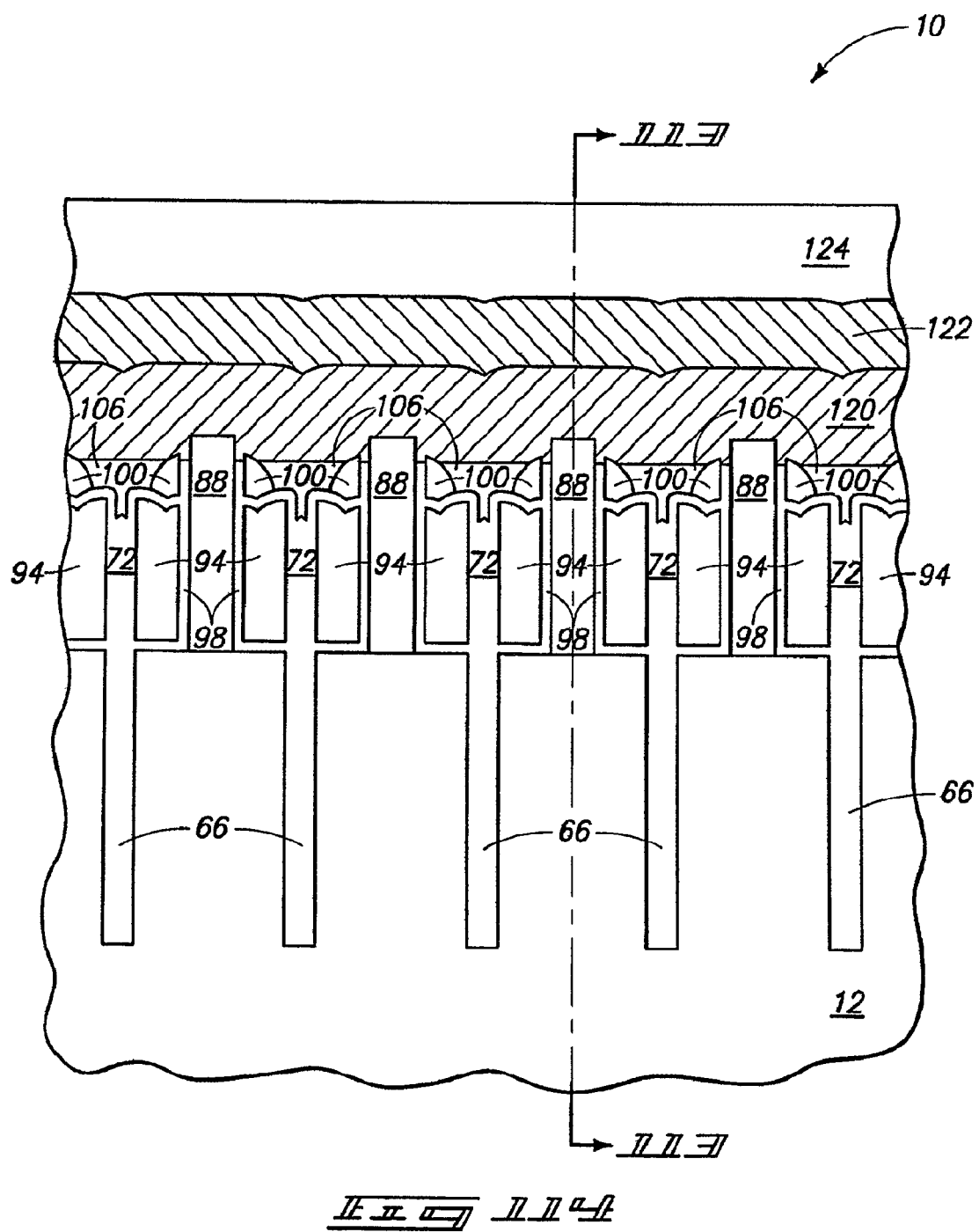

Referring next to FIGS. 112-114, a pattern is transferred from patterned masking layer 126 (FIGS. 109-111) through layers 120, 122 and 124, and subsequently masking layer 126 is removed. The transferring of the pattern through layers 120, 122 and 124 extends gap 130 through the layers, and forms the layers 120, 122 and 124 into patterned stacks corresponding to horizontally-extending digit line stacks 132.

The materials 120, 122 and 124 can be patterned utilizing any suitable etch or combination of etches. For instance, material 124 can be silicon nitride, and can be patterned utilizing a dry etch; material 122 can be tungsten, and can be patterned utilizing a dry etch; and material 120 can be polysilicon and can be patterned utilizing a dry etch.

The conductive digit line material 120 contacts a first set of pedestals 88, and a second set of pedestals is exposed within openings 130. The first set of pedestals is shown in dashed-line view in FIG. 112 to indicate that such set is covered by other materials in the shown view.

Figure 115:
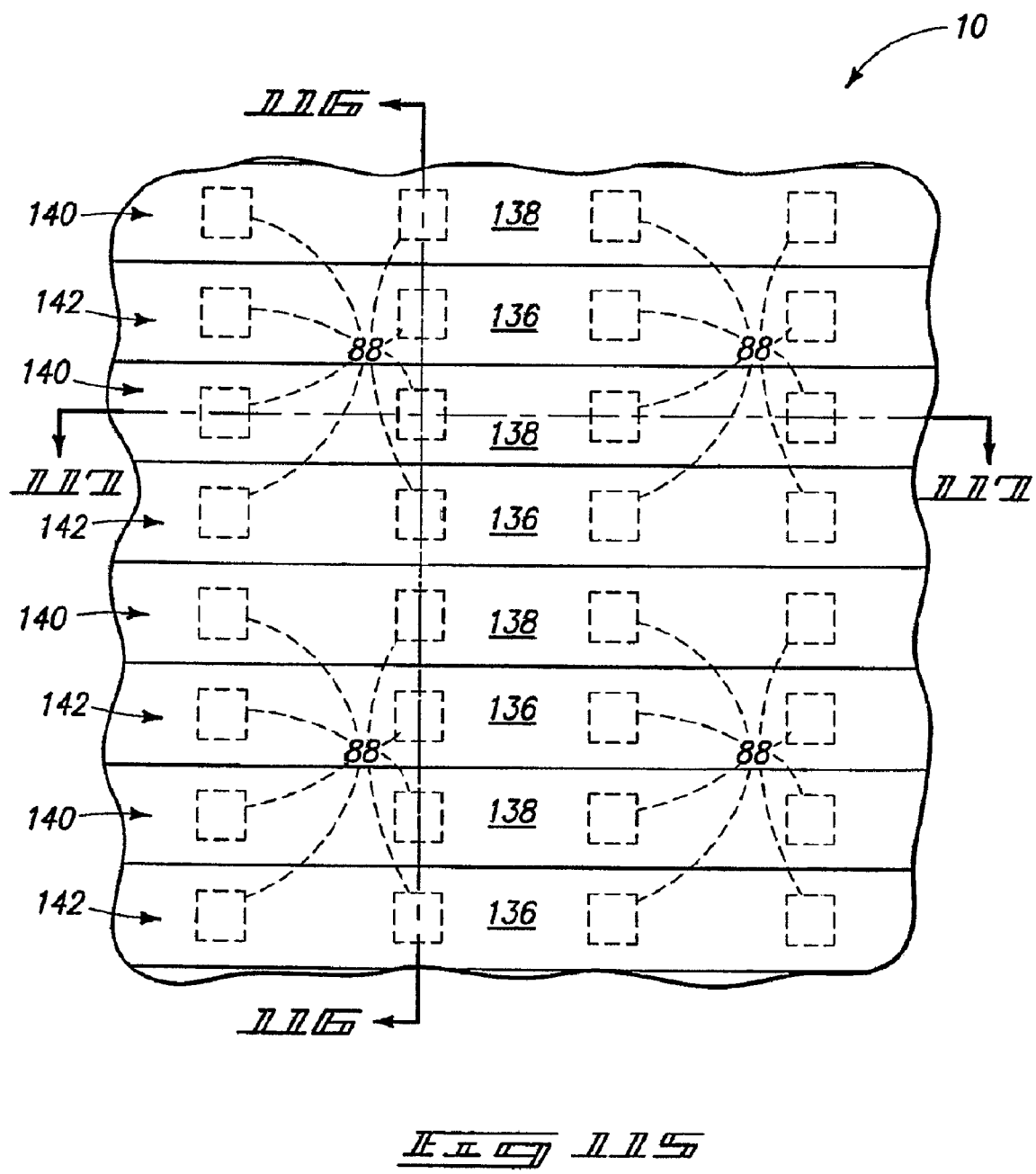
FIGS. 115-117 are a diagrammatic, fragmentary top view and cross-sectional side views of the construction of FIGS. 1-3 shown at a processing stage subsequent to that of FIGS. 112-114.
Figure 116:
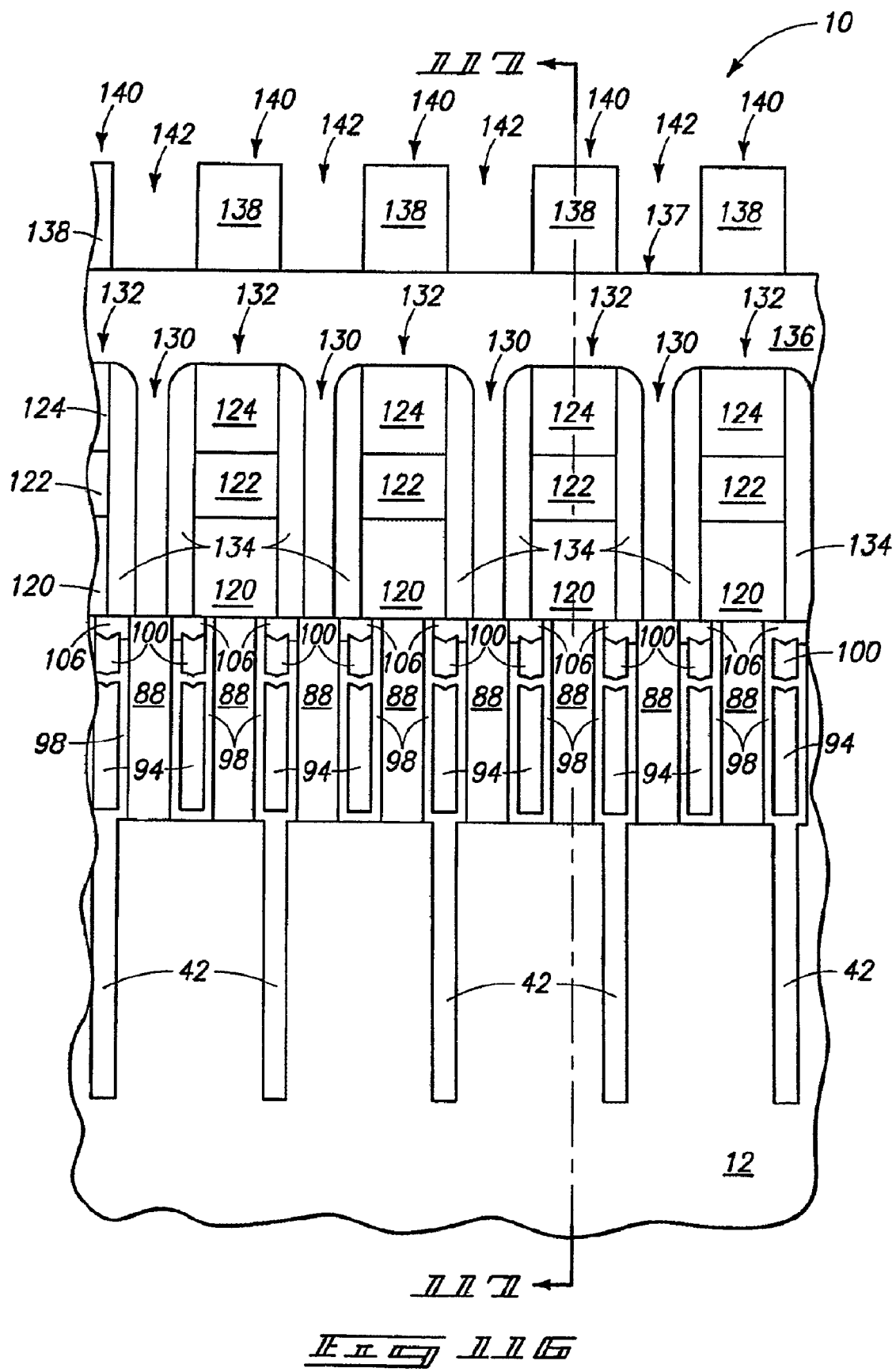
Figure 117:
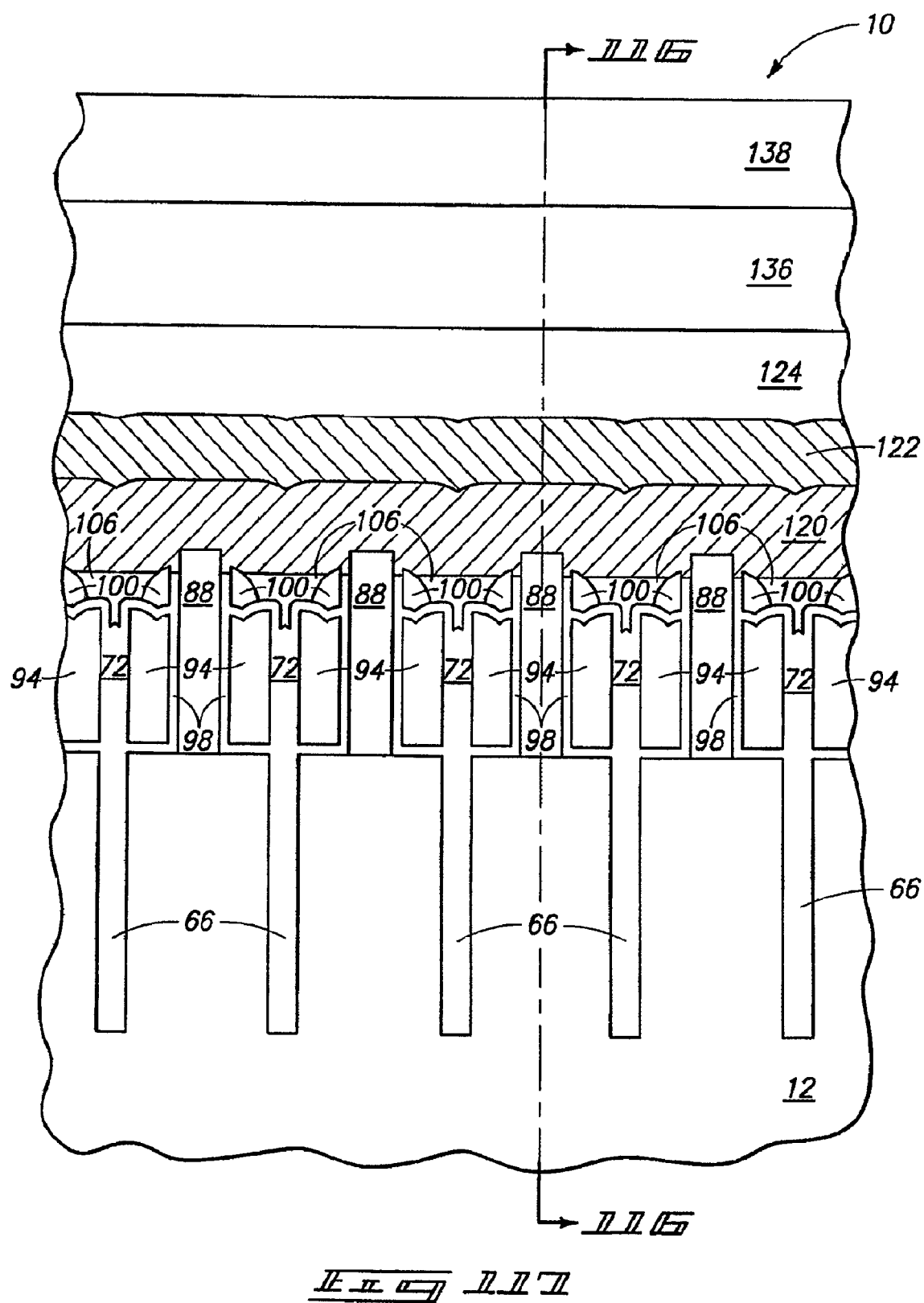

Referring next to FIGS. 115-117, insulative material spacers 134 are formed along stacks 132. Spacers 134 can comprise, consist essentially of, or consist of silicon nitride, and can be formed by depositing a layer of silicon nitride having a thickness of about 200 Å, and subsequently subjecting such layer to an anisotropic spacer etch. Spacers 134 narrow openings 130 between the stacks 132.

An electrically insulative material 136 is formed within the openings 130, and also over stacks 132. Electrically insulative material 136 can, for example, comprise, consist essentially of, or consist of silicon dioxide. In particular aspects, material 136 is silicon dioxide formed to a thickness of about 3000 Å. Alternatively, material 136 can be borophosphosilicate glass (BPSG) formed to a thickness of about 3000 Å. Material 136 has a planarized upper surface 137 which can be formed by, for example, chemical-mechanical polishing across the surface of material 136. In particular aspects, material 136 is chemical-mechanical polished so that the remaining thickness of material 136 from a base of openings 130 to an uppermost surface of the material 136 is about 7000 Å.

A patterned masking material 138 is formed over material 136. Material 138 can be photoresist formed into the shown pattern by photolithographic processing. Patterned mask 138 is formed in a series of lines 140 spaced from one another by gaps 142. The lines and gaps extend in a horizontal direction in the top view of FIG. 115. The pedestals 88 are shown diagrammatically in top view 115 to provide a reference of the location of lines 140.

Figure 118:
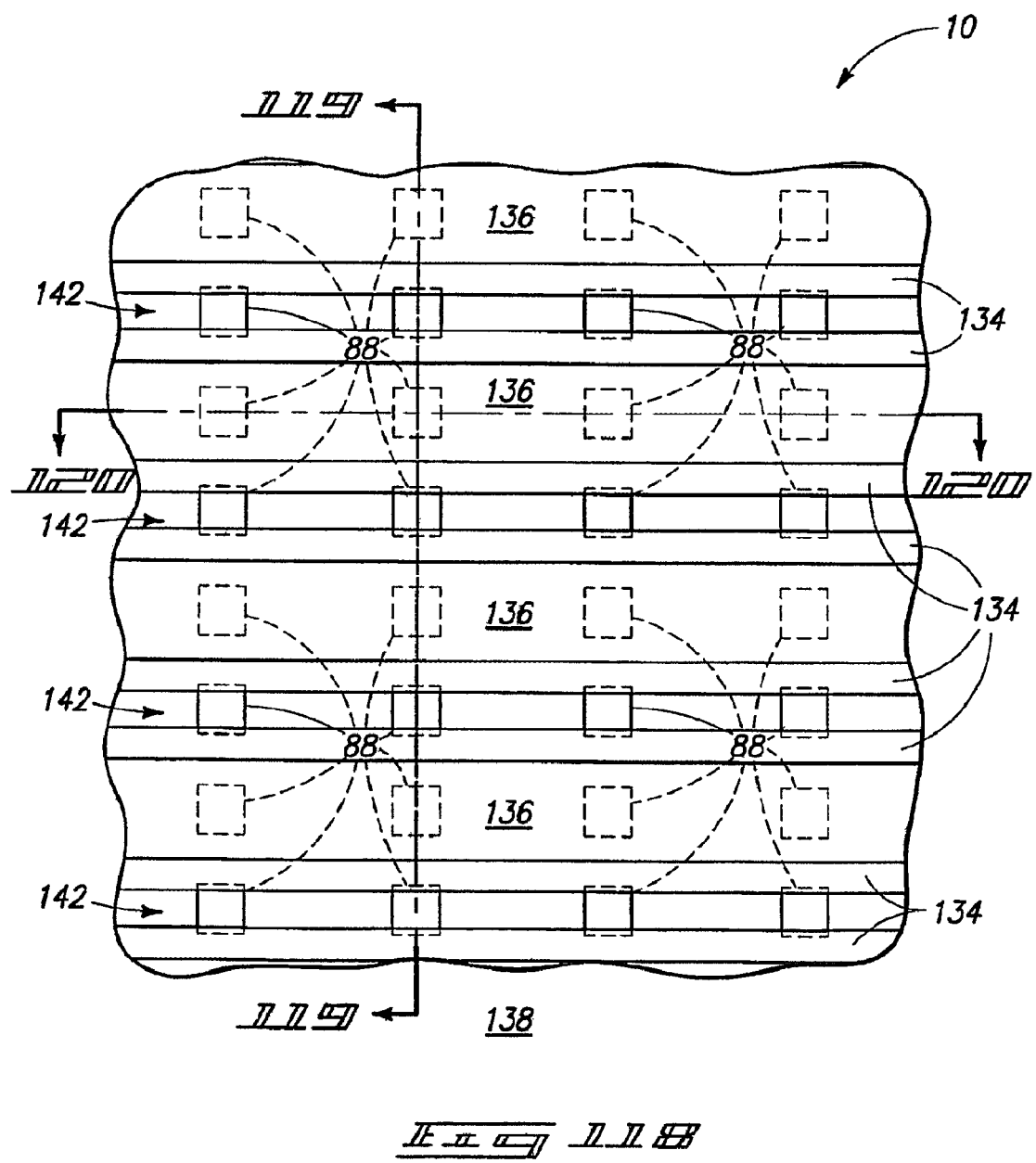
FIGS. 118-120 are a diagrammatic, fragmentary top view and cross-sectional side views of the construction of FIGS. 1-3 shown at a processing stage subsequent to that of FIGS. 115-117.
Figure 119:
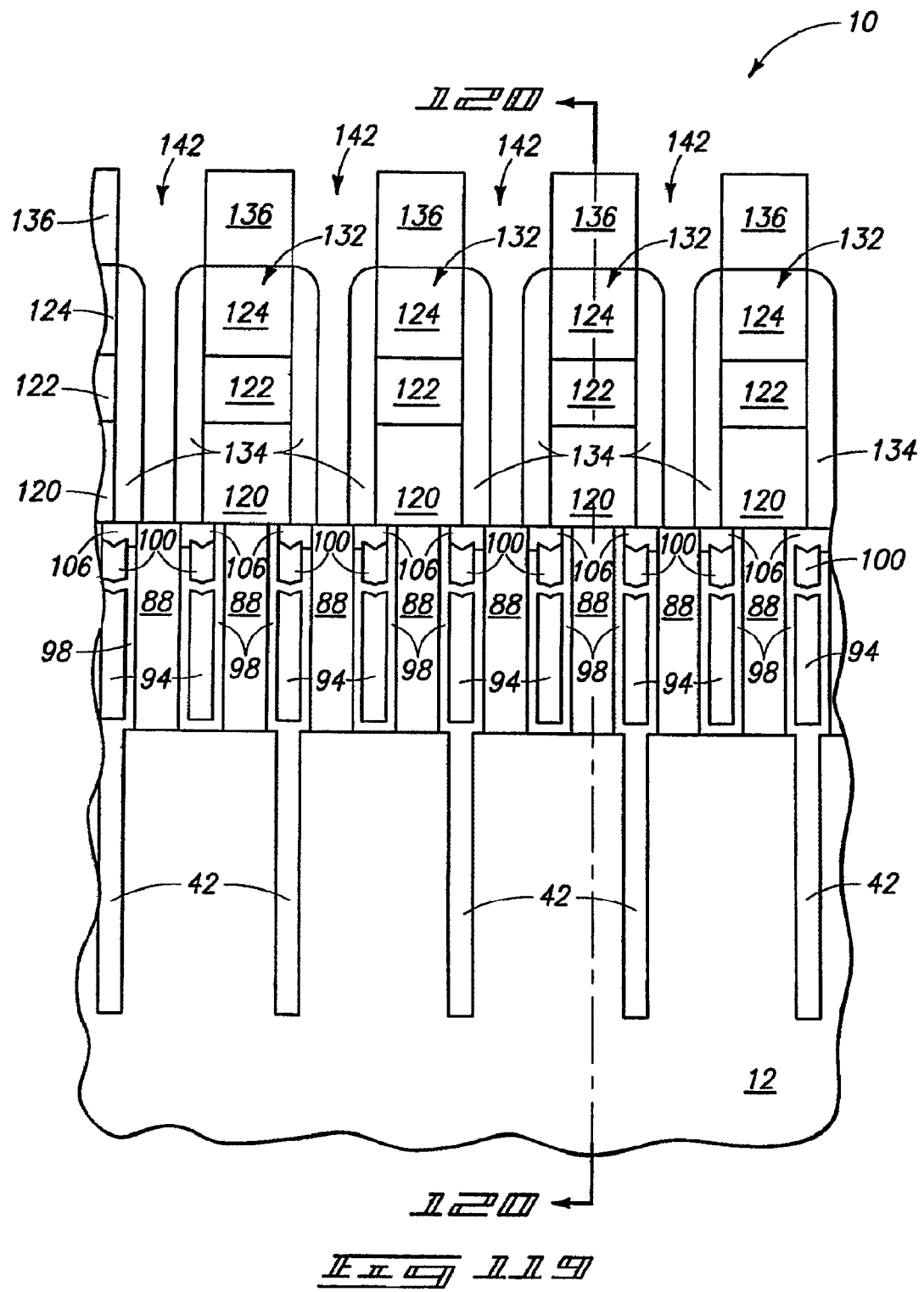
Figure 120:
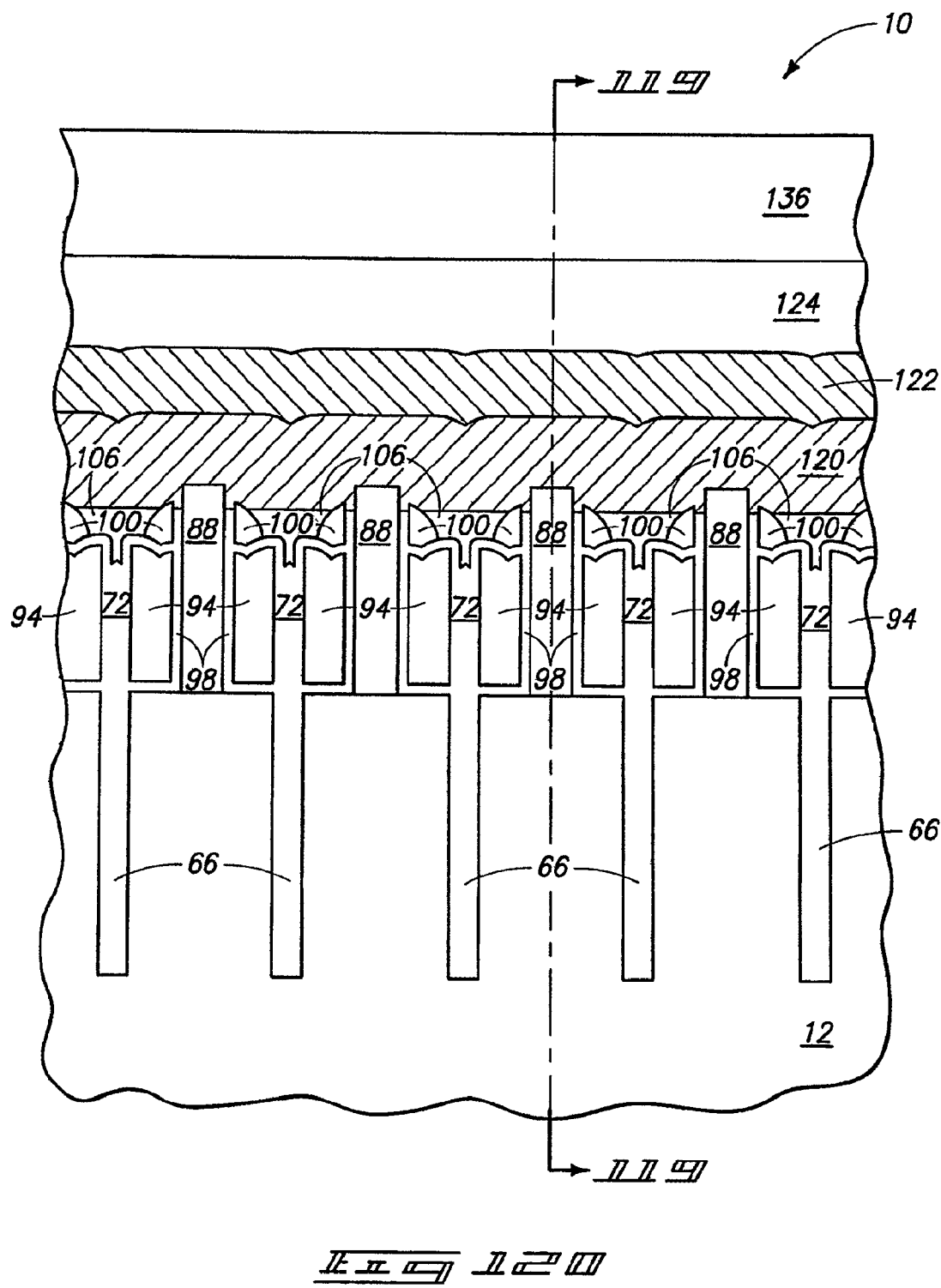

Referring next to FIGS. 118-120, gaps 142 are extended through material 136 to expose the set of pedestals which is not covered by digit line stacks 132, and subsequently patterned mask 138 (FIGS. 115-117) is removed.

The etch utilized to extend through material 136 is preferably selective for material 136 relative to the material of spacers 134. Accordingly, the spacers protect conductive digit line materials 120 and 122 from being exposed during the removal of material 136. In particular aspects, material 136 can be silicon dioxide, spacers 134 can be silicon nitride, and the etch utilized to remove material 136 can be a dry etch which removes about 4000 Å of silicon dioxide.

Figure 121:
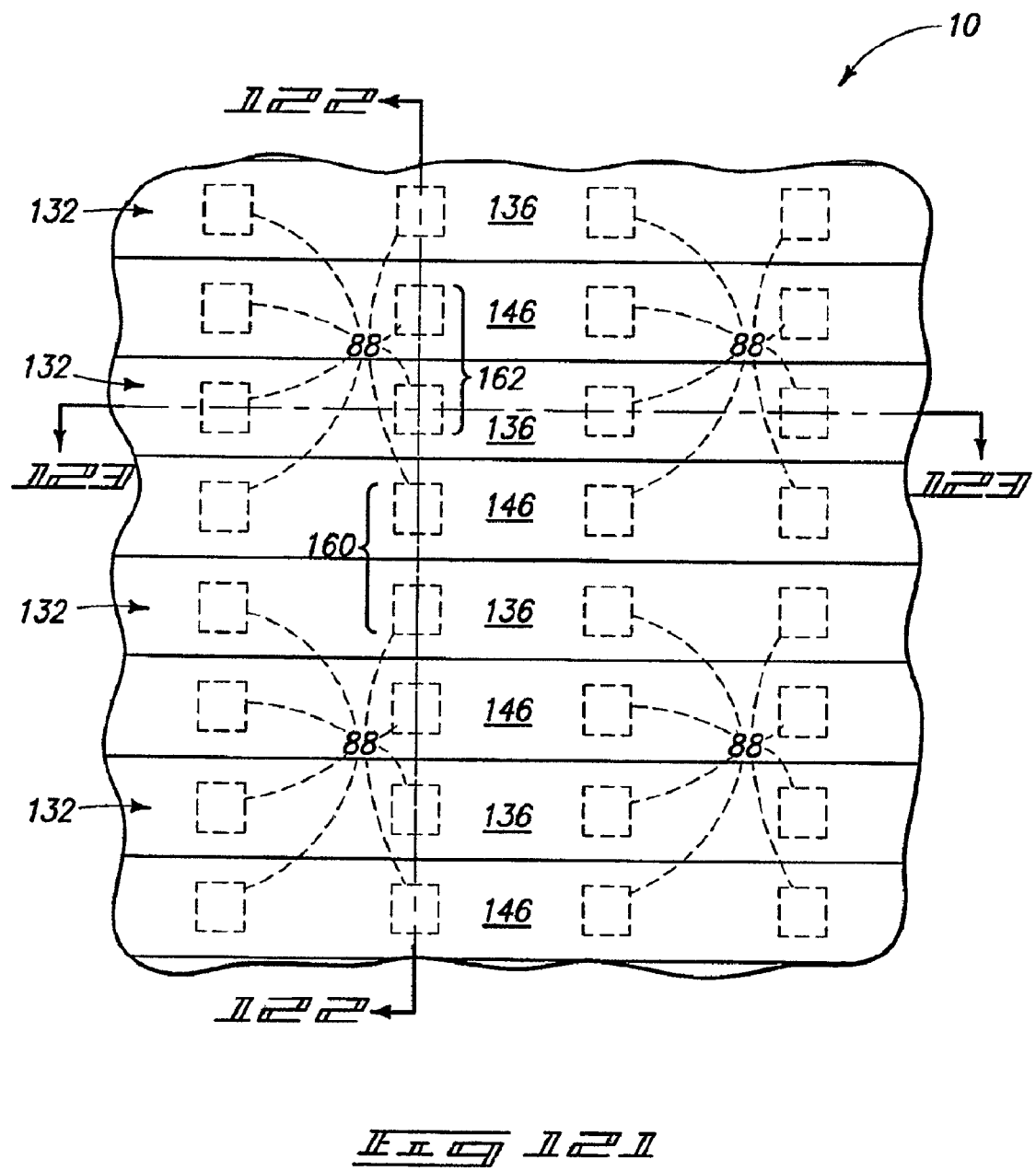
FIGS. 121-123 are a diagrammatic, fragmentary top view and cross-sectional side views of the construction of FIGS. 1-3 shown at a processing stage subsequent to that of FIGS. 118-120.
Figure 122:
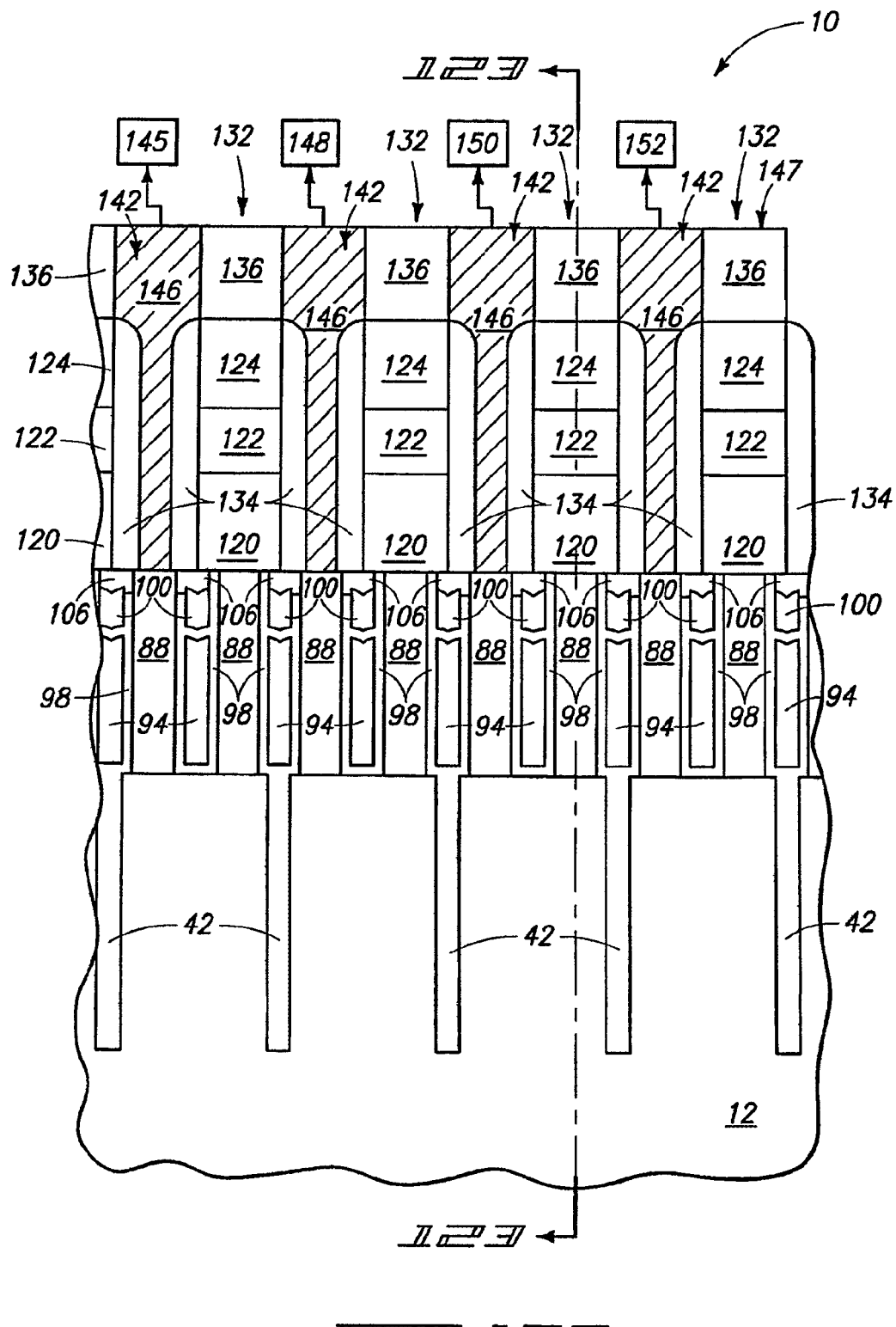
Figure 123:
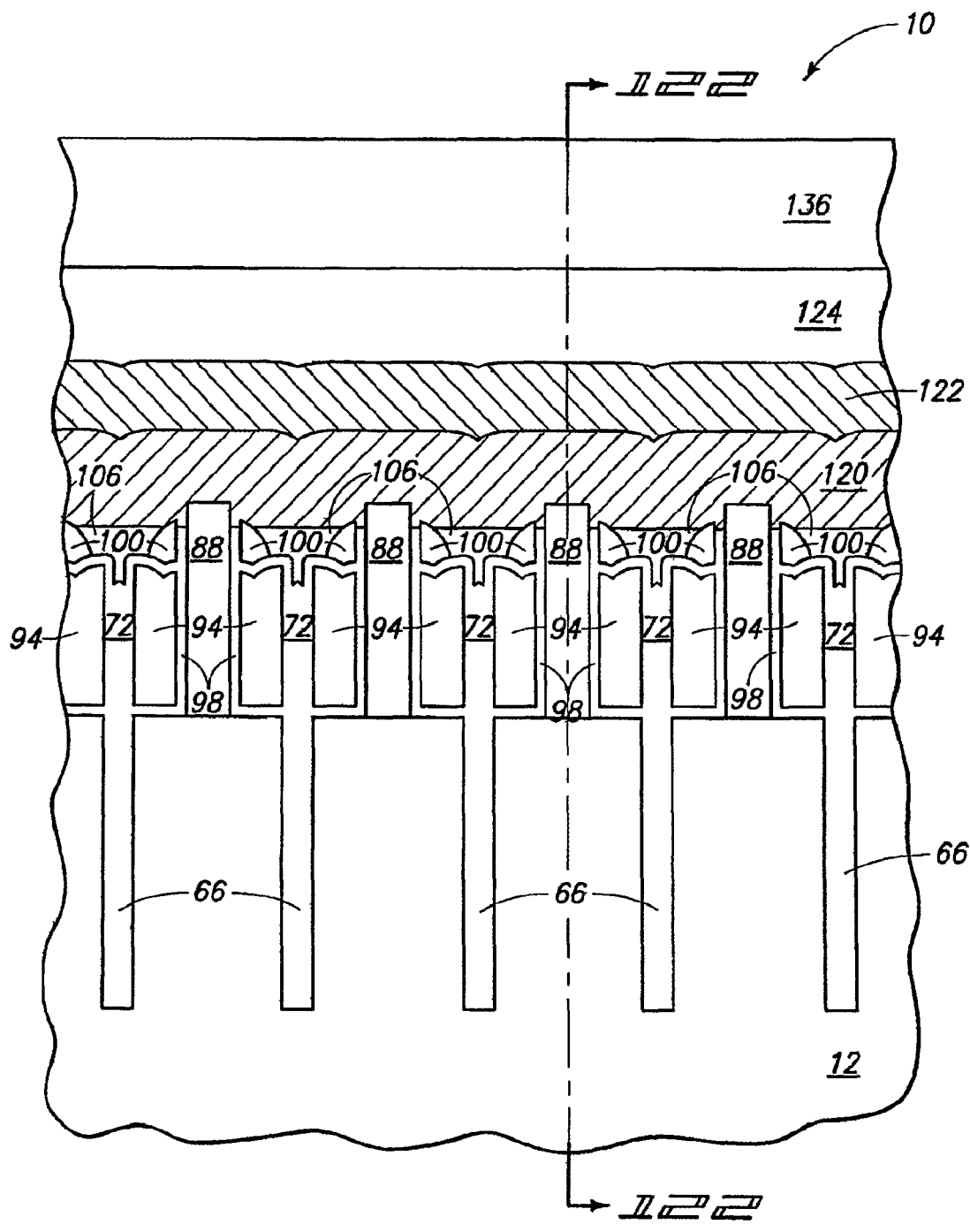

Referring next to FIGS. 121-123, an electrically conductive material 146 is formed within gaps 142. Electrically conductive material 146 can comprise any suitable material. In particular aspects, the conductive material will comprise, consist essentially of, or consist of conductively-doped silicon. For instance, material 146 can be conductively-doped polycrystalline silicon formed to a thickness of about 500 Å. The material 146 would typically be formed over material 136, and then subjected to planarization to form the shown planarized upper surface 147 extending across materials 136 and 146.

A plurality of memory storage devices 145, 148, 150 and 152 are diagrammatically illustrated as being electrically connected with conductive material 146. The memory storage devices can comprise, for example, capacitors, and are electrically connected through conductive pedestals defined by material 146 to underlying source/drain regions incorporated within the pedestals 88.

The top view of FIG. 121 shows that the pedestals 146 and digit line stacks 132 form alternating horizontally-elongated rows. Although not shown in FIG. 121, it is to be understood that there would typically be isolation regions provided along the horizontally-extending row of conductive pedestals 146 so that each of the source/drain regions 88 along the row would be electrically connected to a single memory storage unit electrically separated from the memory storage units that other source/drain regions along the same row are connected to. Thus, each source/drain region within the row can be utilized to store a single bit of information.

The source/drain regions electrically connected to conductive pedestal material 146 are paired with source/drain regions electrically connected to digit line stacks 132 to define individual transistors. Such pairing is illustrated diagrammatically in FIG. 121 by the brackets 160 and 162 which illustrate exemplary source/drain regions which can be paired within individual transistors. The gateline material 94 defines the gate of the transistor which gatedly connects the paired source/drain regions to one another. Particular transistor constructions which can be utilized in exemplary aspects of the present invention are described with reference to FIGS. 124-126.

Figure 124:
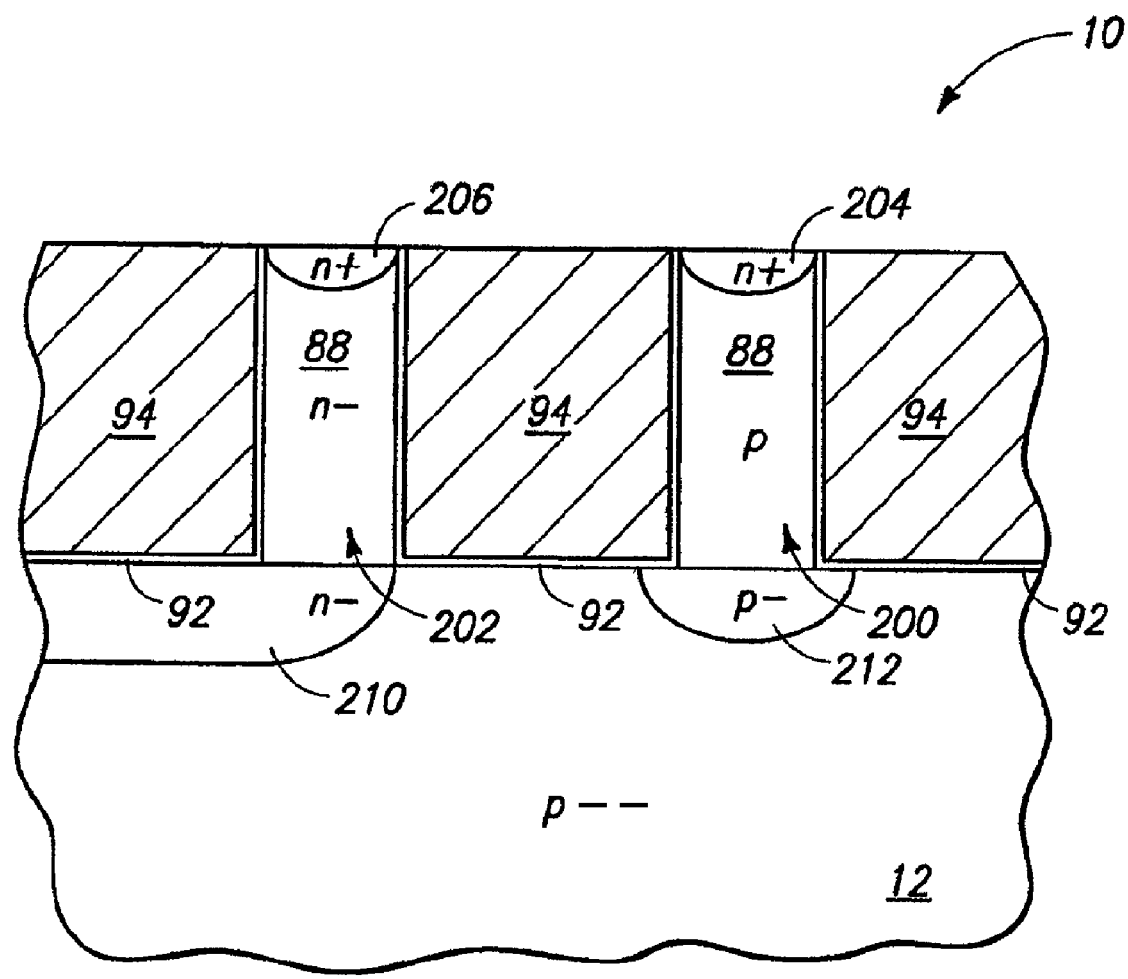
FIG. 124 is a diagrammatic, cross-sectional view of an exemplary memory device construction which can be formed in accordance with an aspect of the present invention.

Referring to FIG. 124, a fragment of construction 10 is illustrated in cross-sectional view at a processing stage at or after the processing stage of FIGS. 82-84 in accordance with an exemplary aspect of the invention. In referring to the construction of FIG. 124, identical numbering will be used as was used above in describing FIGS. 1-123, where appropriate. Accordingly, the construction 10 of FIG. 124 is shown to comprise the substrate 12, gateline material 94, and gate dielectric material 92 described previously. The construction of FIG. 124 further comprises a pair of pedestals 200 and 202 which are particular aspects of the pedestals 88 described previously. The pedestals 200 and 202 are paired within a transistor construction, and accordingly can correspond to a pair of the pedestals along the cross-sectional view 83, such as the paired pedestals 89 discussed above with reference to FIG. 83. The pedestals and gateline material differ in FIG. 124 relative to pedestals and gateline material described previously in this application in that the pedestals of FIG. 124 are at about the same elevational height over substrate 12 as is the gateline material, whereas such was not the case in the aspects of the invention described with reference to FIGS. 1-123. The gateline/pedestal relationships of FIG. 124 and of FIGS. 1-123 can be utilized interchangeably in the various aspects of the invention described herein.

One of the pedestals 88 of the FIG. 124 construction can ultimately be a source/drain region utilized to electrically connect to a digit line, and the other can ultimately be a source/drain region utilized to electrically connect to a memory storage device. In order to distinguish the pedestals from one another, one of the pedestals is labeled as 200, and the other is labeled as 202. In exemplary aspects, the pedestal 200 will be utilized for connecting to a digit line and the pedestal 202 would be utilized for connecting to a memory device, but it is to be understood that the utilizations of the pedestals can be reversed. The gateline material 94 between pedestals 200 and 202 ultimately functions as a transistor gate of a transistor device, and such transistor gate gatedly connects a source/drain region associated with pedestal 202 with a source/drain region associated with pedestal 200.

Each of pedestals 200 and 202 has a heavily-doped region source/drain in an uppermost portion of the pedestal, with the heavily-doped region of pedestal 200 being labeled 204 and the heavily-doped region of pedestal 202 being labeled 206. In the shown exemplary aspect of the invention, both heavily-doped regions are doped to be n-type doped regions. The regions are shown to be n+ regions to indicate that the regions are doped comparatively heavily relative to other regions of the FIG. 124 construction.

Pedestal 202 comprises a lightly-doped region extending from the heavily doped region 206 to an upper surface of substrate 12, with such lightly-doped region being indicated to be n−. Substrate 12 comprises a diffusion region 210 therein, and the lightly-doped portion of pedestal 88 is shown electrically connecting with the diffusion region 210. In the shown aspect of the invention, the diffusion region 210 is doped to an n− level.

Pedestal 200 comprises an intermediately doped region extending from the heavily-doped region 204 to an upper surface of substrate 12. The intermediately-doped region is shown to be a p-type region, and is labeled as being "p". Such label indicates that the region is more heavily doped than would be a p− or n− region, but less heavily doped than would be an n+ or p+ region.

Substrate 12 comprises a conductively-doped diffusion region 212 beneath pedestal 200, and the intermediately-doped region of pedestal 200 is shown electrically connecting with conductively-doped region 212. In the shown aspect of the invention, conductively-doped region 212 is shown to be lightly doped with p-type dopant, and accordingly is shown as a p– region.

Substrate 12 has a p–– region interconnecting the diffusion regions 210 and 212.

The transistor gate of gateline 94 gatedly connects the heavily-doped source/drain region 204 with the heavily-doped source/drain region 206 through the conductively-doped pedestals 200 and 202, through the conductively-doped regions 210 and 212, and through the p–– region of substrate 12. The channel length of the transistor device is the length extending from source/drain region 204 to source/drain region 206. The channel characteristics of the device can be influenced by tailoring the dopant concentrations and types along the channel length. Additionally, characteristics of the device can be influenced by the type of materials utilized for pedestals 200 and 202. For instance, if epitaxial material is utilized for the pedestals, such material tends to be relatively leaky compared to other semiconductor materials. In some aspects it can be advantageous to have the source/drain region associated with the digit line be relatively leaky while the source/drain region associated with the memory storage device be less leaky. In such aspects it can be advantageous to form the pedestals associated with the digit line source/drain region to comprise, consist essentially of, or consist of conductively-doped epitaxial semiconductor material (such as, epitaxial silicon) while the pedestal associated with the source/drain region of the memory storage device comprises, consists essentially of, or consists of conductively-doped semiconductor material which is not epitaxial, such as, for example, conductively-doped silicon which is not epitaxial. If the non-epitaxial semiconductor material is silicon, such can be in the form of, for example, amorphous silicon or polycrystalline silicon. As indicated above, in particular aspects pedestal 200 will be associated with a digit line and pedestal 202 will be associated with a memory storage device.

Figure 125:
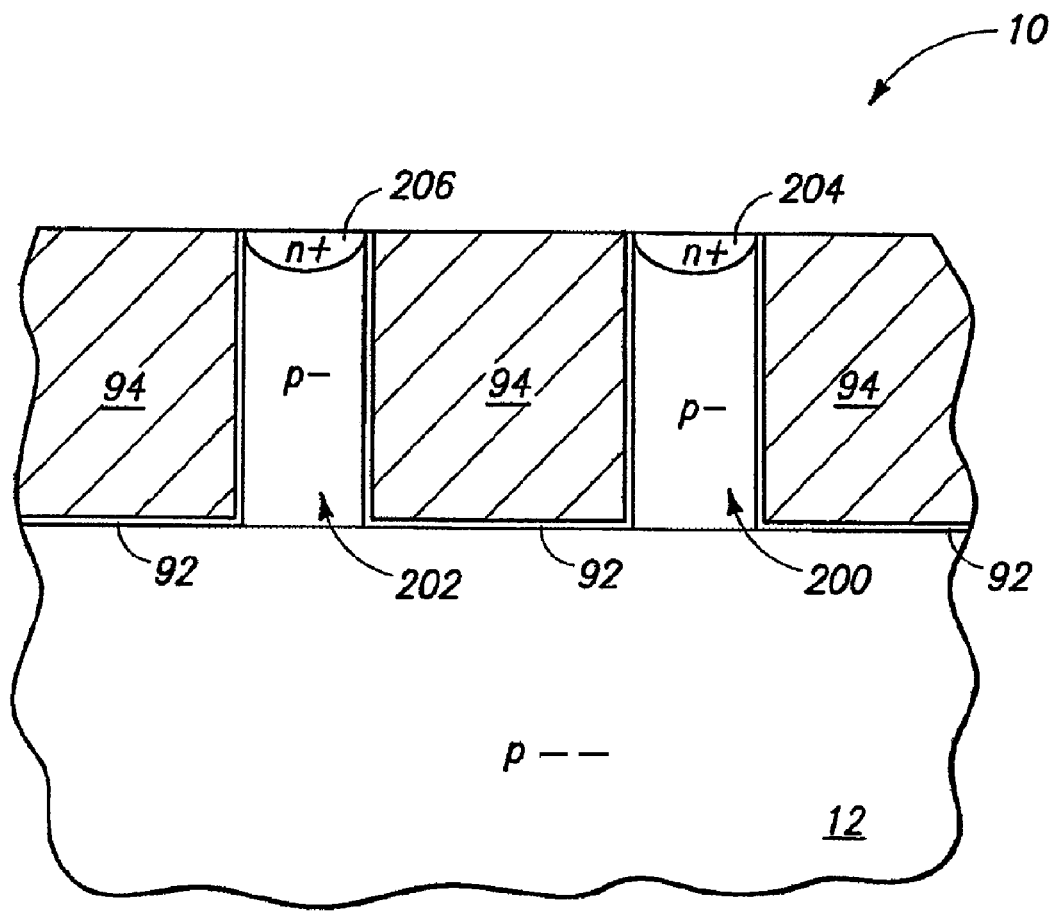
FIG. 125 is a diagrammatic, cross-sectional view of another exemplary memory device construction which can be formed in accordance with an exemplary aspect of the present invention.

Another aspect of the invention is described with reference to FIG. 125. In referring to FIG. 125, similar numbering will be used as was used above in describing FIG. 124. FIG. 125 shows a construction 10 comprising gateline material 94, a pair of pedestals 200 and 202, substrate 12, and gate dielectric material 92. Pedestals 200 and 202 comprise the heavily-doped source/drain regions 204 and 206, but differ from the pedestals described in FIG. 124 in that the pedestals of FIG. 125 are identical to one another and both comprise lightly-doped (shown as p–) regions extending between the heavily-doped regions 204 and 206 and the substrate 12. The substrate 12 comprises p–– doping interconnecting the pedestals 200 and 202. As discussed above with reference to FIG. 124, both of the pedestals can comprise the same composition as one another, or alternatively one of the pedestals can be epitaxial while the other is not.

Figure 126:
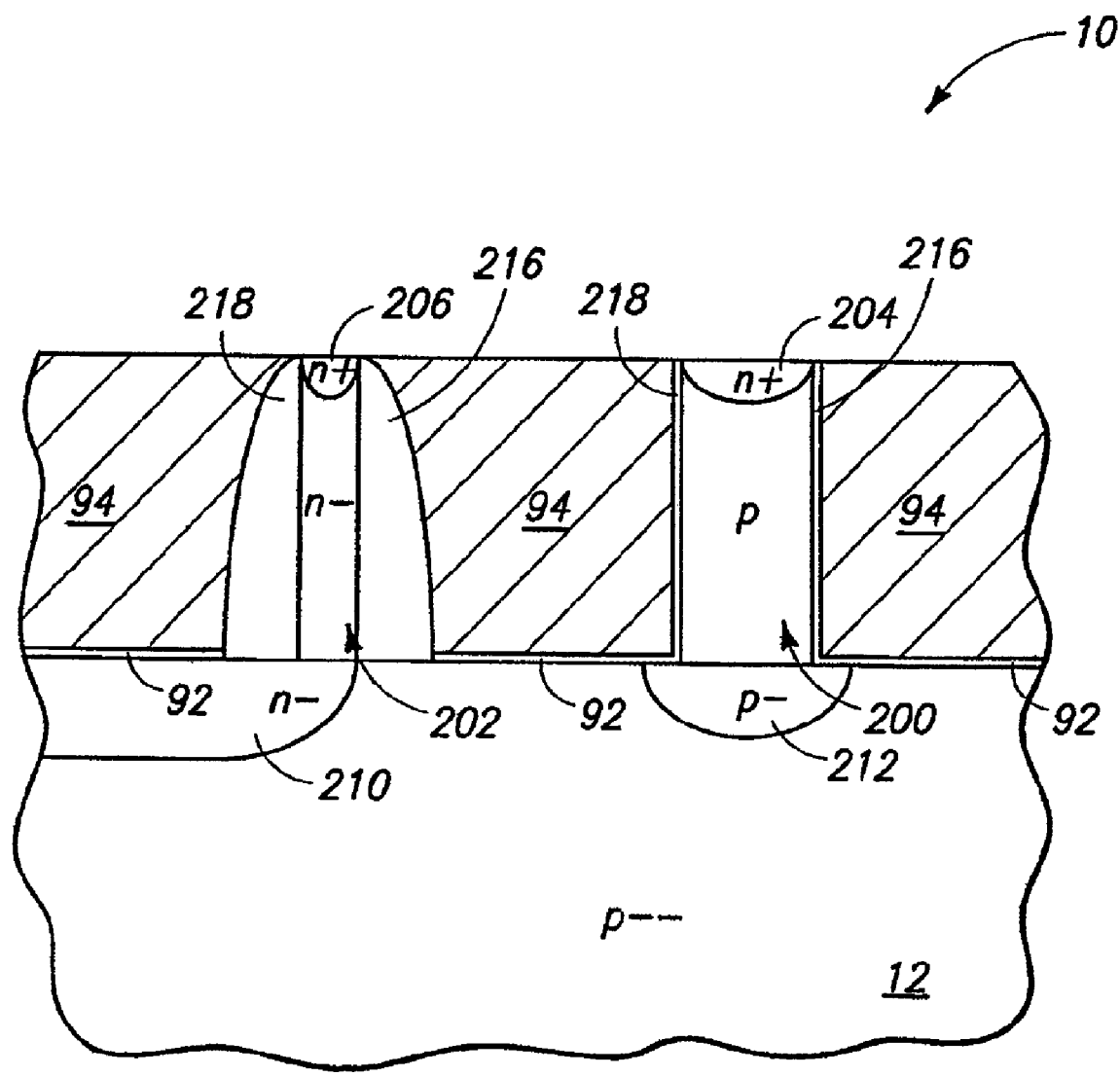
FIG. 126 is a diagrammatic, cross-sectional view of yet another exemplary memory device construction which can be formed in accordance with an exemplary aspect of the present invention.

FIG. 126 shows yet another aspect of the invention. Similar numbering will be used in referring to FIG. 126 as was used above in describing FIGS. 124 and 125. FIG. 126 comprises the gateline material 94, gate dielectric material 92, substrate 12, pedestals 200 and 202, and heavily-doped source/drain regions 204 and 206 described previously. The construction of FIG. 126 differs from those of FIGS. 124 and 125 in several aspects. First, the construction of FIG. 126 comprises spacers 216 and 218 proximate the pedestal 202. Such spacers can narrow pedestal 202 relative to pedestal 200 (i.e., reduce a horizontal cross-sectional width of pedestal 202 relative to the horizontal cross-sectional width of pedestal 200). Spacers 216 can be provided in additional processing steps beyond those described above with reference FIGS. 1-123 by methodology which will be recognized by persons of ordinary skill in the art. Spacers 216 and 218 can comprise, for example, silicon nitride. The utilization of spacers 216 and 218 adjacent pedestal 202 but not adjacent pedestal 200 can allow the electrical characteristics of pedestals 202 and 200 to be specifically tailored to the particular applications that the pedestals are to be utilized in, which can be advantageous in some aspects of the invention. The control of the pedestal width can allow additional control beyond that which can be obtained by controlling doping alone within the pedestal. Although the pedestals are shown having different widths relative to one another, it is to be understood that spacers analogous to 216 and 218 can also be formed adjacent pedestal 200 so that pedestal 200 is also narrowed.

The substrate 12 is shown comprising the conductively-doped diffusion regions 210 and 212 discussed previously with reference to FIG. 124, and pedestals 200 and 202 are shown comprising the same type of doping as was discussed with reference to FIG. 124. It is to be understood, however, that the aspect of the invention of utilization of spacers adjacent one of the pedestals can be used with any appropriate doping of the pedestals and substrate, and that the aspect of FIG. 126 is but one of many aspects of the invention.

FIGS. 124-126 illustrate exemplary aspects of the invention, and it is to be understood that the invention also encompasses various modifications of such aspects. For instance, the dopant types shown in the figures can be reversed relative to the shown aspects. Thus, all of the n-type regions can be converted to opposite conductivity (i.e. p-type) regions, and likewise the p-type regions can be converted to opposite-conductivity (i.e. n-type) regions.

Methodology of the invention can be used in numerous applications. For instance, the invention can be utilized for forming two-vertical transistor, one-capacitor $4F^2$ DRAM cells. In particular aspects, the invention can be considered to comprise vertical DRAM cell technology. One transistor is utilized to connect the cell to a substrate, and another transistor connects the digit line to the substrate. The self-aligned lateral transistor connects vertical source/drain region pedestals to one another. The cell can have low digit capacitance and low wordline resistance, and also can have redundancy against vertical axis problems.

Although the gateline is shown extending entirely around source/drain regions in the shown aspects of the invention, it is to be understood that the invention encompasses other aspects (not shown) in which the gateline extends less than fully around the source/drain regions. For instance, the gateline can extend one-quarter of the way around the source/drain region, halfway around the source/drain region, three-quarters of the way around the source/drain region, etc.

Persons of ordinary skill in the art will recognize that the methodology of FIGS. 1-123 advantageously self-aligns numerous features relative to one another.

Figure 127:
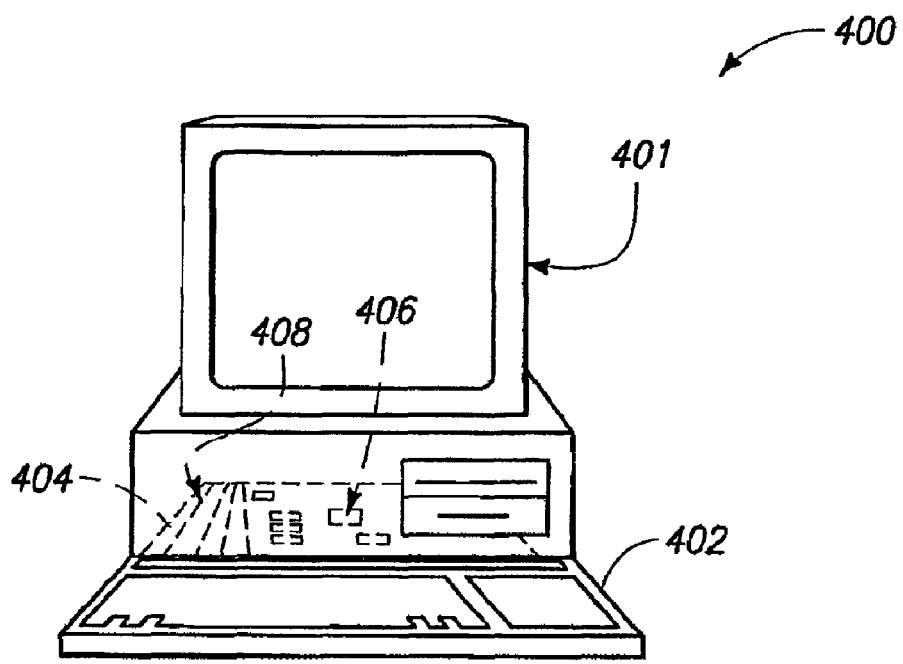
FIG. 127 is a diagrammatic view of a computer illustrating an exemplary application of the present invention.
Figure 128:
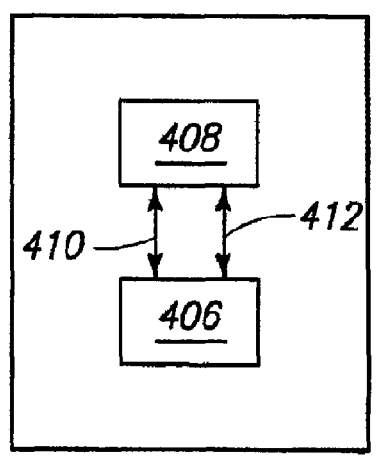
FIG. 128 is a block diagram showing particular features of the motherboard of the FIG. 127 computer.

FIG. 127 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 128. In such block diagram, the addressing circuitry is illustrated as 410 and the read circuitry is illustrated as 412. Various components of computer system 400, including processor 406, can comprise one or more of the constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 129:
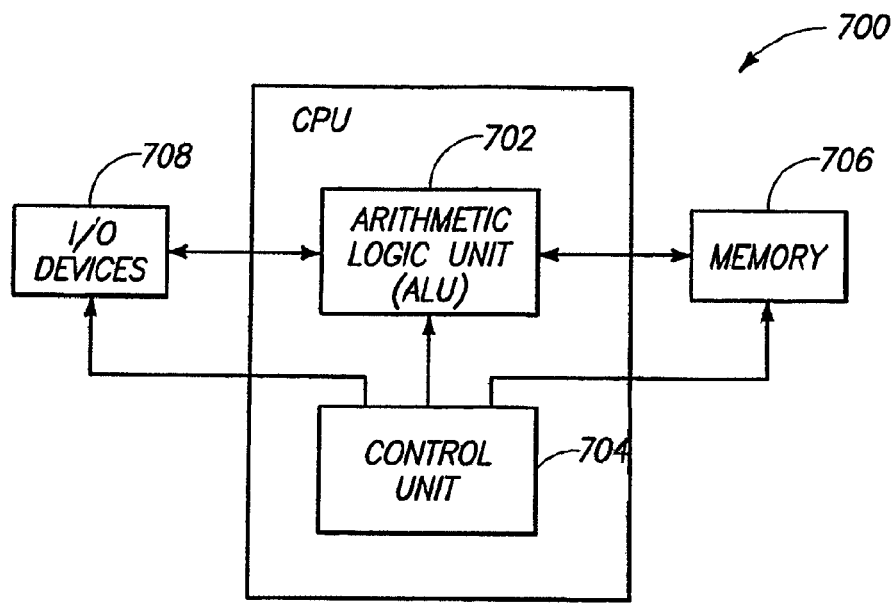
FIG. 129 is a high-level block diagram of an electronic system according to an exemplary aspect of the present invention.

FIG. 129 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 130:
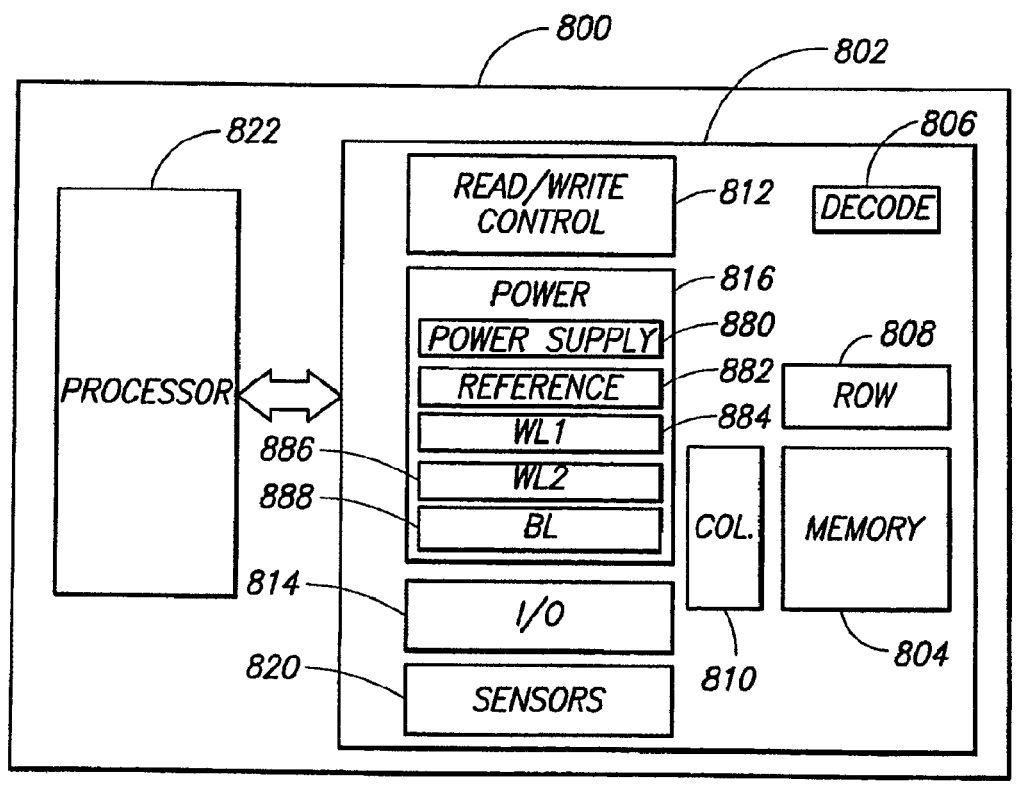
FIG. 130 is a simplified block diagram of an exemplary memory device according to an aspect of the present invention.

FIG. 130 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor structure, comprising:
a semiconductor substrate;
a gateline extending along a first axis over the substrate;
an array of openings formed within the gateline such that the gateline comprises two lines elongated and extending along the first axis on opposite sides of the openings, wherein the openings are spaced from one another by segments of the gateline along the first axis to thereby form a lattice, the segments connecting the two elongated lines to each other; and
elevationally-elongated pillars formed within the openings in the gateline, the pillars forming pairs, wherein each pillar pair comprises one source region in a first pillar adjacent along the first axis to one drain region in a second pillar, wherein the gateline and pillar pairs together form a plurality of transistor constructions in which the source region in the first pillar and the drain region in the second pillar are gatedly connected to each other through the gateline, and wherein the two elongated lines are on opposite sides of the pillar pairs.

2. The structure of claim 1 wherein the gateline comprises at least one metal.

3. The structure of claim 1, wherein the gateline comprises conductively-doped silicon.

4. The structure of claim 1, wherein at least some of the elevationally-elongated pillars comprise conductively-doped epitaxial silicon.

5. The structure of claim 1, wherein at least some of the elevationally-elongated pillars comprise conductively-doped polycrystalline silicon.

6. The structure of claim 1 wherein some of the elevationally-elongated pillars consist essentially of conductively-doped epitaxial silicon and others consist essentially of conductively-doped polycrystalline silicon.

7. The structure of claim 6 wherein the pillars consisting essentially of conductively-doped epitaxial silicon are gatedly connected to pillars consisting essentially of conductively-doped polycrystalline silicon.

8. The structure of claim 1 wherein the openings comprise dielectric material separating the elevationally-elongated pillars from the gateline.

9. The structure of claim 1, wherein the elevationally-elongated pillars extend vertically above the gateline.

10. The structure of claim 9, further comprising a memory storage device connected to the drain regions.

11. The structure of claim 10, wherein the memory storage device comprises a capacitor.

12. The structure of claim 9, further comprising a digit line connected to the source regions.

13. The structure of claim 12, further comprising a processor in communication with the digit line.

14. The structure of claim 1, further comprising a channel connecting a selected pillar pair, the channel comprising a connecting portion of semiconductor material positioned adjacent to the gateline, wherein the channel and the pillar pairs form U-shaped transistors.

15. The structure of claim 14, further comprising a dielectric material positioned between the channel and the gateline.

16. The structure of claim 1, wherein the gateline is also formed in between the source and the drain of one pillar pair.

17. The structure of claim 1, wherein the gateline is also formed in between pillar pairs that are aligned along the first axis.

* * * * *

UNITED STATES PATENT AND TRADEMARK OFFICE
CERTIFICATE OF CORRECTION

PATENT NO. : 7,915,692 B2  
APPLICATION NO. : 12/116748  
DATED : March 29, 2011  
INVENTOR(S) : Werner Juengling It is certified that error appears in the above-identified patent and that said Letters Patent is hereby corrected as shown below:

Title Page, Item (57), "Abstract", in column 2, line 4, delete "sourcedrain" and insert -- source/drain --, therefor.

Title Page, Item (57), "Abstract", in column 2, lines 9-10, delete "sourcedrain" and insert -- source/drain --, therefor.

In column 23, line 16, in Claim 6, delete "1" and insert -- 1, --, therefor.

In column 23, line 20, in Claim 7, delete "6" and insert -- 6, --, therefor.

In column 23, line 24, in Claim 8, delete "1" and insert -- 1, --, therefor.

Signed and Sealed this  
Thirty-first Day of May, 2011

David J. Kappos  
*Director of the United States Patent and Trademark Office*